United States Patent
Seo et al.

(10) Patent No.: US 11,119,593 B2
(45) Date of Patent: *Sep. 14, 2021

(54) ORGANIC LIGHT EMITTING DISPLAY DEVICE INCLUDING A REFLECTIVE TOUCH SENSING ELECTRODE AND METHOD OF MANUFACTURING THE SAME

(71) Applicant: Samsung Display Co., Ltd., Yongin-Si (KR)

(72) Inventors: Young-Seok Seo, Seoul (KR); Seung-lyong Bok, Hwaseong-si (KR); MuGyeom Kim, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/386,607

(22) Filed: Apr. 17, 2019

(65) Prior Publication Data

US 2019/0243500 A1    Aug. 8, 2019

Related U.S. Application Data

(63) Continuation of application No. 15/230,910, filed on Aug. 8, 2016, now Pat. No. 10,268,294.

(30) Foreign Application Priority Data

Oct. 23, 2015  (KR) .................. 10-2015-0147774

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G06F 3/0445* (2019.05);
(Continued)

(58) Field of Classification Search
None
See application file for complete search history.

(56) References Cited

U.S. PATENT DOCUMENTS 8,237,354 B2   8/2012  Kim et al.
8,933,625 B2   1/2015  Chung et al.
(Continued)

FOREIGN PATENT DOCUMENTS

CN   101661949 A   3/2010
CN   103794624 A   5/2014
(Continued)

OTHER PUBLICATIONS

Chinese Office Action for Application No. 201610890130.6 dated Apr. 15, 2021 enumerating the above listed references.
(Continued)

*Primary Examiner* — Kirk W Hermann
(74) *Attorney, Agent, or Firm* — Cantor Colburn LLP

(57) ABSTRACT

A organic light emitting display device includes a substrate comprising a light-emitting region and a reflection region, a first sensing electrode which senses a touch position, is disposed in the reflection region, and comprises a material having a first reflectivity and a second sensing electrode which senses a touch position, is disposed in the light-emitting region and the reflection region, and comprises a material having a second reflectivity, and overlapping a portion of the first sensing electrode.

17 Claims, 148 Drawing Sheets

(51) Int. Cl.
  *G06F 3/044* (2006.01)
  *H01L 27/32* (2006.01)
  *H01L 51/52* (2006.01)
  *H01L 51/56* (2006.01)

(52) U.S. Cl.
  CPC .......... *G06F 3/0446* (2019.05); *H01L 27/323* (2013.01); *H01L 51/5271* (2013.01); *H01L 51/56* (2013.01); *G06F 2203/04103* (2013.01); *G06F 2203/04111* (2013.01); *G06F 2203/04112* (2013.01); *H01L 2251/5338* (2013.01)

(56) References Cited

U.S. PATENT DOCUMENTS

| | | | |
|---|---|---|---|
| 9,082,668 B2 | 7/2015 | Kim et al. | |
| 9,118,036 B2 | 8/2015 | Kim | |
| 10,488,962 B2 | 11/2019 | Xie et al. | |
| 2009/0273577 A1 | 11/2009 | Chen et al. | |
| 2012/0299472 A1* | 11/2012 | Chung | H01L 51/5271 313/504 |
| 2013/0044074 A1* | 2/2013 | Park | G02F 1/13338 345/174 |
| 2013/0049640 A1 | 2/2013 | Kuo et al. | |
| 2013/0127742 A1* | 5/2013 | Kang | G02B 5/3025 345/173 |
| 2013/0162549 A1* | 6/2013 | Kim | G06F 3/0443 345/173 |
| 2013/0278513 A1 | 10/2013 | Jang | |
| 2013/0341070 A1 | 12/2013 | Kim et al. | |
| 2013/0341651 A1* | 12/2013 | Kim | H01L 31/0232 257/84 |
| 2014/0014960 A1 | 1/2014 | Yamazaki et al. | |
| 2014/0145979 A1 | 5/2014 | Lee | |
| 2014/0160411 A1 | 6/2014 | Yim et al. | |
| 2014/0189989 A1* | 7/2014 | Flitsch | H01L 21/67178 29/25.01 |
| 2014/0220715 A1 | 8/2014 | Kang | |
| 2014/0374704 A1* | 12/2014 | Jang | H01L 51/0097 257/40 |
| 2015/0194470 A1 | 7/2015 | Hwang | |
| 2015/0309633 A1 | 10/2015 | Ho et al. | |
| 2016/0026285 A1* | 1/2016 | Qin | G06F 3/0412 345/174 |
| 2016/0109998 A1* | 4/2016 | Watanabe | G06F 3/044 349/12 |
| 2016/0357278 A1* | 12/2016 | Qu | G06F 3/041 |
| 2017/0115797 A1* | 4/2017 | Zheng | G02F 1/13338 |

FOREIGN PATENT DOCUMENTS

| | | |
|---|---|---|
| CN | 104009067 A | 8/2014 |
| CN | 104347670 A | 2/2015 |
| JP | 2010243930 A | 10/2010 |
| KR | 1020040031826 A | 4/2004 |
| KR | 200400903 Y1 | 11/2005 |
| KR | 1020100077083 A | 7/2010 |
| KR | 1020140073216 A | 6/2014 |
| KR | 1020140122132 A | 10/2014 |
| KR | 1020150016031 A | 2/2015 |

OTHER PUBLICATIONS

Dictionary.com definition of dispose, http://www.dictionary.com/browse/disposed?s=t, p. 1.
Dictionary.com definition of overlap, http://www.dictionary.com/browse/overlap?s=t, p. 1.
Dictionary.com definition of rhombus, http://www.dictionary.com/browse/rhombus?s=t, p. 1.

\* cited by examiner

FIG. 19
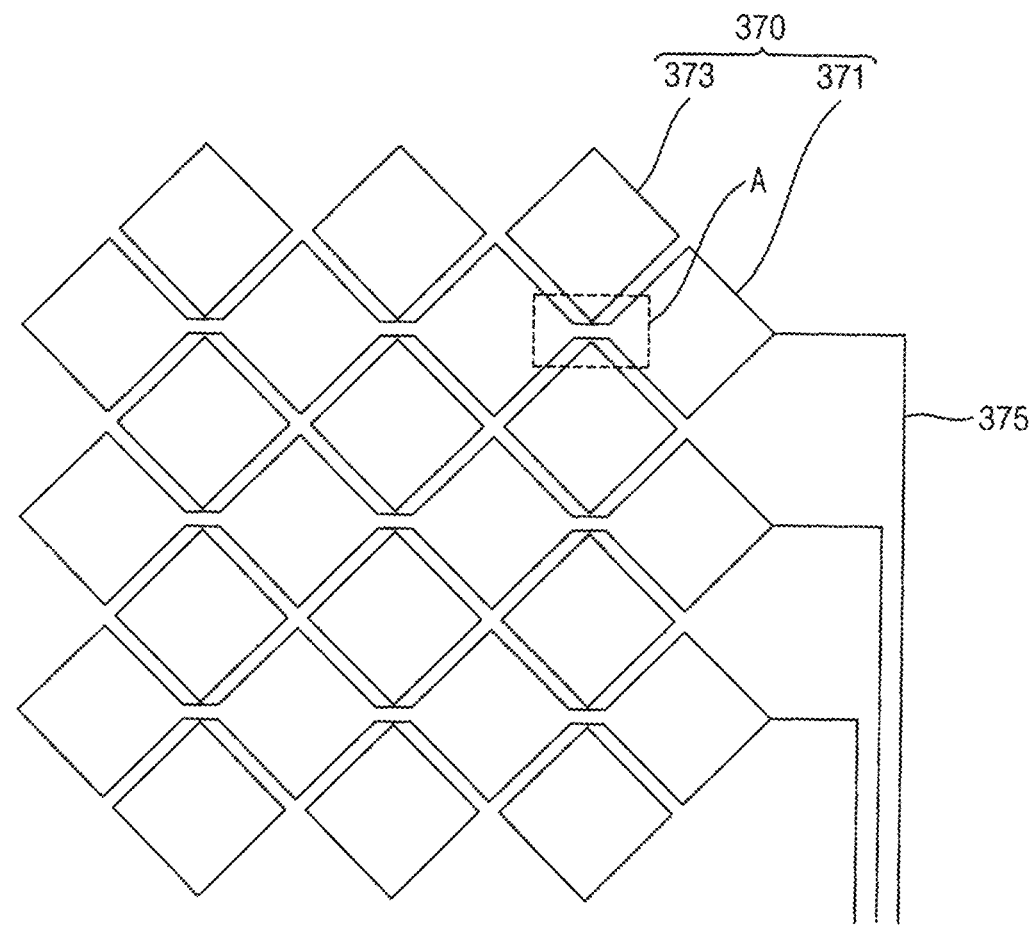
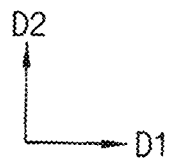

FIG. 147
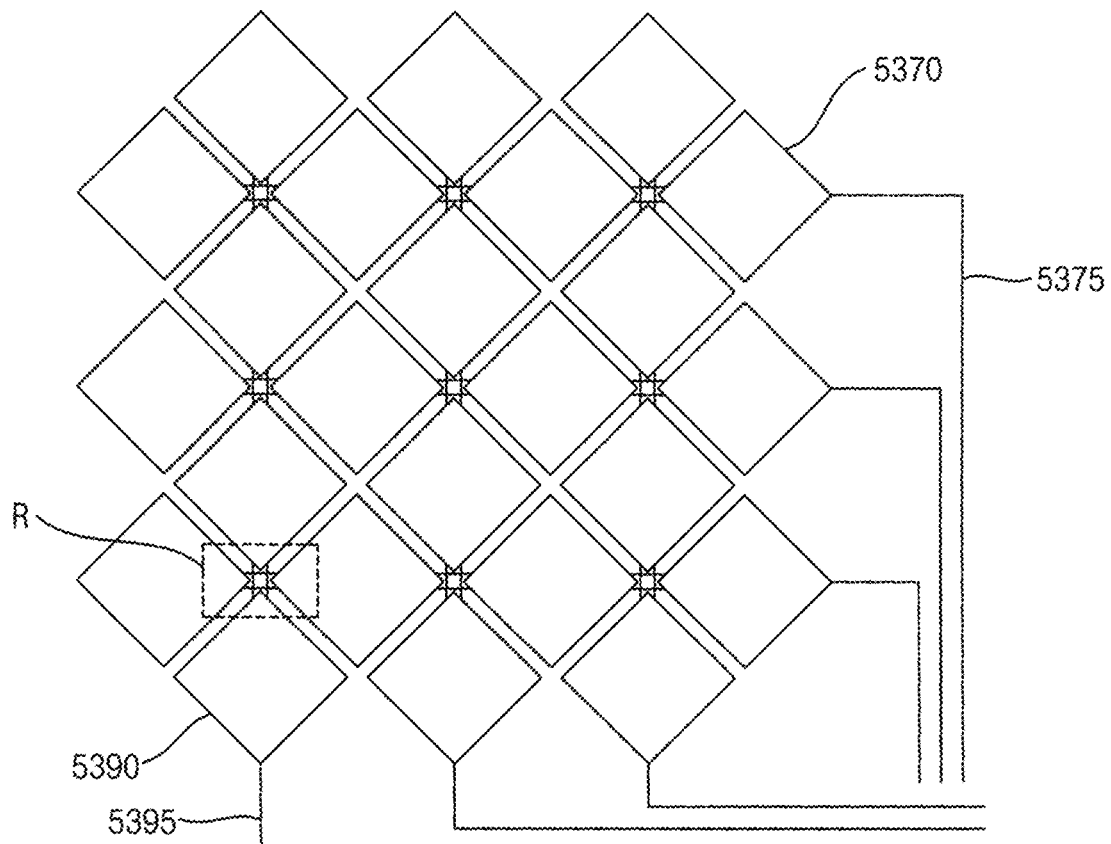
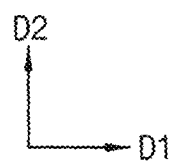

ORGANIC LIGHT EMITTING DISPLAY DEVICE INCLUDING A REFLECTIVE TOUCH SENSING ELECTRODE AND METHOD OF MANUFACTURING THE SAME

This application is a continuation of U.S. patent application Ser. No. 15/230,910, filed on Aug. 8, 2016, which claims priority to Korean Patent Application No. 10-2015-0147774, filed on Oct. 23, 2015, and all the benefits accruing therefrom under 35 U.S.C. § 119, the content of which in its entirety is herein incorporated by reference.

BACKGROUND

1. Field

Exemplary embodiments of the invention relate to an organic light emitting display device and a method of manufacturing the organic light emitting display device. More particularly, exemplary embodiments relate to an organic light emitting display device having a mirror function and a touch function, and a method of manufacturing the organic light emitting display device.

2. Description of the Related Art

A flat panel display ("FPD") device is widely used as a display device of an electronic device due to its lightweight and thinness compared to a cathode-ray tube ("CRT") display device. Typical examples of the flat panel display device include a liquid crystal display ("LCD") device and an organic light emitting diode ("OLED") display device. Compared to the LCD, the OLED has many advantages such as a higher luminance and a wider viewing angle. In addition, the OLED display device may be made thinner than the LCD because the OLED display device does not require a backlight. In the OLED display device, electrons and holes are injected into an organic thin layer through a cathode and an anode, and then recombined in the organic thin layer to generate excitons, thereby a light of a certain wavelength is emitted.

Recently, a mirror OLED device reflecting an image of an object (or target) that is located in front of the OLED device by including a reflective member has been developed. In addition, an OLED device having a mirror function and a touch function has been developed.

SUMMARY

In order to manufacture an organic light emitting diode ("OLED") device having a mirror function and a touch function, an additional process for forming an electrode layer having a touch function may be required, which increases a manufacturing cost.

Exemplary embodiments of the invention provide an organic light emitting display device having a mirror function and a touch function.

Exemplary embodiments of the invention also provide a method of manufacturing the organic light emitting display device.

In an exemplary embodiment of an organic light emitting display device according to the invention, the organic light emitting display device includes a substrate comprising a light-emitting region and a reflection region, a first sensing electrode which senses a touch position, is disposed in the reflection region, and comprises a material having a first reflectivity and a second sensing electrode which senses a touch position, is disposed in the light-emitting region and the reflection region, and comprises a material having a second reflectivity, and overlapping with a portion of the first sensing electrode.

In an exemplary embodiment, the organic light emitting display device may further include an opposite substrate facing the substrate. The first sensing electrode may be disposed on a first surface of the opposite substrate, and the second sensing electrode may be disposed on a second surface opposing the first surface of the opposite substrate. The first sensing electrode may be disposed in the reflection region and an outside of the light-emitting region.

In an exemplary embodiment, the organic light emitting display device may further include an opposite substrate facing the substrate. The first sensing electrode may be disposed on the substrate and the second sensing electrode may be disposed on a first surface of the opposite substrate, the second sensing electrode may be disposed between the substrate and the opposite substrate.

In an exemplary embodiment, the organic light emitting display device may further include an opposite substrate facing the substrate. The first sensing electrode may be disposed on a first surface of the opposite substrate, the first sensing electrode may be disposed between the substrate and the opposite substrate, and the second sensing electrode may be disposed on the first sensing electrode. The organic light emitting display device may further include an insulation layer disposed between the first sensing electrode and the second sensing electrode, and comprising an adhesive material.

In an exemplary embodiment, the organic light emitting display device may further include an opposite substrate facing the substrate. The second sensing electrode may be disposed on a first surface of the opposite substrate, the second sensing electrode may be disposed between the substrate and the opposite substrate, and the first sensing electrode may be disposed on the second sensing electrode.

In an exemplary embodiment, the organic light emitting display device may further include a thin film encapsulation layer disposed on the substrate. The second sensing electrode may be disposed on the thin film encapsulation layer, and the first sensing electrode may be disposed on the second sensing electrode. The organic light emitting display device may further include an insulation layer disposed between the first sensing electrode and the second sensing electrode, and comprising an adhesive material.

In an exemplary embodiment, the organic light emitting display device may further include a first thin film encapsulation layer disposed on the substrate. The second sensing electrode may be disposed on the first thin film encapsulation layer, and the first sensing electrode may be disposed on the second sensing electrode. The organic light emitting display device may further include a second thin film encapsulation layer disposed between the first sensing electrode and the second sensing electrode.

In an exemplary embodiment, the first sensing electrode may include a plurality of first patterns extending in a first direction, and the second sensing electrode may include a plurality of second patterns extending in a second direction crossing the first direction.

In an exemplary embodiment, the first patterns may include a plurality of first sensing patterns which sense a touch position and a plurality of first dummy patterns disposed between the plurality of first sensing patterns. The plurality of second patterns may include a plurality of second sensing patterns which sense a touch position and a plurality of second dummy patterns disposed between the plurality of second sensing patterns.

In an exemplary embodiment, the plurality of first sensing patterns may have a mesh shape. A width of the plurality of second patterns in the second direction may be the same as a width of the first patterns in the first direction.

In an exemplary embodiment, the first sensing electrode may include a plurality of first sensing patterns having a rhombus shape and sequentially connected each other in a first direction and a plurality of first dummy patterns having a rhombus shape, and disposed between the plurality of first sensing patterns, and spaced apart from each other. The second sensing electrode may include a plurality of second sensing patterns having a rhombus shape and sequentially connected each other in a second direction crossing the first direction and a plurality of second dummy patterns having a rhombus shape, and disposed between the plurality of second sensing patterns, and spaced apart from each other.

In an exemplary embodiment of a method of manufacturing an organic light emitting display device including a substrate comprising a light-emitting region and a reflection region, the method includes forming a first sensing electrode comprising a material having a first reflectivity on the reflection region and forming a second sensing electrode comprising a material having a second reflectivity and overlapping with a portion of the first sensing electrode on the light-emitting region and the reflection region.

In an exemplary embodiment, forming the first sensing electrode and the second sensing electrode may include forming the first sensing electrode on a first surface of an opposite substrate facing the substrate and forming the second sensing electrode on a second surface opposing the first surface of the opposite substrate. The first sensing electrode may be disposed in the reflection region and an outside of the light-emitting region.

In an exemplary embodiment, forming the first sensing electrode and the second sensing electrode may include forming the first sensing electrode on the substrate and forming the second sensing electrode on a first surface of an opposite substrate facing the substrate. The second sensing electrode may be disposed between the substrate and the opposite substrate.

In an exemplary embodiment, forming the first sensing electrode and the second sensing electrode may include forming the first sensing electrode on a first surface of an opposite substrate facing the substrate, the first sensing electrode being disposed between the substrate and the opposite substrate, forming an insulation layer comprising an adhesive material on the first sensing electrode and forming the second sensing electrode on the insulation layer.

In an exemplary embodiment, forming the first sensing electrode and the second sensing electrode may include forming the second sensing electrode on a first surface of an opposite substrate facing the substrate, the second sensing electrode being disposed between the substrate and the opposite substrate, forming an insulation layer comprising an adhesive material on the second sensing electrode and forming the first sensing electrode on the insulation layer.

In an exemplary embodiment, forming the first sensing electrode and the second sensing electrode may include forming a thin film encapsulation layer on the substrate, forming the second sensing electrode on the thin film encapsulation layer, forming an insulation layer on the second sensing electrode and forming the first sensing electrode on the insulation layer.

In an exemplary embodiment, forming the first sensing electrode and the second sensing electrode may include forming a first thin film encapsulation layer on the substrate, forming the second sensing electrode on the first thin film encapsulation layer, forming a second thin film encapsulation layer comprising the same material as that of the first thin film encapsulation layer on the second sensing electrode and forming the first sensing electrode on the second thin film encapsulation layer.

In an exemplary embodiment, the first sensing electrode may include a plurality of first patterns extending in a first direction, and the second sensing electrode may include a plurality of second patterns extending in a second direction crossing the first direction.

In an exemplary embodiment, the first sensing electrode may include a plurality of first sensing patterns having a rhombus shape and sequentially connected each other in a first direction and a plurality of first dummy patterns having a rhombus shape, and disposed between the plurality of first sensing patterns, and spaced apart from each other. The second sensing electrode may include a plurality of second sensing patterns having a rhombus shape and sequentially connected each other in a second direction crossing the first direction and a plurality of second dummy patterns having a rhombus shape, and disposed between the plurality of second sensing patterns, and spaced apart from each other.

According to the illustrated exemplary embodiment, an organic light emitting display device includes a reflection member having a mirror function and a touch function. Thus, additional process for forming an electrode layer having a touch function may be omitted. This, a manufacturing cost may be decreased.

In addition, the organic light emitting display device includes a first reflection member disposed in a reflection region and a second disposed in the light-emitting region and the reflection region. Thus, scattered reflection occurred at an edge of the first reflection member may be decreased.

In addition, the organic light emitting display device includes a thin film encapsulation layer. Thus, a flexible organic light emitting display device having a mirror function and a touch function may be manufactured.

BRIEF DESCRIPTION OF THE DRAWINGS

The above and other features and advantages of the invention will become more apparent by describing in detailed exemplary embodiments thereof with reference to the accompanying drawings, in which:

FIG. 19 is a plan view illustrating a first sensing electrode of FIG. 2;

FIG. 147 is a plan view illustrating the first sensing electrode of FIG. 143 and the second sensing electrode of FIG. 145.

DETAILED DESCRIPTION

Figure 1:
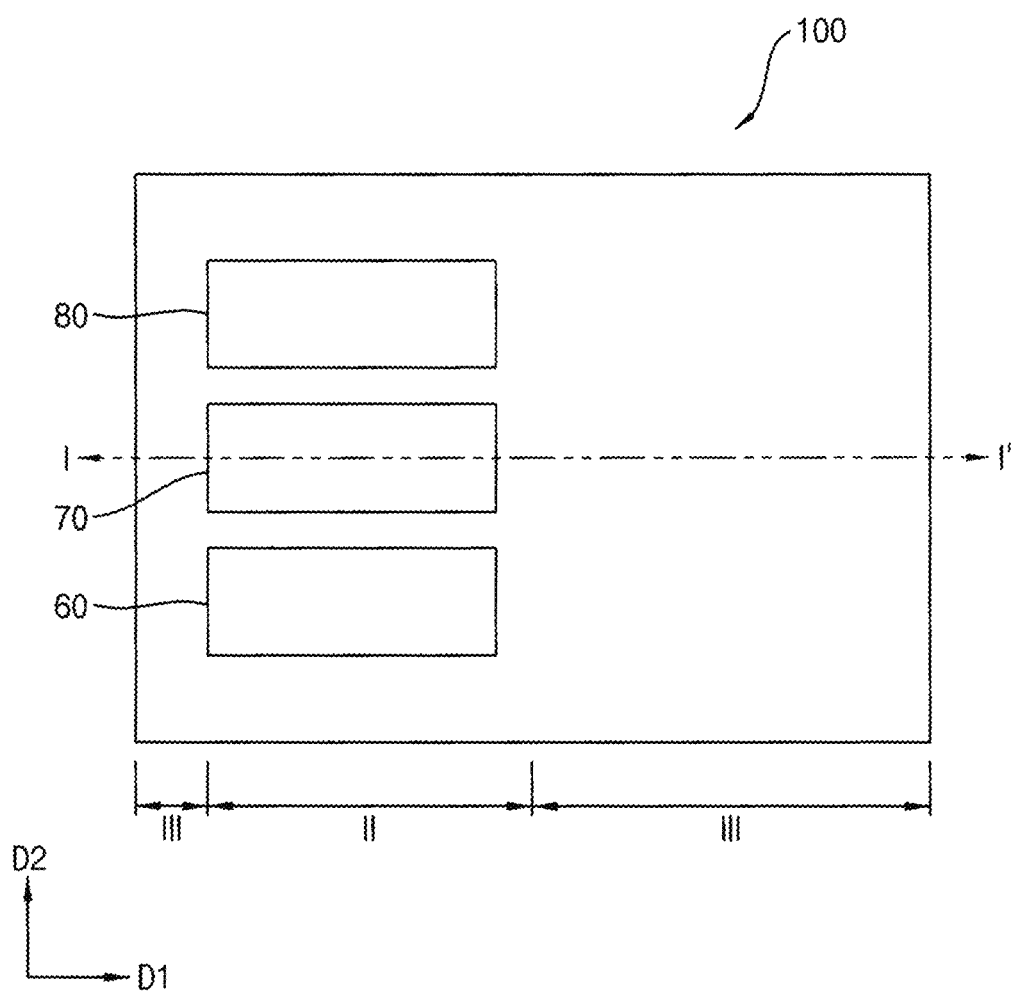
FIG. 1 is a plan view illustrating an exemplary embodiment of an organic light emitting display device according to the invention.

Hereinafter, the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
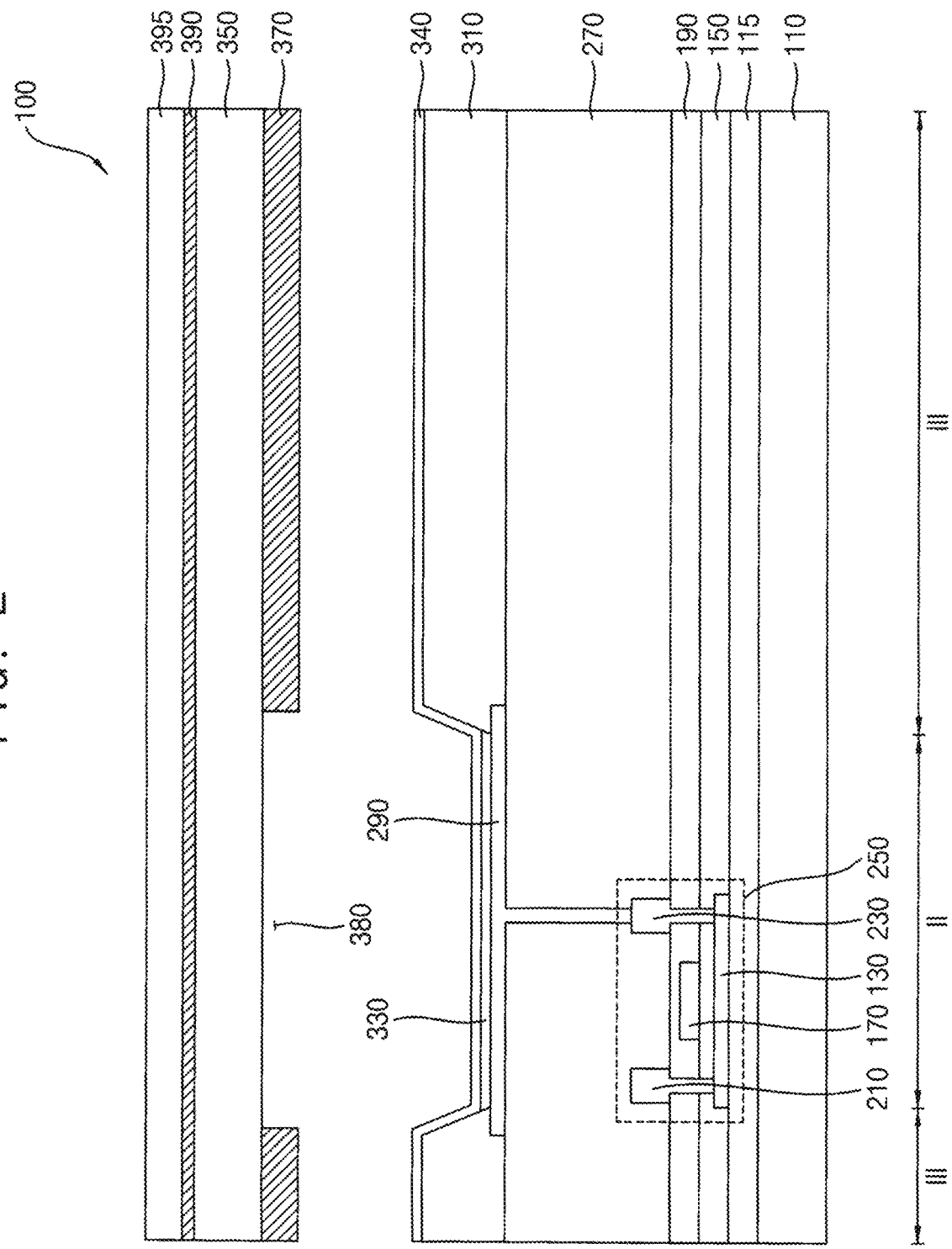
FIG. 2 is a cross-sectional view taken along line I-I' of FIG. 1.

FIG. 1 is a plan view illustrating an organic light emitting display device according to an exemplary embodiment of the invention. FIG. 2 is a cross-sectional view taken along line I-I' of FIG. 1.

Referring to FIGS. 1 and 2, an organic light emitting display device according to an exemplary embodiment of the invention may include a light-emitting region II and a reflection region III. Pixels 60, 70, and 80 may be positioned in the light-emitting region II, and a transparent window may be positioned in the reflection region III. In an exemplary embodiment, the pixel 60 may be a pixel emitting a red color, the pixel 70 may be a pixel emitting a green color, and the pixel 80 may be a pixel emitting a blue color, for example.

A reflection member may be disposed in the light-emitting region II and the reflection region III. The reflection member may include a first reflection member disposed in the reflection region III and a second reflection member disposed in the light-emitting region II and the reflection region III. The first reflection member may overlap a portion of the pixels 60, 70, and 80. The first reflection member is disposed outside of the pixels 60, 70, and 80, and thus the first reflection member may overlap a portion of the pixels 60, 70, and 80. The first reflection member may have different reflectivity from the second reflection member. When the reflection member includes only the first reflection member, scattered reflection may be occurred at an edge of the first reflection member. However, an organic light emitting display device according to an exemplary embodiment of the invention includes the second reflection member disposed in the light-emitting region II and the reflection region III. Thus, scattered reflection occurred at an edge of the first reflection member may be decreased.

The first reflection member according to an exemplary embodiment of the invention may be a first sensing electrode 370 including a material having a predetermined reflectivity. In addition, the second reflection member according to an exemplary embodiment of the invention may be a second sensing electrode 390 including a material which has a predetermined reflectivity and sensing a touch position. The first sensing electrode 370 may overlap the second sensing electrode 390.

The first sensing electrode 370 and second sensing electrode 390 may perform as a sensing electrode of a touch screen panel of mutual capacitance type. In an exemplary embodiment, when an electric conductor is contacted, capacitance of an intersecting point of the first sensing electrode 370 and second sensing electrode 390 around a touch position is changed, for example. Thus, a touch panel sensor (not shown) may decide a touch position based on a capacitance sensing signal corresponding to the change of capacitance.

The first sensing electrode 370 may have a different thickness from a thickness of the second sensing electrode 390. In an exemplary embodiment, a thickness of the first sensing electrode 370 measured along a cross-sectional direction may be about 1000 angstroms (Å), for example. When the thickness of the first sensing electrode 370 is about 1000 Å, transmissivity of the first sensing electrode 370 may be about 0 percent (%), and reflexibility of the first sensing electrode 370 may be greater than about 95%. In addition, a thickness of the second sensing electrode 390 measured along a cross-sectional direction may be about 100 Å. When the thickness of the second sensing electrode 390 is about 100 Å, transmissivity of the second sensing electrode 390 may be greater than about 50% and less than about 95%. When an organic light emitting display device emits light, the light is emitted through the second electrode 390 in the light-emitting region II, and when an organic light emitting display device does not emit light, the second sensing electrode 390 may perform a mirror function.

An organic light emitting display device according to an exemplary embodiment of the invention includes a first substrate 110, a buffer layer 115, a first insulation interlayer 150, a second insulation layer 190, a third insulation layer 270, a light emitting structure, a pixel defining layer 310, a first sensing electrode 370, a second sensing electrode 390 and a second substrate 350. Here, the light emitting structure includes a semiconductor element 250, a first electrode 290, an emission layer 330 and a second electrode 340. The semiconductor element 250 includes an active pattern 130, a gate electrode 170, a source electrode 210 and a drain electrode 230. An opening 380 is defined in the first sensing electrode 370.

Figure 12:
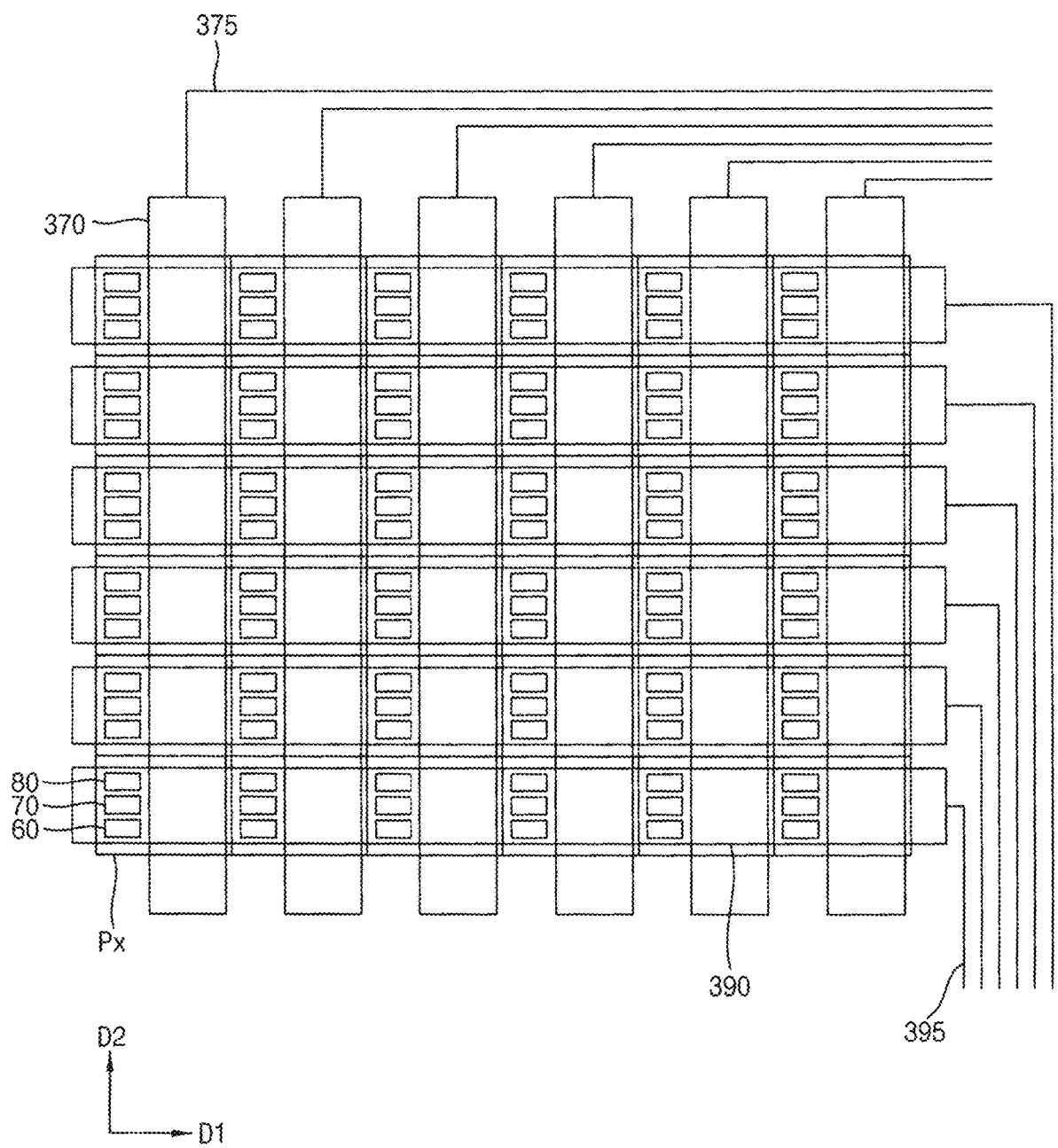
FIG. 12 is a plan view illustrating the first sensing electrode of FIG. 10 and the second sensing electrode of FIG. 11.

The organic light emitting display device 100 may include a plurality of pixel regions Px (refer to FIG. 12). One pixel region may include the light-emitting region II and the reflection region III. The reflection region III may substantially surround the light-emitting region II. The semiconductor element 250, the first electrode 290, the emission layer 330 and a portion of the second electrode 340 may be disposed in the light-emitting region II. However, the invention is not limited thereto, and the semiconductor element 250 may be disposed in the reflection region III. In addition, the first sensing electrode 370 may be disposed in the reflection region III and outside of the light-emitting region II, and the second sensing electrode 390 may be disposed in the light-emitting region II and the reflection region III.

A display image may be displayed in light-emitting region II. An image of an object that is located in front of the organic light emitting display device 100 may be reflected in the reflection region III.

The light emitting structure may be disposed on the first substrate 110. The first substrate 110 may include transparent materials. In an exemplary embodiment, the first substrate 110 may include quartz, synthetic quartz, calcium fluoride, fluoride-doping quartz, a sodalime glass, a non-alkali glass etc., for example. In an alternative exemplary embodiment, the first substrate 110 may include a flexible transparent resin substrate. Here, the flexible transparent resin substrate for the first substrate 110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the semiconductor element 250, a capacitor, the first electrode 290, the light emitting layer 330, the second electrode 340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 110 after the removal of the glass substrate. As the organic light emitting display device 100 includes the light-emitting region II and the reflection region III, the first substrate 110 may also include the light-emitting region II and the reflection region III.

A buffer layer 115 may be disposed on the first substrate 110. The buffer layer 115 may extend from the light-emitting region II into the reflection region III. The buffer layer 115 may prevent the diffusion (e.g., an out gassing) of metal atoms and/or impurities from the first substrate 110. Additionally, the buffer layer 115 may control a rate of a heat transfer in a crystallization process for forming the active pattern 130, thereby obtaining substantially uniform the active pattern 130. Furthermore, the buffer layer 115 may improve a surface flatness of the first substrate 110 when a surface of the first substrate 110 is relatively irregular.

According to a type of the first substrate 110, at least two buffer layers may be provided on the first substrate 110, or the buffer layer may not be disposed.

The semiconductor element 250 may include the active pattern 130, the gate electrode 170, the source electrode 210, and the drain electrode 230. In an exemplary embodiment, the active pattern 130 may be disposed on the first substrate 110, for example. In an exemplary embodiment, the active pattern 130 may be disposed an oxide semiconductor, an inorganic semiconductor (e.g., amorphous silicon, polysilicon, etc.), an organic semiconductor, etc., for example.

The first insulation layer 150 may be disposed on the active pattern 130. The first insulation layer 150 may cover the active pattern 130 in the light-emitting region II, and may extend in the first direction on the first substrate 110. That is, the first insulation layer 150 may be disposed on the entire surface of the first substrate 110. In an exemplary embodiment, the first insulation layer 150 may include a silicon compound, a metal oxide, etc., for example.

The gate electrode 170 may be disposed on a portion of the first insulation layer 150 under which the active pattern 130 is disposed. In an exemplary embodiment, the gate electrode 170 may include a metal, an alloy, metal nitride, conductive metal oxide, transparent conductive materials, etc., for example.

The second insulation layer 190 may be disposed on the gate electrode 170. The second insulation layer 190 may cover the gate electrode 170 in the light-emitting region II, and may extend in the first direction on the first substrate 110. That is, the second insulation layer 190 may be disposed on the entire surface of the first substrate 110. In an exemplary embodiment, the second insulation layer 190 may include a silicon compound, a metal oxide, etc., for example.

The source electrode 210 and the drain electrode 230 may be disposed on the second insulation layer 190. The source electrode 210 may be in contact with a first side of the active pattern 130 by removing a portion of the first and second insulation layers 150 and 190. The drain electrode 230 may be in contact with a second side of the active pattern 130 by removing a second portion of the first and second insulation layers 150 and 190. In an exemplary embodiment, each of the source electrode 210 and the drain electrode 230 may include a metal, an alloy, metal nitride, conductive metal oxide, transparent conductive materials, etc., for example.

The third insulation layer 270 may be disposed on the source electrode 210 and the drain electrode 230. The third insulation layer 270 may cover the source electrode 210 and the drain electrode 230 in the sub-pixel region II, and may extend in the first direction on the first substrate 110. That is, the third insulation layer 270 may be disposed on the entire surface of the first substrate 110. In an exemplary embodiment, the third insulation layer 270 may include a silicon compound, a metal oxide, etc., for example.

The first electrode 290 may be disposed on the third insulation layer 270. The first electrode 290 may be in contact with the source electrode 210 by removing a portion of the third insulation layer 270. In addition, the first electrode 290 may be electrically connected to the semiconductor element 250. In an exemplary embodiment, the first electrode 290 may include a metal, an alloy, metal nitride, conductive metal oxide, transparent conductive materials, etc., for example.

In the illustrated exemplary embodiment, the gate electrode 170 is disposed on the active pattern 130. However, the invention is not limited thereto, and the gate electrode 170 may be disposed under the active pattern 130.

The pixel defining layer 310 may be disposed on the third insulation layer 270 to expose a portion of the first electrode 290. The pixel defining layer 310 may include organic materials or inorganic materials. In this case, the light emitting layer 330 may be disposed on a portion that the first electrode 290 is exposed by the pixel defining layer 310.

The light emitting layer 330 may be disposed on the exposed first electrode 290. The light emitting layer 330 may be provided using light emitting materials capable of generating different colors of light (e.g., a red color of light, a blue color of light, and a green color of light). However, the invention is not limited thereto, and the light emitting layer 330 may stack light emitting materials capable of generating different colors of light to emit white color of light.

The second electrode 340 may be disposed on the pixel defining layer 310 and the light emitting layer 330. The second electrode 340 may cover the pixel defining layer 310 and the light emitting layer 330 in the light-emitting region II and the reflection region III, and may extend in the first direction on the first substrate 110. That is, the second electrode 340 may be electrically connected to the first through third pixels. In an exemplary embodiment, the second electrode 340 may include a metal, an alloy, metal nitride, conductive metal oxide, a transparent conductive material, etc., for example. These may be used alone or in a combination thereof. The first substrate 110 may be combined with the second substrate 350 by using a sealing member. In addition, a filler may be disposed between the first substrate 110 and the second substrate 350.

The first sensing electrode 370 may be disposed on a first surface of the second substrate 350. A first surface of the first sensing electrode 370 may face the second electrode 340, and a second surface opposing the first surface of the first sensing electrode 370 may contact with the second substrate 350. However, the invention is not limited thereto, and an insulation layer may be disposed between the second substrate 350 and the first sensing electrode 370.

The first sensing electrode 370 may include a material having a predetermined reflectivity. In an exemplary embodiment, the first sensing electrode 370 may include gold (Au), silver (Ag), aluminum (Al), magnesium (Mg), platinum (Pt), Nickel (Ni), titanium (Ti), etc., for example. In an alternative exemplary embodiment, the first sensing electrode 370 may include an alloy, metal nitride, conductive metal oxide, etc., for example. In an exemplary embodiment, the first sensing electrode 370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), strontium ruthenium oxide ("SRO"), zinc oxide (ZnOx), stannum oxide (SnOx), indium oxide (InOx), gallium oxide (GaOx), etc., for example.

The second substrate 350 and the first substrate 110 may include substantially the same materials. In an exemplary embodiment, the second substrate 350 may include quartz, synthetic quartz, calcium fluoride, fluoride-doping quartz, sodalime glass, non-alkali glass etc., for example. In exemplary embodiments, the second substrate 350 may include a transparent inorganic material or flexible plastic. In an exemplary embodiment, the second substrate 350 may include a flexible transparent resin substrate, for example. In this case, to increase flexibility of the organic light emitting display device 100, the second substrate 350 may include a stacked structure where at least one organic layer and at least one inorganic layer are alternately stacked.

The second sensing electrode 390 may be disposed on a second surface opposing the first surface of the second substrate 350. The second sensing electrode 390 may be disposed in the light-emitting region II and the reflection region III. However, the invention is not limited thereto, and an insulation layer may be disposed between second substrate 350 and the second sensing electrode 390.

The second sensing electrode 390 may include a material having a predetermined reflectivity. In an exemplary embodiment, the second sensing electrode 390 may include gold (Au), silver (Ag), aluminum (Al), magnesium (Mg), platinum (Pt), Nickel (Ni), titanium (Ti), etc., for example. In an alternative exemplary embodiment, the second sensing electrode 390 may include an alloy, metal nitride, conductive metal oxide, etc. In an exemplary embodiment, the second sensing electrode 390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

A fifth insulation layer 395 may be disposed on the second sensing electrode 390. In an exemplary embodiment, the fifth insulation layer 395 may include a silicon compound, a metal oxide, etc., for example.

In the illustrated exemplary embodiment, the first sensing electrode 370 may be disposed on a first surface of the second substrate 350 and the second sensing electrode 390 may be disposed on a second surface opposing the first surface of the second substrate 350. However, the invention is not limited thereto, and the first sensing electrode 370 may be disposed on the second surface of the second substrate 350 and the second sensing electrode 390 may be disposed on the first surface of the second substrate 350.

FIGS. 3 to 9 are cross-sectional views illustrating a method of manufacturing the organic light emitting display device of FIG. 2.

Figure 3:
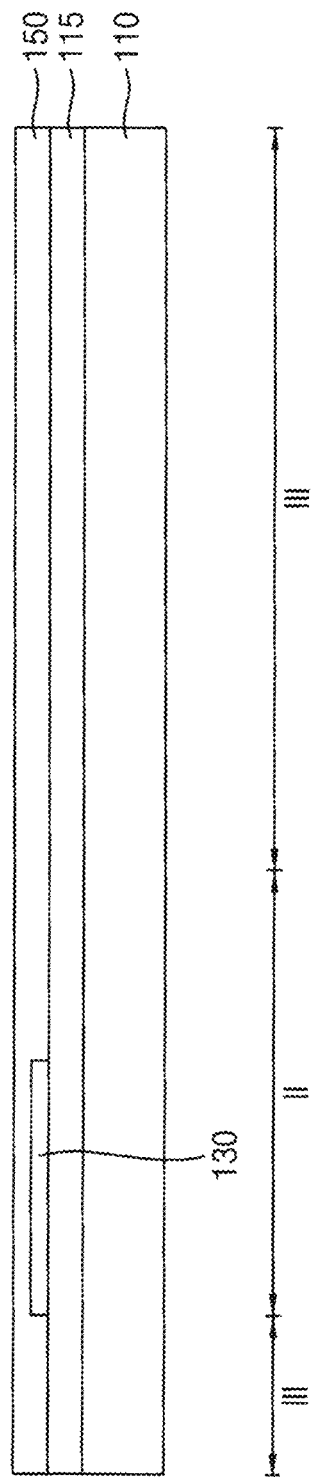
FIGS. 3 to 9 are cross-sectional views illustrating a method of manufacturing the organic light emitting display device of FIG. 2.

Referring to FIG. 3, the buffer layer 115 is disposed on the first substrate 110. Thereafter, the active pattern 130 and the first insulation layer 150 are disposed on the buffer layer 115.

In an exemplary embodiment, the first substrate 110 may include quartz, synthetic quartz, calcium fluoride, fluoride-doping quartz, a sodalime glass, a non-alkali glass etc., for example.

The light emitting structure may be disposed on the first substrate 110. The first substrate 110 may include transparent materials. In an exemplary embodiment, the first substrate 110 may include quartz, synthetic quartz, calcium fluoride, fluoride-doping quartz, a sodalime glass, a non-alkali glass etc., for example. In an alternative exemplary embodiment, the first substrate 110 may include a flexible transparent resin substrate. Here, the flexible transparent resin substrate for the first substrate 110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the semiconductor element 250, a capacitor, the first electrode 290, the light emitting layer 330, the second electrode 340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 110 after the removal of the glass substrate. As the organic light emitting display device 100 includes the light-emitting region II and the reflection region III, the first substrate 110 may also include the light-emitting region II and the reflection region III.

A buffer layer 115 may be disposed on the first substrate 110. The buffer layer 115 may extend from the light-emitting region II into the reflection region III. The buffer layer 115 may prevent the diffusion (e.g., an out gassing) of metal atoms and/or impurities from the first substrate 110. Additionally, the buffer layer 115 may control a rate of a heat transfer in a crystallization process for forming the active pattern 130, thereby obtaining substantially uniform the active pattern 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be disposed.

In an exemplary embodiment, the active pattern 130 may include an oxide semiconductor, an inorganic semiconductor (e.g., amorphous silicon, polysilicon, etc.), an organic semiconductor, etc., for example.

The first insulation layer 150 may be disposed on the active pattern 130. The first insulation layer 150 may cover the active pattern 130 in the light-emitting region II, and may extend in the first direction on the first substrate 110. That is, the first insulation layer 150 may be disposed on the entire surface of the first substrate 110. In an exemplary embodiment, the first insulation layer 150 may include a silicon compound, a metal oxide, etc., for example.

Figure 4:
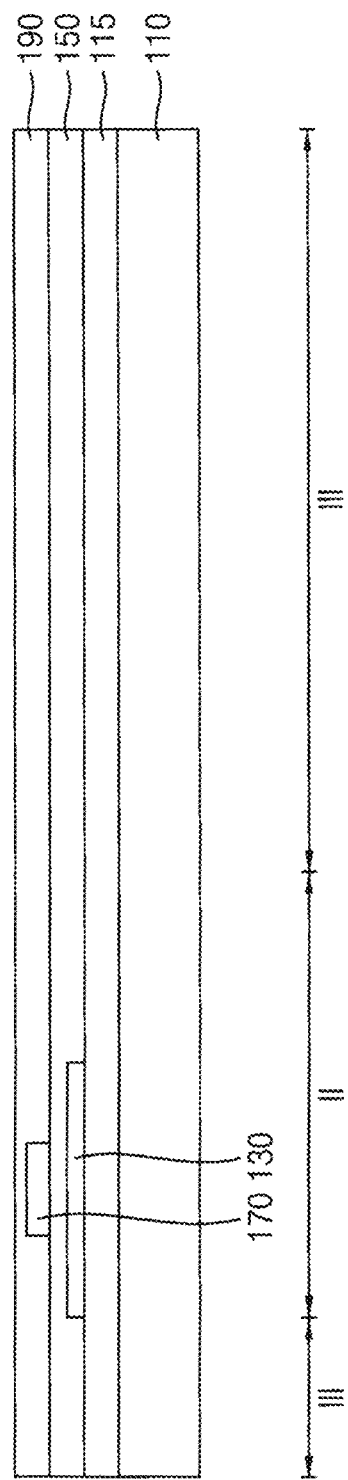

Referring to FIG. 4, the gate electrode 170 and the second insulation layer 190 are disposed on the first substrate 110 on which the first insulation layer 150 is disposed.

The gate electrode 170 may be disposed on a portion of the first insulation layer 150 under which the active pattern 130 is disposed. In an exemplary embodiment, the gate electrode 170 may include a metal, an alloy, metal nitride, conductive metal oxide, transparent conductive materials, etc., for example.

The second insulation layer 190 may be disposed on the gate electrode 170. The second insulation layer 190 may cover the gate electrode 170 in the light-emitting region II, and may extend in the first direction on the first substrate 110. That is, the second insulation layer 190 may be disposed on the entire surface of the first substrate 110. In an exemplary embodiment, the second insulation layer 190 may include a silicon compound, a metal oxide, etc., for example.

Figure 5:
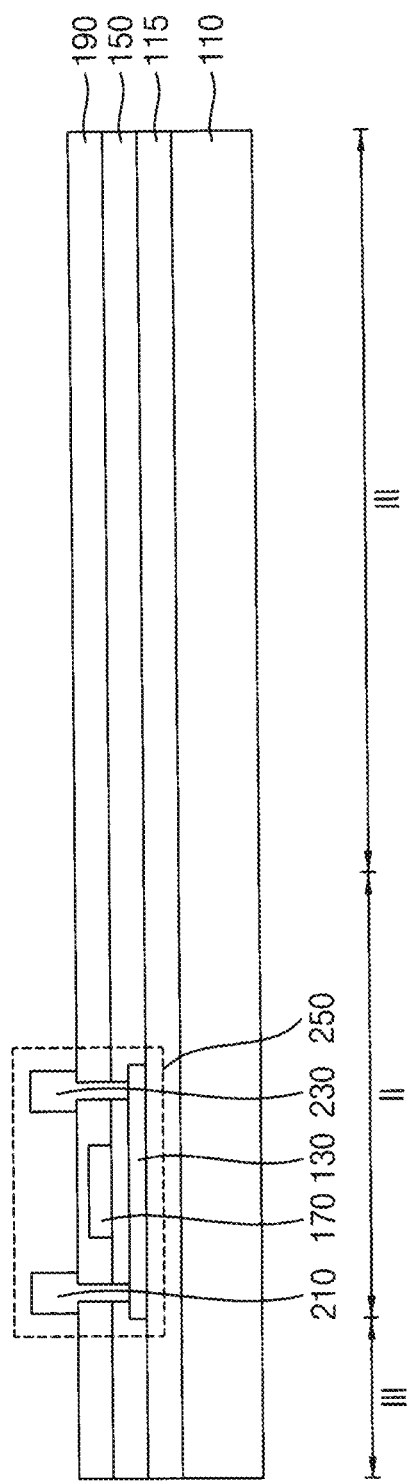

Referring to FIG. 5, the source electrode 210 and the drain electrode 230 are disposed on the first substrate 110 on which the second insulation layer 190 is disposed.

The source electrode 210 and the drain electrode 230 may be disposed on the second insulation layer 190. The source electrode 210 may be in contact with a first side of the active layer 130 by removing a portion of the first and second insulation layers 150 and 190. The drain electrode 230 may be in contact with a second side of the active layer 130 by removing a second portion of the first and second insulation layers 150 and 190. In an exemplary embodiment, each of the source electrode 210 and the drain electrode 230 may include a metal, an alloy, metal nitride, conductive metal oxide, transparent conductive materials, etc., for example.

In the illustrated exemplary embodiment, the gate electrode 170 is disposed on the active pattern 130. However, the invention is not limited thereto, and the gate electrode 170 may be disposed under the active pattern 130.

Figure 6:
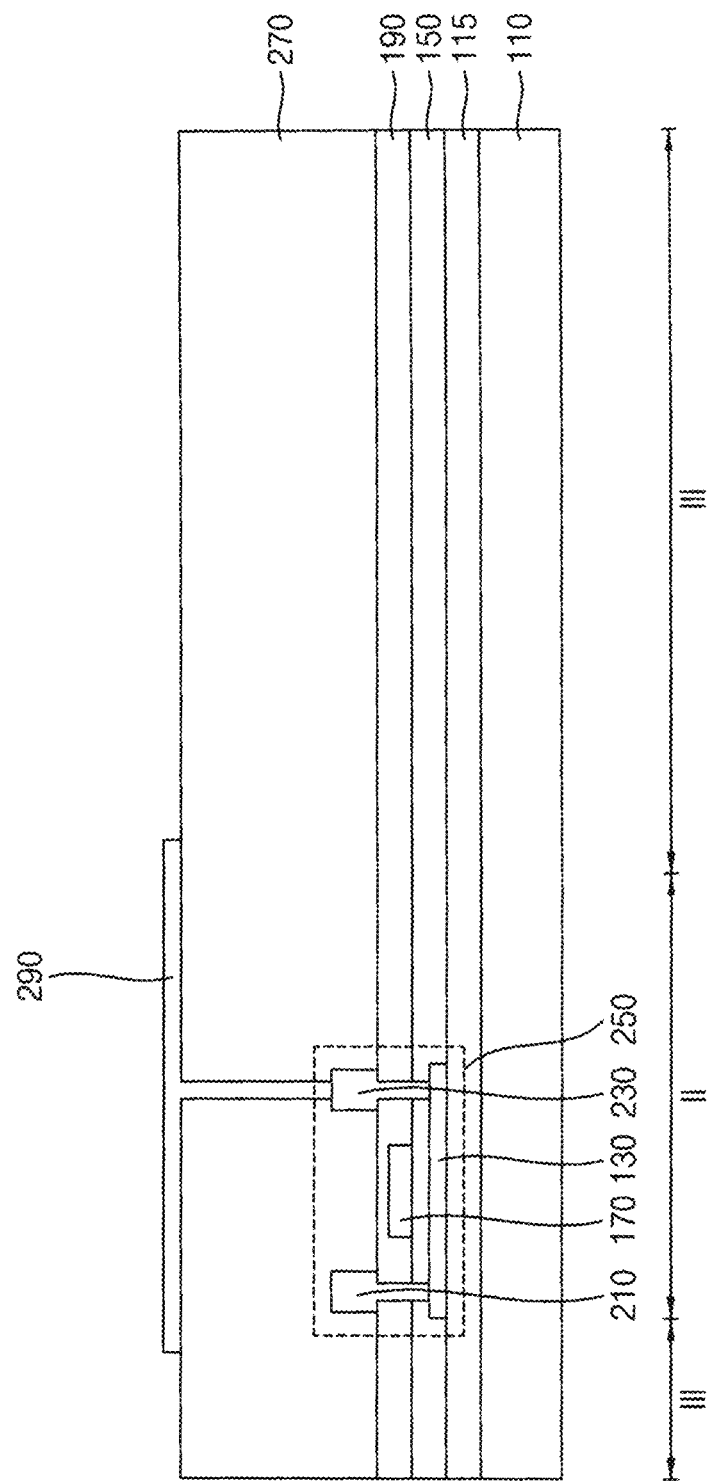

Referring to FIG. 6, the third insulation layer 270 and the first electrode 290 are disposed on the first substrate 110 on which the source electrode 210 and the drain electrode 230 are disposed.

The third insulation layer 270 may be disposed on the source electrode 210 and the drain electrode 230. The third insulation layer 270 may cover the source electrode 210 and the drain electrode 230 in the sub-pixel region II, and may extend in the first direction on the first substrate 110. That is, the third insulation layer 270 may be disposed on the entire surface of the first substrate 110. In an exemplary embodiment, the third insulation layer 270 may include a silicon compound, a metal oxide, etc., for example.

The first electrode 290 may be disposed on the third insulation layer 270. The first electrode 290 may be in contact with the source electrode 210 by removing a portion of the third insulation layer 270. In addition, the first electrode 290 may be electrically connected to the semiconductor element 250. In an exemplary embodiment, the first electrode 290 may include a metal, an alloy, metal nitride, conductive metal oxide, transparent conductive materials, etc., for example.

Figure 7:
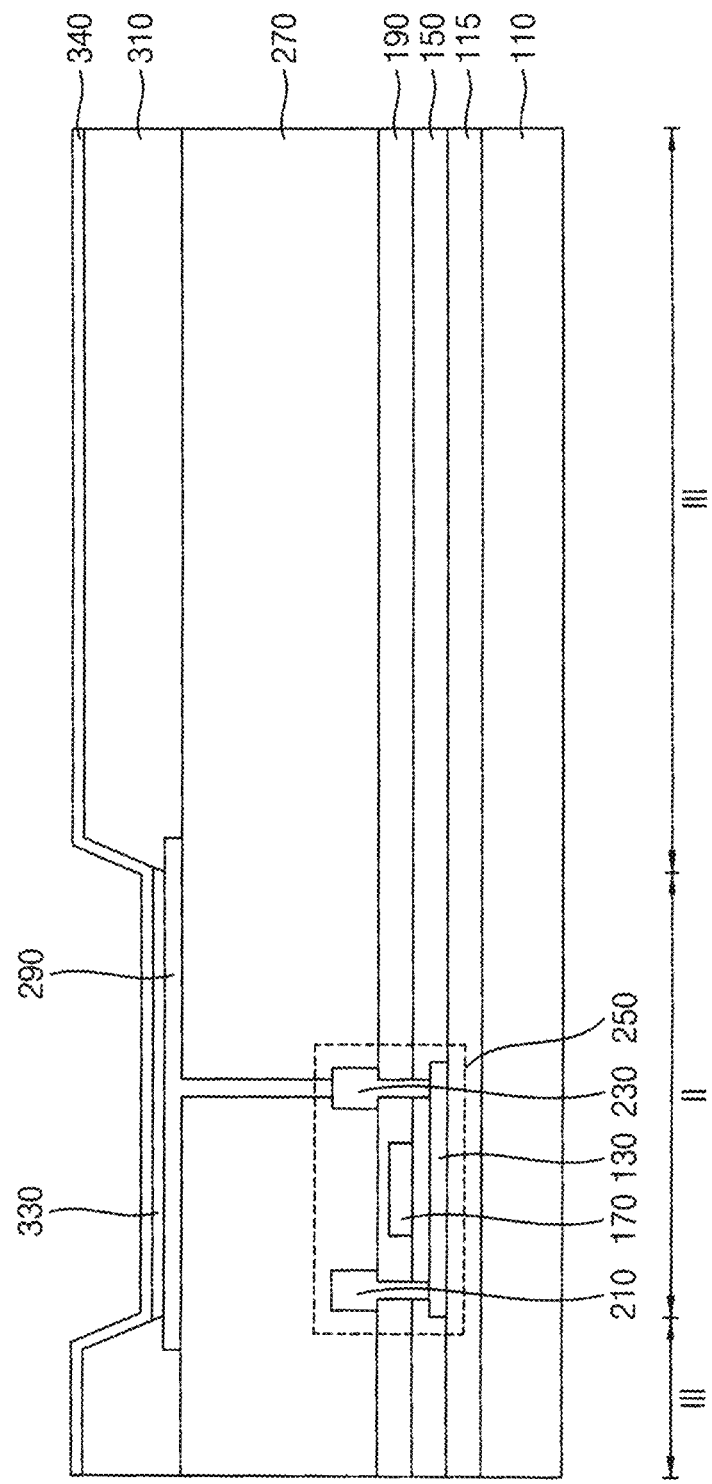

Referring to FIG. 7, the pixel defining layer 310, the light emitting layer 330 and the second electrode 340 are disposed on the first substrate 110 on which the first electrode 290 is disposed.

The pixel defining layer 310 may be disposed on the third insulation layer 270 to expose a portion of the first electrode 290. The pixel defining layer 310 may include organic materials or inorganic materials. In this case, the light emitting layer 330 may be disposed on a portion that the first electrode 290 is exposed by the pixel defining layer 310.

The light emitting layer 330 may be disposed on the exposed first electrode 290. The light emitting layer 330 may be provided using light emitting materials capable of generating different colors of light (e.g., a red color of light, a blue color of light, and a green color of light). However, the invention is not limited thereto, and the light emitting layer 330 may stack light emitting materials capable of generating different colors of light to emit white color of light.

The second electrode 340 may be disposed on the pixel defining layer 310 and the light emitting layer 330. The second electrode 340 may cover the pixel defining layer 310 and the light emitting layer 330 in the light-emitting region II and the reflection region III, and may extend in the first direction on the first substrate 110. That is, the second electrode 340 may be electrically connected to the first through third pixels. In an exemplary embodiment, the second electrode 340 may include a metal, an alloy, metal nitride, conductive metal oxide, a transparent conductive material, etc., for example. These may be used alone or in a combination thereof. The first substrate 110 may be combined with the second substrate 350 by using a sealing member. In addition, a filler may be disposed between the first substrate 110 and the second substrate 350.

Figure 8:
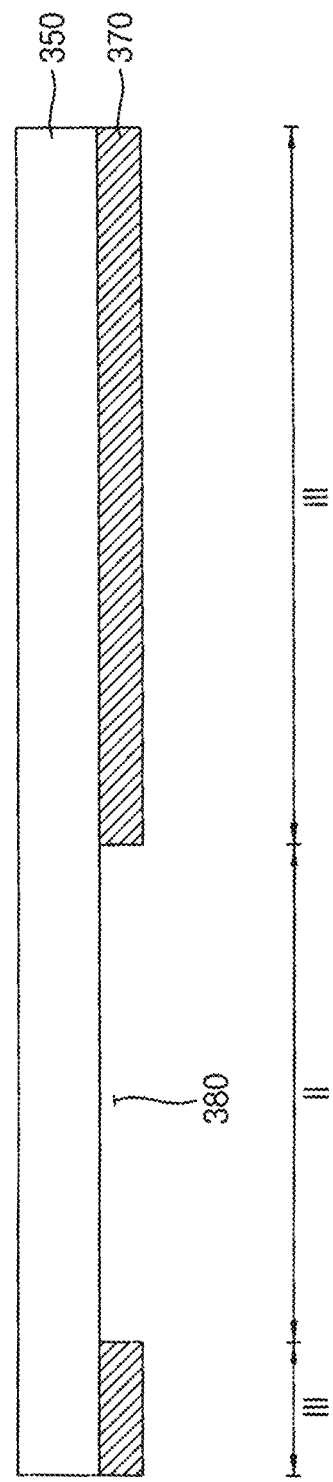

Referring to FIG. 8, the first sensing electrode 370 is disposed on the second substrate 350.

The first sensing electrode 370 may be disposed on a first surface of the second substrate 350. A first surface of the first sensing electrode 370 may face the second electrode 340, and a second surface opposing the first surface of the first sensing electrode 370 may contact with the second substrate 350.

The first sensing electrode 370 may include a material having a predetermined reflectivity. In an exemplary embodiment, the first sensing electrode 370 may include gold (Au), silver (Ag), aluminum (Al), magnesium (Mg), platinum (Pt), Nickel (Ni), titanium (Ti), etc., for example. In an alternative exemplary embodiment, the first sensing electrode 370 may include an alloy, metal nitride, conductive metal oxide, etc. In an exemplary embodiment, the first sensing electrode 370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 350 and the first substrate 110 may include substantially the same materials. In an exemplary embodiment, the second substrate 350 may include quartz, synthetic quartz, calcium fluoride, fluoride-doping quartz, sodalime glass, non-alkali glass etc. In exemplary embodiments, the second substrate 350 may include a transparent inorganic material or flexible plastic. In an exemplary embodiment, the second substrate 350 may include a flexible transparent resin substrate. In this case, to increase flexibility of the organic light emitting display device 100, the second substrate 350 may include a stacked structure where at least one organic layer and at least one inorganic layer are alternately stacked.

Figure 9:
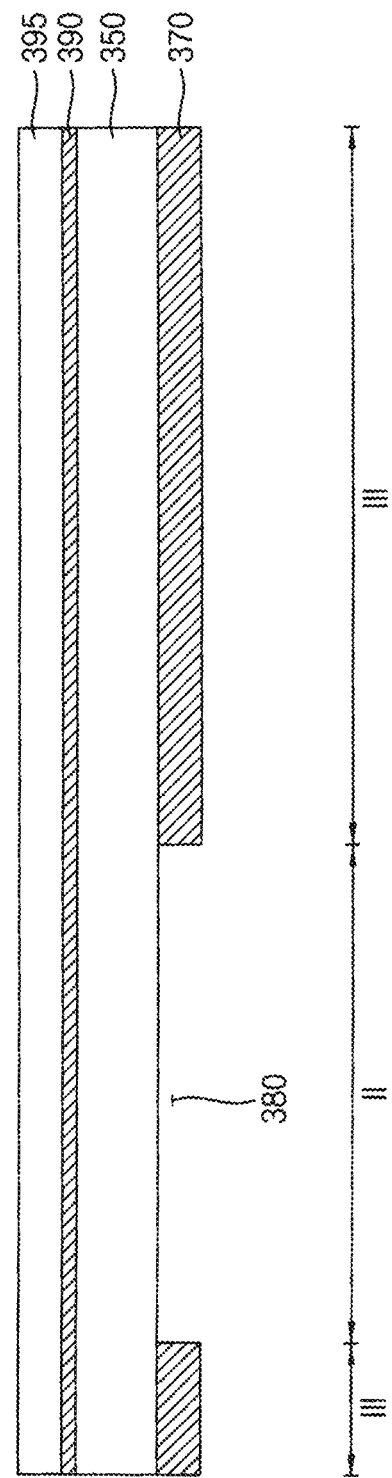

Referring to FIG. 9, the second sensing electrode 390 is disposed on a second surface opposing the first surface of the second substrate 350. A fifth insulation layer 395 is disposed on the second sensing electrode 390.

The second sensing electrode 390 may be disposed on a second surface opposing the first surface of the second substrate 350. The second sensing electrode 390 may be disposed in the light-emitting region II and the reflection region III. However, the invention is not limited thereto, and an insulation layer may be disposed between second substrate 350 and the second sensing electrode 390.

The second sensing electrode 390 may include a material having a predetermined reflectivity. In an exemplary embodiment, the second sensing electrode 390 may include gold (Au), silver (Ag), aluminum (Al), magnesium (Mg), platinum (Pt), Nickel (Ni), titanium (Ti), etc., for example. In an alternative exemplary embodiment, the second sensing electrode 390 may include an alloy, metal nitride, conductive metal oxide, etc. In an exemplary embodiment, the second sensing electrode 390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 10:
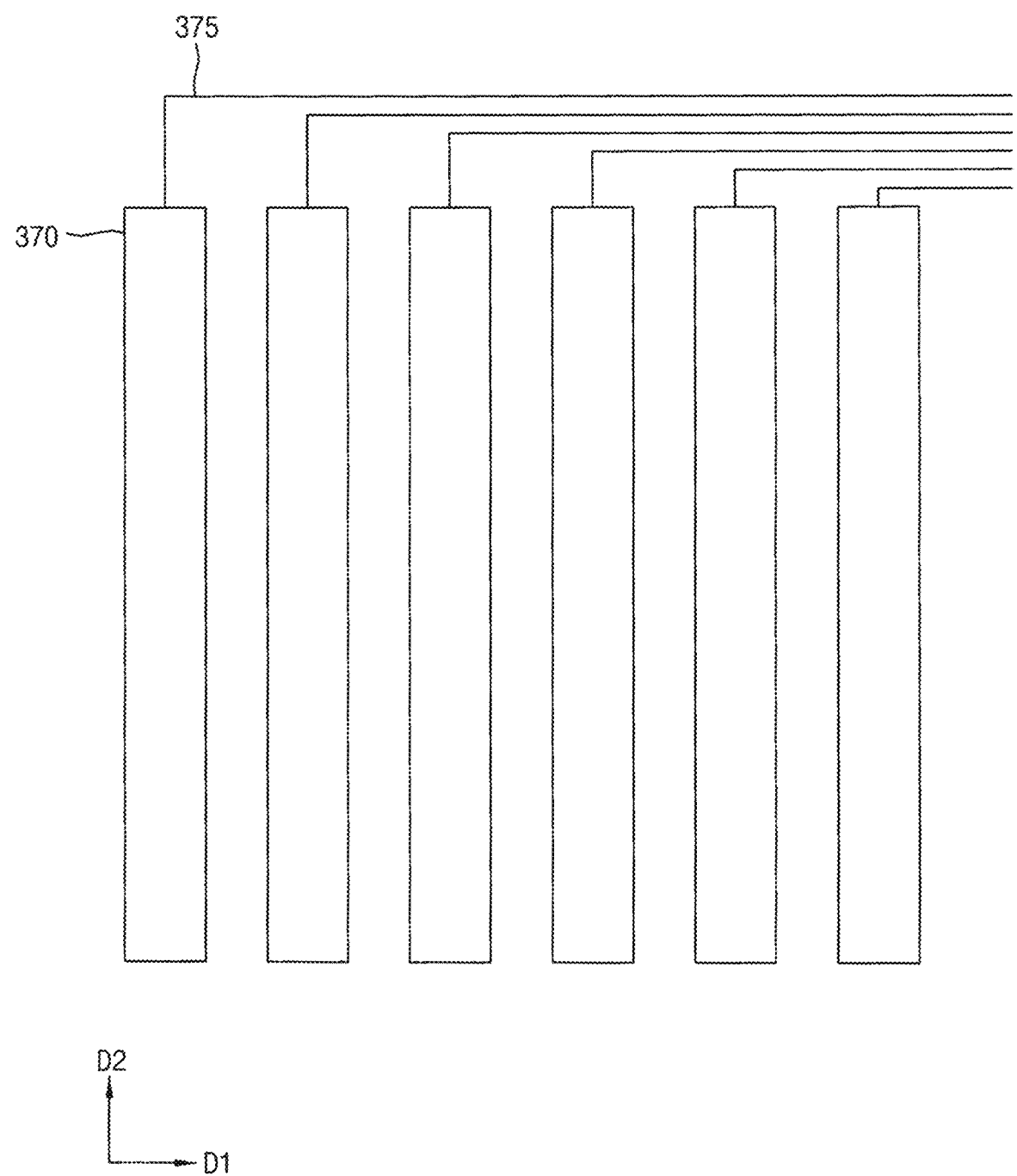
FIG. 10 is a plan view illustrating a first sensing electrode of FIG. 2.
Figure 11:
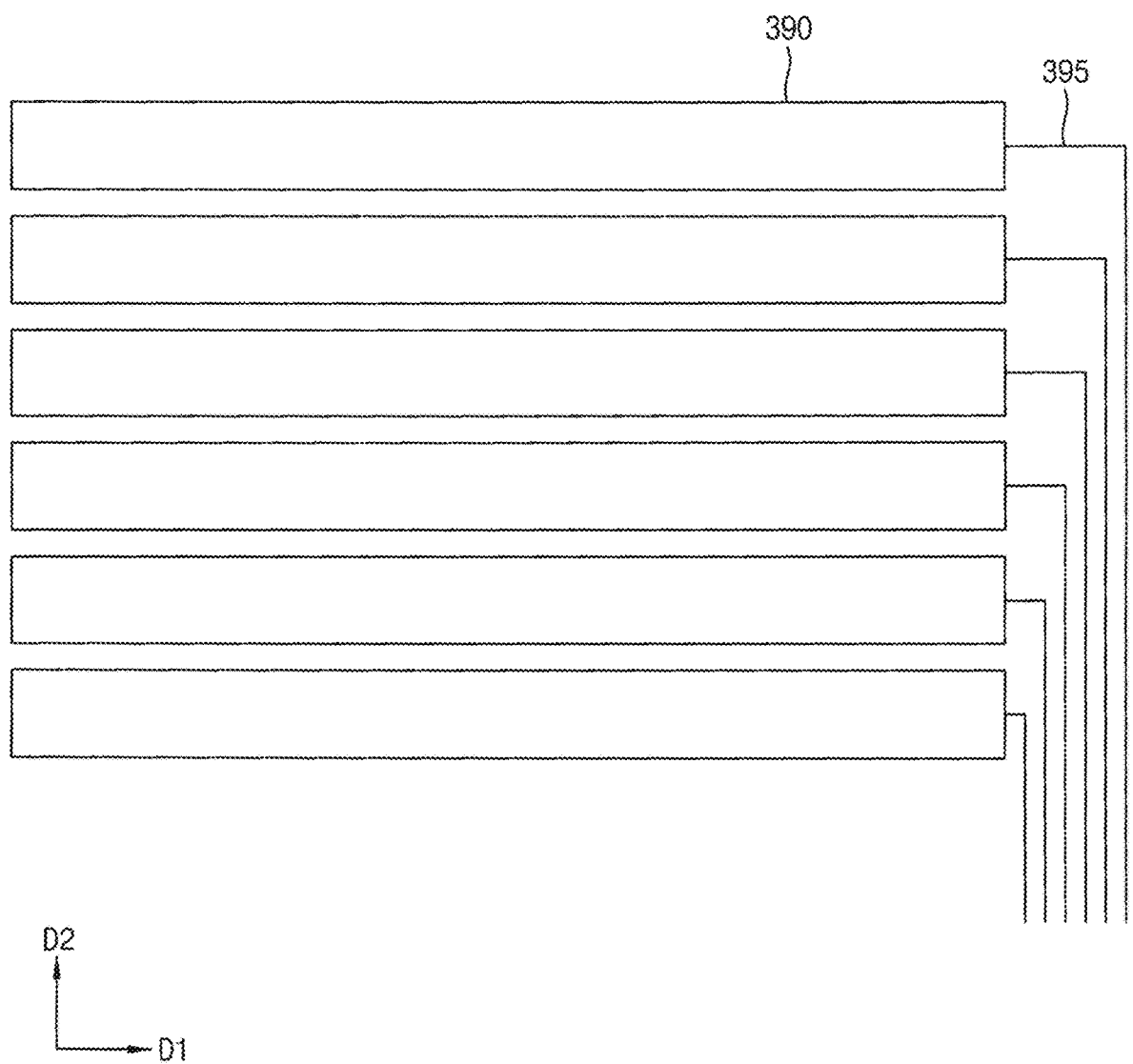
FIG. 11 is a plan view illustrating a second sensing electrode of FIG. 2.

FIG. 10 is a plan view illustrating a first sensing electrode of FIG. 2. FIG. 11 is a plan view illustrating a second sensing electrode of FIG. 2. FIG. 12 is a plan view illustrating the first sensing electrode of FIG. 10 and the second sensing electrode of FIG. 11.

Referring to FIGS. 2 and 10 to 12, a first sensing electrode 370 and a second sensing electrode 390 are illustrated.

The first sensing electrode 370 may be provided as a plurality of patterns extending in a second direction D2. The first sensing electrode 370 is disposed in the reflection region III. The first sensing electrode 370 may be connected to a sensing driving part through a first connecting line 375. The first connecting line 375 may include the same material as that of the first sensing electrode 370. The first connecting line 375 may be disposed on the same layer as that on which the first sensing electrode 370 is disposed.

The second sensing electrode 390 may be provided as a plurality of patterns extending in a first direction D1 crossing the second direction D2. The second sensing electrode 390 is disposed in the light-emitting region II and the reflection region III. The second sensing electrode 390 may be connected to a sensing driving part through a second connecting line 395. The second connecting line 395 may include the same material as that of the second sensing electrode 390. The second connecting line 395 may be disposed on the same layer as that on which the second sensing electrode 390 is disposed.

The first sensing electrode 370 may include a material having a predetermined reflectivity. The second sensing electrode 390 may include a material having a predetermined reflectivity. The first sensing electrode 370 may partially overlap the second sensing electrode 390.

The first sensing electrode 370 may be disposed on a first surface of the second substrate 350. The second sensing electrode 390 may be disposed on a second surface opposing the first surface of the second substrate 350.

The first sensing electrode 370 and second sensing electrode 390 may perform as a sensing electrode of a touch screen panel of mutual capacitance type. In an exemplary embodiment, when an electric conductor is contacted, capacitance of an intersecting point of the first sensing electrode 370 and second sensing electrode 390 around a touch position is changed, for example. Thus, a touch panel sensor (not shown) may decide a touch position based on a capacitance sensing signal corresponding to the change of capacitance.

The first sensing electrode 370 may have a different thickness from a thickness of the second sensing electrode 390. In an exemplary embodiment, a thickness of the first sensing electrode 370 may be about 1000 Å, for example. When the thickness of the first sensing electrode 370 is about 1000 Å, transmissivity of the first sensing electrode 370 may be about 0%, and reflexibility of the first sensing electrode 370 may be greater than about 95%. In addition, a thickness of the second sensing electrode 390 may be about 100 Å. When the thickness of the second sensing electrode 390 is about 100 Å, transmissivity of the second sensing electrode 390 may be greater than about 50% and less than about 95%. When an organic light emitting display device emits light, the light is emitted through the second electrode 390 in the light-emitting region II, and when an organic light emitting display device does not emit light, the second sensing electrode 390 may perform a mirror function.

Figure 13:
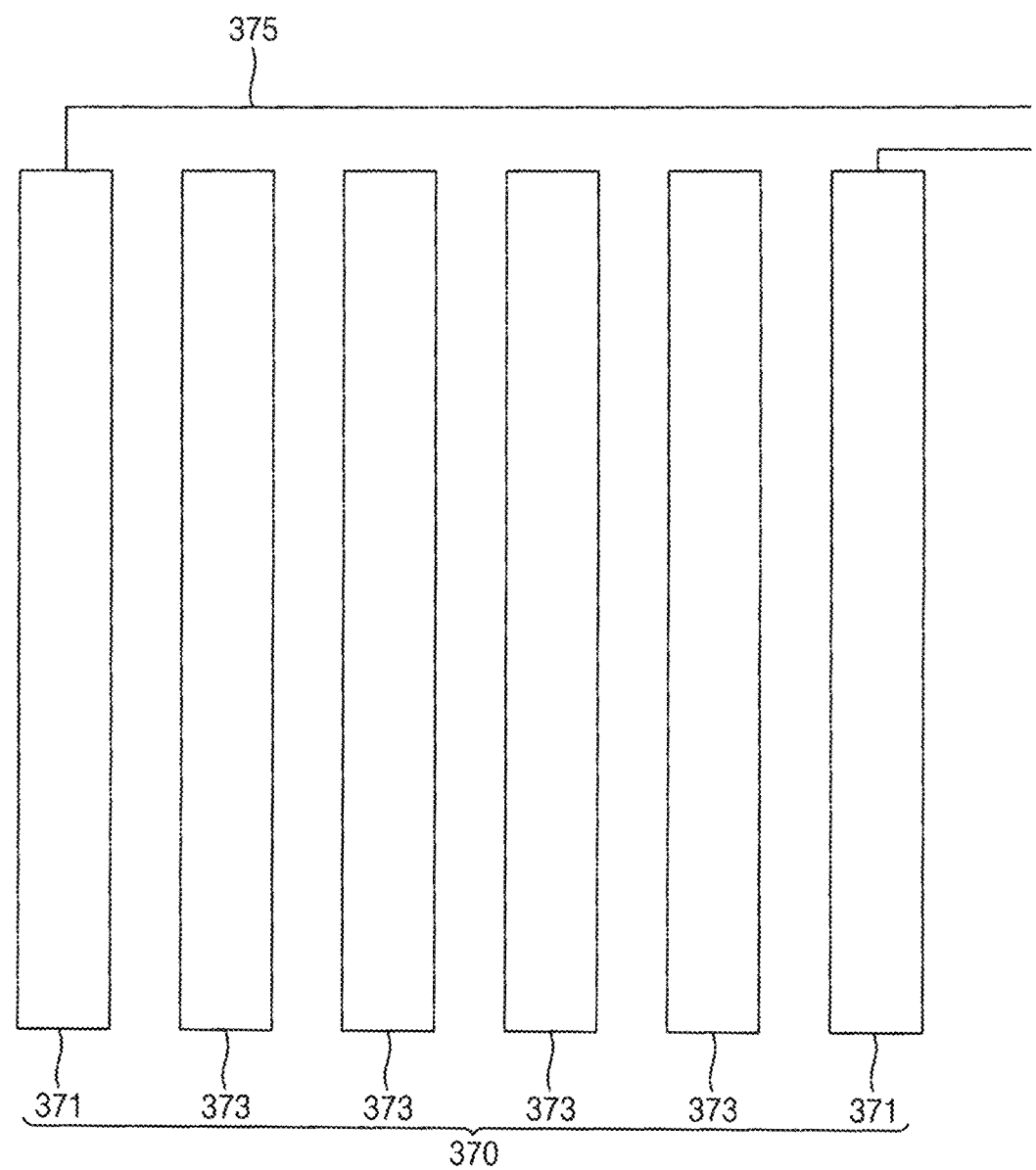
FIG. 13 is a plan view illustrating a first sensing electrode of FIG. 2.
Figure 14:
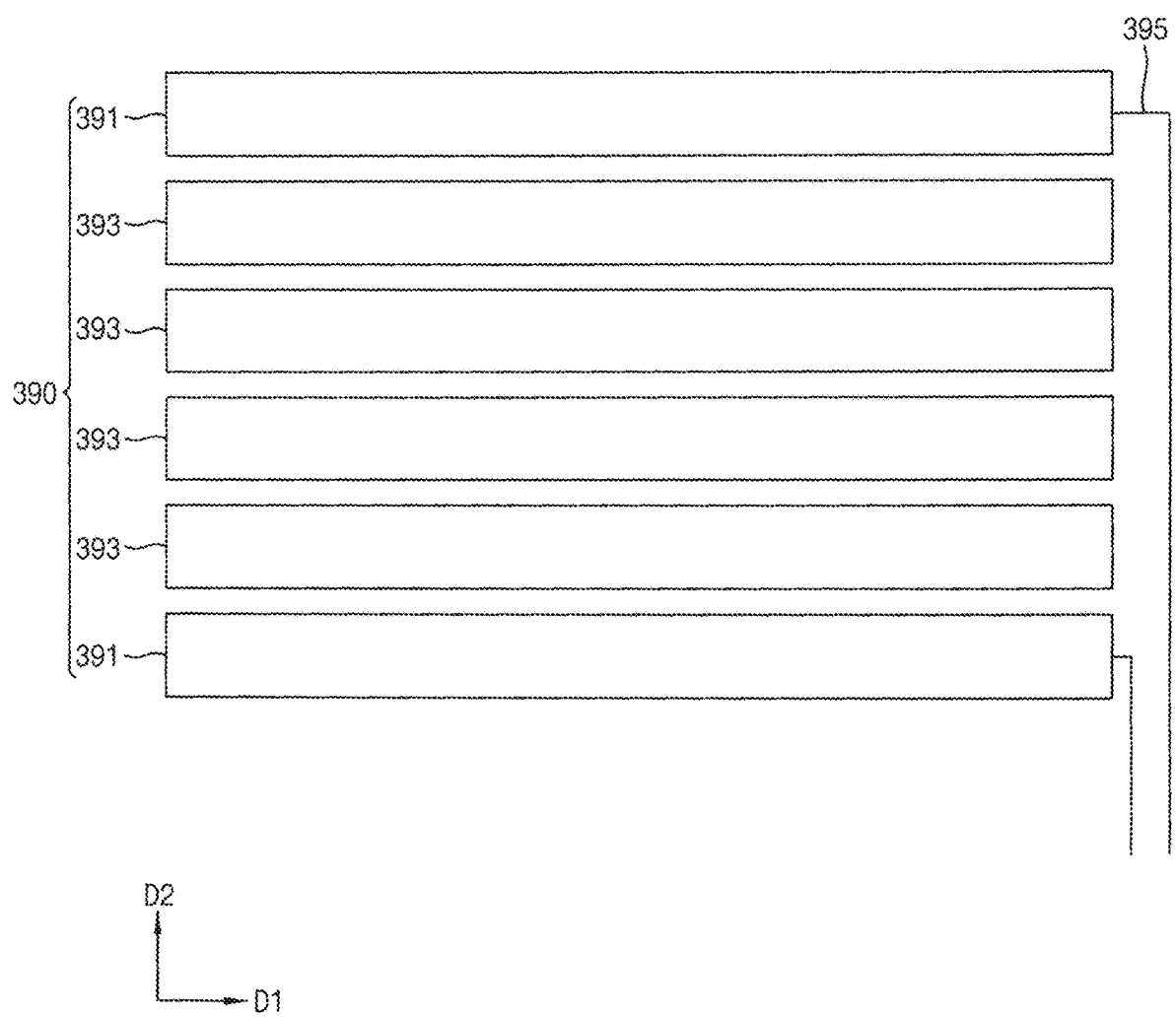
FIG. 14 is a plan view illustrating a second sensing electrode of FIG. 2.
Figure 15:
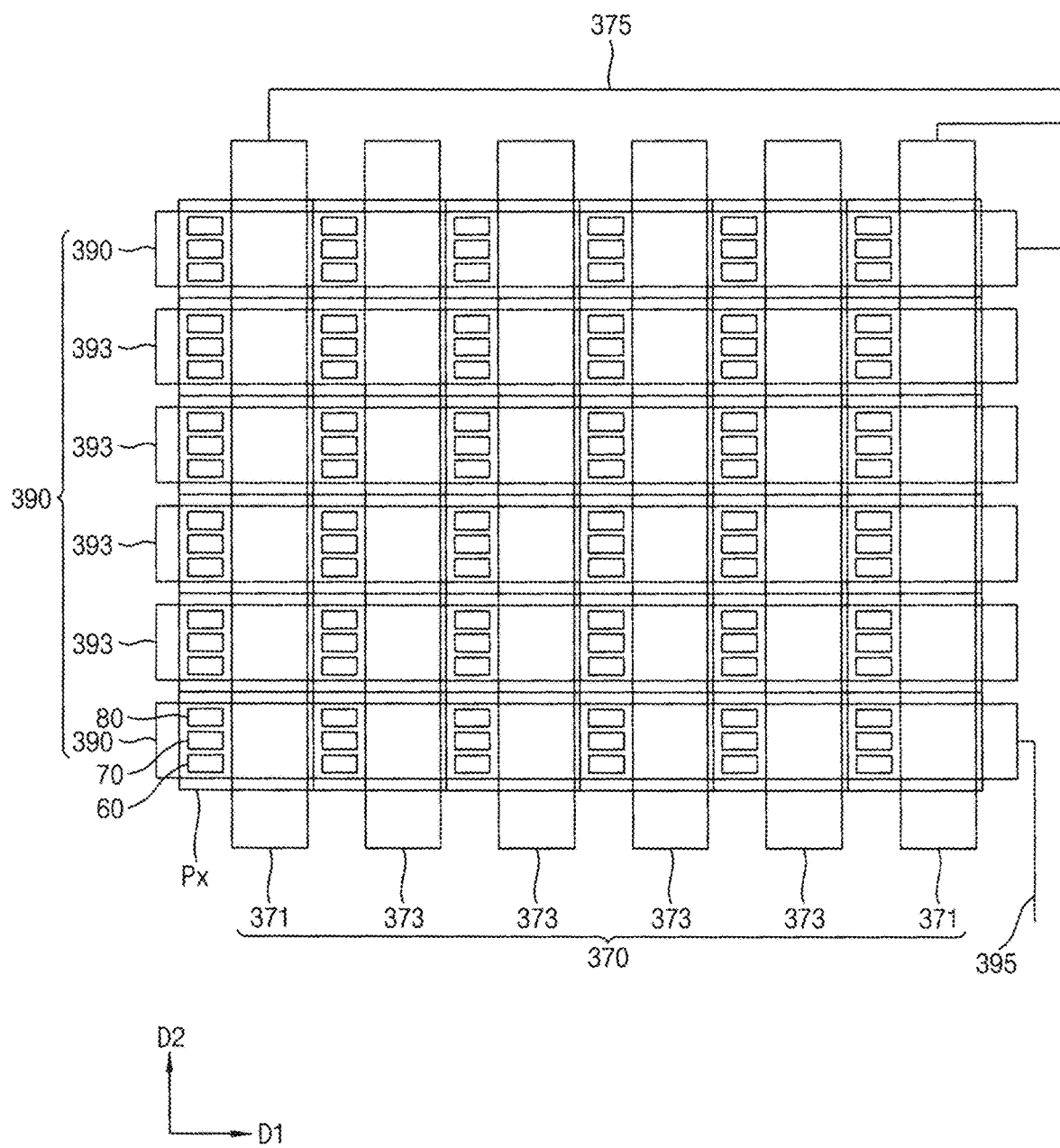
FIG. 15 is a plan view illustrating the first sensing electrode of FIG. 13 and the second sensing electrode of FIG. 14.

FIG. 13 is a plan view illustrating a first sensing electrode of FIG. 2. FIG. 14 is a plan view illustrating a second sensing electrode of FIG. 2. FIG. 15 is a plan view illustrating the first sensing electrode of FIG. 13 and the second sensing electrode of FIG. 14.

Referring to FIGS. 2 and 13 to 15, a first sensing electrode 370 and a second sensing electrode 390 are illustrated.

The first sensing electrode 370 may include a plurality of first sensing patterns 371 extending in a second direction D2 and a plurality of first dummy patterns 373 disposed between the first sensing patterns 371. The first sensing electrode 370 is disposed in the reflection region III. An interval of the first sensing patterns 371 may be adjusted according to the number of the first dummy patterns 373. The first sensing electrode 370 may be connected to a sensing driving part through a first connecting line 375. The first connecting line 375 may include the same material as that of the first sensing electrode 370. The first connecting line 375 may be disposed on the same layer as that on which the first sensing electrode 370 is disposed.

The second sensing electrode 390 may be provided as a plurality of second sensing patterns 391 extending in a first direction D1 crossing the second direction D2 and a plurality of second dummy patterns 393 disposed between the second sensing patterns 391. The second sensing electrode 390 is disposed in the light-emitting region II and the reflection region III. An interval of the second sensing electrode 390 may be adjusted according to the number of the second dummy patterns 393. The second sensing electrode 390 may be connected to a sensing driving part through a second connecting line 395. The second connecting line 395 may include the same material as that of the second sensing electrode 390. The second connecting line 395 may be disposed on the same layer as that on which the second sensing electrode 390 is disposed.

The first sensing electrode 370 may include a material having a predetermined reflectivity. The second sensing electrode 390 may include a material having a predetermined reflectivity. The first sensing electrode 370 may partially overlap the second sensing electrode 390.

The first sensing electrode 370 may be disposed on a first surface of the second substrate 350. The second sensing electrode 390 may be disposed on a second surface opposing the first surface of the second substrate 350.

The first sensing electrode 370 may have a different thickness from a thickness of the second sensing electrode 390. In an exemplary embodiment, a thickness of the first sensing electrode 370 may be about 1000 Å, for example. When the thickness of the first sensing electrode 370 is about 1000 Å, transmissivity of the first sensing electrode 370 may be about 0%, and reflexibility of the first sensing electrode 370 may be greater than about 95%. In addition, a thickness of the second sensing electrode 390 may be about 100 Å. When the thickness of the second sensing electrode 390 is about 100 Å, transmissivity of the second sensing electrode 390 may be greater than about 50% and less than about 95%. When an organic light emitting display device emits light, the light is emitted through the second electrode 390 in the light-emitting region II, and when an organic light emitting display device does not emit light, the second sensing electrode 390 may perform a mirror function.

The first sensing electrode 370 and second sensing electrode 390 may perform as a sensing electrode of a touch screen panel of mutual capacitance type. In an exemplary embodiment, when an electric conductor is contacted, capacitance of an intersecting point of the first sensing electrode 370 and second sensing electrode 390 around a touch position is changed, for example. Thus, a touch panel sensor (not shown) may decide a touch position based on a capacitance sensing signal corresponding to the change of capacitance.

Figure 16:
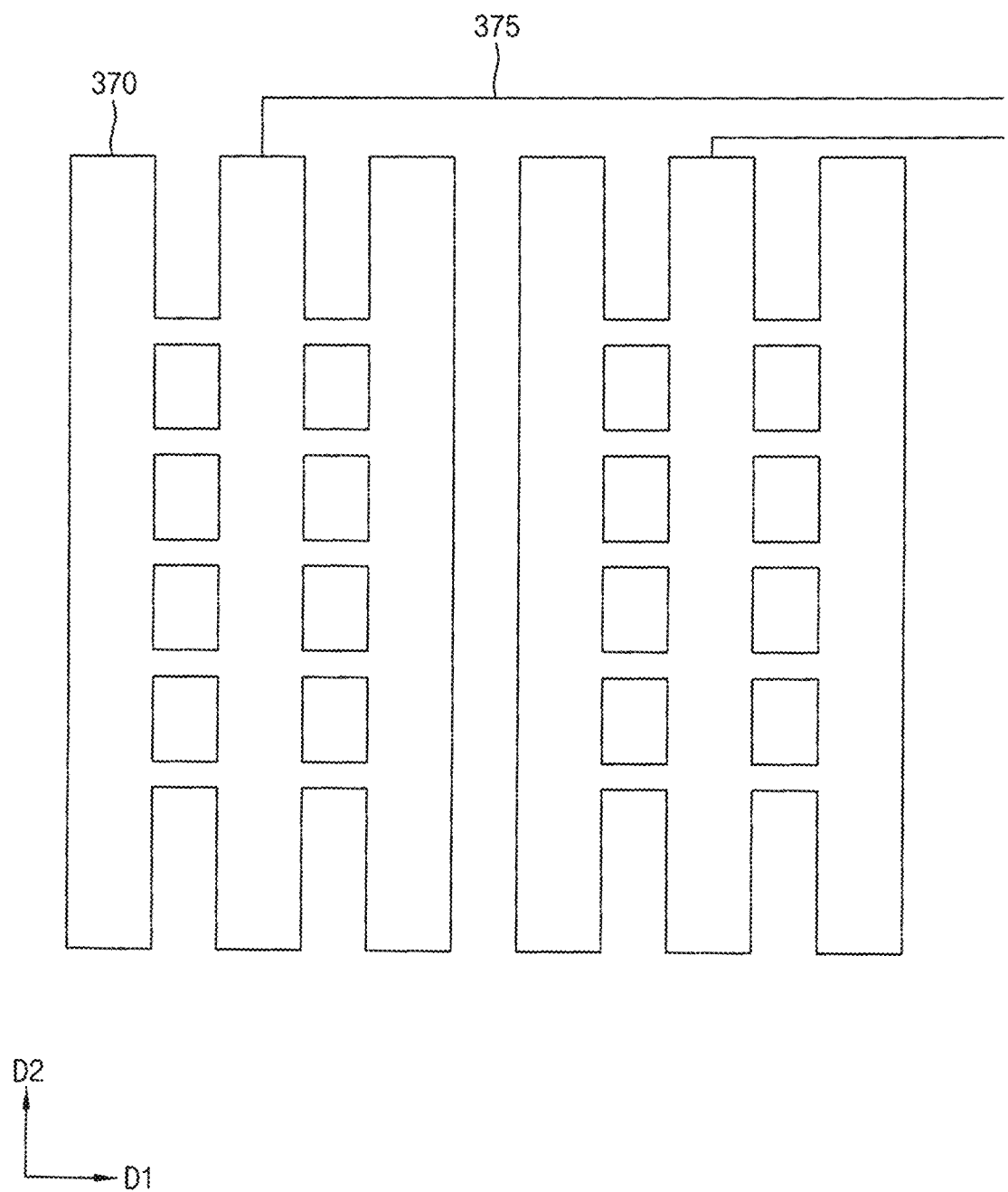
FIG. 16 is a plan view illustrating a first sensing electrode of FIG. 2.
Figure 17:
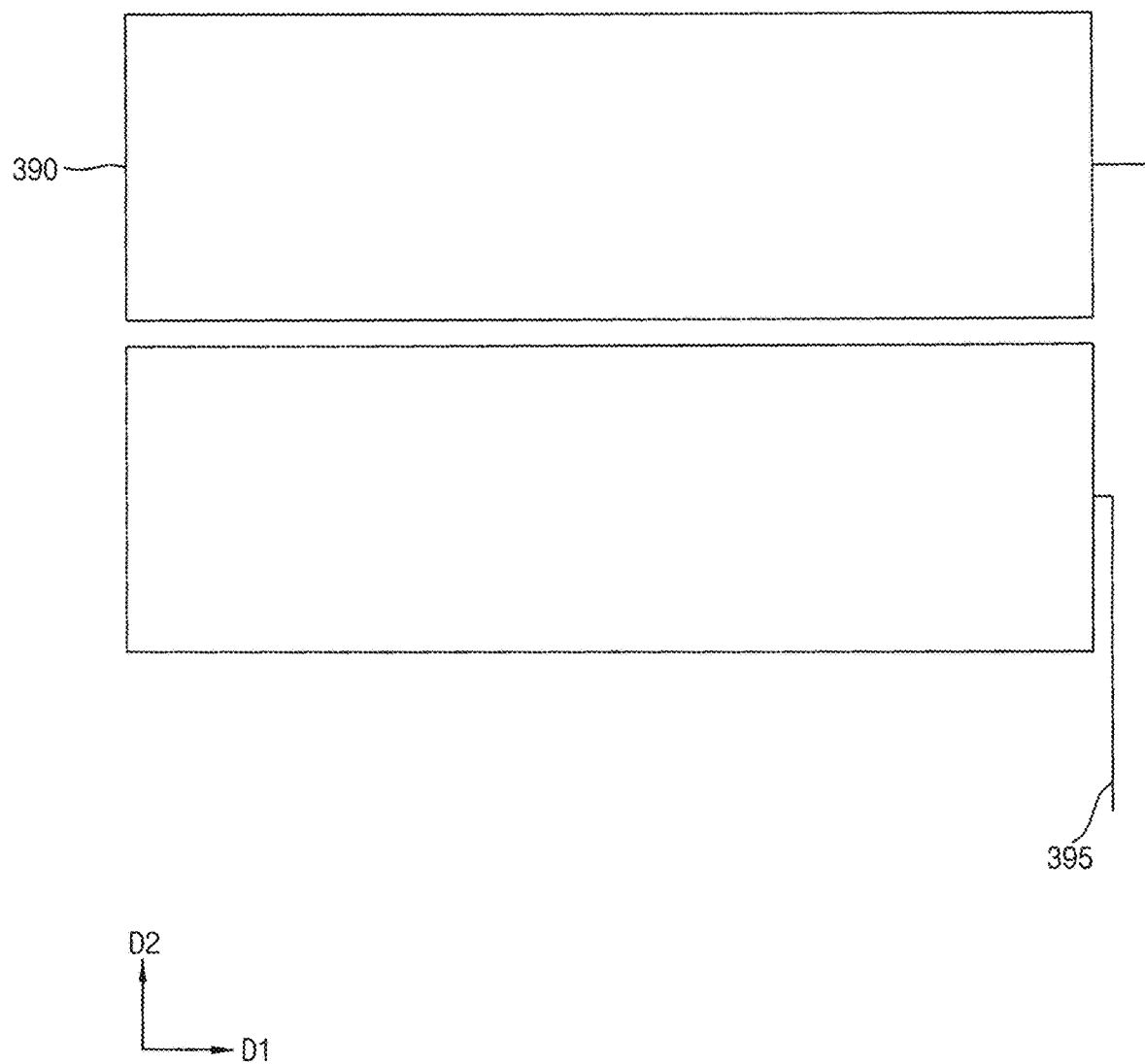
FIG. 17 is a plan view illustrating a second sensing electrode of FIG. 2.
Figure 18:
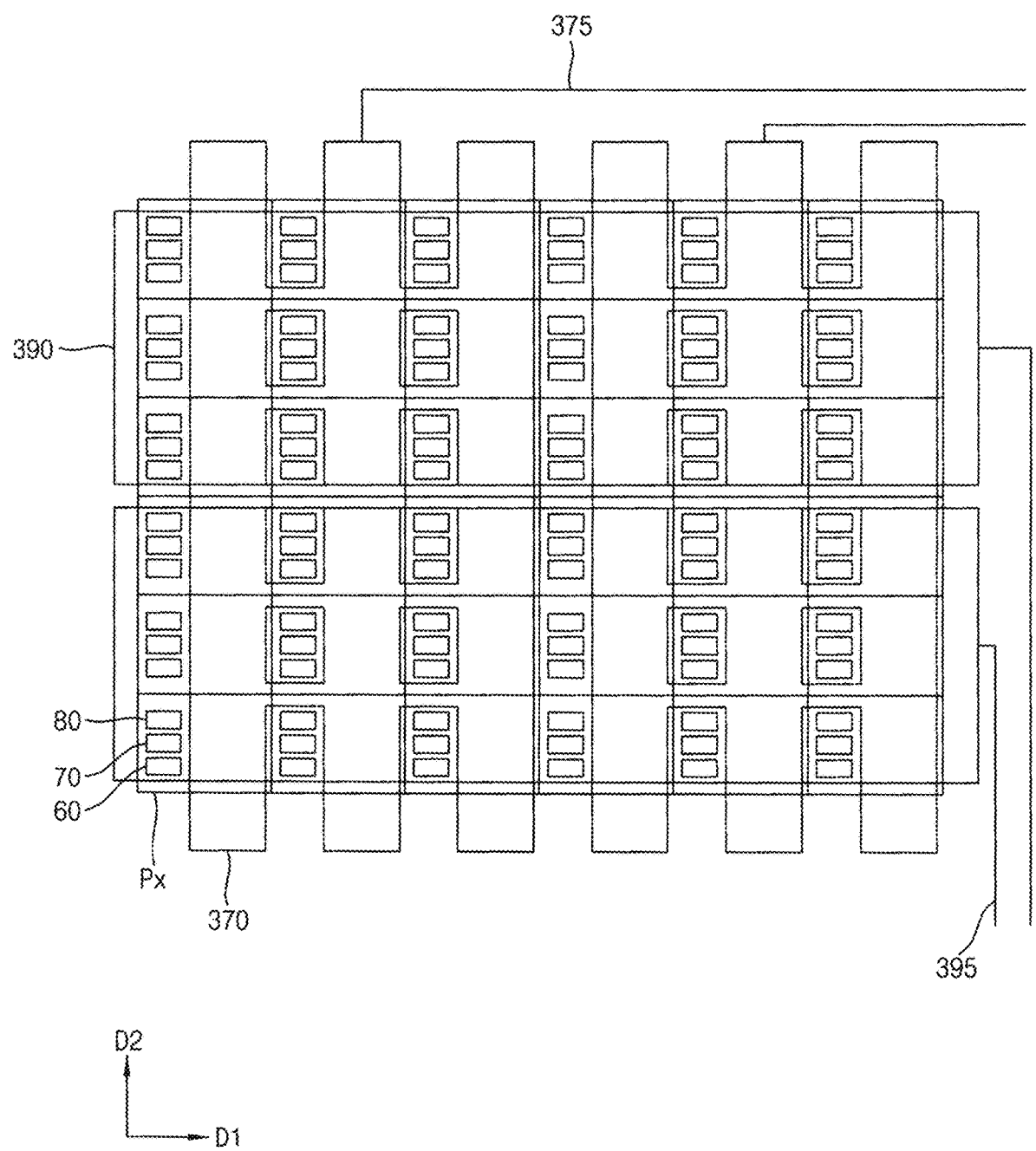
FIG. 18 is a plan view illustrating the first sensing electrode of FIG. 16 and the second sensing electrode of FIG. 17.

FIG. 16 is a plan view illustrating a first sensing electrode of FIG. 2. FIG. 17 is a plan view illustrating a second sensing electrode of FIG. 2. FIG. 18 is a plan view illustrating the first sensing electrode of FIG. 16 and the second sensing electrode of FIG. 17.

Referring to FIGS. 2 and 16 to 18, a first sensing electrode 370 and a second sensing electrode 390 are illustrated.

The first sensing electrode 370 may be provided as a plurality of patterns extending in a second direction D2. The first sensing electrode 370 may be provided as a mesh shape. The first sensing electrode 370 is disposed in the reflection region III. The first sensing electrode 370 may be connected to a sensing driving part through a first connecting line 375. The first connecting line 375 may include the same material as that of the first sensing electrode 370. The first connecting line 375 may be disposed on the same layer as that on which the first sensing electrode 370 is disposed.

The second sensing electrode 390 may be provided as a plurality of patterns extending in a first direction D1 crossing the second direction D2. A width of the second sensing electrode 390 in the second direction D2 is the same as a width of the first sensing electrode 370 in the first direction D1. The second sensing electrode 390 is disposed in the light-emitting region II and the reflection region III. The second sensing electrode 390 may be connected to a sensing driving part through a second connecting line 395. The second connecting line 395 may include the same material as that of the second sensing electrode 390. The second connecting line 395 may be disposed on the same layer as that on which the second sensing electrode 390 is disposed.

The first sensing electrode 370 may include a material having a predetermined reflectivity. The second sensing electrode 390 may include a material having a predetermined reflectivity. The first sensing electrode 370 may partially overlap the second sensing electrode 390.

The first sensing electrode 370 may be disposed on a first surface of the second substrate 350. The second sensing electrode 390 may be disposed on a second surface opposing the first surface of the second substrate 350.

The first sensing electrode 370 and second sensing electrode 390 may perform as a sensing electrode of a touch screen panel of mutual capacitance type. In an exemplary embodiment, when an electric conductor is contacted, capacitance of an intersecting point of the first sensing electrode 370 and second sensing electrode 390 around a touch position is changed, for example. Thus, a touch panel sensor (not shown) may decide a touch position based on a capacitance sensing signal corresponding to the change of capacitance.

The first sensing electrode 370 may have a different thickness from a thickness of the second sensing electrode 390. In an exemplary embodiment, a thickness of the first sensing electrode 370 may be about 1000 Å, for example. When the thickness of the first sensing electrode 370 is about 1000 Å, transmissivity of the first sensing electrode 370 may be about 0%, and reflexibility of the first sensing electrode 370 may be greater than about 95%. In addition, a thickness of the second sensing electrode 390 may be about 100 Å. When the thickness of the second sensing electrode 390 is about 100 Å, transmissivity of the second sensing electrode 390 may be greater than about 50% and less than about 95%. When an organic light emitting display device emits light, the light is emitted through the second electrode 390 in the light-emitting region II, and when an organic light emitting display device does not emit light, the second sensing electrode 390 may perform a mirror function.

Figure 20:
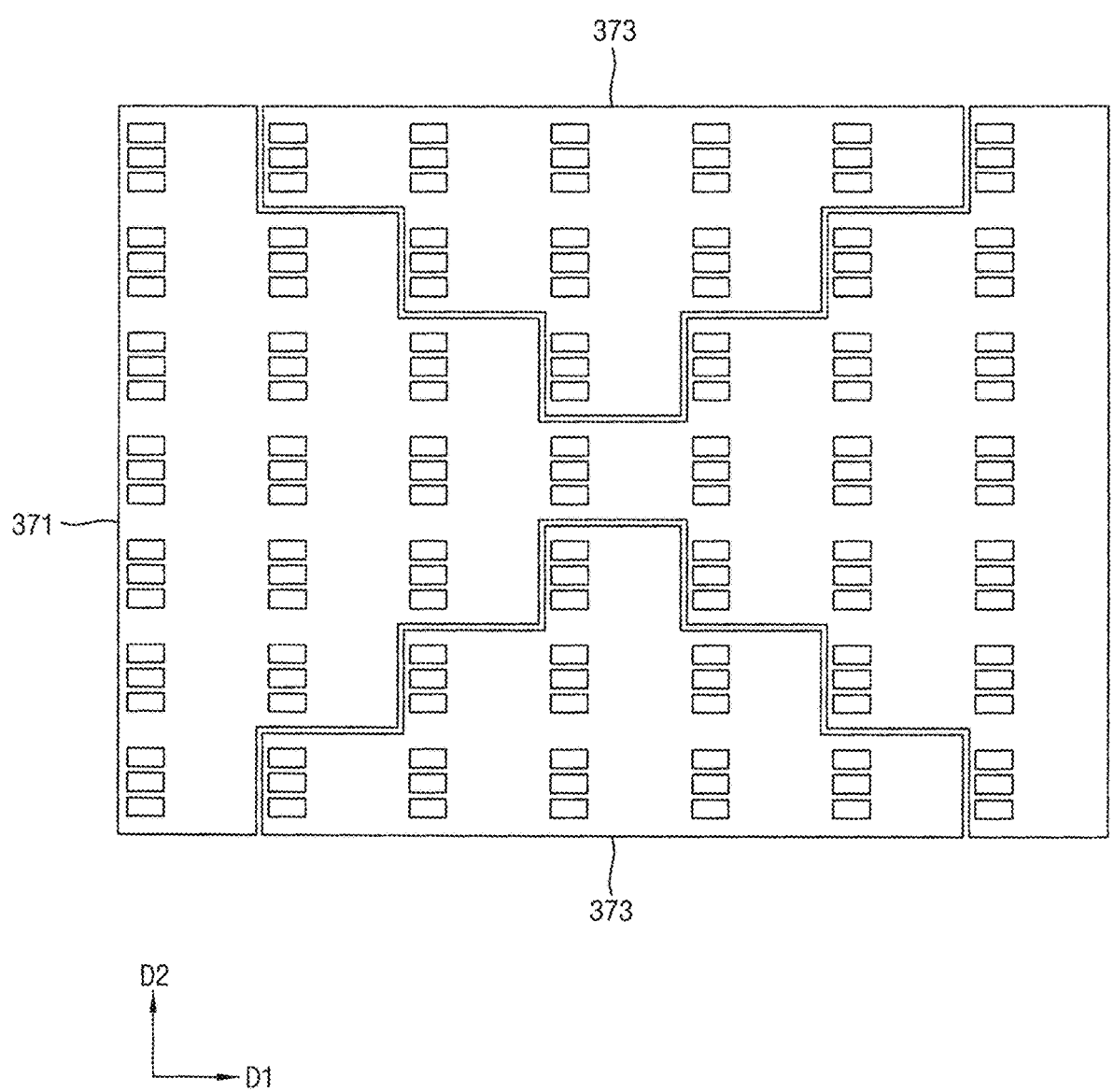
FIG. 20 is a plan view magnifying 'A' portion of FIG. 19.
Figure 21:
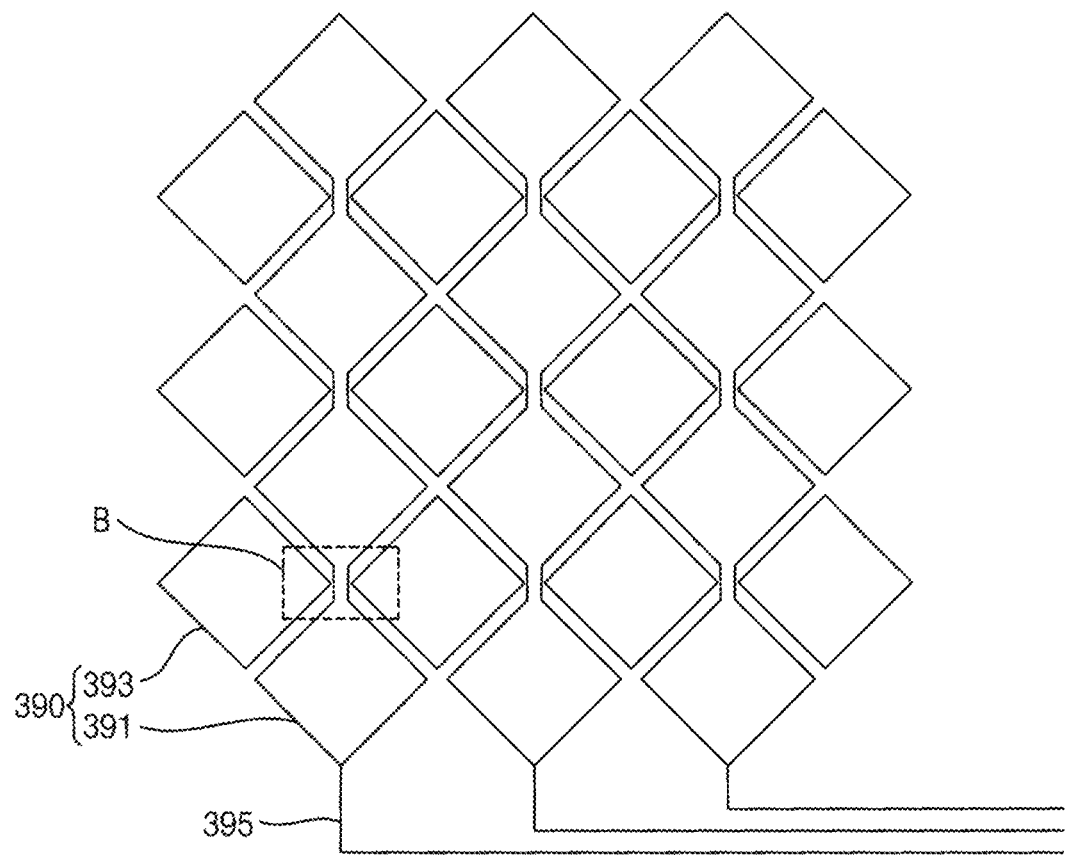
FIG. 21 is a plan view illustrating a second sensing electrode of FIG. 2.
Figure 22:
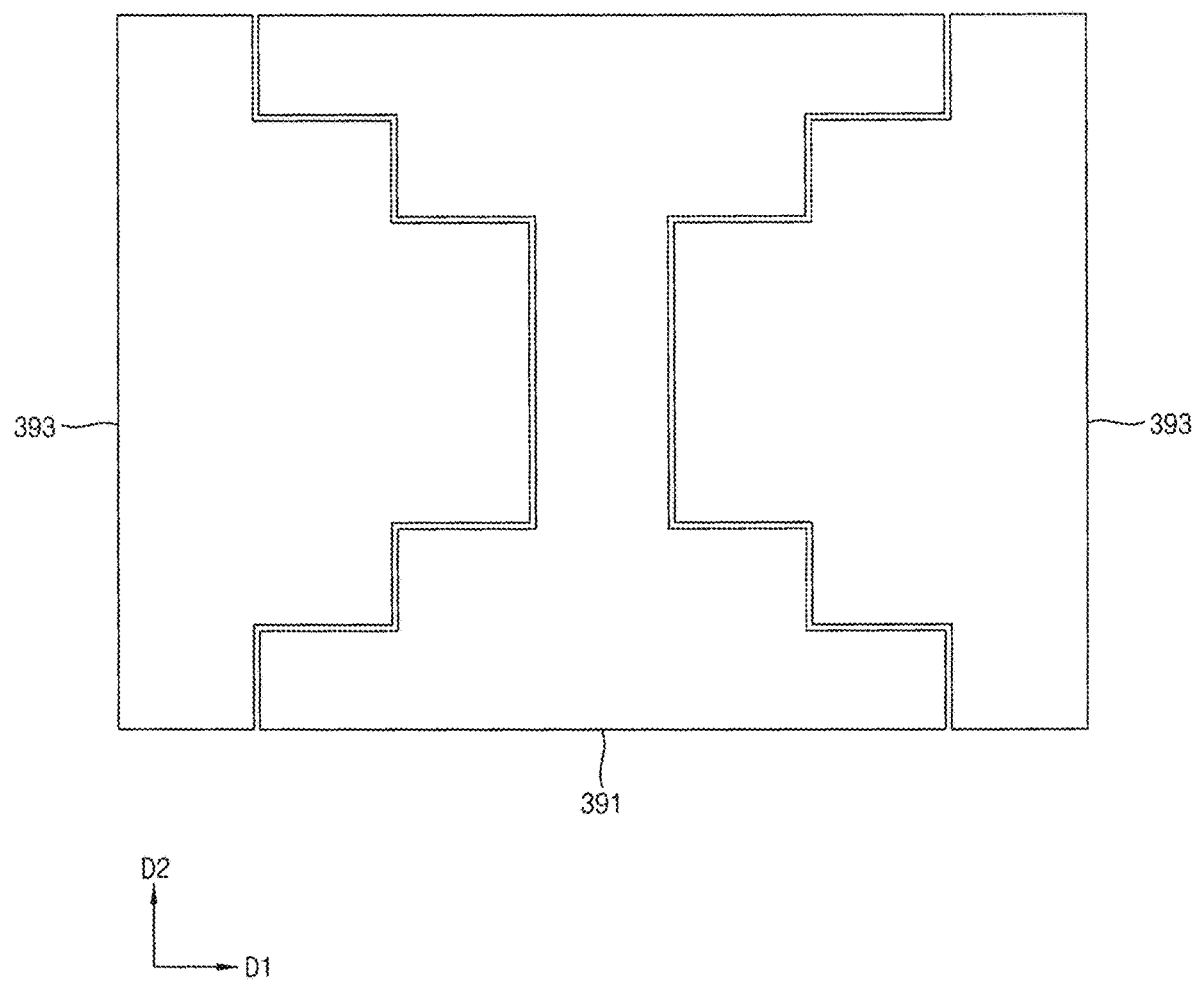
FIG. 22 is a plan view magnifying 'B' portion of FIG. 21.
Figure 23:
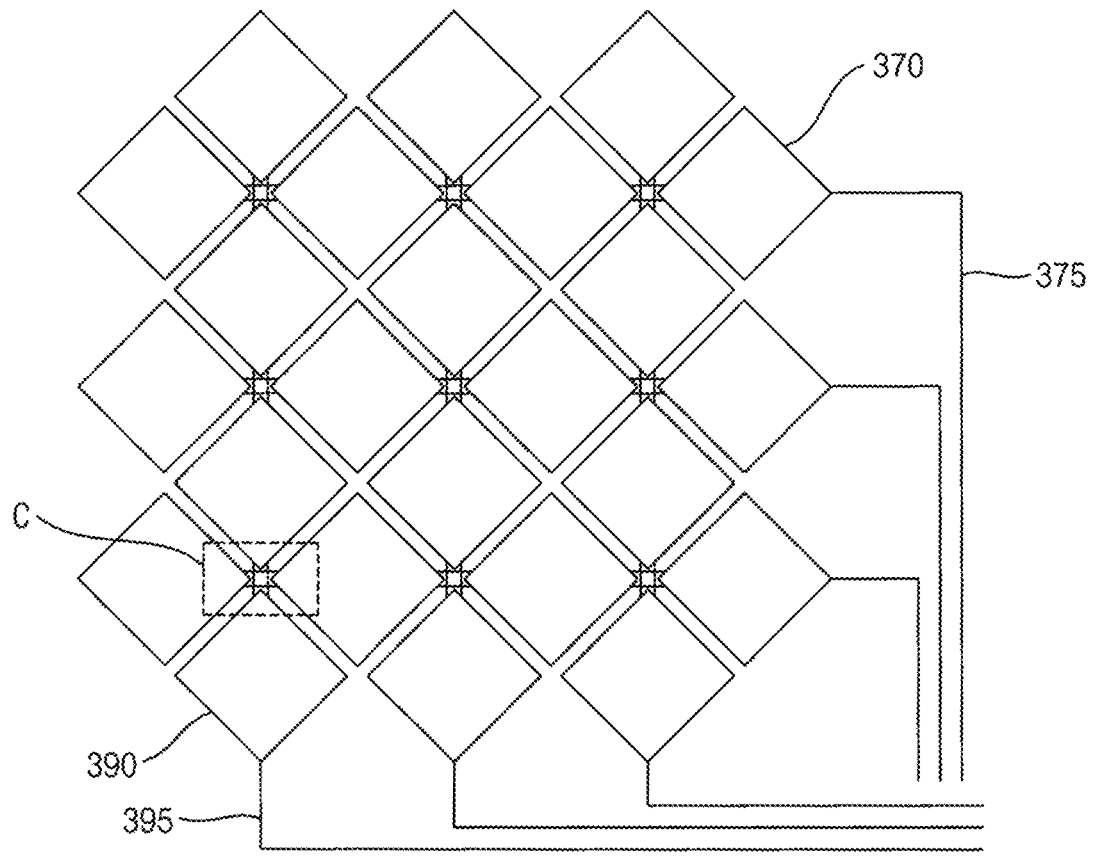
FIG. 23 is a plan view illustrating the first sensing electrode of FIG. 19 and the second sensing electrode of FIG. 21.
Figure 24:
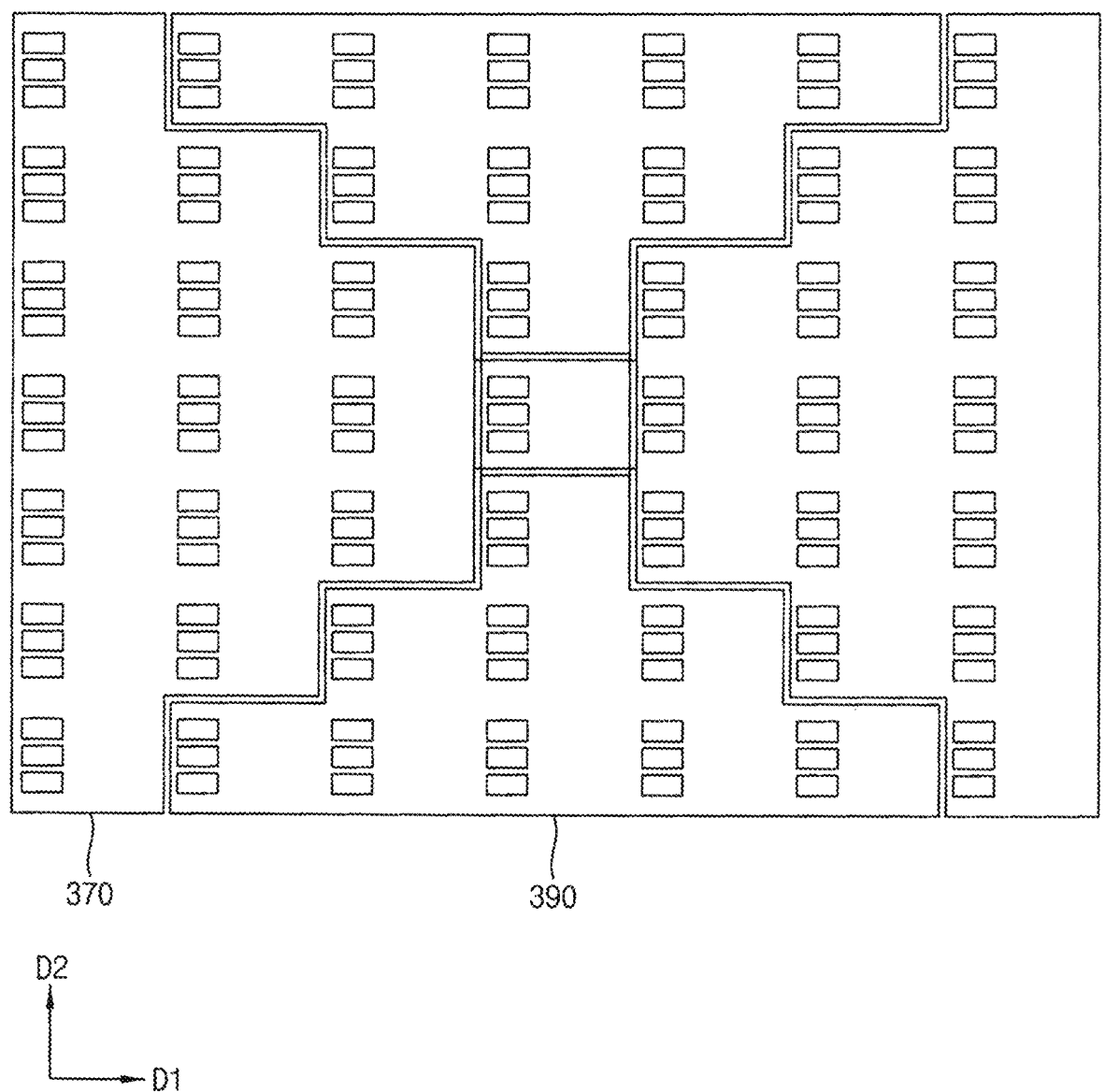
FIG. 24 is a plan view magnifying 'C' portion of FIG. 23.

FIG. 19 is a plan view illustrating a first sensing electrode of FIG. 2. FIG. 20 is a plan view magnifying 'A' portion of FIG. 19. FIG. 21 is a plan view illustrating a second sensing electrode of FIG. 2. FIG. 22 is a plan view magnifying 'B' portion of FIG. 21. FIG. 23 is a plan view illustrating the first sensing electrode of FIG. 19 and the second sensing electrode of FIG. 21. FIG. 24 is a plan view magnifying 'C' portion of FIG. 23.

Referring to FIGS. 2 and 19 to 24, a first sensing electrode 370 and a second sensing electrode 390 are illustrated.

The first sensing electrode 370 may include plurality of first sensing patterns 371 having a rhombus shape and sequentially connected each other in a first direction D1 and a plurality of first dummy patterns 373 having a rhombus shape and disposed between the first sensing patterns 371. The first dummy patterns 373 are spaced apart from each other. The first sensing electrode 370 is disposed in the reflection region III. The first sensing electrode 370 may be connected to a sensing driving part through a first connecting line 375. The first connecting line 375 may include the same material as that of the first sensing electrode 370. The first connecting line 375 may be disposed on the same layer as that on which the first sensing electrode 370 is disposed.

The second sensing electrode 390 may include plurality of second sensing patterns 391 having a rhombus shape and sequentially connected each other in a second direction D2 and a plurality of second dummy patterns 393 having a rhombus shape and disposed between the second sensing patterns 391. The second dummy patterns 393 are spaced apart from each other. The second sensing electrode 390 is disposed in the light-emitting region II and the reflection region III. The second sensing electrode 390 may be connected to a sensing driving part through a second connecting line 395. The second connecting line 395 may include the same material as that of the second sensing electrode 390. The second connecting line 395 may be disposed on the same layer as that on which the second sensing electrode 390 is disposed.

The first sensing electrode 370 may include a material having a predetermined reflectivity. The second sensing electrode 390 may include a material having a predetermined reflectivity. The first sensing electrode 370 may partially overlap the second sensing electrode 390.

The first sensing electrode 370 may be disposed on a first surface of the second substrate 350. The second sensing electrode 390 may be disposed on a second surface opposing the first surface of the second substrate 350.

The first sensing electrode 370 and second sensing electrode 390 may perform as a sensing electrode of a touch screen panel of mutual capacitance type. In an exemplary embodiment, when an electric conductor is contacted, capacitance of an intersecting point of the first sensing electrode 370 and second sensing electrode 390 around a touch position is changed, for example. Thus, a touch panel sensor (not shown) may decide a touch position based on a capacitance sensing signal corresponding to the change of capacitance.

The first sensing electrode 370 may have a different thickness from a thickness of the second sensing electrode 390. In an exemplary embodiment, a thickness of the first sensing electrode 370 may be about 1000 Å, for example. When the thickness of the first sensing electrode 370 is about 1000 Å, transmissivity of the first sensing electrode 370 may be about 0%, and reflexibility of the first sensing electrode 370 may be greater than about 95%. In addition, a thickness of the second sensing electrode 390 may be about 100 Å. When the thickness of the second sensing electrode 390 is about 100 Å, transmissivity of the second sensing electrode 390 may be greater than about 50% and less than about 95%. When an organic light emitting display device emits light, the light is emitted through the second electrode 390 in the light-emitting region II, and when an organic light emitting display device does not emit light, the second sensing electrode 390 may perform a mirror function.

Figure 25:
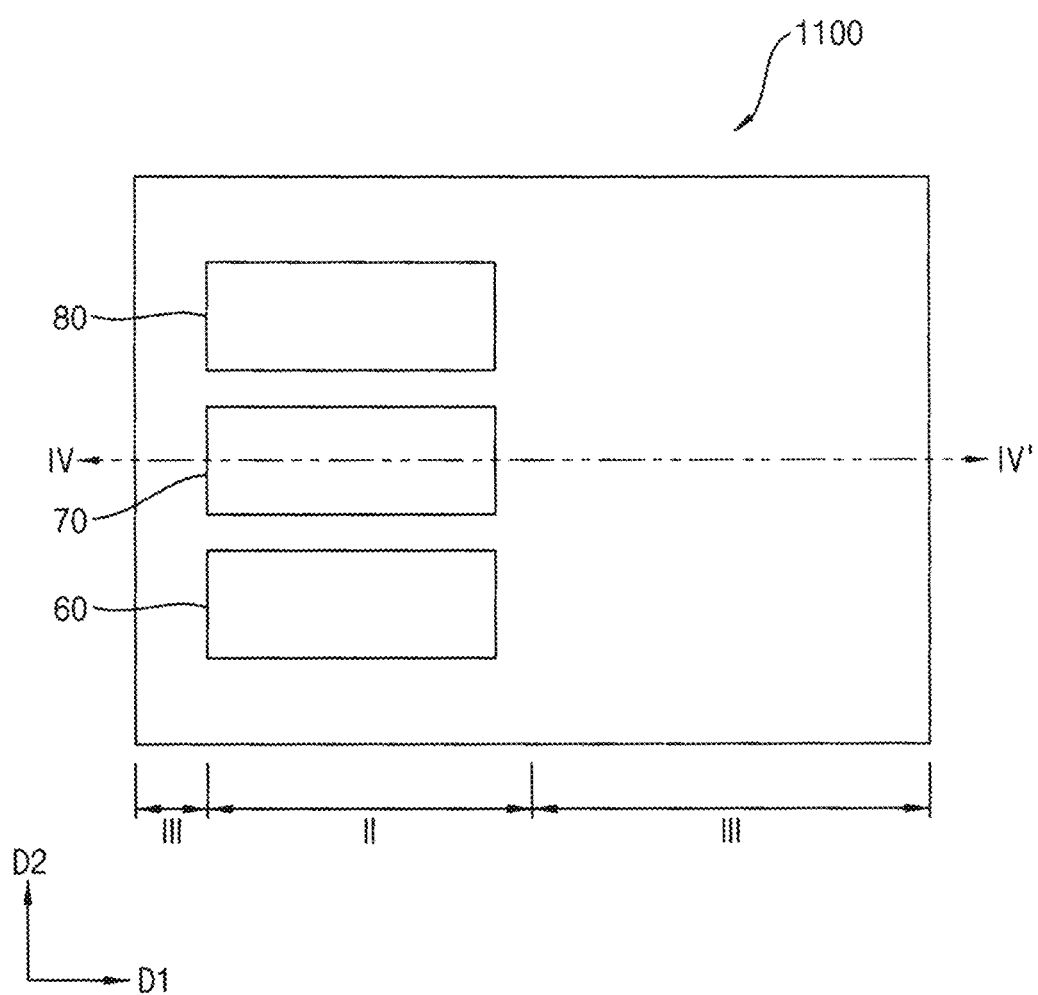
FIG. 25 is a plan view illustrating an exemplary embodiment of an organic light emitting display device according to the invention.
Figure 26:
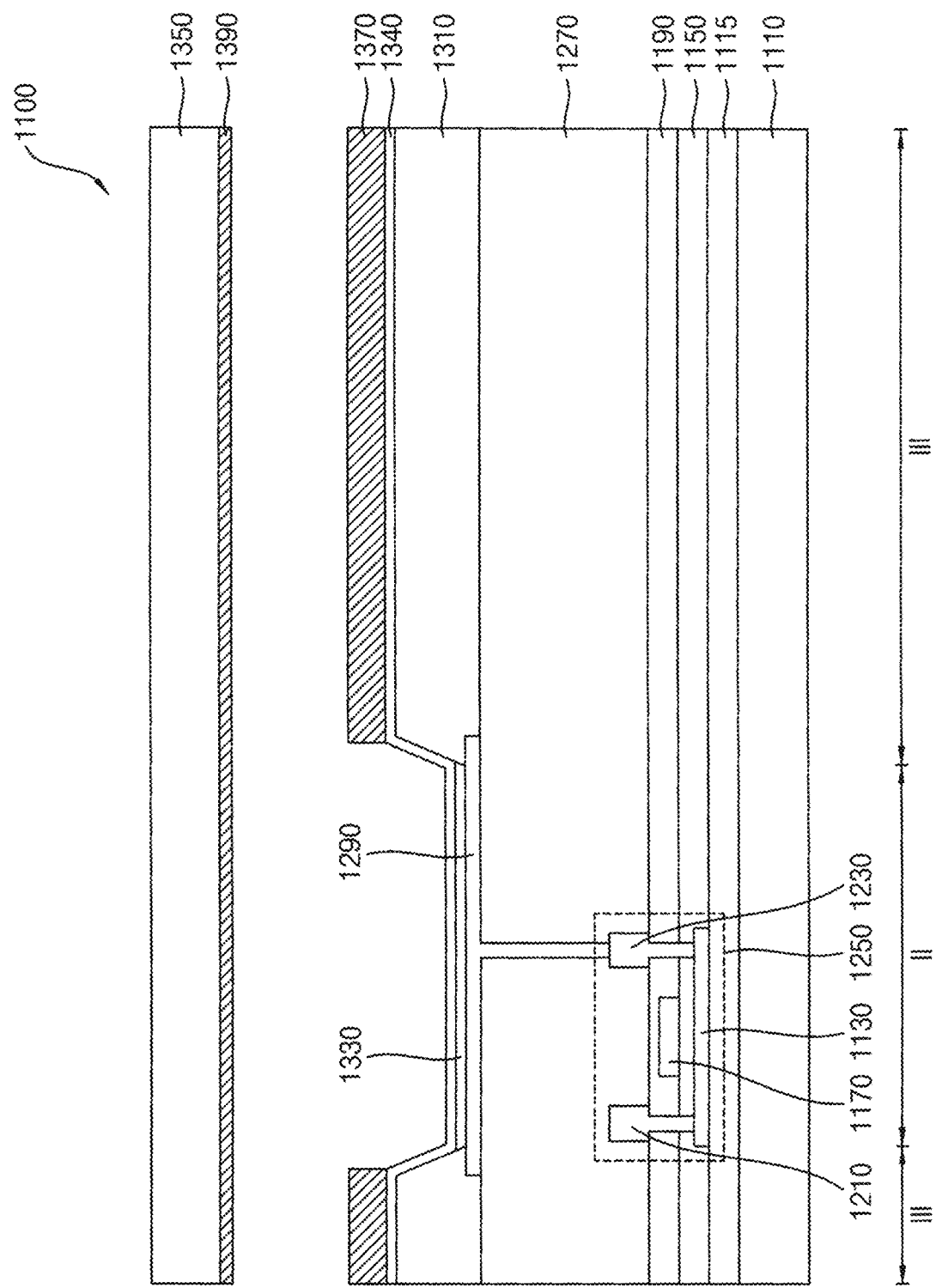
FIG. 26 is a cross-sectional view taken along line IV-IV' of FIG. 25.

FIG. 25 is a plan view illustrating an organic light emitting display device according to an exemplary embodiment of the invention. FIG. 26 is a cross-sectional view taken along line IV-IV' of FIG. 25.

An organic light emitting display device according to the illustrated exemplary embodiment is substantially same as the organic light emitting display device of FIGS. 1 and 2 except for a first sensing electrode 1370 and a second sensing electrode 1390 and thus similar reference numerals are used for same elements and repetitive explanation will be omitted.

Referring to FIGS. 25 and 26, the first sensing electrode 1370 is disposed on a second electrode 1340. The first sensing electrode 1370 is disposed on a first substrate 1110. The first sensing electrode 1370 may be disposed in the reflection region III and outside of the light-emitting region II.

The first sensing electrode 1370 may include a material having a predetermined reflectivity. In an exemplary embodiment, the first sensing electrode 1370 may include gold (Au), silver (Ag), aluminum (Al), magnesium (Mg), platinum (Pt), Nickel (Ni), titanium (Ti), etc., for example. In an alternative exemplary embodiment, the first sensing electrode 1370 may include an alloy, metal nitride, conductive metal oxide, etc. In an exemplary embodiment, the first sensing electrode 1370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 1350 and the first substrate 1110 may include substantially the same materials. In an exemplary embodiment, the second substrate 1350 may include quartz, synthetic quartz, calcium fluoride, fluoride-doping quartz, sodalime glass, non-alkali glass etc., for example. In exemplary embodiments, the second substrate 1350 may include a transparent inorganic material or flexible plastic. In an exemplary embodiment, the second substrate 1350 may include a flexible transparent resin substrate, for example. In this case, to increase flexibility of the organic light emitting display device 1100, the second substrate 1350 may include a stacked structure where at least one organic layer and at least one inorganic layer are alternately stacked.

The second sensing electrode 1390 may be disposed on the second substrate 1350. The second sensing electrode 1390 may be disposed in the light-emitting region II and the reflection region III. However, the invention is not limited thereto, and an insulation layer may be disposed between second substrate 1350 and the second sensing electrode 1390.

The second sensing electrode 1390 may include a material having a predetermined reflectivity. In an exemplary embodiment, the second sensing electrode 1390 may include gold (Au), silver (Ag), aluminum (Al), magnesium (Mg), platinum (Pt), Nickel (Ni), titanium (Ti), etc., for example. In an alternative exemplary embodiment, the second sensing electrode 1390 may include an alloy, metal nitride, conductive metal oxide, etc. In an exemplary embodiment, the second sensing electrode 1390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The first sensing electrode 1370 may have a different thickness from a thickness of the second sensing electrode 1390. In an exemplary embodiment, a thickness of the first sensing electrode 1370 may be about 1000 Å, for example. When the thickness of the first sensing electrode 1370 is about 1000 Å, transmissivity of the first sensing electrode 1370 may be about 0%, and reflexibility of the first sensing electrode 1370 may be greater than about 95%. In addition, a thickness of the second sensing electrode 1390 may be about 100 Å. When the thickness of the second sensing electrode 1390 is about 100 Å, transmissivity of the second sensing electrode 1390 may be greater than about 50% and less than about 95%. When an organic light emitting display device emits light, the second sensing electrode 1390 may display an image in the light-emitting region II, and when an organic light emitting display device does not emit light, the second sensing electrode 1390 may perform a mirror function.

FIGS. 27 to 33 are cross-sectional views illustrating a method of manufacturing the organic light emitting display device of FIG. 26.

Figure 27:
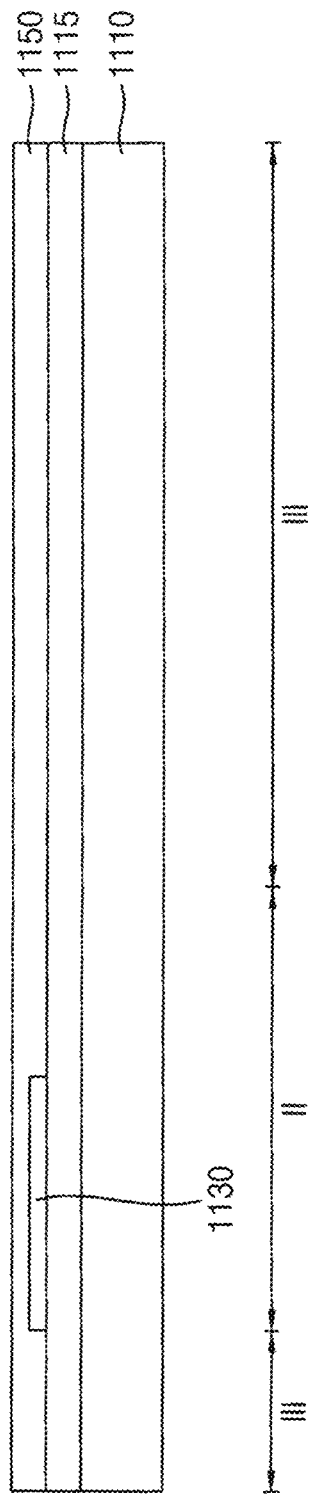
FIGS. 27 to 33 are cross-sectional views illustrating a method of manufacturing the organic light emitting display device of FIG. 26.

Referring to FIG. 27, the buffer layer 1115 is disposed on the first substrate 1110. Thereafter, the active pattern 1130 and the first insulation layer 1150 are disposed on the buffer layer 1115.

In an exemplary embodiment, the first substrate 1110 may include quartz, synthetic quartz, calcium fluoride, fluoride-doping quartz, a sodalime glass, a non-alkali glass etc., for example.

The light emitting structure may be disposed on the first substrate 1110. The first substrate 1110 may include transparent materials. In an exemplary embodiment, the first substrate 1110 may include quartz, synthetic quartz, calcium fluoride, fluoride-doping quartz, a sodalime glass, a non-alkali glass etc., for example. In an alternative exemplary embodiment, the first substrate 1110 may include a flexible transparent resin substrate. Here, the flexible transparent resin substrate for the first substrate 1110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 1110 may have a structure in which the first polyimide layer, the barrier film layer and the second polyimide layer are stacked on a glass substrate. Here, after an insulation layer is provided on the second polyimide layer, the light emitting structure (e.g., the semiconductor element 1250, a capacitor, the first electrode 1290, the light emitting layer 1330, the second electrode 1340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 1110 after the removal of the glass substrate. As the organic light emitting display device 1100 includes the light-emitting region II and the reflection region III, the first substrate 1110 may also include the light-emitting region II and the reflection region III.

A buffer layer 1115 may be disposed on the first substrate 1110. The buffer layer 1115 may extend from the light-emitting region II into the reflection region III. The buffer layer 1115 may prevent the diffusion (e.g., an out gassing) of metal atoms and/or impurities from the first substrate 1110. Additionally, the buffer layer 1115 may control a rate of a heat transfer in a crystallization process for forming the active pattern 1130, thereby obtaining substantially uniform the active pattern 1130. Furthermore, the buffer layer 1115 may improve a surface flatness of the first substrate 1110 when a surface of the first substrate 1110 is relatively irregular. According to a type of the first substrate 1110, at least two buffer layers may be provided on the first substrate 1110, or the buffer layer may not be disposed.

In an exemplary embodiment, the active pattern 1130 may include an oxide semiconductor, an inorganic semiconductor (e.g., amorphous silicon, polysilicon, etc.), an organic semiconductor, etc., for example.

The first insulation layer 1150 may be disposed on the active pattern 1130. The first insulation layer 1150 may cover the active pattern 1130 in the light-emitting region II, and may extend in the first direction on the first substrate 1110. That is, the first insulation layer 1150 may be disposed on the entire surface of the first substrate 1110. In an exemplary embodiment, the first insulation layer 1150 may include a silicon compound, a metal oxide, etc., for example.

Figure 28:
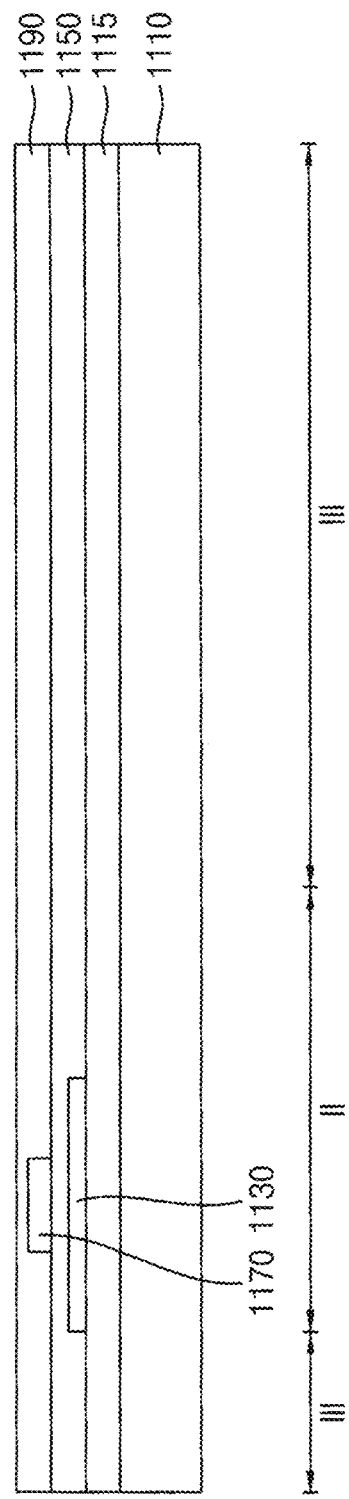

Referring to FIG. 28, the gate electrode 1170 and the second insulation layer 1190 are disposed on the first substrate 1110 on which the first insulation layer 1150 is disposed.

The gate electrode 1170 may be disposed on a portion of the first insulation layer 1150 under which the active pattern 1130 is disposed. In an exemplary embodiment, the gate electrode 1170 may include a metal, an alloy, metal nitride, conductive metal oxide, transparent conductive materials, etc., for example.

The second insulation layer 1190 may be disposed on the gate electrode 1170. The second insulation layer 1190 may cover the gate electrode 1170 in the light-emitting region II, and may extend in the first direction on the first substrate 1110. That is, the second insulation layer 1190 may be disposed on the entire surface of the first substrate 1110. In an exemplary embodiment, the second insulation layer 1190 may include a silicon compound, a metal oxide, etc., for example.

Figure 29:
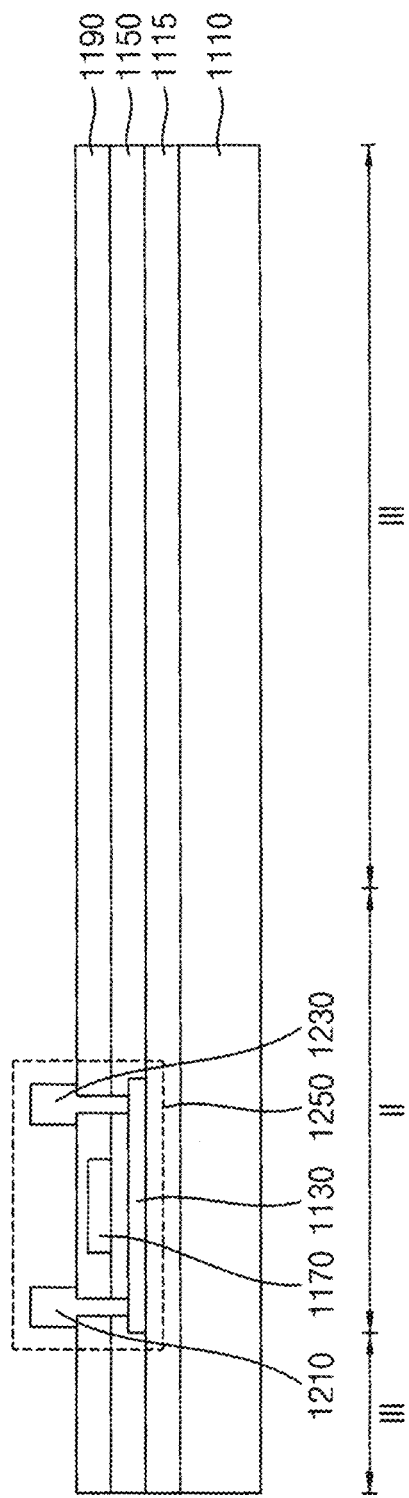

Referring to FIG. 29, the source electrode 1210 and the drain electrode 1230 are disposed on the first substrate 1110 on which the second insulation layer 1190 is disposed.

The source electrode 1210 and the drain electrode 1230 may be disposed on the second insulation layer 1190. The source electrode 1210 may be in contact with a first side of the active layer 1130 by removing a portion of the first and second insulation layers 1150 and 1190. The drain electrode 1230 may be in contact with a second side of the active layer 1130 by removing a second portion of the first and second insulation layers 1150 and 1190. In an exemplary embodiment, each of the source electrode 1210 and the drain electrode 1230 may include a metal, an alloy, metal nitride, conductive metal oxide, transparent conductive materials, etc., for example.

In the illustrated exemplary embodiment, the gate electrode 1170 is disposed on the active pattern 1130. However, the invention is not limited thereto, and the gate electrode 1170 may be disposed under the active pattern 1130.

Figure 30:
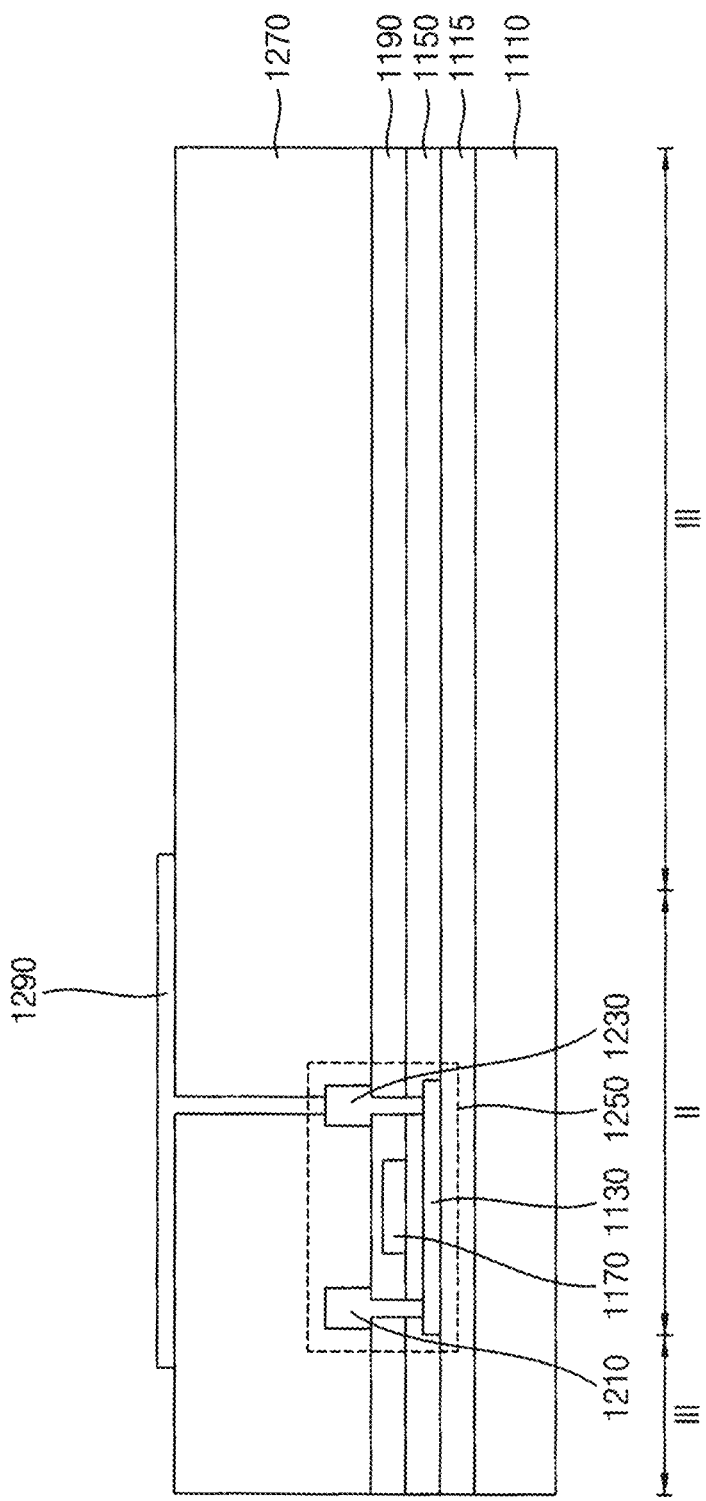

Referring to FIG. 30, the third insulation layer 1270 and the first electrode 1290 are disposed on the first substrate 1110 on which the source electrode 1210 and the drain electrode 1230 are disposed.

The third insulation layer 1270 may be disposed on the source electrode 1210 and the drain electrode 1230. The third insulation layer 1270 may cover the source electrode 1210 and the drain electrode 1230 in the sub-pixel region II, and may extend in the first direction on the first substrate 1110. That is, the third insulation layer 1270 may be disposed on the entire surface of the first substrate 1110. In an exemplary embodiment, the third insulation layer 1270 may include a silicon compound, a metal oxide, etc., for example.

The first electrode 1290 may be disposed on the third insulation layer 1270. The first electrode 1290 may be in contact with the source electrode 1210 by removing a portion of the third insulation layer 1270. In addition, the first electrode 1290 may be electrically connected to the semiconductor element 1250. In an exemplary embodiment, the first electrode 1290 may include a metal, an alloy, metal nitride, conductive metal oxide, transparent conductive materials, etc., for example.

Figure 31:
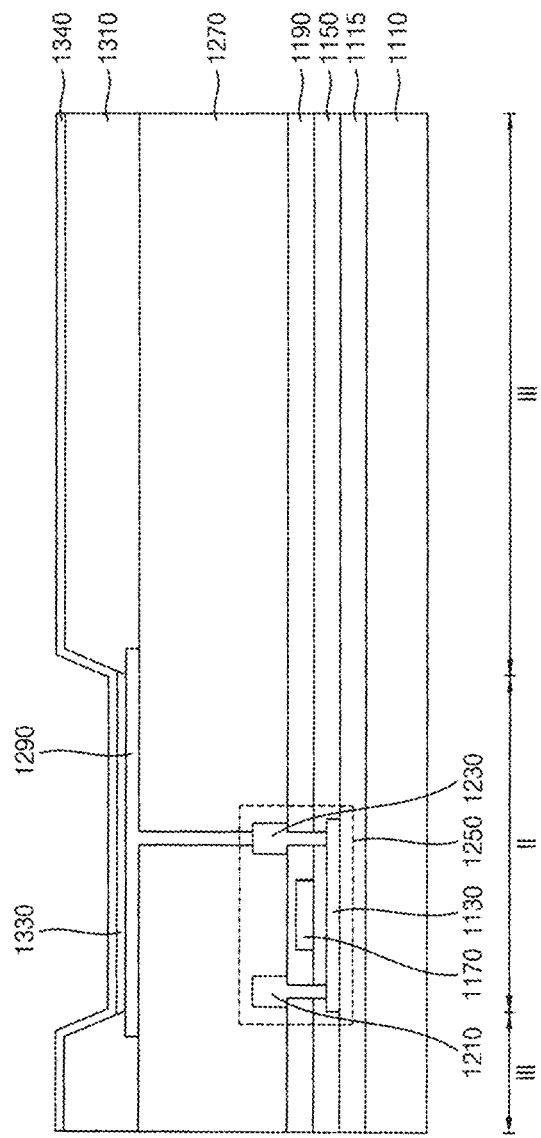

Referring to FIG. 31, the pixel defining layer 1310, the light emitting layer 1330 and the second electrode 1340 are disposed on the first substrate 1110 on which the first electrode 1290 is disposed.

The pixel defining layer 1310 may be disposed on the third insulation layer 1270 to expose a portion of the first electrode 1290. The pixel defining layer 1310 may include organic materials or inorganic materials. In this case, the light emitting layer 1330 may be disposed on a portion that the first electrode 1290 is exposed by the pixel defining layer 1310.

The light emitting layer 1330 may be disposed on the exposed first electrode 1290. The light emitting layer 1330 may be provided using light emitting materials capable of generating different colors of light (e.g., a red color of light, a blue color of light, and a green color of light). However, the invention is not limited thereto, and the light emitting layer 1330 may stack light emitting materials capable of generating different colors of light to emit white color of light.

The second electrode 1340 may be disposed on the pixel defining layer 1310 and the light emitting layer 1330. The second electrode 1340 may cover the pixel defining layer 1310 and the light emitting layer 1330 in the light-emitting region II and the reflection region III, and may extend in the first direction on the first substrate 1110. That is, the second electrode 1340 may be electrically connected to the first through third pixels. In an exemplary embodiment, the second electrode 1340 may include a metal, an alloy, metal nitride, conductive metal oxide, a transparent conductive material, etc., for example. These may be used alone or in a combination thereof. The first substrate 1110 may be combined with the second substrate 1350 by using a sealing member. In addition, a filler may be disposed between the first substrate 1110 and the second substrate 1350.

Figure 32:
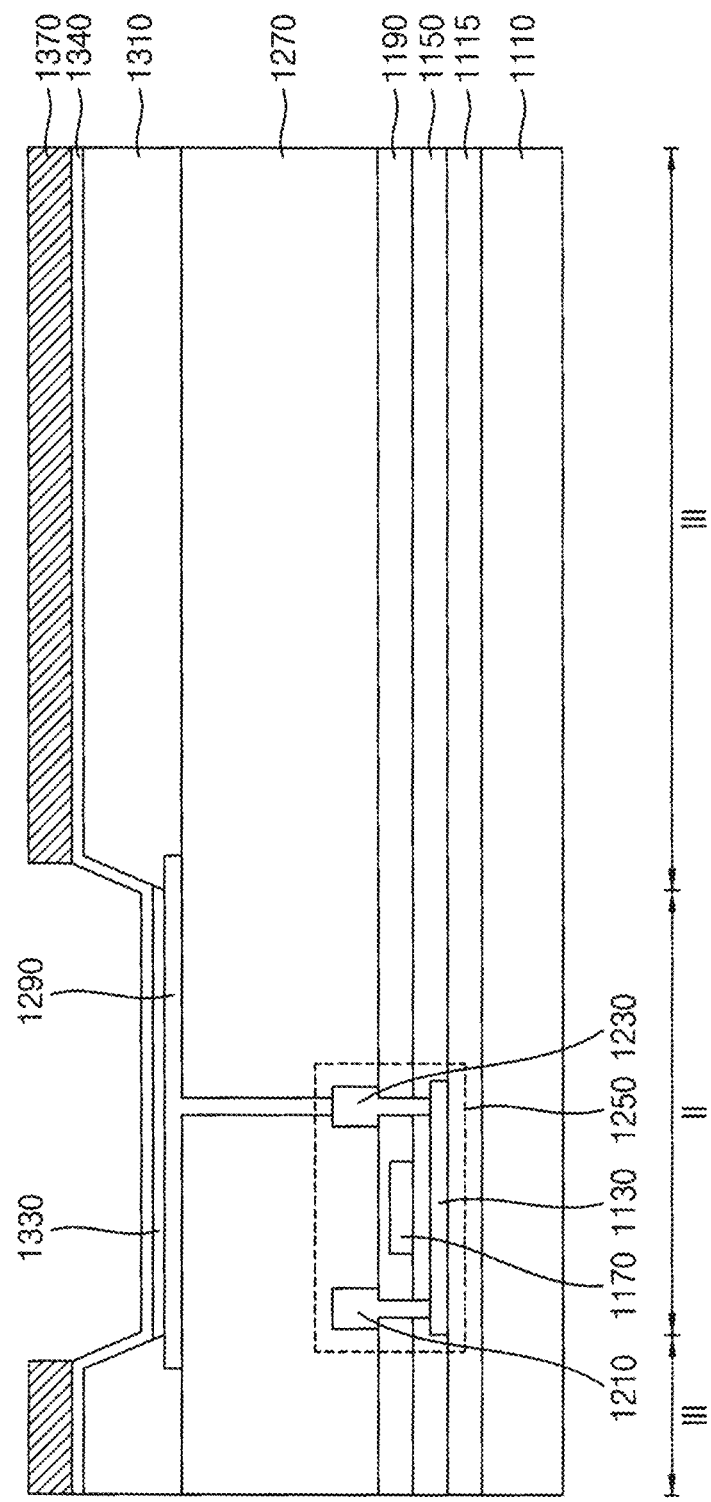

Referring to FIG. 32, the first sensing electrode 1370 is disposed on the first substrate 1110 on which the second electrode 1340 is disposed.

The first sensing electrode 1370 is disposed on a first substrate 1110. The first sensing electrode 370 may be disposed in the reflection region III and outside of the light-emitting region II.

The first sensing electrode 1370 may include a material having a predetermined reflectivity. In an exemplary embodiment, the first sensing electrode 1370 may include gold (Au), silver (Ag), aluminum (Al), magnesium (Mg), platinum (Pt), Nickel (Ni), titanium (Ti), etc., for example. In an alternative exemplary embodiment, the first sensing electrode 1370 may include an alloy, metal nitride, conductive metal oxide, etc. In an exemplary embodiment, the first sensing electrode 1370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 33:
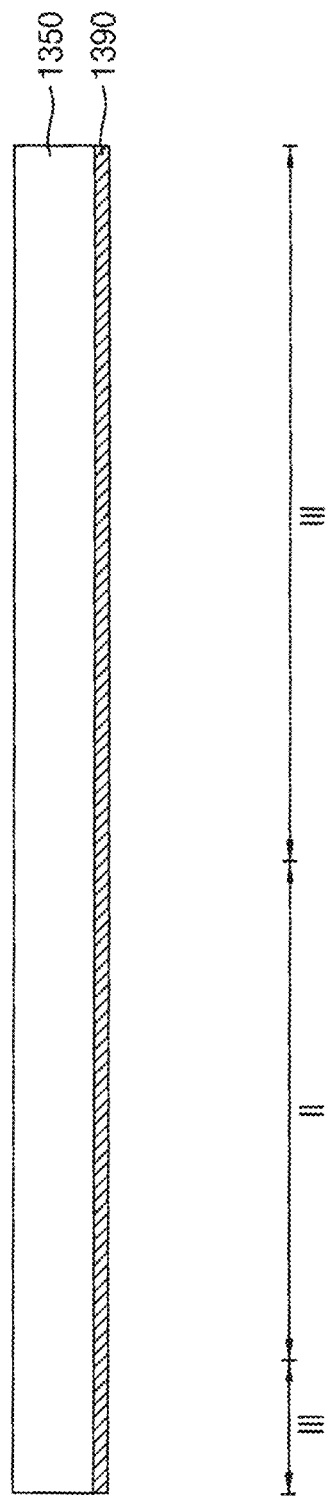

Referring to FIG. 33, the second sensing electrode 1390 is disposed on the second substrate 1350.

The second sensing electrode 1390 may be disposed on the second substrate 1350. The second sensing electrode 1390 may be disposed in the light-emitting region II and the reflection region III.

The second sensing electrode 1390 may include a material having a predetermined reflectivity. In an exemplary embodiment, the second sensing electrode 1390 may include gold (Au), silver (Ag), aluminum (Al), magnesium (Mg), platinum (Pt), Nickel (Ni), titanium (Ti), etc., for example. In an alternative exemplary embodiment, the second sensing electrode 1390 may include an alloy, metal nitride, conductive metal oxide, etc. In an exemplary embodiment, the second sensing electrode 1390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

However, the invention is not limited thereto, and an insulation layer may be disposed between second substrate 1350 and the second sensing electrode 1390.

Figure 34:
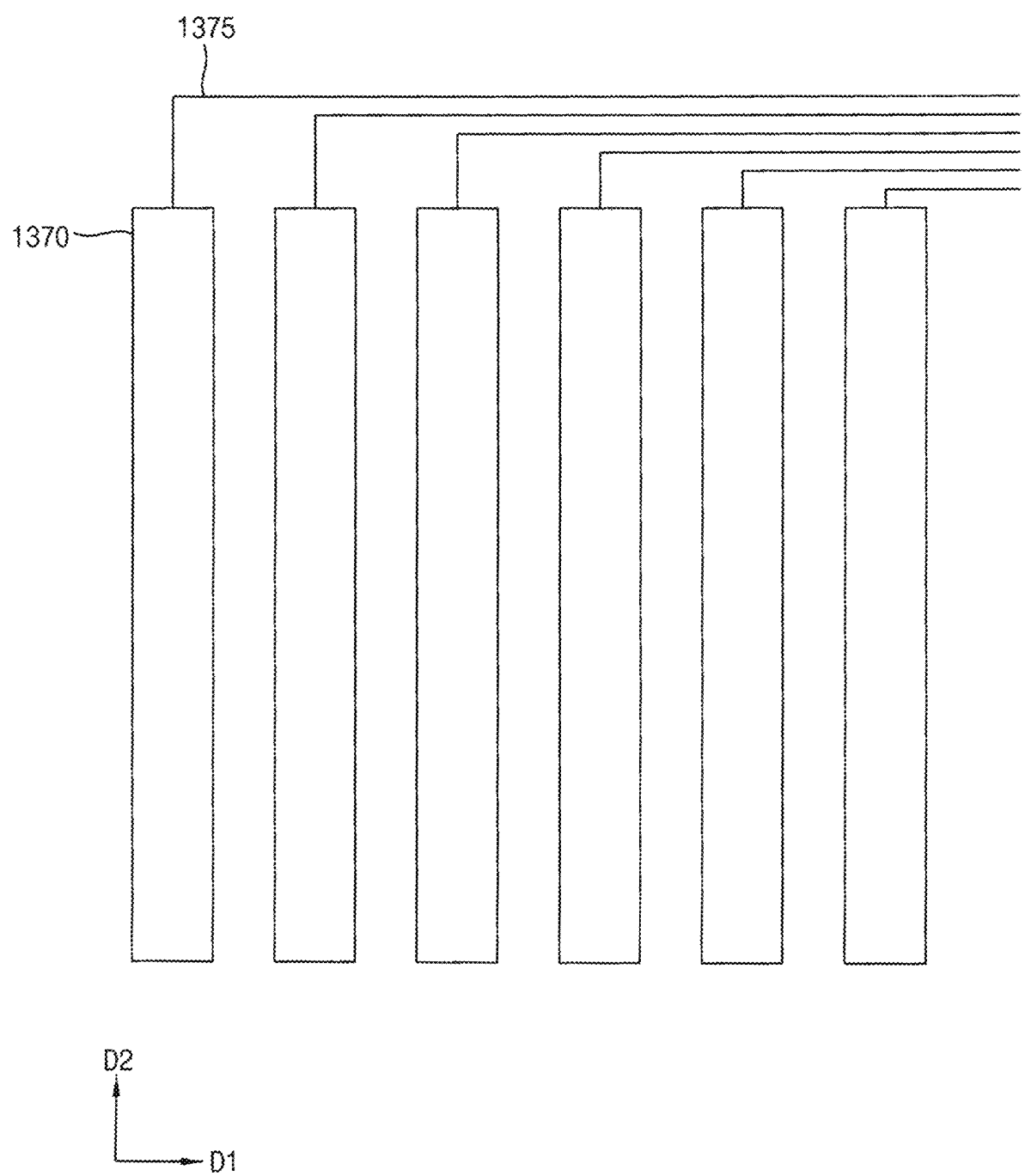
FIG. 34 is a plan view illustrating a first sensing electrode of FIG. 26.
Figure 35:
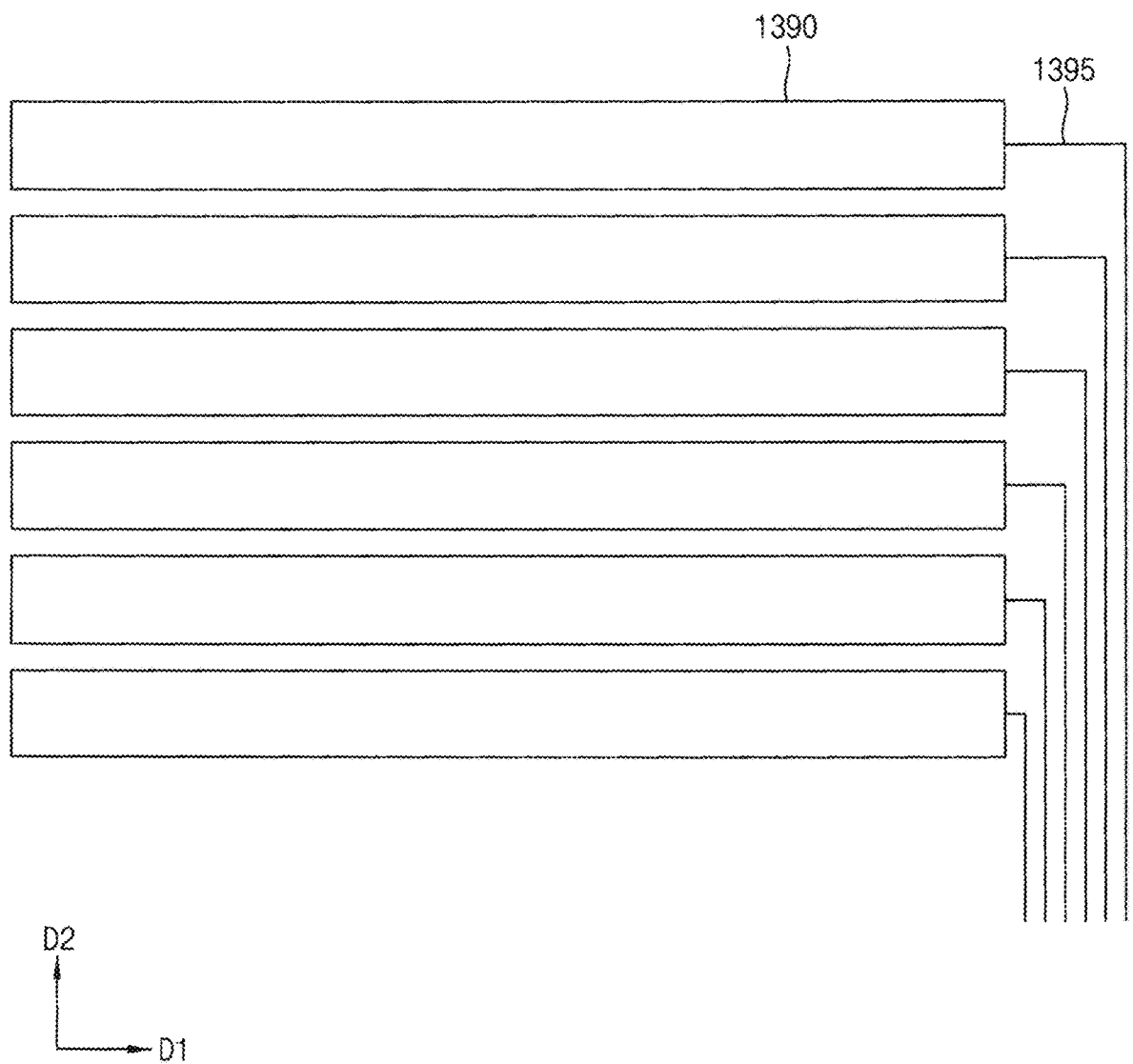
FIG. 35 is a plan view illustrating a second sensing electrode of FIG. 26.
Figure 36:
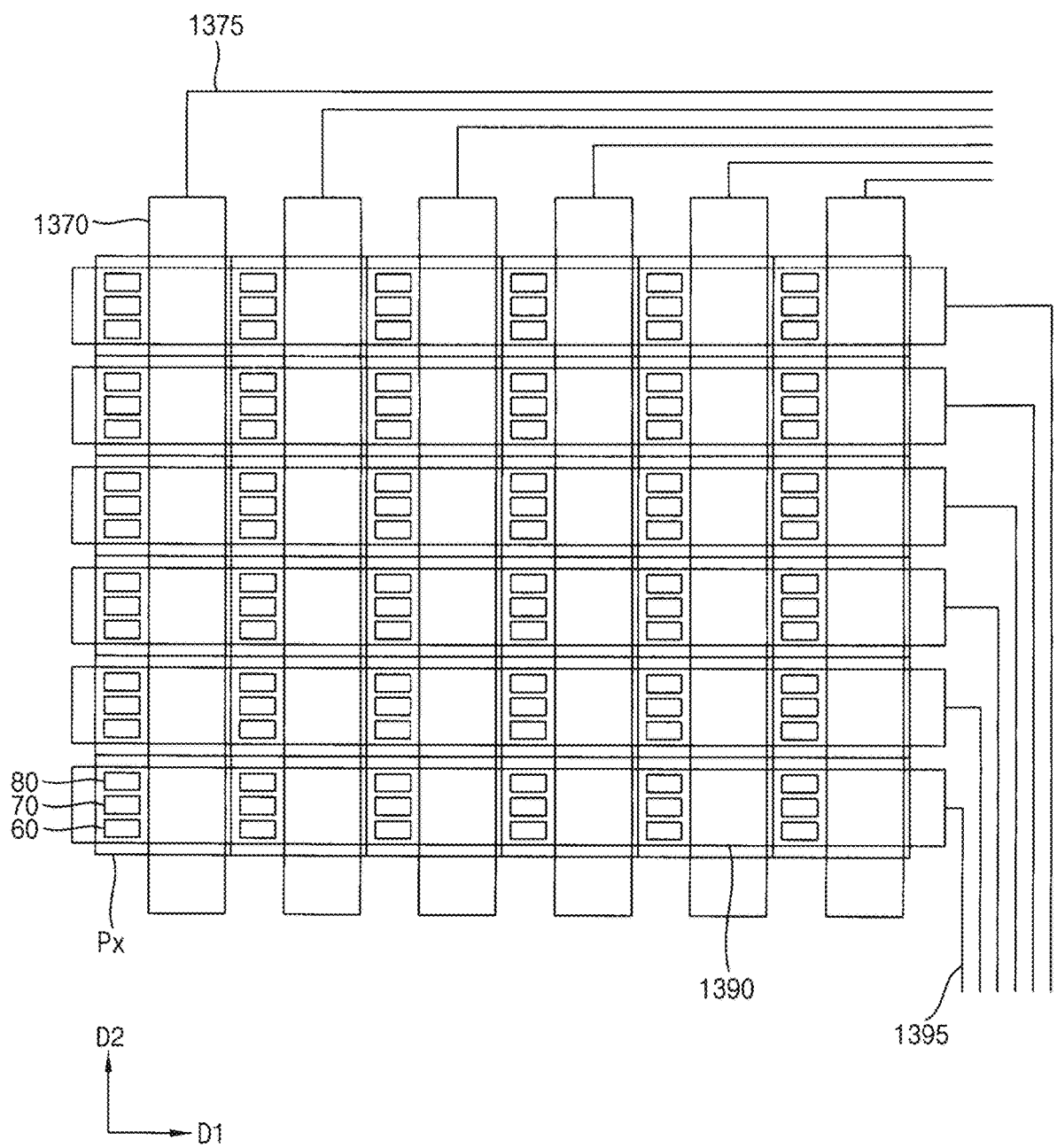
FIG. 36 is a plan view illustrating the first sensing electrode of FIG. 34 and the second sensing electrode of FIG. 35.

FIG. 34 is a plan view illustrating a first sensing electrode of FIG. 26. FIG. 35 is a plan view illustrating a second sensing electrode of FIG. 26. FIG. 36 is a plan view illustrating the first sensing electrode of FIG. 34 and the second sensing electrode of FIG. 35.

Referring to FIGS. 26 and 34 to 36, a first sensing electrode 1370 and a second sensing electrode 1390 are illustrated.

The first sensing electrode 1370 may be provided as a plurality of patterns extending in a second direction D2. The first sensing electrode 1370 is disposed in the reflection region III. The first sensing electrode 1370 may be connected to a sensing driving part through a first connecting line 1375. The first connecting line 1375 may include the same material as that of the first sensing electrode 1370. The first connecting line 1375 may be disposed on the same layer as that on which the first sensing electrode 1370 is disposed.

The second sensing electrode 1390 may be provided as a plurality of patterns extending in a first direction D1 crossing the second direction D2. The second sensing electrode 1390 is disposed in the light-emitting region II and the reflection region III. The second sensing electrode 1390 may be connected to a sensing driving part through a second connecting line 1395. The second connecting line 1395 may include the same material as that of the second sensing electrode 1390. The second connecting line 1395 may be disposed on the same layer as that on which the second sensing electrode 1390 is disposed.

The first sensing electrode 1370 may include a material having a predetermined reflectivity. The second sensing electrode 1390 may include a material having a predetermined reflectivity. The first sensing electrode 1370 may partially overlap the second sensing electrode 1390.

The first sensing electrode 1370 may be disposed on the first substrate 1110. The second sensing electrode 1390 may be disposed on the second substrate 1350.

The first sensing electrode 1370 and second sensing electrode 1390 may perform as a sensing electrode of a touch screen panel of mutual capacitance type. In an exemplary embodiment, when an electric conductor is contacted, capacitance of an intersecting point of the first sensing electrode 1370 and second sensing electrode 1390 around a touch position is changed, for example. Thus, a touch panel sensor (not shown) may decide a touch position based on a capacitance sensing signal corresponding to the change of capacitance.

The first sensing electrode 1370 may have a different thickness from a thickness of the second sensing electrode 1390. In an exemplary embodiment, a thickness of the first sensing electrode 1370 may be about 1000 Å, for example. When the thickness of the first sensing electrode 1370 is about 1000 Å, transmissivity of the first sensing electrode 1370 may be about 0%, and reflexibility of the first sensing electrode 1370 may be greater than about 95%. In addition, a thickness of the second sensing electrode 1390 may be about 100 Å. When the thickness of the second sensing electrode 1390 is about 100 Å, transmissivity of the second sensing electrode 1390 may be greater than about 50% and less than about 95%. When an organic light emitting display device emits light, the second sensing electrode 1390 may display an image in the light-emitting region II, and when an organic light emitting display device does not emit light, the second sensing electrode 1390 may perform a mirror function.

Figure 37:
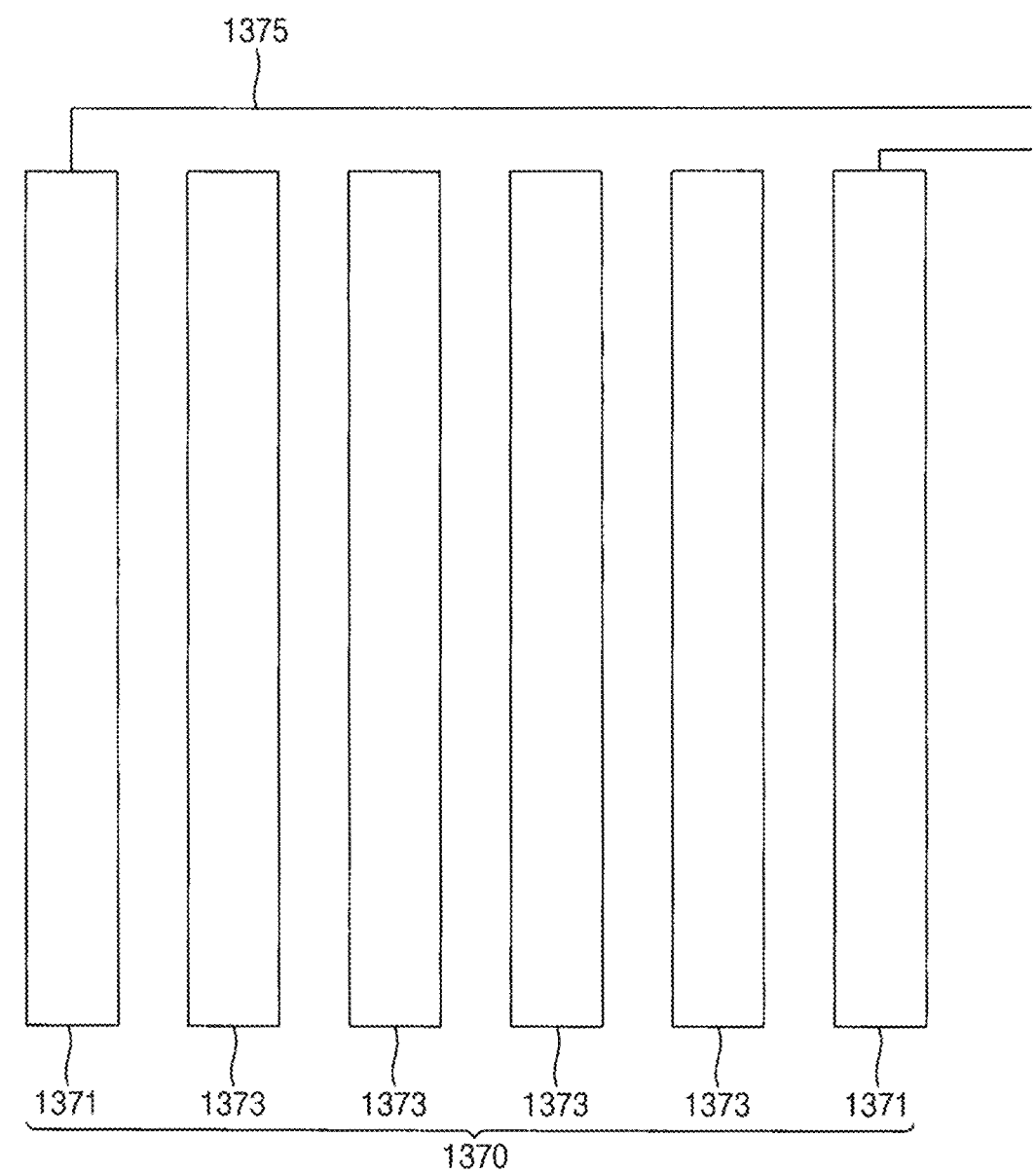
FIG. 37 is a plan view illustrating a first sensing electrode of FIG. 26.
Figure 38:
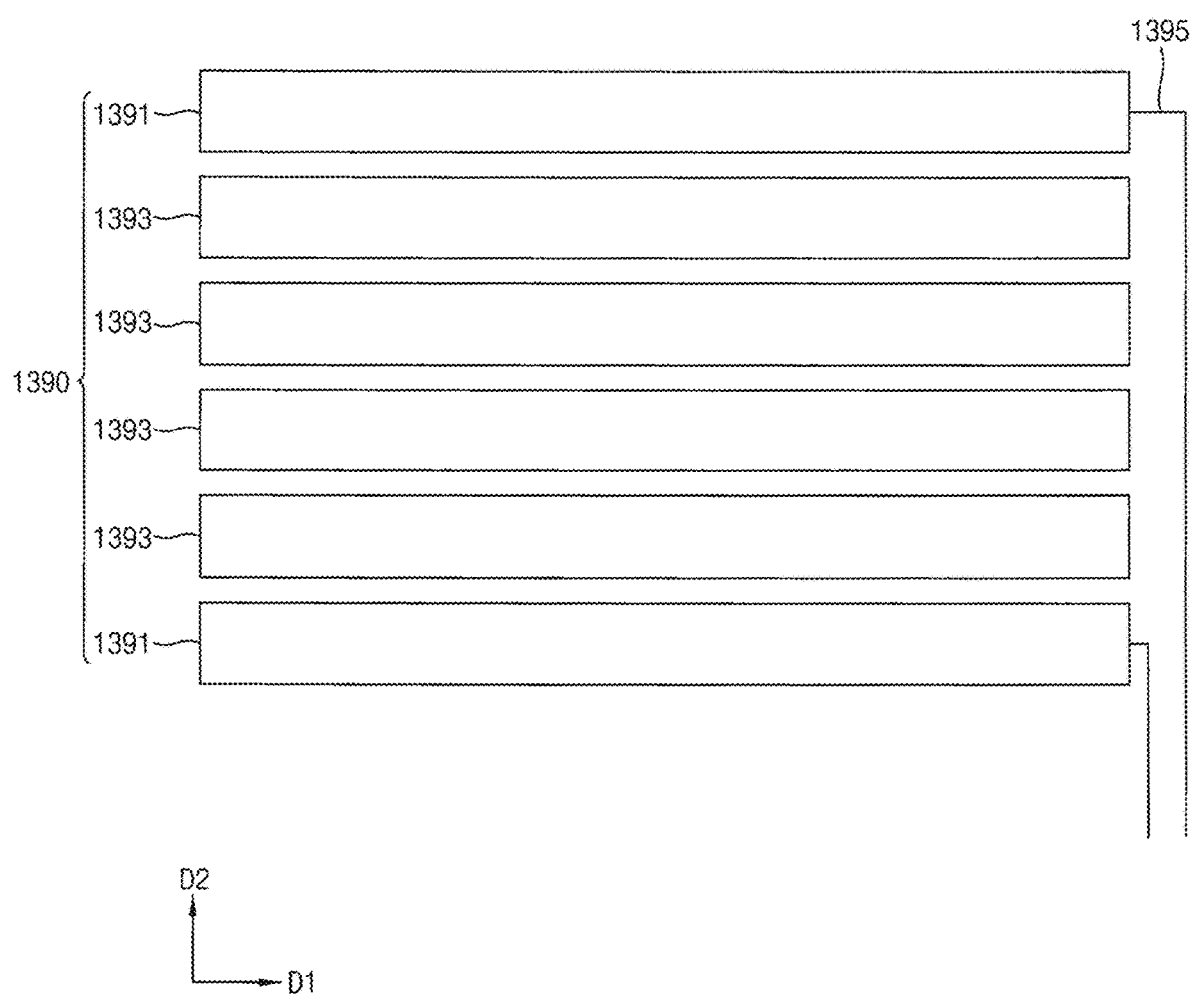
FIG. 38 is a plan view illustrating a second sensing electrode of FIG. 26.
Figure 39:
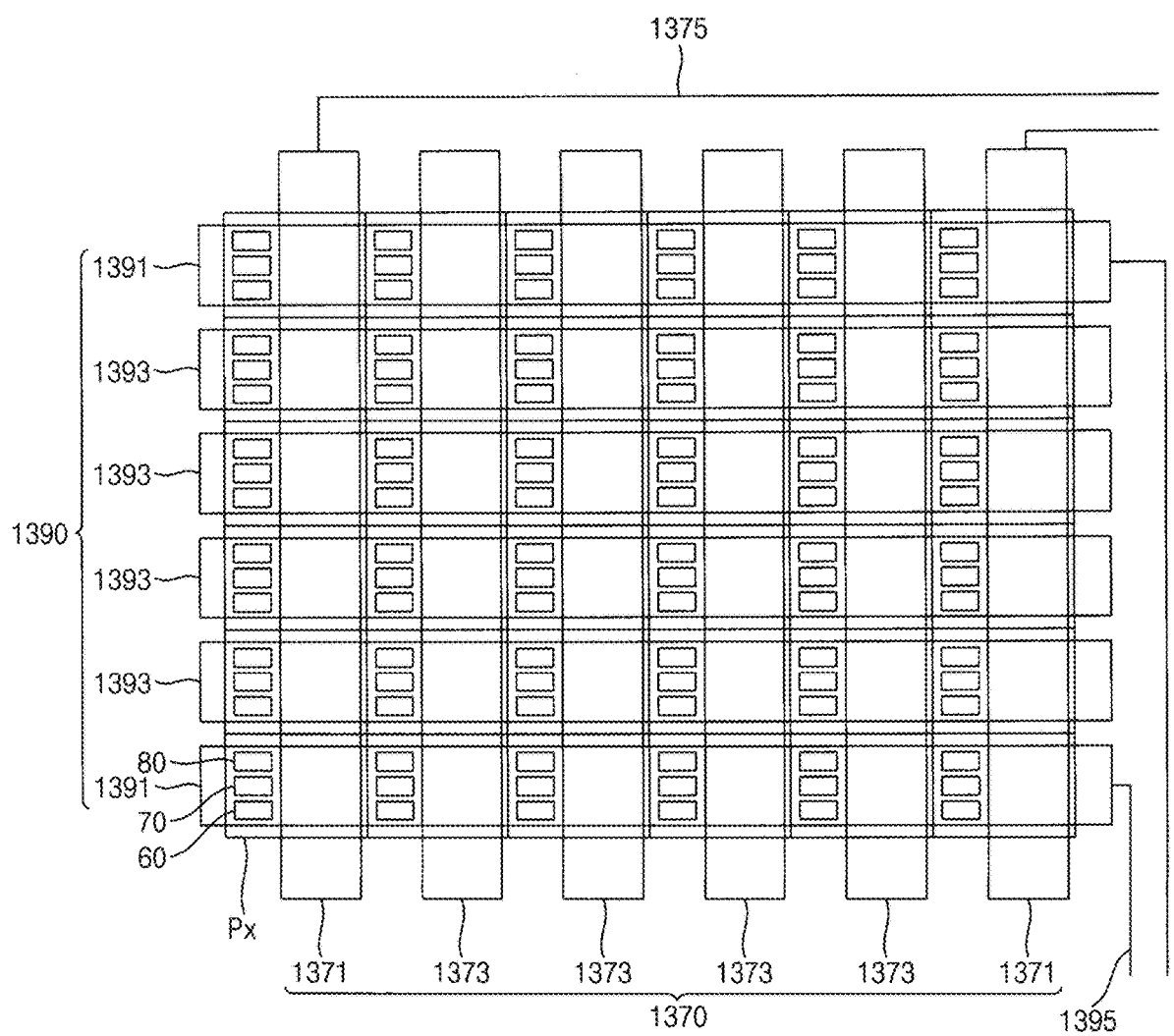
FIG. 39 is a plan view illustrating the first sensing electrode of FIG. 37 and the second sensing electrode of FIG. 38.

FIG. 37 is a plan view illustrating a first sensing electrode of FIG. 26. FIG. 38 is a plan view illustrating a second sensing electrode of FIG. 26. FIG. 39 is a plan view illustrating the first sensing electrode of FIG. 37 and the second sensing electrode of FIG. 38.

Referring to FIGS. 26 and 37 to 39, a first sensing electrode 1370 and a second sensing electrode 1390 are illustrated.

The first sensing electrode 1370 may include a plurality of first sensing patterns 1371 extending in a second direction D2 and a plurality of first dummy patterns 1373 disposed between the first sensing patterns 1371. The first sensing electrode 1370 is disposed in the reflection region III. An interval of the first sensing patterns 1371 may be adjusted according to the number of the first dummy patterns 1373. The first sensing electrode 1370 may be connected to a sensing driving part through a first connecting line 1375. The first connecting line 1375 may include the same material as that of the first sensing electrode 1370. The first connecting line 1375 may be disposed on the same layer as that on which the first sensing electrode 1370 is disposed.

The second sensing electrode 1390 may be provided as a plurality of second sensing patterns 1391 extending in a first direction D1 crossing the second direction D2 and a plurality of second dummy patterns 1393 disposed between the second sensing patterns 1391. The second sensing electrode 1390 is disposed in the light-emitting region II and the reflection region III. An interval of the second sensing electrode 1390 may be adjusted according to the number of the second dummy patterns 1393. The second sensing electrode 1390 may be connected to a sensing driving part through a second connecting line 1395. The second connecting line 1395 may include the same material as that of the second sensing electrode 1390. The second connecting line 1395 may be disposed on the same layer as that on which the second sensing electrode 1390 is disposed.

The first sensing electrode 1370 may include a material having a predetermined reflectivity. The second sensing electrode 1390 may include a material having a predetermined reflectivity. The first sensing electrode 1370 may partially overlap the second sensing electrode 1390.

The first sensing electrode 1370 may be disposed on the first substrate 1110. The second sensing electrode 1390 may be disposed on the second substrate 1350.

The first sensing electrode 1370 and second sensing electrode 1390 may perform as a sensing electrode of a touch screen panel of mutual capacitance type. In an exemplary embodiment, when an electric conductor is contacted, capacitance of an intersecting point of the first sensing electrode 1370 and second sensing electrode 1390 around a touch position is changed, for example. Thus, a touch panel sensor (not shown) may decide a touch position based on a capacitance sensing signal corresponding to the change of capacitance.

The first sensing electrode 1370 may have a different thickness from a thickness of the second sensing electrode 1390. In an exemplary embodiment, a thickness of the first sensing electrode 1370 may be about 1000 Å, for example. When the thickness of the first sensing electrode 1370 is about 1000 Å, transmissivity of the first sensing electrode 1370 may be about 0%, and reflexibility of the first sensing electrode 1370 may be greater than about 95%. In addition, a thickness of the second sensing electrode 1390 may be about 100 Å. When the thickness of the second sensing electrode 1390 is about 100 Å, transmissivity of the second sensing electrode 1390 may be greater than about 50% and less than about 95%. When an organic light emitting display device emits light, the second sensing electrode 1390 may display an image in the light-emitting region II, and when an organic light emitting display device does not emit light, the second sensing electrode 1390 may perform a mirror function.

Figure 40:
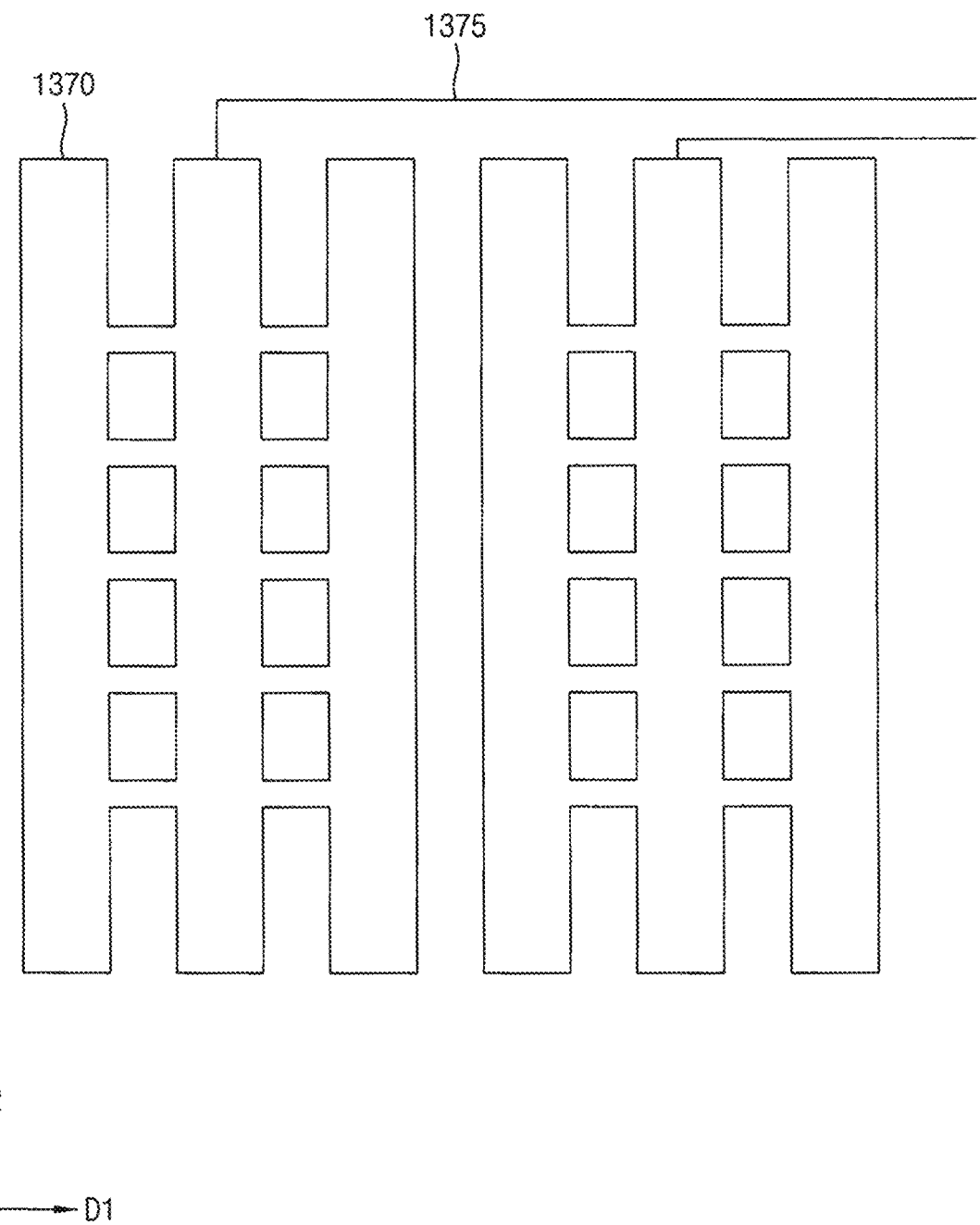
FIG. 40 is a plan view illustrating a first sensing electrode of FIG. 26.
Figure 41:
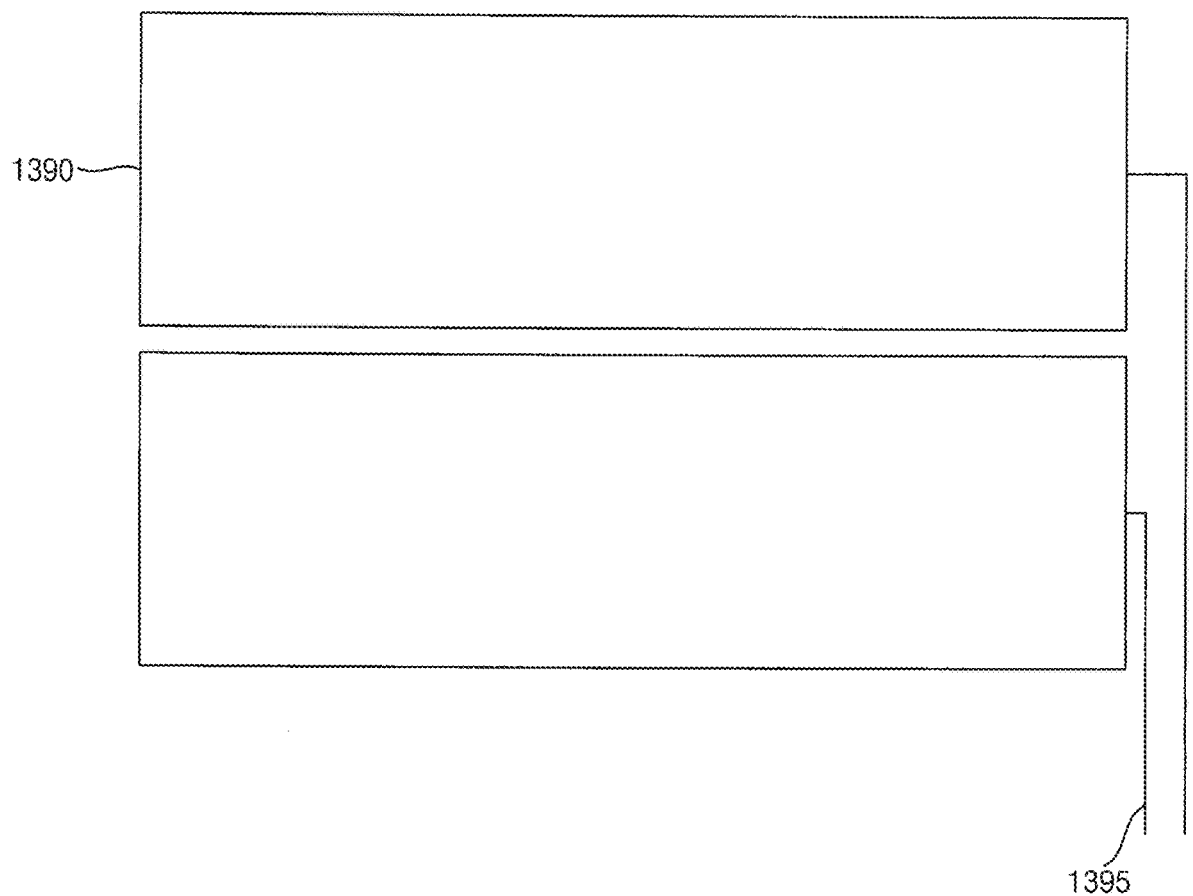
FIG. 41 is a plan view illustrating a second sensing electrode of FIG. 26.
Figure 42:
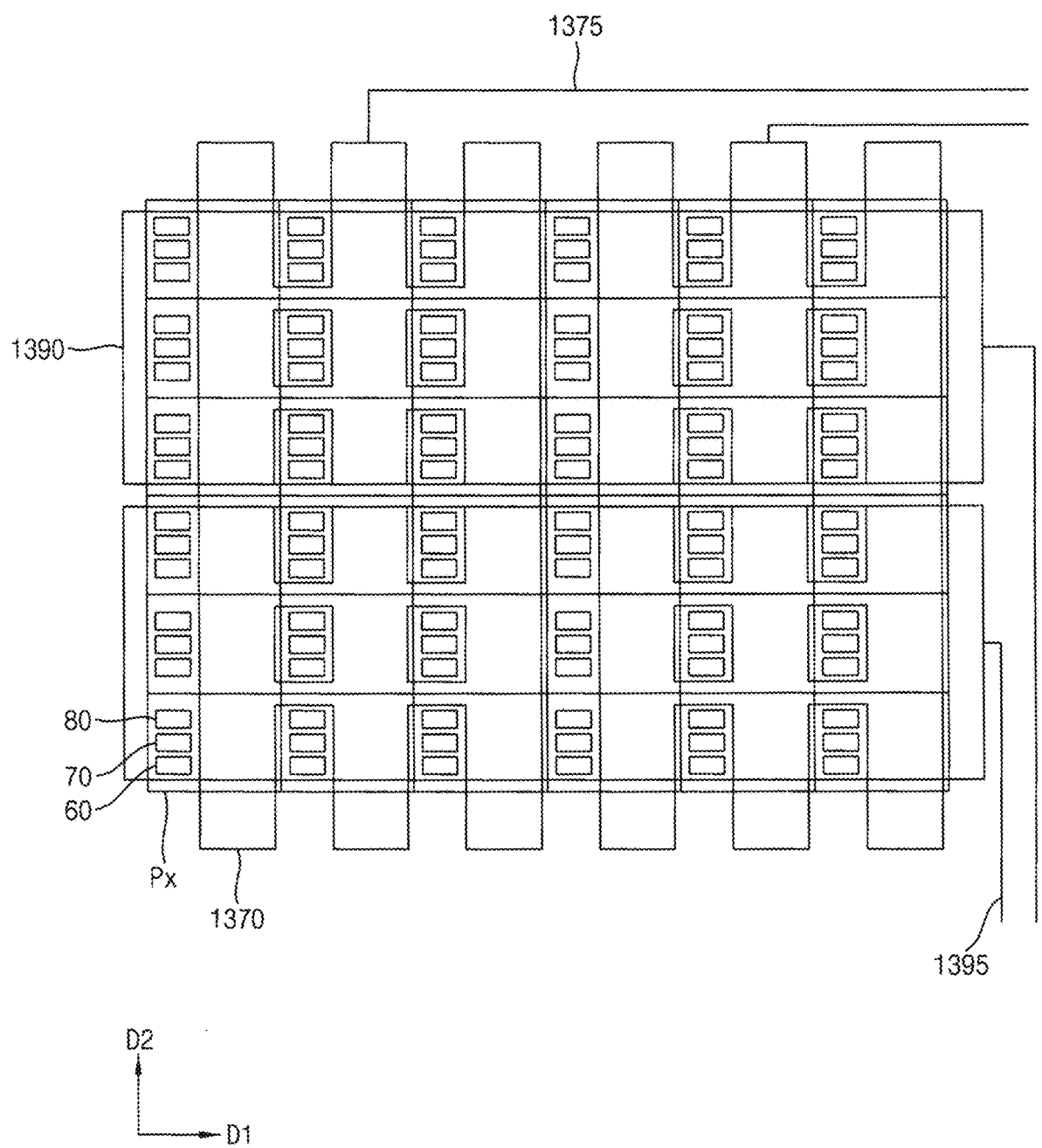
FIG. 42 is a plan view illustrating the first sensing electrode of FIG. 40 and the second sensing electrode of FIG. 41.

FIG. 40 is a plan view illustrating a first sensing electrode of FIG. 26. FIG. 41 is a plan view illustrating a second sensing electrode of FIG. 26. FIG. 42 is a plan view illustrating the first sensing electrode of FIG. 40 and the second sensing electrode of FIG. 41.

Referring to FIGS. 26 and 40 to 42, a first sensing electrode 1370 and a second sensing electrode 1390 are illustrated.

The first sensing electrode 1370 may be provided as a plurality of patterns extending in a second direction D2. The first sensing electrode 1370 may be provided as a mesh shape. The first sensing electrode 1370 is disposed in the reflection region III. The first sensing electrode 1370 may be connected to a sensing driving part through a first connecting line 1375. The first connecting line 1375 may include the same material as that of the first sensing electrode 1370. The first connecting line 1375 may be disposed on the same layer as that on which the first sensing electrode 1370 is disposed.

The second sensing electrode 1390 may be provided as a plurality of patterns extending in a first direction D1 crossing the second direction D2. A width of the second sensing electrode 1390 in the second direction D2 is the same as a width of the first sensing electrode 1370 in the first direction D1. The second sensing electrode 1390 is disposed in the light-emitting region II and the reflection region III. The second sensing electrode 1390 may be connected to a sensing driving part through a second connecting line 1395. The second connecting line 1395 may include the same material as that of the second sensing electrode 1390. The second connecting line 1395 may be disposed on the same layer as that on which the second sensing electrode 1390 is disposed.

The first sensing electrode 1370 may include a material having a predetermined reflectivity. The second sensing electrode 1390 may include a material having a predetermined reflectivity. The first sensing electrode 1370 may partially overlap the second sensing electrode 1390.

The first sensing electrode 1370 may be disposed on the first substrate 1110. The second sensing electrode 1390 may be disposed on the second substrate 1350.

The first sensing electrode 1370 and second sensing electrode 1390 may perform as a sensing electrode of a touch screen panel of mutual capacitance type. In an exemplary embodiment, when an electric conductor is contacted, capacitance of an intersecting point of the first sensing electrode 1370 and second sensing electrode 1390 around a touch position is changed, for example. Thus, a touch panel sensor (not shown) may decide a touch position based on a capacitance sensing signal corresponding to the change of capacitance.

The first sensing electrode 1370 may have a different thickness from a thickness of the second sensing electrode 1390. In an exemplary embodiment, a thickness of the first sensing electrode 1370 may be about 1000 Å, for example. When the thickness of the first sensing electrode 1370 is about 1000 Å, transmissivity of the first sensing electrode 1370 may be about 0%, and reflexibility of the first sensing electrode 1370 may be greater than about 95%. In addition, a thickness of the second sensing electrode 1390 may be about 100 Å. When the thickness of the second sensing electrode 1390 is about 100 Å, transmissivity of the second sensing electrode 1390 may be greater than about 50% and less than about 95%. When an organic light emitting display device emits light, the second sensing electrode 1390 may display an image in the light-emitting region II, and when an organic light emitting display device does not emit light, the second sensing electrode 1390 may perform a mirror function.

Figure 43:
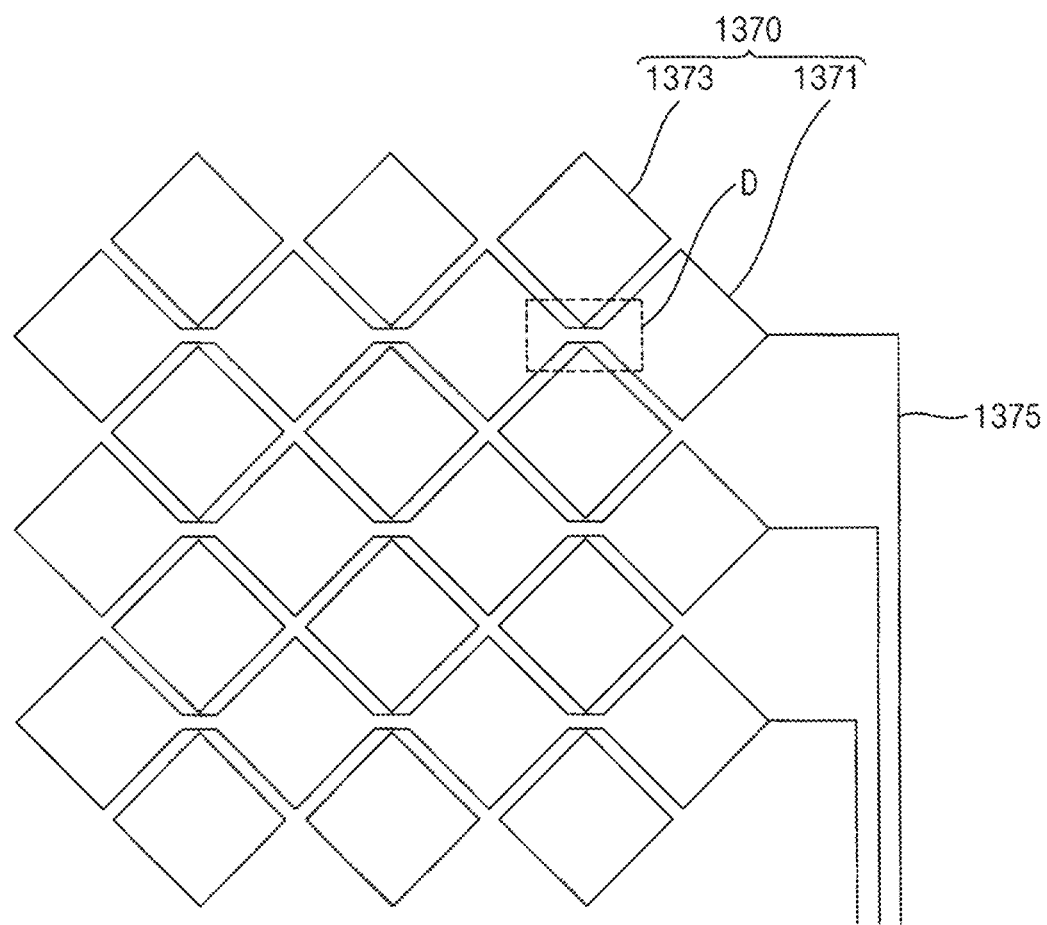
FIG. 43 is a plan view illustrating a first sensing electrode of FIG. 26.
Figure 44:
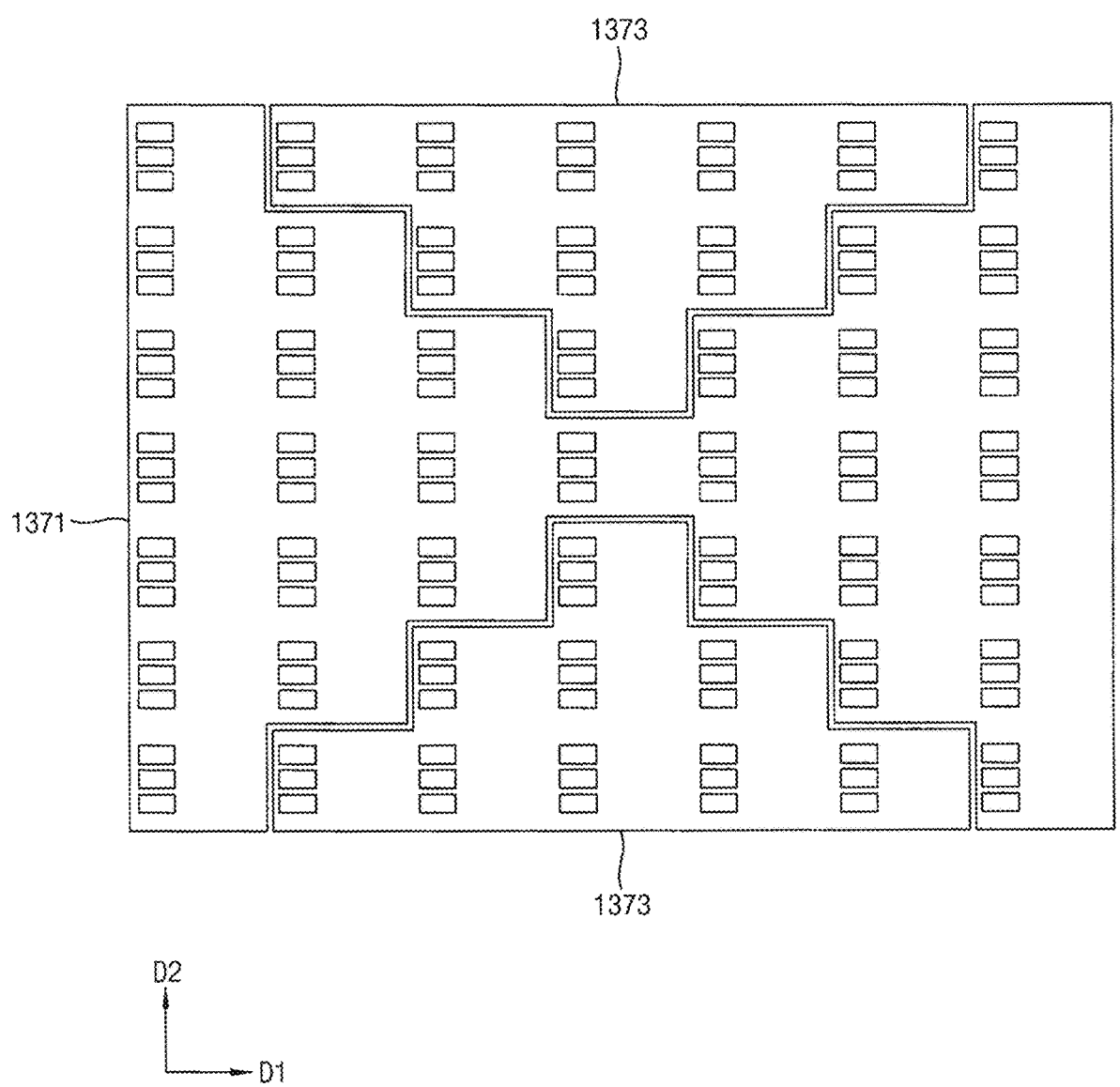
FIG. 44 is a plan view magnifying 'D' portion of FIG. 43.
Figure 45:
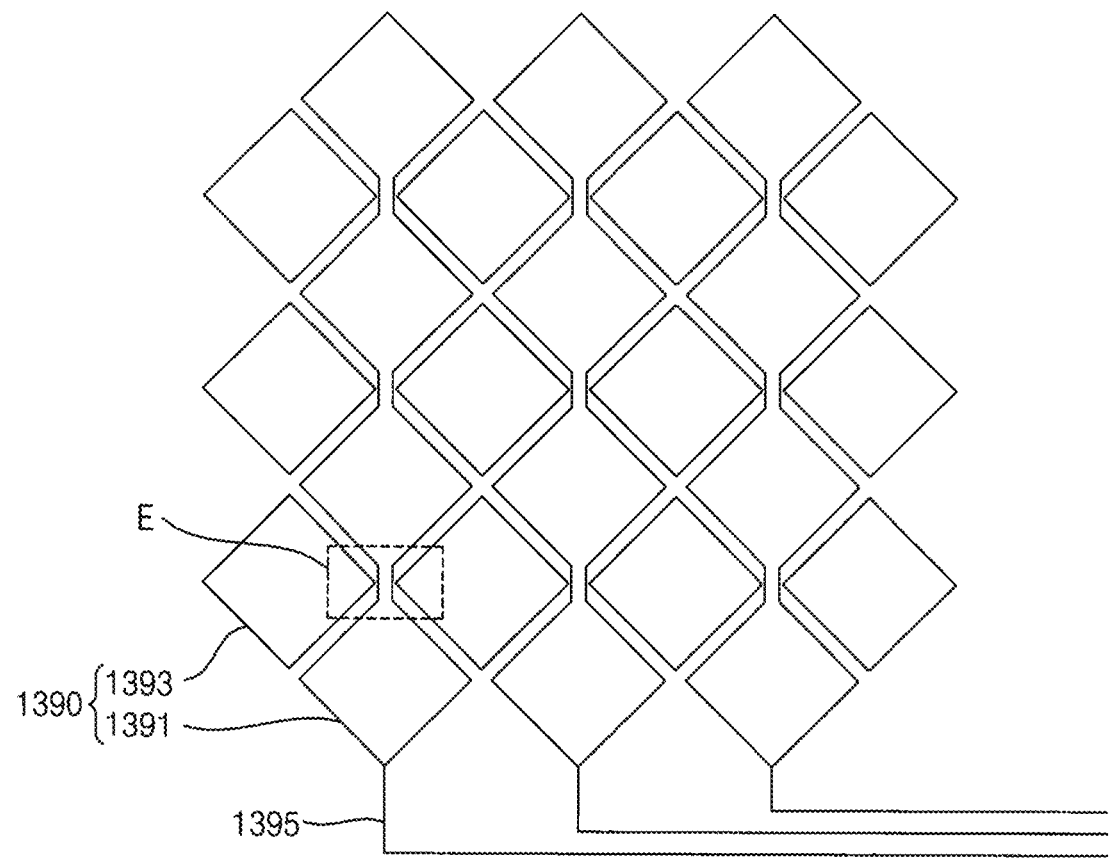
FIG. 45 is a plan view illustrating a second sensing electrode of FIG. 26.
Figure 46:
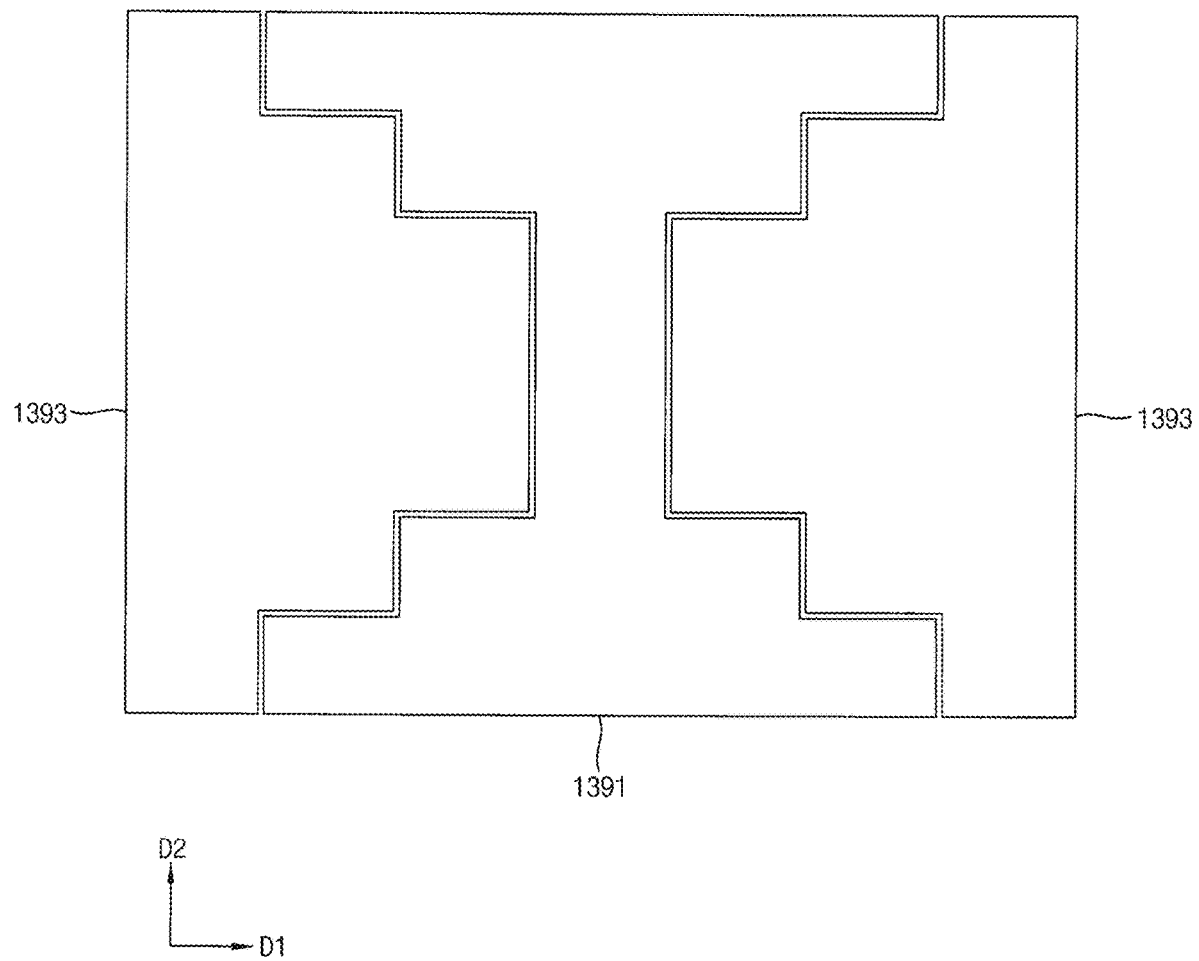
FIG. 46 is a plan view magnifying 'E' portion of FIG. 45.
Figure 47:
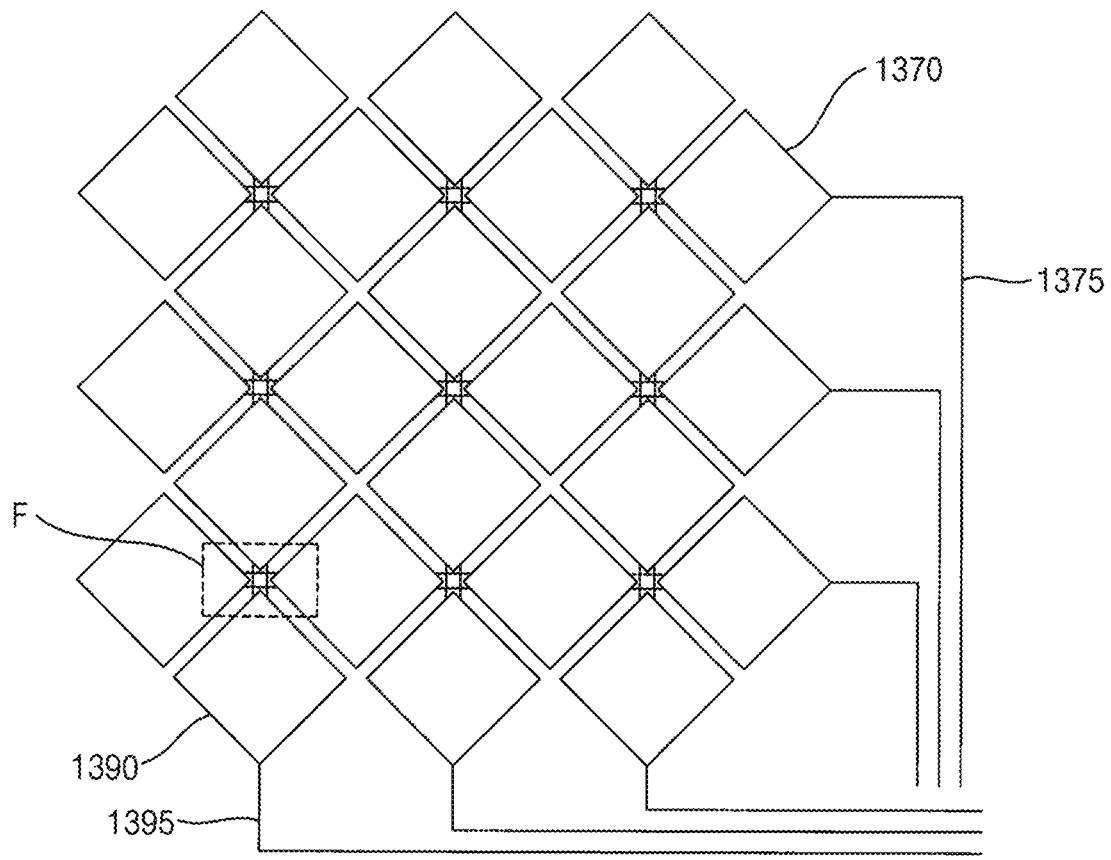
FIG. 47 is a plan view illustrating the first sensing electrode of FIG. 43 and the second sensing electrode of FIG. 45.
Figure 48:
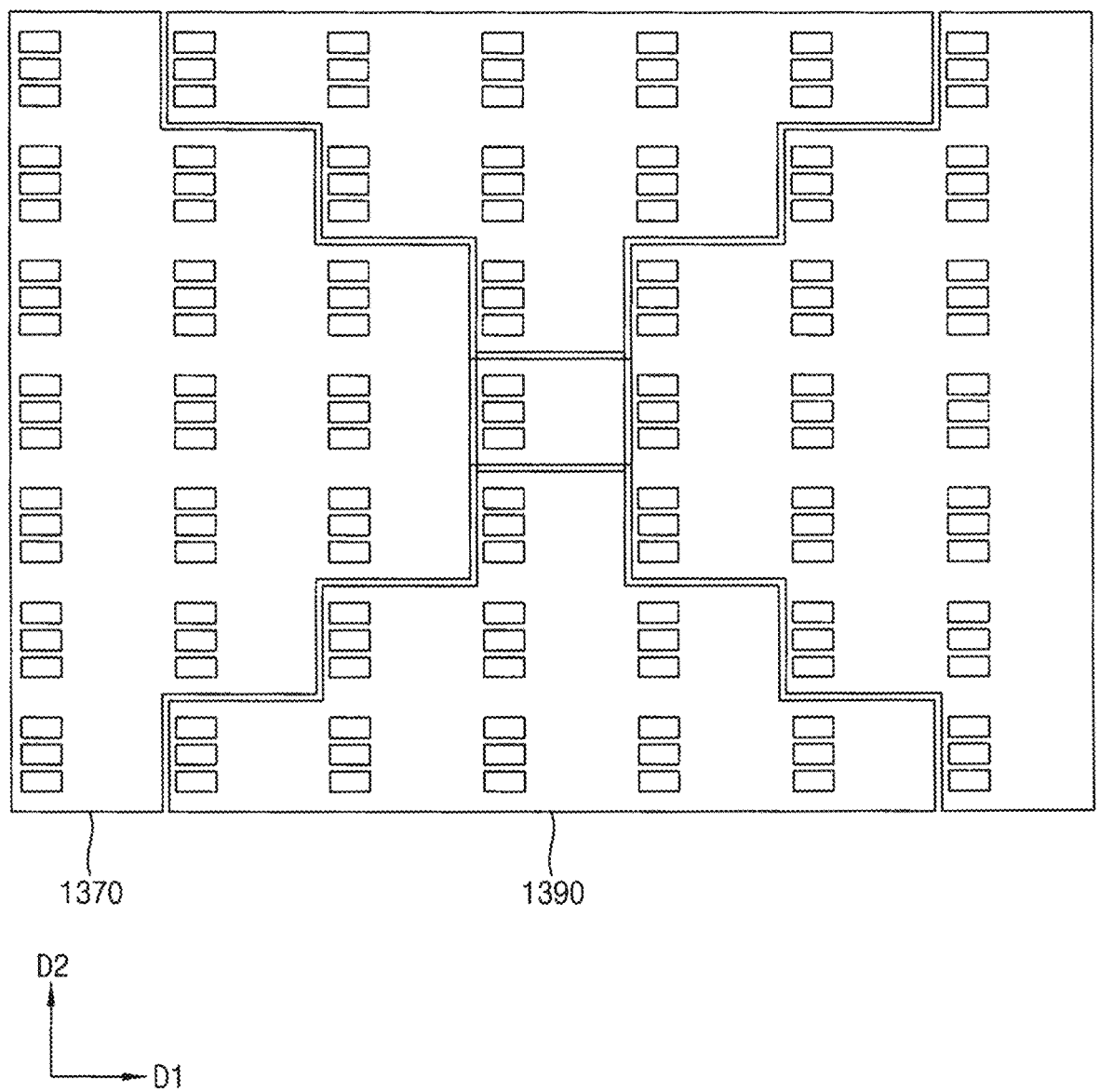
FIG. 48 is a plan view magnifying 'F' portion of FIG. 47.

FIG. 43 is a plan view illustrating a first sensing electrode of FIG. 26. FIG. 44 is a plan view magnifying 'D' portion of FIG. 43. FIG. 45 is a plan view illustrating a second sensing electrode of FIG. 26. FIG. 46 is a plan view magnifying 'E' portion of FIG. 45. FIG. 47 is a plan view illustrating the first sensing electrode of FIG. 43 and the second sensing electrode of FIG. 45. FIG. 48 is a plan view magnifying 'F' portion of FIG. 47.

Referring to FIGS. 26 and 43 to 48, a first sensing electrode 1370 and a second sensing electrode 1390 are illustrated.

The first sensing electrode 1370 may include plurality of first sensing patterns 1371 having a rhombus shape and sequentially connected each other in a first direction D1 and a plurality of first dummy patterns 1373 having a rhombus shape and disposed between the first sensing patterns 1371. The first dummy patterns 1373 are spaced apart from each other. The first sensing electrode 1370 is disposed in the reflection region III. The first sensing electrode 1370 may be connected to a sensing driving part through a first connecting line 1375. The first connecting line 1375 may include the same material as that of the first sensing electrode 1370. The first connecting line 1375 may be disposed on the same layer as that on which the first sensing electrode 1370 is disposed.

The second sensing electrode 1390 may include plurality of second sensing patterns 1391 having a rhombus shape and sequentially connected each other in a second direction D2 and a plurality of second dummy patterns 1393 having a rhombus shape and disposed between the second sensing patterns 1391. The second dummy patterns 1393 are spaced apart from each other. The second sensing electrode 1390 is disposed in the light-emitting region II and the reflection region III. The second sensing electrode 1390 may be connected to a sensing driving part through a second connecting line 1395. The second connecting line 1395 may include the same material as that of the second sensing electrode 1390. The second connecting line 1395 may be disposed on the same layer as that on which the second sensing electrode 1390 is disposed.

The first sensing electrode 1370 may include a material having a predetermined reflectivity. The second sensing electrode 1390 may include a material having a predetermined reflectivity. The first sensing electrode 1370 may partially overlap the second sensing electrode 1390.

The first sensing electrode 1370 may be disposed on the first substrate 1110. The second sensing electrode 1390 may be disposed on the second substrate 1350.

The first sensing electrode 1370 and second sensing electrode 1390 may perform as a sensing electrode of a touch screen panel of mutual capacitance type. In an exemplary embodiment, when an electric conductor is contacted, capacitance of an intersecting point of the first sensing electrode 1370 and second sensing electrode 1390 around a touch position is changed, for example. Thus, a touch panel sensor (not shown) may decide a touch position based on a capacitance sensing signal corresponding to the change of capacitance.

The first sensing electrode 1370 may have a different thickness from a thickness of the second sensing electrode 1390. In an exemplary embodiment, a thickness of the first sensing electrode 1370 may be about 1000 Å, for example. When the thickness of the first sensing electrode 1370 is about 1000 Å, transmissivity of the first sensing electrode 1370 may be about 0%, and reflexibility of the first sensing electrode 1370 may be greater than about 95%. In addition, a thickness of the second sensing electrode 1390 may be about 100 Å. When the thickness of the second sensing electrode 1390 is about 100 Å, transmissivity of the second sensing electrode 1390 may be greater than about 50% and less than about 95%. When an organic light emitting display device emits light, the second sensing electrode 1390 may display an image in the light-emitting region II, and when an organic light emitting display device does not emit light, the second sensing electrode 1390 may perform a mirror function.

Figure 49:
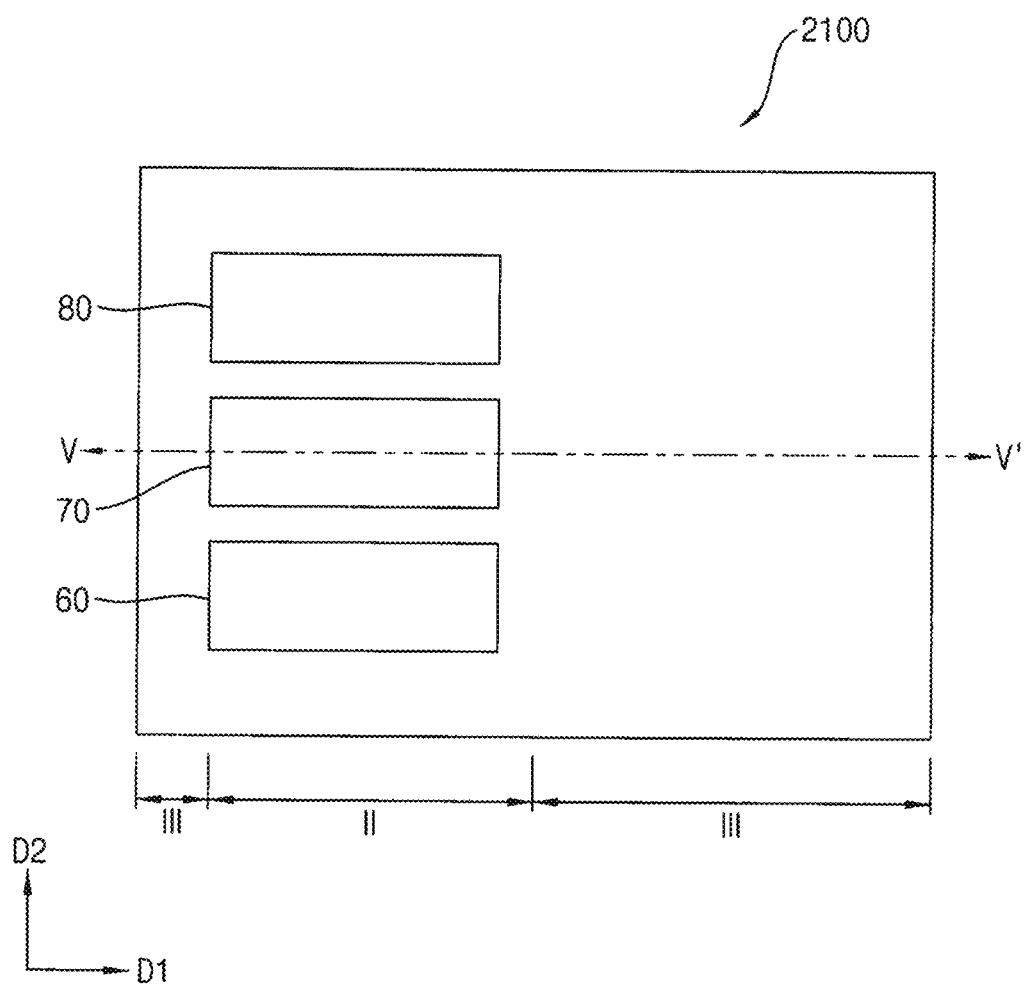
FIG. 49 is a plan view illustrating an exemplary embodiment of an organic light emitting display device according to the invention.
Figure 50:
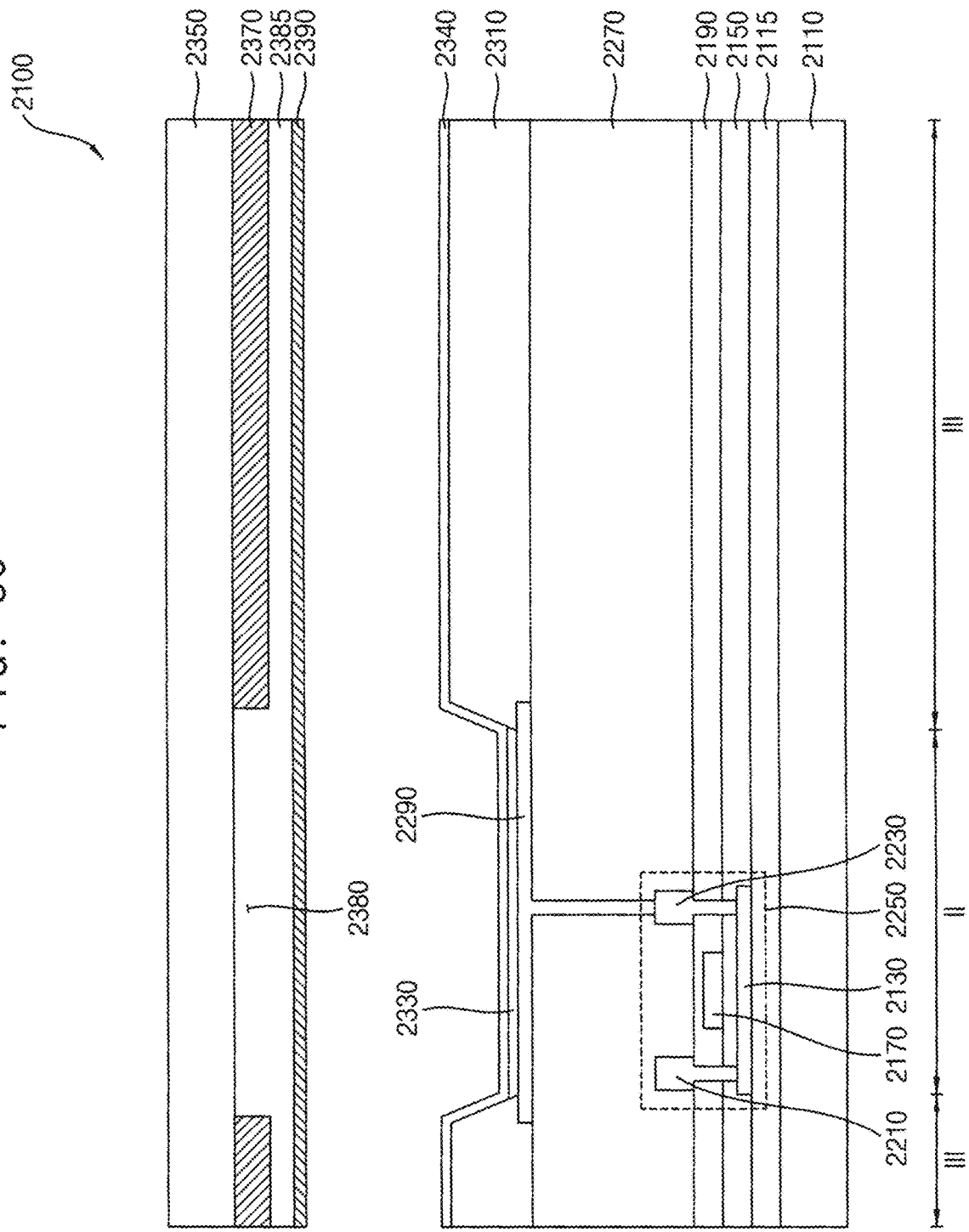
FIG. 50 is a cross-sectional view taken along line V-V' of FIG. 49.

FIG. 49 is a plan view illustrating an organic light emitting display device according to an exemplary embodiment of the invention. FIG. 50 is a cross-sectional view taken along line V-V' of FIG. 49.

An organic light emitting display device according to the illustrated exemplary embodiment is substantially same as the organic light emitting display device of FIGS. 1 and 2 except for a first sensing electrode 2370, a fourth insulation layer 2385 and a second sensing electrode 2390 and thus similar reference numerals are used for same elements and repetitive explanation will be omitted.

Referring to FIGS. 49 and 50, the first sensing electrode 2370 is disposed on a second substrate 2350. The first sensing electrode 2370 may be disposed in the reflection region III and outside of the light-emitting region II. The fourth insulation layer 2385 is disposed on the first sensing electrode 2370. The second sensing electrode 2390 is disposed on the fourth insulation layer 2385.

The first sensing electrode 2370 may include a material having a predetermined reflectivity. In an exemplary embodiment, the first sensing electrode 2370 may include gold (Au), silver (Ag), aluminum (Al), magnesium (Mg), platinum (Pt), Nickel (Ni), titanium (Ti), etc., for example. In an alternative exemplary embodiment, the first sensing electrode 2370 may include an alloy, metal nitride, conductive metal oxide, etc. In an exemplary embodiment, the first sensing electrode 2370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 2350 and the first substrate 2110 may include substantially the same materials. In an exemplary embodiment, the second substrate 2350 may include quartz, synthetic quartz, calcium fluoride, fluoride-doping quartz, sodalime glass, non-alkali glass etc., for example. In exemplary embodiments, the second substrate 2350 may include a transparent inorganic material or flexible plastic. In an exemplary embodiment, the second substrate 2350 may include a flexible transparent resin substrate, for example. In this case, to increase flexibility of the organic light emitting display device 2100, the second substrate 2350 may include a stacked structure where at least one organic layer and at least one inorganic layer are alternately stacked.

The fourth insulation layer 2385 is disposed on the first sensing electrode 2370. The fourth insulation layer 2385 may includes an adhesive material.

The second sensing electrode 2390 is disposed on the fourth insulation layer 2385. The second sensing electrode 2390 may be disposed in the light-emitting region II and the reflection region III.

The second sensing electrode 2390 may include a material having a predetermined reflectivity. In an exemplary embodiment, the second sensing electrode 2390 may include gold (Au), silver (Ag), aluminum (Al), magnesium (Mg), platinum (Pt), Nickel (Ni), titanium (Ti), etc., for example. In an alternative exemplary embodiment, the second sensing electrode 2390 may include an alloy, metal nitride, conductive metal oxide, etc. In an exemplary embodiment, the second sensing electrode 2390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The first sensing electrode 2370 may have a different thickness from a thickness of the second sensing electrode 2390. In a exemplary embodiment, a thickness of the first sensing electrode 2370 may be about 1000 Å, for example. When the thickness of the first sensing electrode 2370 is about 1000 Å, transmissivity of the first sensing electrode 2370 may be about 0%, and reflexibility of the first sensing electrode 2370 may be greater than about 95%. In addition, a thickness of the second sensing electrode 2390 may be about 100 Å. When the thickness of the second sensing electrode 2390 is about 100 Å, transmissivity of the second sensing electrode 2390 may be greater than about 50% and less than about 95%. When an organic light emitting display device emits light, the second sensing electrode 2390 may display an image in the light-emitting region II, and when an organic light emitting display device does not emit light, the second sensing electrode 2390 may perform a mirror function.

FIGS. 51 to 58 are cross-sectional views illustrating a method of manufacturing the organic light emitting display device of FIG. 50.

Figure 51:
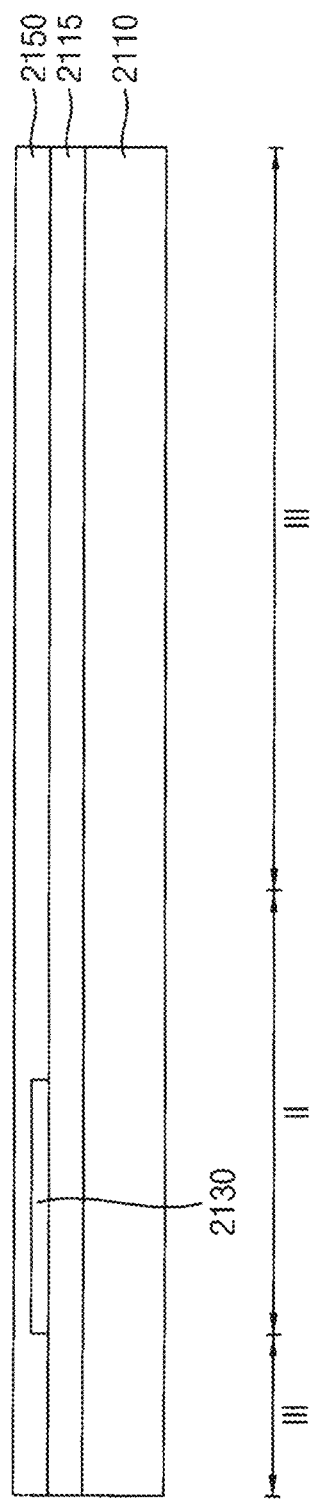
FIGS. 51 to 58 are cross-sectional views illustrating a method of manufacturing the organic light emitting display device of FIG. 50.

Referring to FIG. 51, the buffer layer 2115 is disposed on the first substrate 2110. Thereafter, the active pattern 2130 and the first insulation layer 2150 are disposed on the buffer layer 2115.

In an exemplary embodiment, the first substrate 2110 may include quartz, synthetic quartz, calcium fluoride, fluoride-doping quartz, a sodalime glass, a non-alkali glass etc., for example.

The light emitting structure may be disposed on the first substrate 2110. The first substrate 2110 may include transparent materials. In an exemplary embodiment, the first substrate 2110 may include quartz, synthetic quartz, calcium fluoride, fluoride-doping quartz, a sodalime glass, a non-alkali glass etc., for example. In an alternative exemplary embodiment, the first substrate 2110 may include a flexible transparent resin substrate. Here, the flexible transparent resin substrate for the first substrate 2110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 2110 may have a structure in which the first polyimide layer, the barrier film layer and the second polyimide layer are stacked on a glass substrate. Here, after an insulation layer is provided on the second polyimide layer, the light emitting structure (e.g., the semiconductor element 2250, a capacitor, the first electrode 2290, the light emitting layer 2330, the second electrode 2340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 2110 after the removal of the glass substrate. As the organic light emitting display device 2100 includes the light-emitting region II and the reflection region III, the first substrate 2110 may also include the light-emitting region II and the reflection region III.

A buffer layer 2115 may be disposed on the first substrate 2110. The buffer layer 2115 may extend from the light-emitting region II into the reflection region III. The buffer layer 2115 may prevent the diffusion (e.g., an out gassing) of metal atoms and/or impurities from the first substrate 2110. Additionally, the buffer layer 2115 may control a rate of a heat transfer in a crystallization process for forming the active pattern 2130, thereby obtaining substantially uniform the active pattern 2130. Furthermore, the buffer layer 2115 may improve a surface flatness of the first substrate 2110 when a surface of the first substrate 2110 is relatively irregular. According to a type of the first substrate 2110, at least two buffer layers may be provided on the first substrate 2110, or the buffer layer may not be disposed.

In an exemplary embodiment, the active pattern 2130 may include an oxide semiconductor, an inorganic semiconductor (e.g., amorphous silicon, polysilicon, etc.), an organic semiconductor, etc., for example.

The first insulation layer 2150 may be disposed on the active pattern 2130. The first insulation layer 2150 may cover the active pattern 2130 in the light-emitting region II, and may extend in the first direction on the first substrate 2110. That is, the first insulation layer 2150 may be disposed on the entire surface of the first substrate 2110. In an exemplary embodiment, the first insulation layer 2150 may include a silicon compound, a metal oxide, etc., for example.

Figure 52:
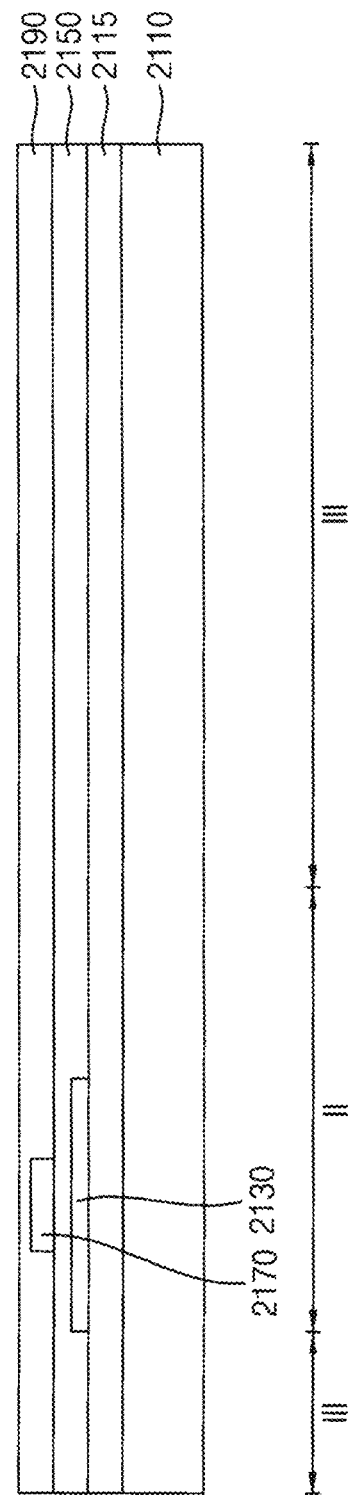

Referring to FIG. 52, the gate electrode 2170 and the second insulation layer 2190 are disposed on the first substrate 2110 on which the first insulation layer 2150 is disposed.

The gate electrode 2170 may be disposed on a portion of the first insulation layer 2150 under which the active pattern 2130 is disposed. In an exemplary embodiment, the gate electrode 2170 may include a metal, an alloy, metal nitride, conductive metal oxide, transparent conductive materials, etc., for example.

The second insulation layer 2190 may be disposed on the gate electrode 2170. The second insulation layer 2190 may cover the gate electrode 2170 in the light-emitting region II, and may extend in the first direction on the first substrate 2110. That is, the second insulation layer 2190 may be disposed on the entire surface of the first substrate 2110. In an exemplary embodiment, the second insulation layer 2190 may include a silicon compound, a metal oxide, etc., for example.

Figure 53:
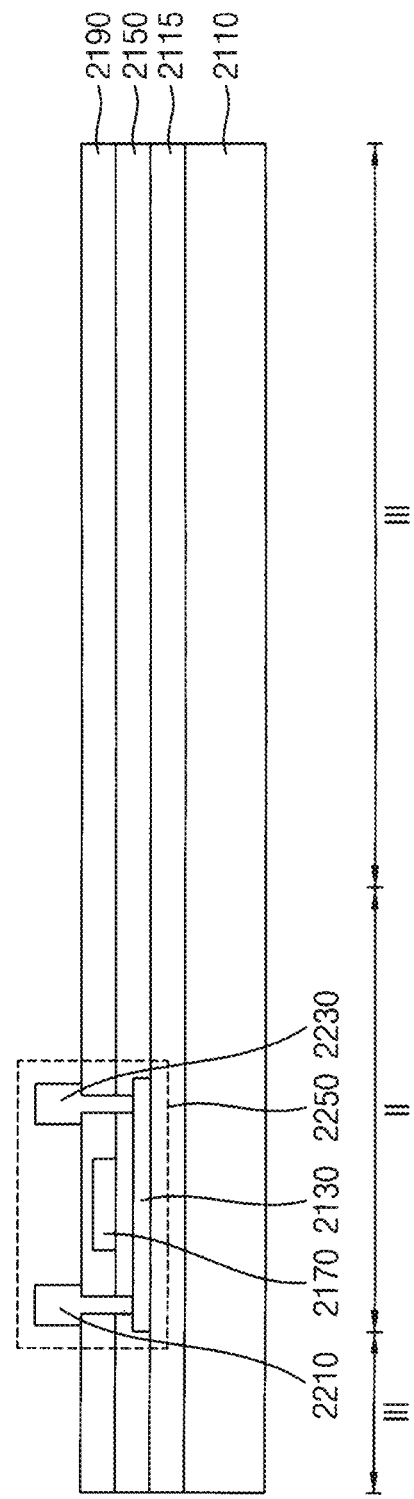

Referring to FIG. 53, the source electrode 2210 and the drain electrode 2230 are disposed on the first substrate 2110 on which the second insulation layer 2190 is disposed.

The source electrode 2210 and the drain electrode 2230 may be disposed on the second insulation layer 2190. The source electrode 2210 may be in contact with a first side of the active layer 2130 by removing a portion of the first and second insulation layers 2150 and 2190. The drain electrode 2230 may be in contact with a second side of the active layer 2130 by removing a second portion of the first and second insulation layers 2150 and 2190. In an exemplary embodiment, each of the source electrode 2210 and the drain electrode 2230 may include a metal, an alloy, metal nitride, conductive metal oxide, transparent conductive materials, etc., for example.

In the illustrated exemplary embodiment, the gate electrode 2170 is disposed on the active pattern 2130. However, the invention is not limited thereto, and the gate electrode 2170 may be disposed under the active pattern 2130.

Figure 54:
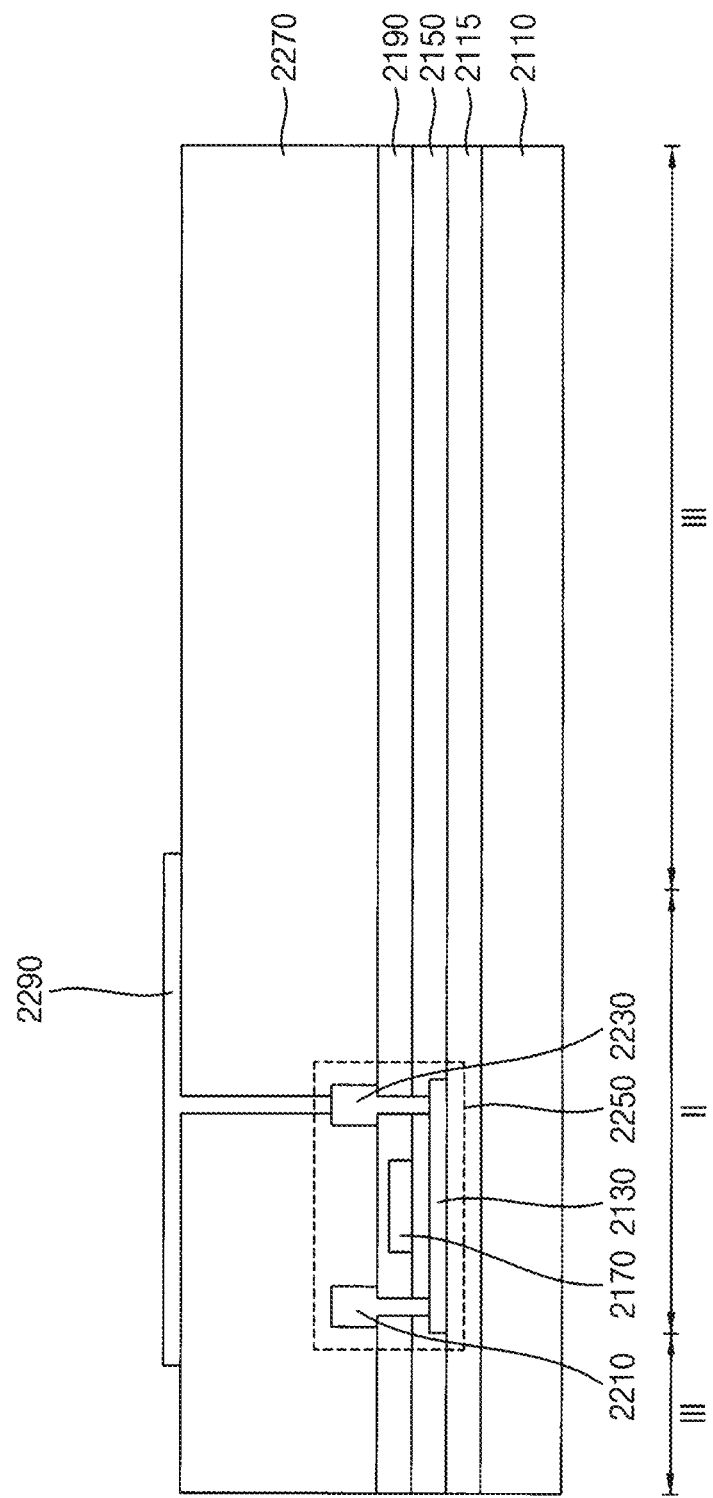

Referring to FIG. 54, the third insulation layer 2270 and the first electrode 2290 are disposed on the first substrate 2110 on which the source electrode 2210 and the drain electrode 2230 are disposed.

The third insulation layer 2270 may be disposed on the source electrode 2210 and the drain electrode 2230. The third insulation layer 2270 may cover the source electrode 2210 and the drain electrode 2230 in the sub-pixel region II, and may extend in the first direction on the first substrate 2110. That is, the third insulation layer 2270 may be disposed on the entire surface of the first substrate 2110. In an exemplary embodiment, the third insulation layer 2270 may include a silicon compound, a metal oxide, etc., for example.

The first electrode 2290 may be disposed on the third insulation layer 2270. The first electrode 2290 may be in contact with the source electrode 2210 by removing a portion of the third insulation layer 2270. In addition, the first electrode 2290 may be electrically connected to the semiconductor element 2250. In an exemplary embodiment, the first electrode 2290 may include a metal, an alloy, metal nitride, conductive metal oxide, transparent conductive materials, etc., for example.

Figure 55:
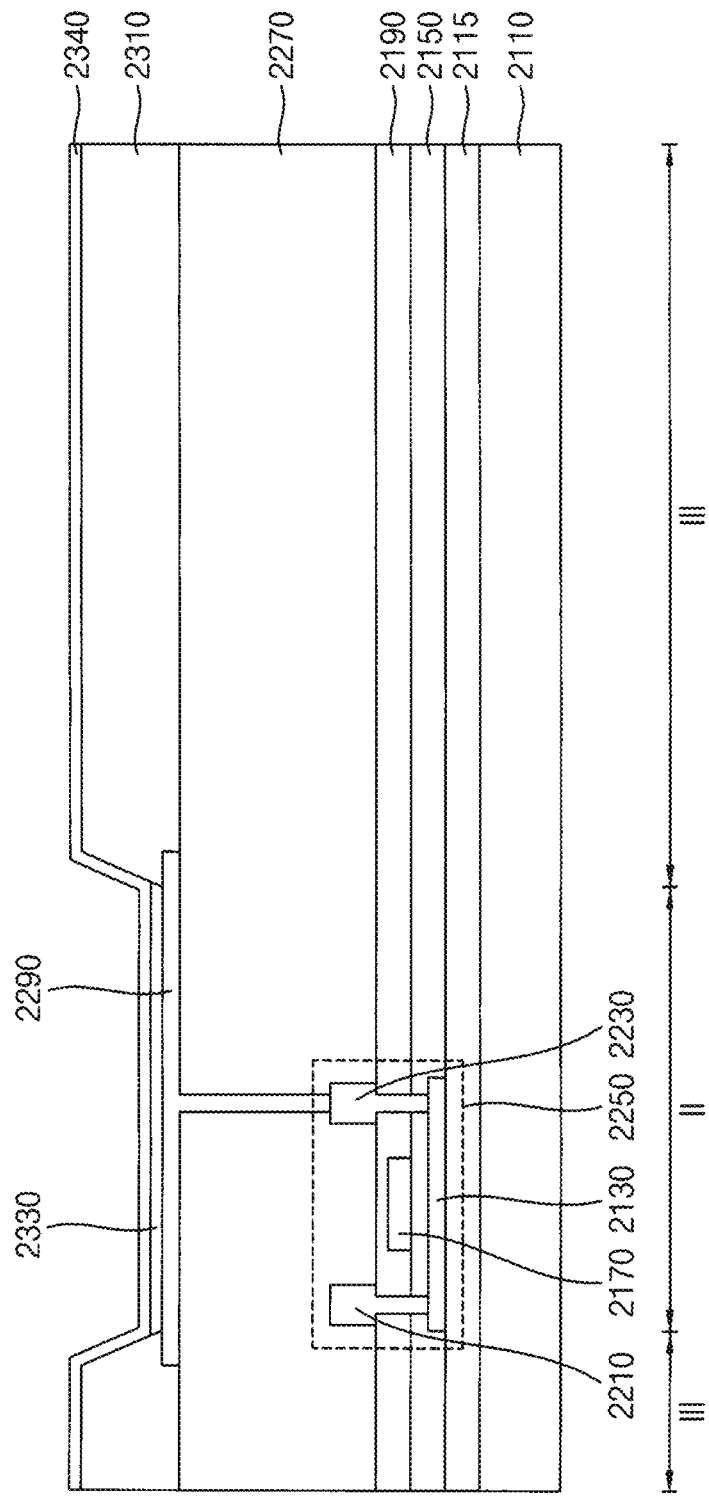

Referring to FIG. 55, the pixel defining layer 2310, the light emitting layer 2330 and the second electrode 2340 are disposed on the first substrate 2110 on which the first electrode 2290 is disposed.

The pixel defining layer 2310 may be disposed on the third insulation layer 2270 to expose a portion of the first electrode 2290. The pixel defining layer 2310 may include organic materials or inorganic materials. In this case, the light emitting layer 2330 may be disposed on a portion that the first electrode 2290 is exposed by the pixel defining layer 2310.

The light emitting layer 2330 may be disposed on the exposed first electrode 2290. The light emitting layer 2330 may be provided using light emitting materials capable of generating different colors of light (e.g., a red color of light, a blue color of light, and a green color of light). However, the invention is not limited thereto, and the light emitting layer 2330 may stack light emitting materials capable of generating different colors of light to emit white color of light.

The second electrode 2340 may be disposed on the pixel defining layer 2310 and the light emitting layer 2330. The second electrode 2340 may cover the pixel defining layer 2310 and the light emitting layer 2330 in the light-emitting region II and the reflection region III, and may extend in the first direction on the first substrate 2110. That is, the second electrode 2340 may be electrically connected to the first through third pixels. In an exemplary embodiment, the second electrode 2340 may include a metal, an alloy, metal nitride, conductive metal oxide, a transparent conductive material, etc., for example. These may be used alone or in a combination thereof. The first substrate 2110 may be combined with the second substrate 2350 by using a sealing member. In addition, a filler may be disposed between the first substrate 2110 and the second substrate 2350.

Figure 56:
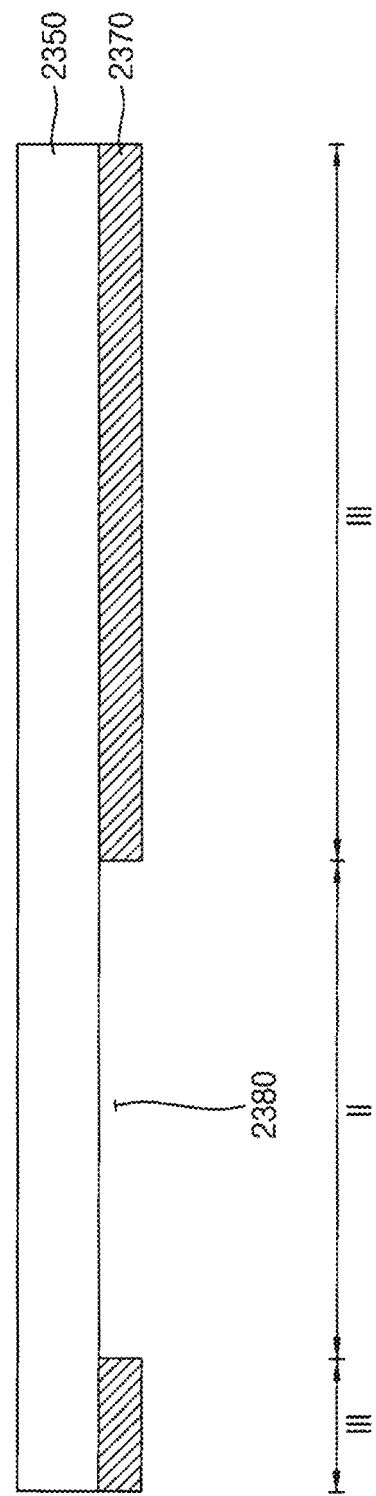

Referring to FIG. 56, the first sensing electrode 2370 is disposed on the second substrate 2350.

The first sensing electrode 2370 may be disposed on a first surface of the second substrate 2350. A first surface of the first sensing electrode 2370 may face the second electrode 2340, and a second surface opposing the first surface of the first sensing electrode 2370 may contact with the second substrate 2350. The first sensing electrode 2370 may be disposed in the reflection region III and outside of the light-emitting region II. However, the invention is not limited thereto, and an insulation layer may be disposed between the second substrate 2350 and the first sensing electrode 2370.

The first sensing electrode 2370 may include a material having a predetermined reflectivity. In an exemplary embodiment, the first sensing electrode 2370 may include gold (Au), silver (Ag), aluminum (Al), magnesium (Mg), platinum (Pt), Nickel (Ni), titanium (Ti), etc., for example. In an alternative exemplary embodiment, the first sensing electrode 2370 may include an alloy, metal nitride, conductive metal oxide, etc. In an exemplary embodiment, the first sensing electrode 2370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 2350 and the first substrate 2110 may include substantially the same materials. In an exemplary embodiment, the second substrate 2350 may include quartz, synthetic quartz, calcium fluoride, fluoride-doping quartz, sodalime glass, non-alkali glass etc., for example.

Figure 57:
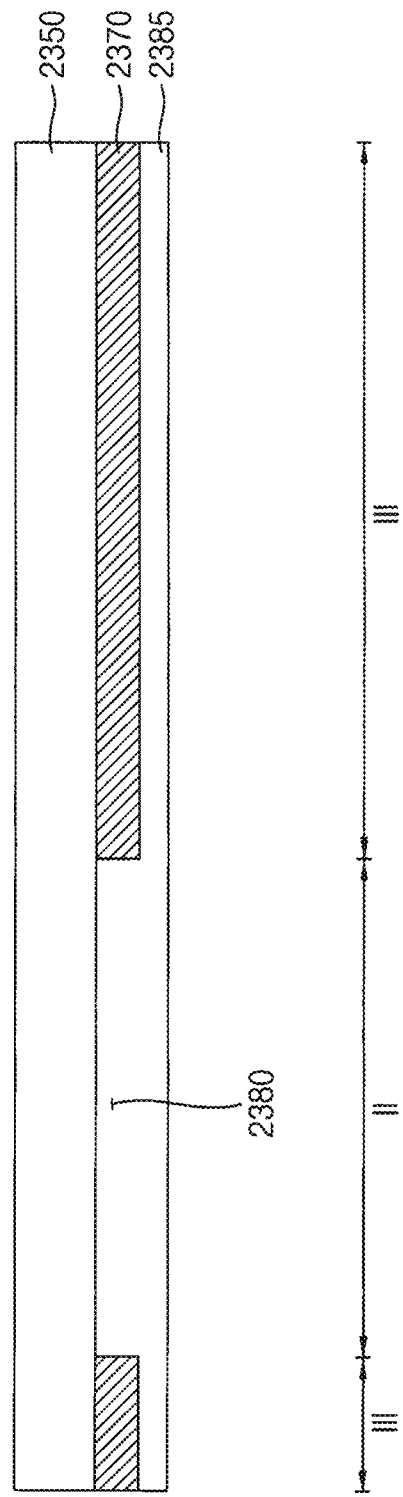

Referring to FIG. 57, the fourth insulation layer 2385 is disposed on the second substrate 2350 on which the first sensing electrode 2370 is disposed.

The fourth insulation layer 2385 may prevent from oxidation of the first sensing electrode 2370. The fourth insulation layer 2385 may include an adhesive material. The fourth insulation layer 2385 may prevent from separating of the first sensing electrode 2370 and the second sensing electrode 2390 from the second substrate 2350. The fourth insulation layer 2385 may insulate between the first sensing electrode 2370 and the second sensing electrode 2390.

Figure 58:
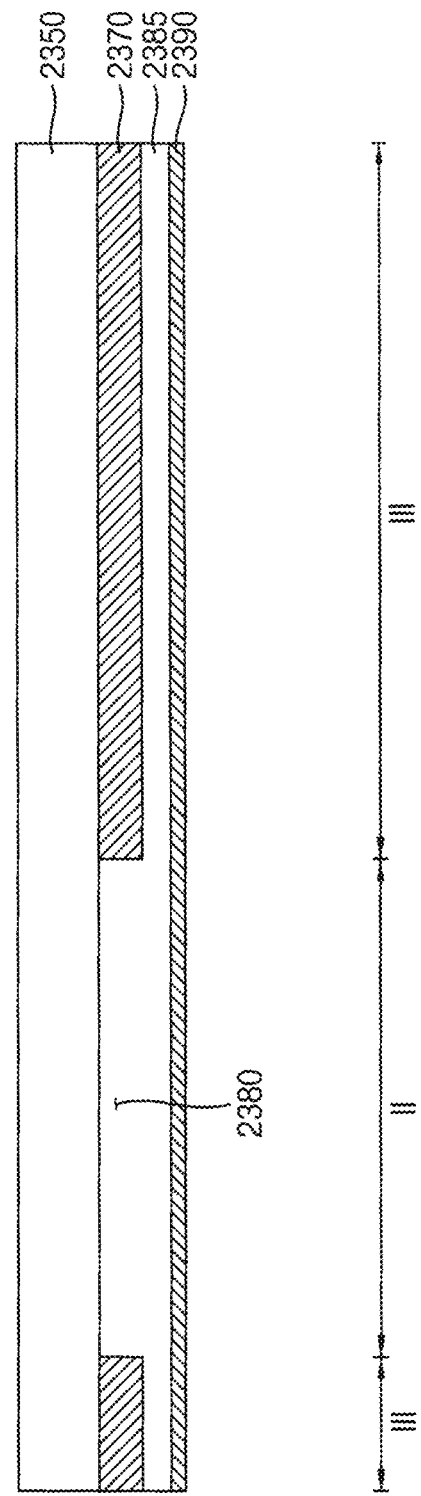

Referring to FIG. 58, the second sensing electrode 2390 is disposed on the fourth insulation layer 2385.

The second sensing electrode 2390 may be disposed in the light-emitting region II and the reflection region III.

The second sensing electrode 2390 may include a material having a predetermined reflectivity. In an exemplary embodiment, the second sensing electrode 2390 may include gold (Au), silver (Ag), aluminum (Al), magnesium (Mg), platinum (Pt), Nickel (Ni), titanium (Ti), etc., for example. In an alternative exemplary embodiment, the second sensing electrode 2390 may include an alloy, metal nitride, conductive metal oxide, etc. In an exemplary embodiment, the second sensing electrode 2390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 59:
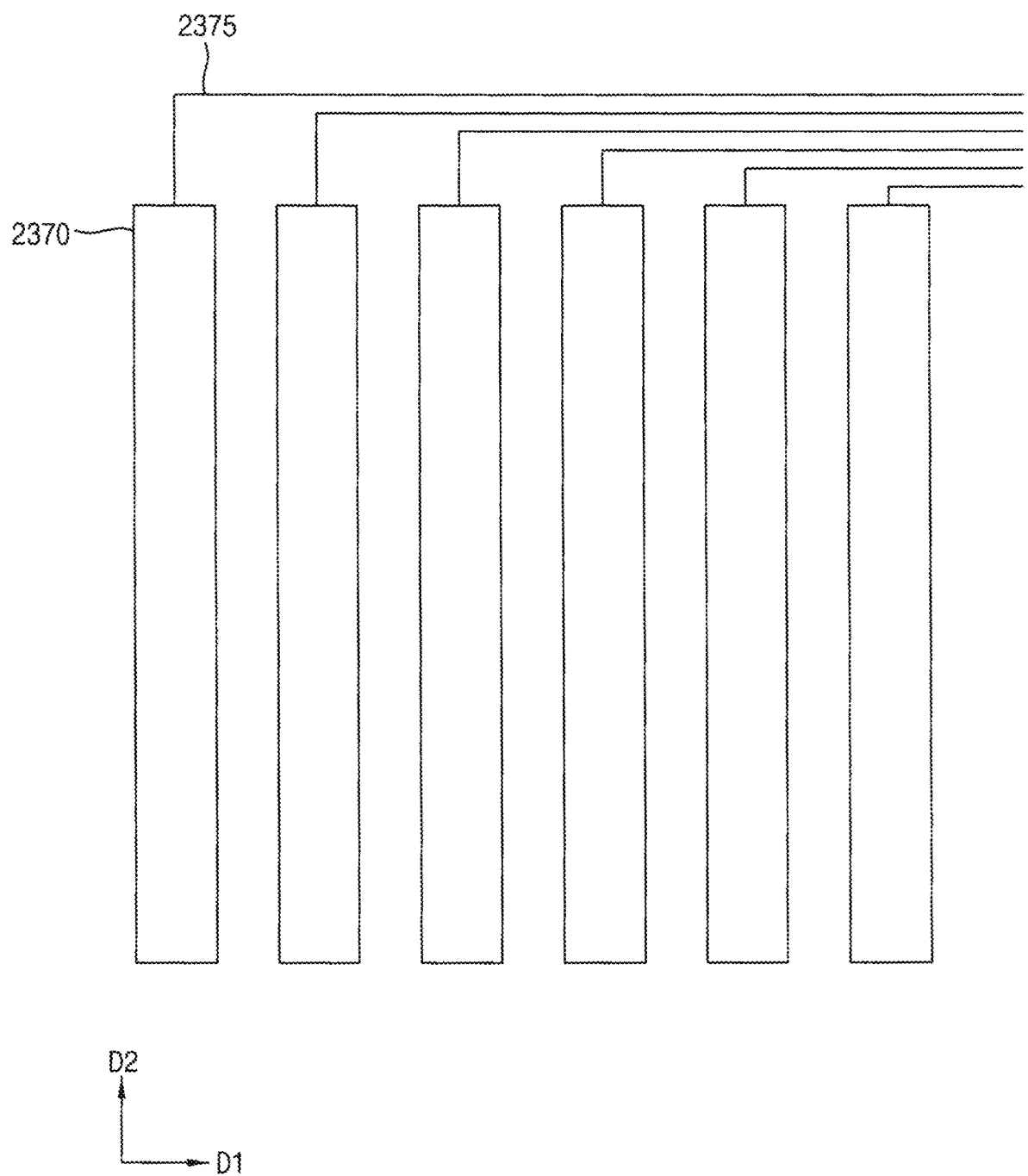
FIG. 59 is a plan view illustrating a first sensing electrode of FIG. 50.
Figure 60:
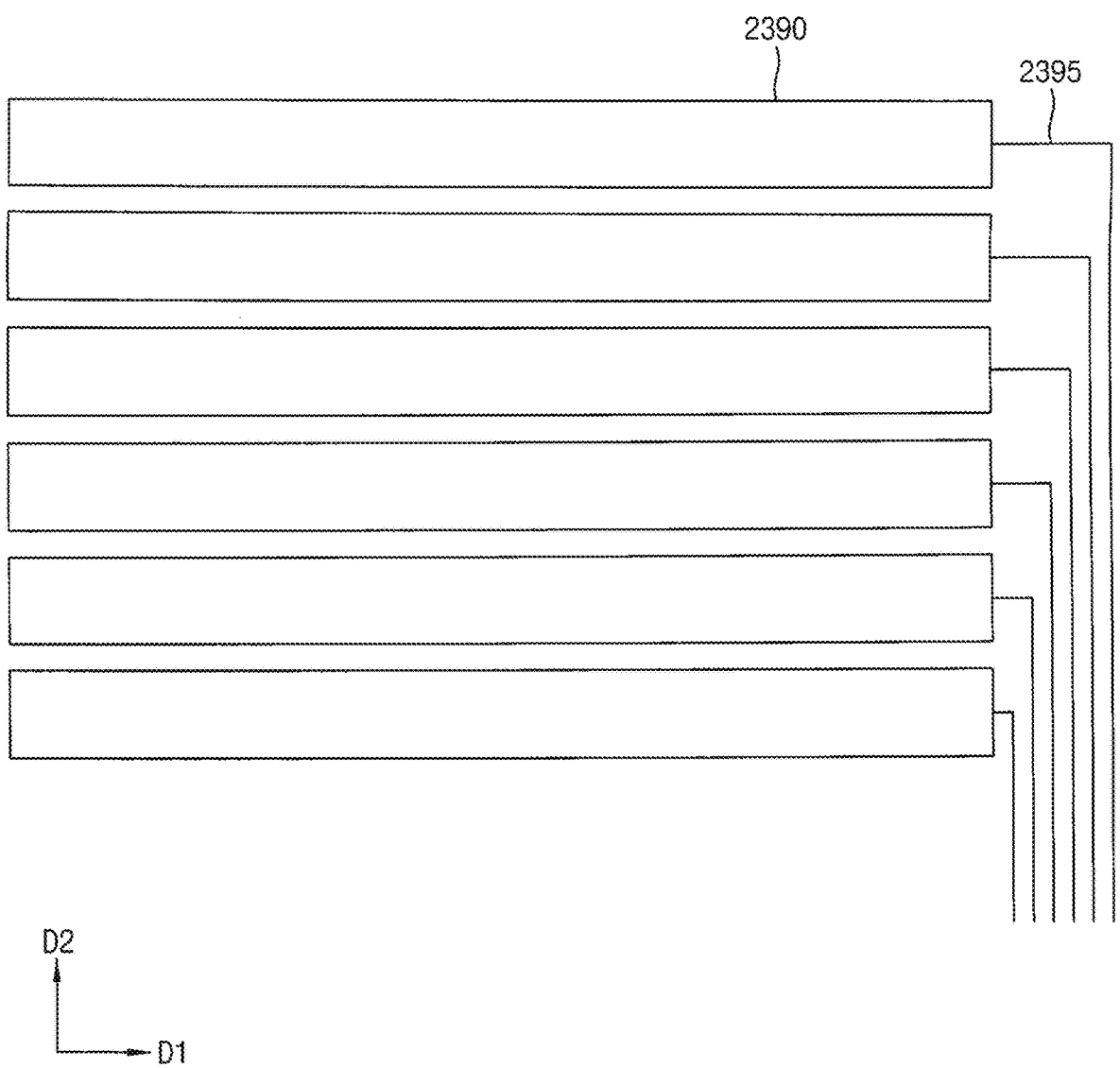
FIG. 60 is a plan view illustrating a second sensing electrode of FIG. 50.
Figure 61:
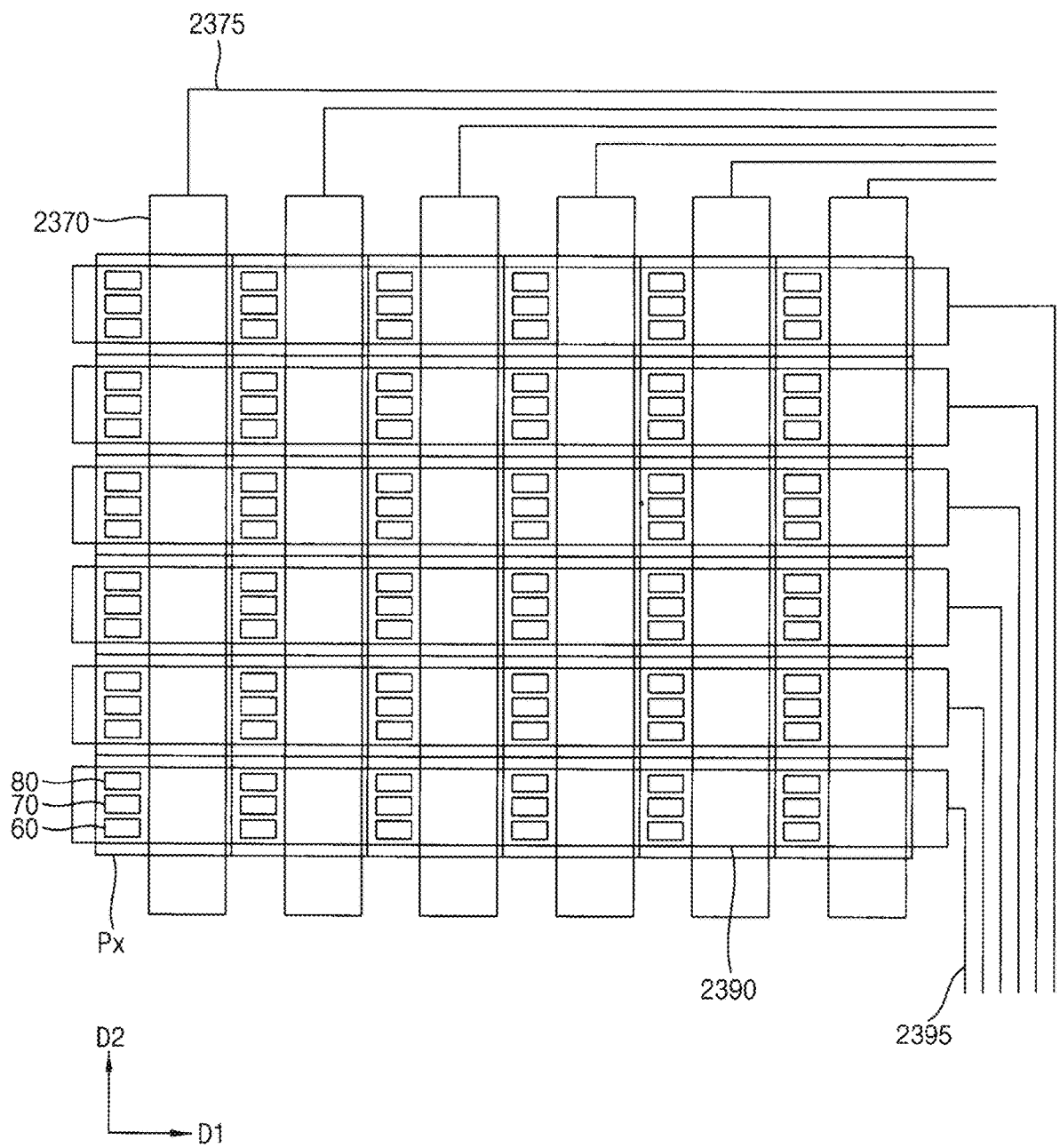
FIG. 61 is a plan view illustrating the first sensing electrode of FIG. 59 and the second sensing electrode of FIG. 60.

FIG. 59 is a plan view illustrating a first sensing electrode of FIG. 50. FIG. 60 is a plan view illustrating a second sensing electrode of FIG. 50. FIG. 61 is a plan view illustrating the first sensing electrode of FIG. 59 and the second sensing electrode of FIG. 60.

Referring to FIGS. 50 and 59 to 61, a first sensing electrode 2370 and a second sensing electrode 2390 are illustrated.

The first sensing electrode 2370 may be provided as a plurality of patterns extending in a second direction D2. The first sensing electrode 2370 is disposed in the reflection region III. The first sensing electrode 2370 may be connected to a sensing driving part through a first connecting line 2375. The first connecting line 2375 may include the same material as that of the first sensing electrode 2370. The first connecting line 2375 may be disposed on the same layer as that on which the first sensing electrode 2370 is disposed.

The second sensing electrode 2390 may be provided as a plurality of patterns extending in a first direction D1 crossing the second direction D2. The second sensing electrode 2390 is disposed in the light-emitting region II and the reflection region III. The second sensing electrode 2390 may be connected to a sensing driving part through a second connecting line 2395. The second connecting line 2395 may include the same material as that of the second sensing electrode 2390. The second connecting line 2395 may be disposed on the same layer as that on which the second sensing electrode 2390 is disposed.

The first sensing electrode 2370 may include a material having a predetermined reflectivity. The second sensing electrode 2390 may include a material having a predetermined reflectivity. The first sensing electrode 2370 may partially overlap the second sensing electrode 2390.

The first sensing electrode 2370 may be disposed on a first surface of the second substrate 2350. The fourth insulation layer 2385 is disposed on the first sensing electrode 2370. The second sensing electrode 2390 is disposed on the fourth insulation layer 2385.

The first sensing electrode 2370 and second sensing electrode 2390 may perform as a sensing electrode of a touch screen panel of mutual capacitance type. In an exemplary embodiment, when an electric conductor is contacted, capacitance of an intersecting point of the first sensing electrode 2370 and second sensing electrode 2390 around a touch position is changed, for example. Thus, a touch panel sensor (not shown) may decide a touch position based on a capacitance sensing signal corresponding to the change of capacitance.

The first sensing electrode 2370 may have a different thickness from a thickness of the second sensing electrode 2390. In an exemplary embodiment, a thickness of the first sensing electrode 2370 may be about 1000 Å, for example. When the thickness of the first sensing electrode 2370 is about 1000 Å, transmissivity of the first sensing electrode 2370 may be about 0%, and reflexibility of the first sensing electrode 2370 may be greater than about 95%. In addition, a thickness of the second sensing electrode 2390 may be about 100 Å. When the thickness of the second sensing electrode 2390 is about 100 Å, transmissivity of the second sensing electrode 2390 may be greater than about 50% and less than about 95%. When an organic light emitting display device emits light, the second sensing electrode 2390 may display an image in the light-emitting region II, and when an organic light emitting display device does not emit light, the second sensing electrode 2390 may perform a mirror function.

Figure 62:
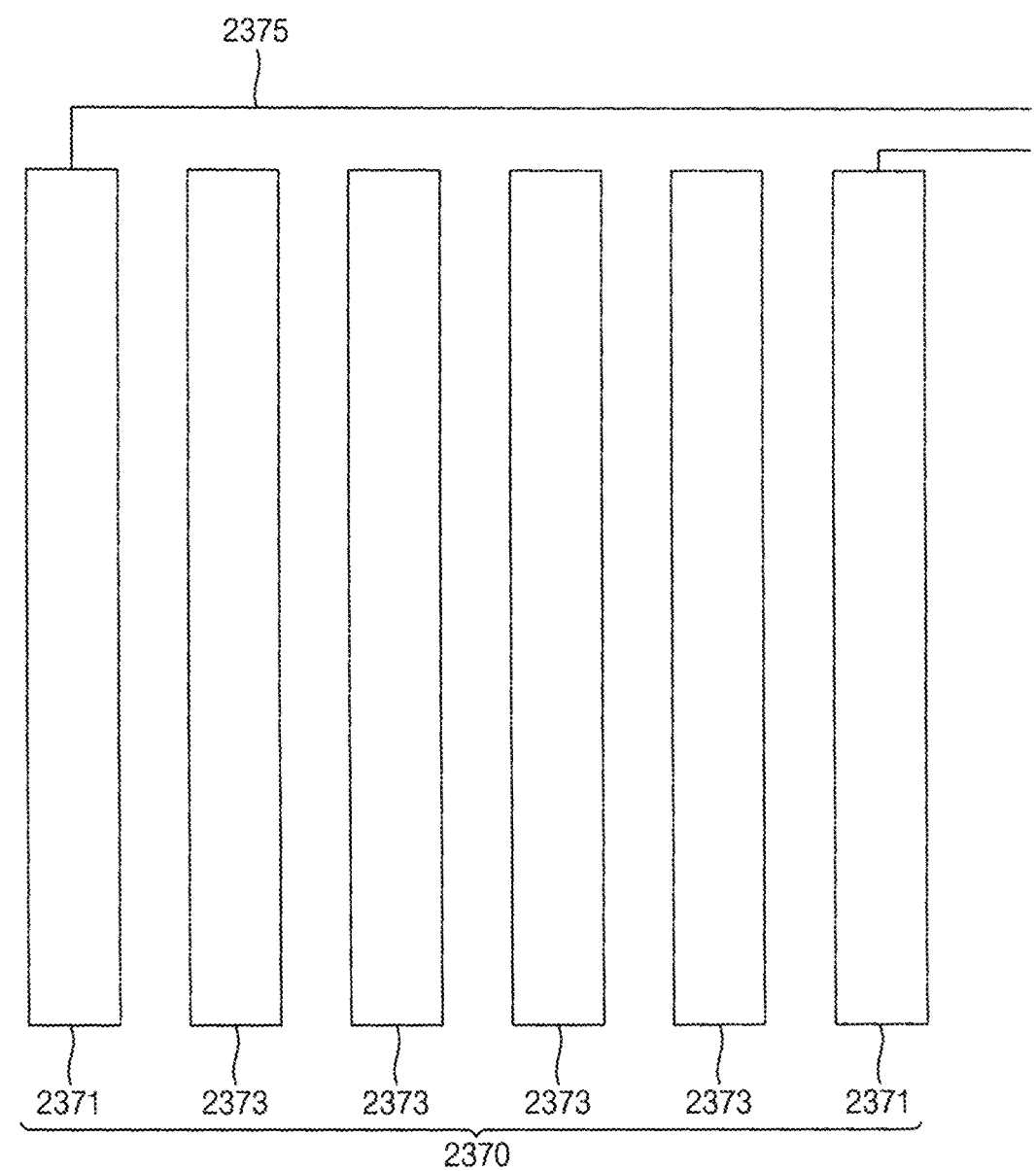
FIG. 62 is a plan view illustrating a first sensing electrode of FIG. 50.
Figure 63:
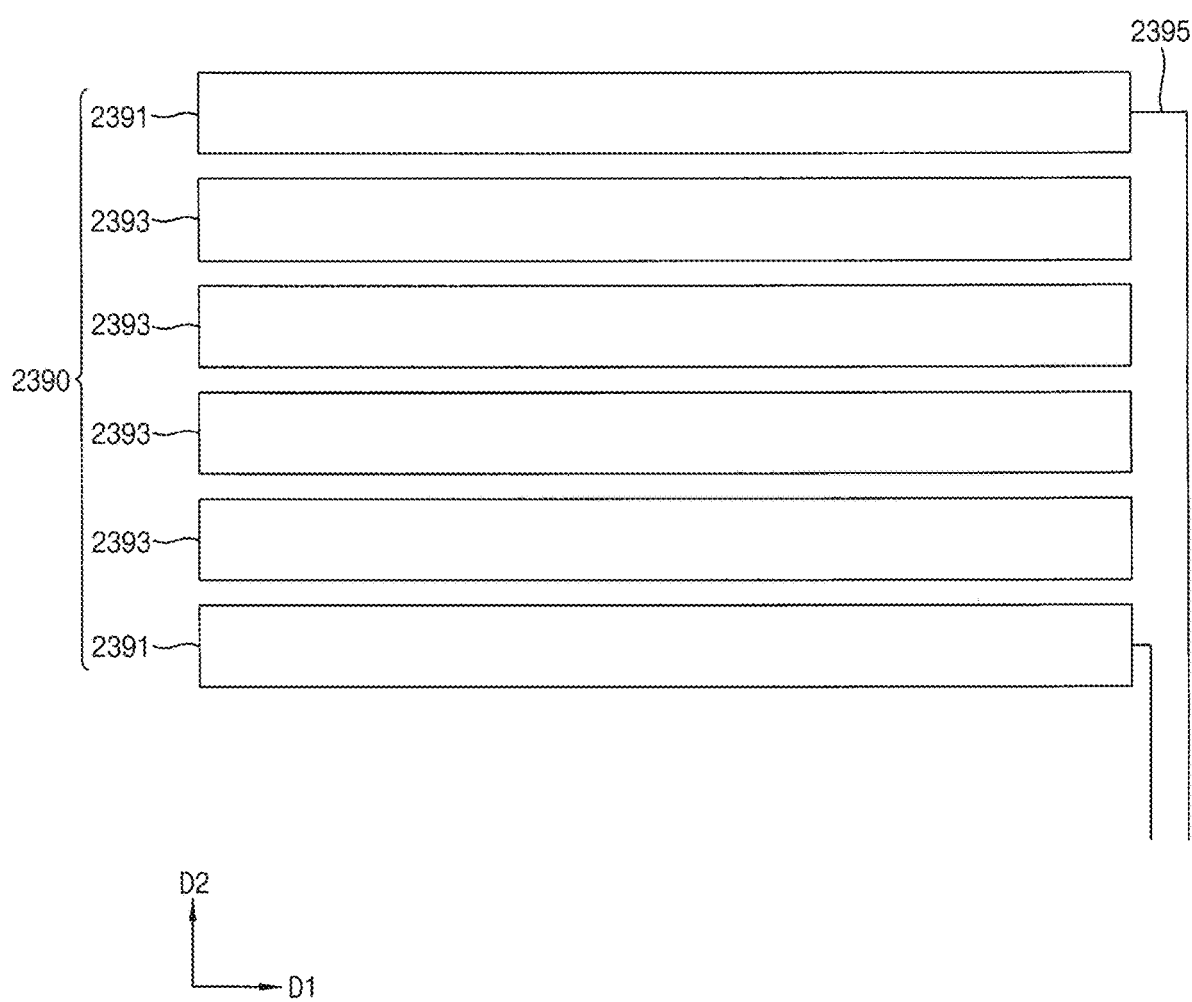
FIG. 63 is a plan view illustrating a second sensing electrode of FIG. 50.
Figure 64:
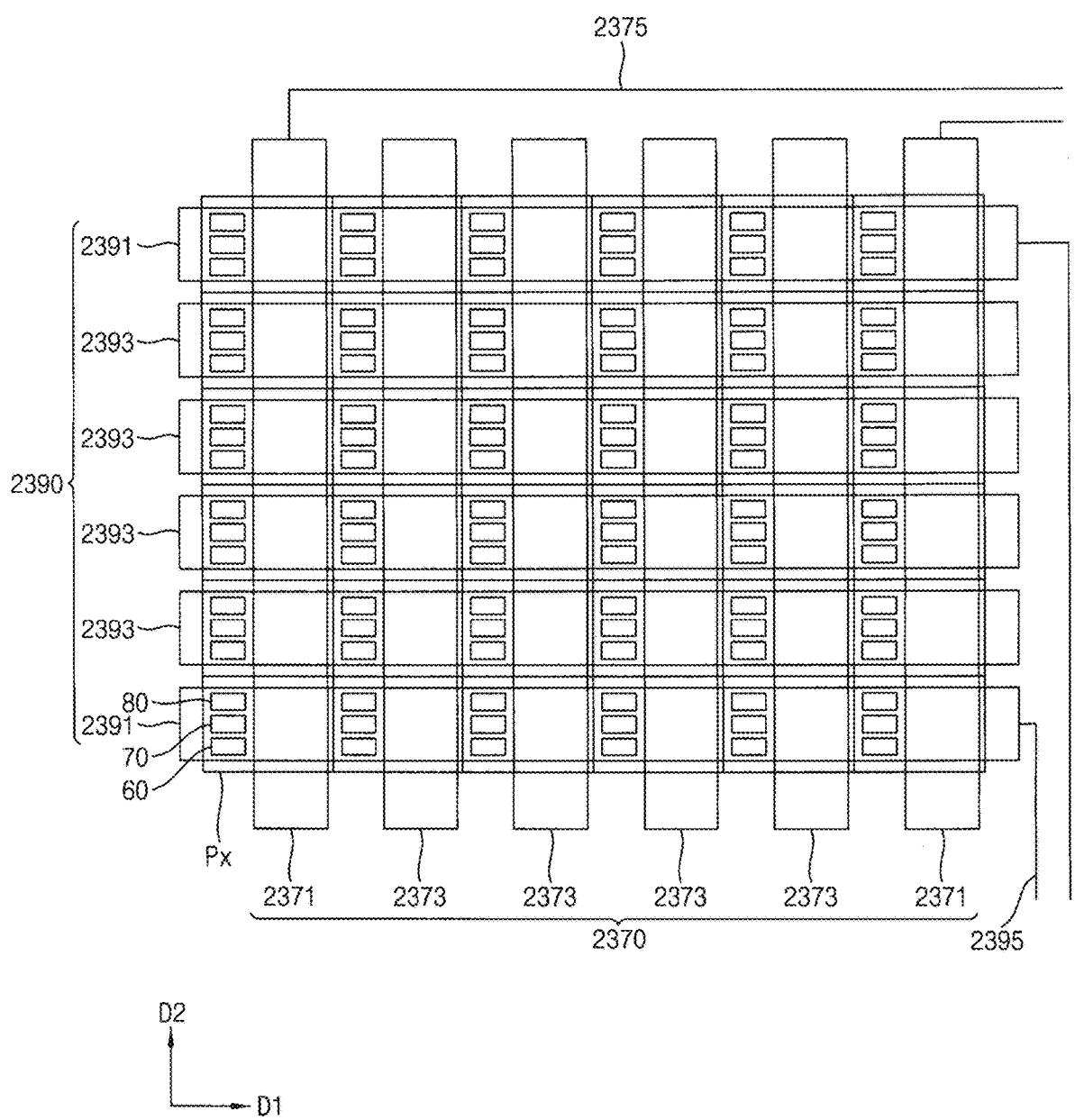
FIG. 64 is a plan view illustrating the first sensing electrode of FIG. 62 and the second sensing electrode of FIG. 63.

FIG. 62 is a plan view illustrating a first sensing electrode of FIG. 50. FIG. 63 is a plan view illustrating a second sensing electrode of FIG. 50. FIG. 64 is a plan view illustrating the first sensing electrode of FIG. 62 and the second sensing electrode of FIG. 63.

Referring to FIGS. 50 and 62 to 64, a first sensing electrode 2370 and a second sensing electrode 2390 are illustrated.

The first sensing electrode 2370 may include a plurality of first sensing patterns 2371 extending in a second direction D2 and a plurality of first dummy patterns 2373 disposed between the first sensing patterns 2371. The first sensing electrode 2370 is disposed in the reflection region III. An interval of the first sensing patterns 2371 may be adjusted according to the number of the first dummy patterns 2373. The first sensing electrode 2370 may be connected to a sensing driving part through a first connecting line 2375. The first connecting line 2375 may include the same material as that of the first sensing electrode 2370. The first connecting line 2375 may be disposed on the same layer as that on which the first sensing electrode 2370 is disposed.

The second sensing electrode 2390 may be provided as a plurality of second sensing patterns 2391 extending in a first direction D1 crossing the second direction D2 and a plurality of second dummy patterns 2393 disposed between the second sensing patterns 2391. The second sensing electrode 2390 is disposed in the light-emitting region II and the reflection region III. An interval of the second sensing electrode 2390 may be adjusted according to the number of the second dummy patterns 2393. The second sensing electrode 2390 may be connected to a sensing driving part through a second connecting line 2395. The second connecting line 2395 may include the same material as that of the second sensing electrode 2390. The second connecting line 2395 may be disposed on the same layer as that on which the second sensing electrode 2390 is disposed.

The first sensing electrode 2370 may include a material having a predetermined reflectivity. The second sensing electrode 2390 may include a material having a predetermined reflectivity. The first sensing electrode 2370 may partially overlap the second sensing electrode 2390.

The first sensing electrode 2370 may be disposed on a first surface of the second substrate 2350. The fourth insulation layer 2385 is disposed on the first sensing electrode 2370. The second sensing electrode 2390 is disposed on the fourth insulation layer 2385.

The first sensing electrode 2370 and second sensing electrode 2390 may perform as a sensing electrode of a touch screen panel of mutual capacitance type. In an exemplary embodiment, when an electric conductor is contacted, capacitance of an intersecting point of the first sensing electrode 2370 and second sensing electrode 2390 around a touch position is changed, for example. Thus, a touch panel sensor (not shown) may decide a touch position based on a capacitance sensing signal corresponding to the change of capacitance.

The first sensing electrode 2370 may have a different thickness from a thickness of the second sensing electrode 2390. In an exemplary embodiment, a thickness of the first sensing electrode 2370 may be about 1000 Å, for example. When the thickness of the first sensing electrode 2370 is about 1000 Å, transmissivity of the first sensing electrode 2370 may be about 0%, and reflexibility of the first sensing electrode 2370 may be greater than about 95%. In addition, a thickness of the second sensing electrode 2390 may be about 100 Å. When the thickness of the second sensing electrode 2390 is about 100 Å, transmissivity of the second sensing electrode 2390 may be greater than about 50% and less than about 95%. When an organic light emitting display device emits light, the second sensing electrode 2390 may display an image in the light-emitting region II, and when an organic light emitting display device does not emit light, the second sensing electrode 2390 may perform a mirror function.

Figure 65:
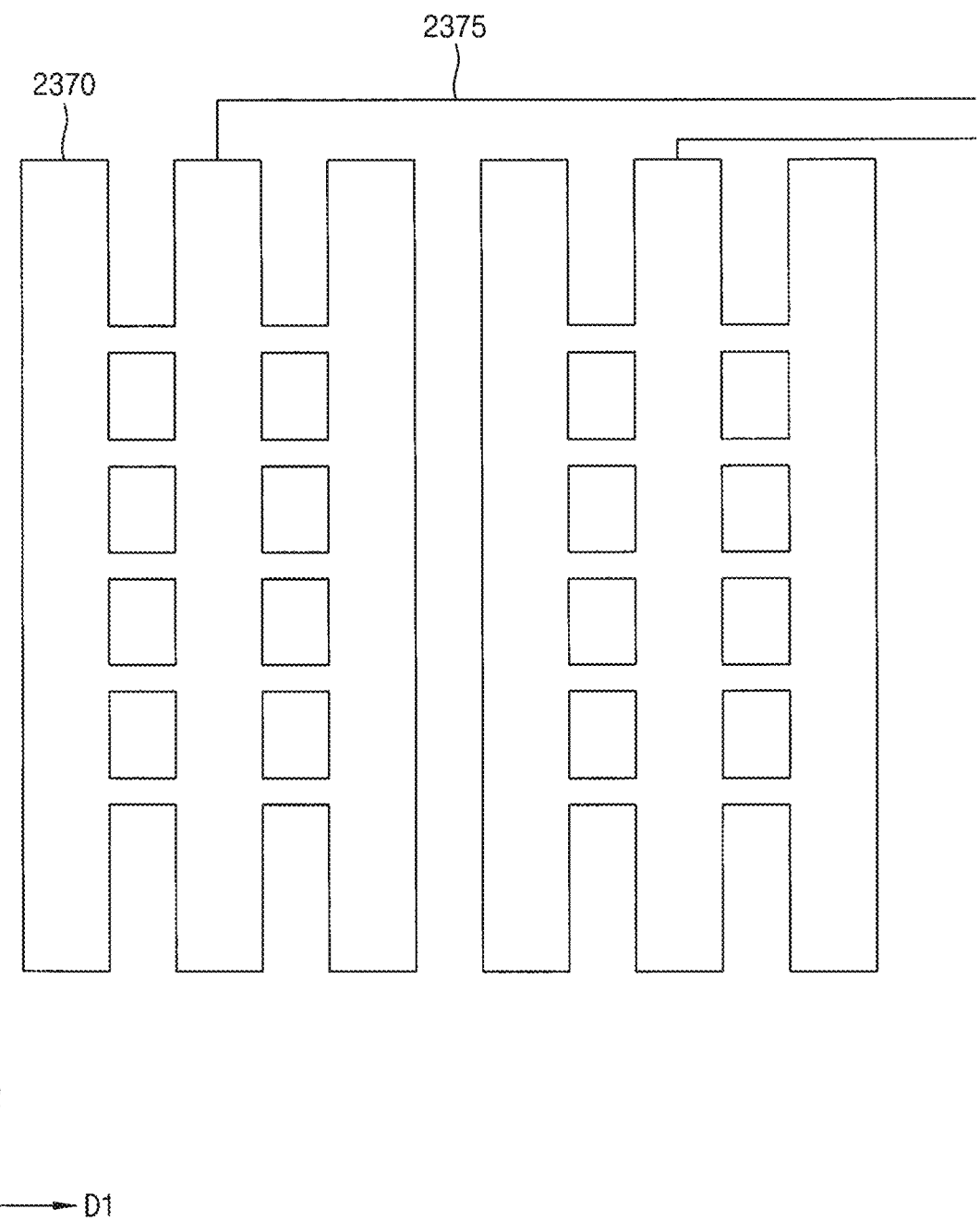
FIG. 65 is a plan view illustrating a first sensing electrode of FIG. 50.
Figure 66:
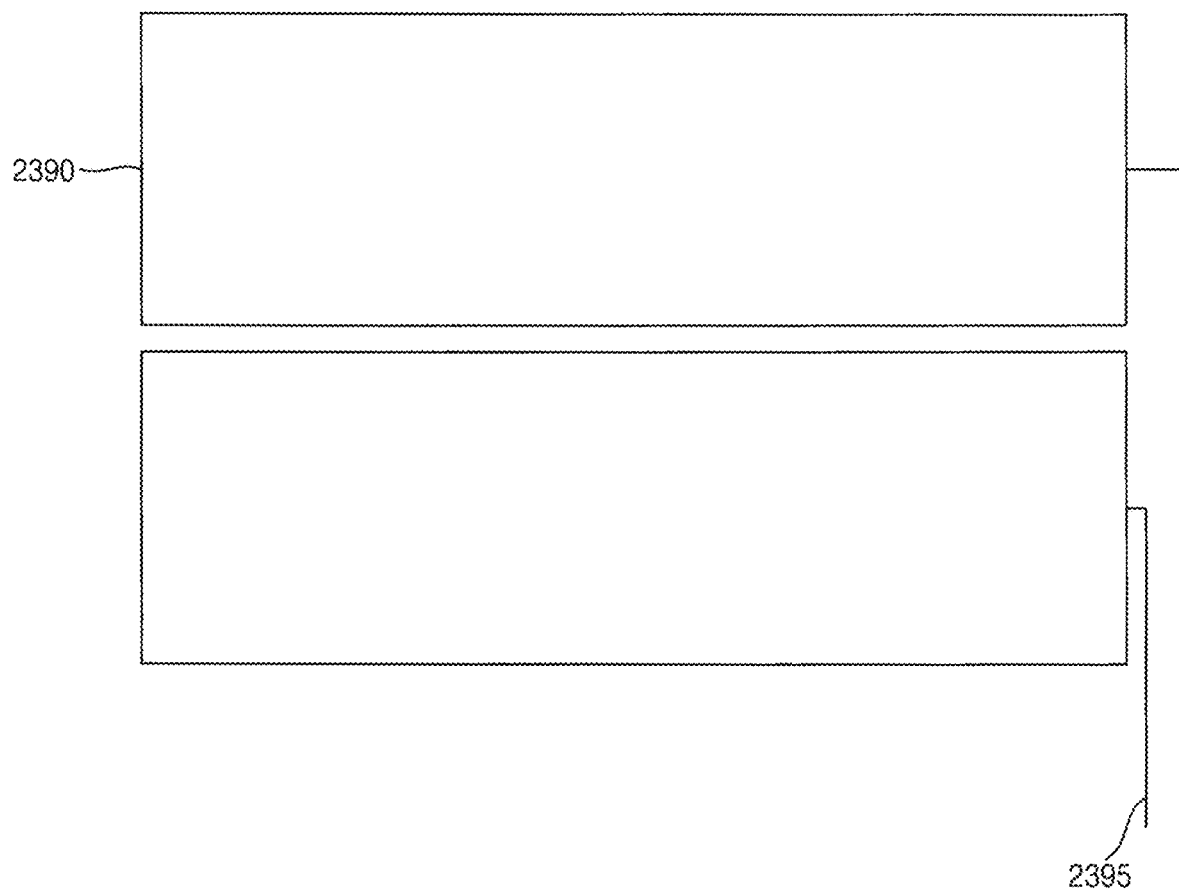
FIG. 66 is a plan view illustrating a second sensing electrode of FIG. 50.
Figure 67:
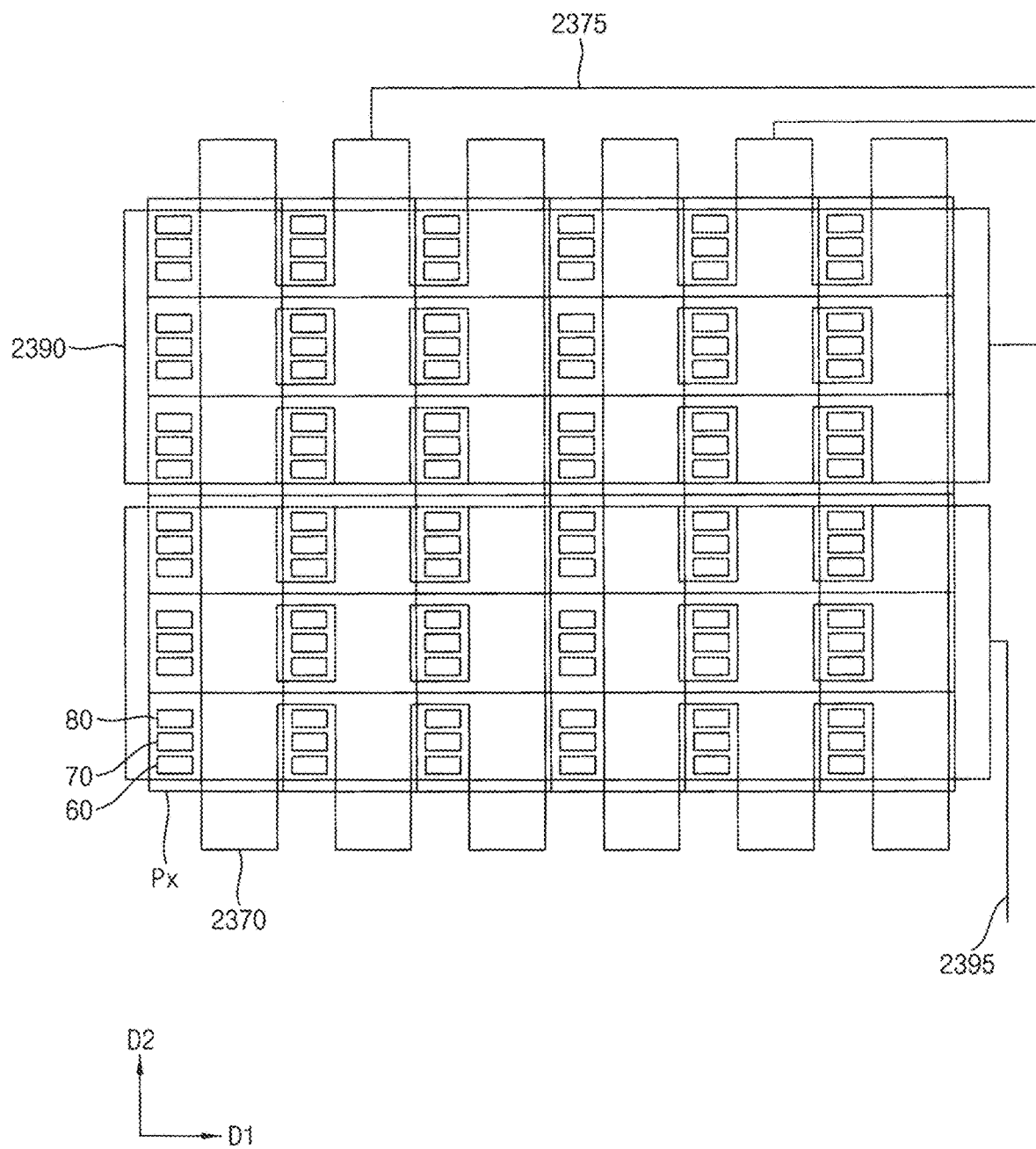
FIG. 67 is a plan view illustrating the first sensing electrode of FIG. 65 and the second sensing electrode of FIG. 66.

FIG. 65 is a plan view illustrating a first sensing electrode of FIG. 50. FIG. 66 is a plan view illustrating a second sensing electrode of FIG. 50. FIG. 67 is a plan view illustrating the first sensing electrode of FIG. 65 and the second sensing electrode of FIG. 66.

Referring to FIGS. 50 and 65 to 67, a first sensing electrode 2370 and a second sensing electrode 2390 are illustrated.

The first sensing electrode 2370 may be provided as a plurality of patterns extending in a second direction D2. The first sensing electrode 2370 may be provided as a mesh shape. The first sensing electrode 2370 is disposed in the reflection region III. The first sensing electrode 2370 may be connected to a sensing driving part through a first connecting line 2375. The first connecting line 2375 may include the same material as that of the first sensing electrode 2370. The first connecting line 2375 may be disposed on the same layer as that on which the first sensing electrode 2370 is disposed.

The second sensing electrode 2390 may be provided as a plurality of patterns extending in a first direction D1 crossing the second direction D2. A width of the second sensing electrode 2390 in the second direction D2 is the same as a width of the first sensing electrode 2370 in the first direction D1. The second sensing electrode 2390 is disposed in the light-emitting region II and the reflection region III. The second sensing electrode 2390 may be connected to a sensing driving part through a second connecting line 2395. The second connecting line 2395 may include the same material as that of the second sensing electrode 2390. The second connecting line 2395 may be disposed on the same layer as that on which the second sensing electrode 2390 is disposed.

The first sensing electrode 2370 may be disposed on a first surface of the second substrate 2350. The fourth insulation layer 2385 is disposed on the first sensing electrode 2370. The second sensing electrode 2390 is disposed on the fourth insulation layer 2385.

The first sensing electrode 2370 and second sensing electrode 2390 may perform as a sensing electrode of a touch screen panel of mutual capacitance type. In an exemplary embodiment, when an electric conductor is contacted, capacitance of an intersecting point of the first sensing electrode 2370 and second sensing electrode 2390 around a touch position is changed, for example. Thus, a touch panel sensor (not shown) may decide a touch position based on a capacitance sensing signal corresponding to the change of capacitance.

The first sensing electrode 2370 may have a different thickness from a thickness of the second sensing electrode 2390. In an exemplary embodiment, a thickness of the first sensing electrode 2370 may be about 1000 Å, for example. When the thickness of the first sensing electrode 2370 is about 1000 Å, transmissivity of the first sensing electrode 2370 may be about 0%, and reflexibility of the first sensing electrode 2370 may be greater than about 95%. In addition, a thickness of the second sensing electrode 2390 may be about 100 Å. When the thickness of the second sensing electrode 2390 is about 100 Å, transmissivity of the second sensing electrode 2390 may be greater than about 50% and less than about 95%. When an organic light emitting display device emits light, the second sensing electrode 2390 may display an image in the light-emitting region II, and when an organic light emitting display device does not emit light, the second sensing electrode 2390 may perform a mirror function.

Figure 68:
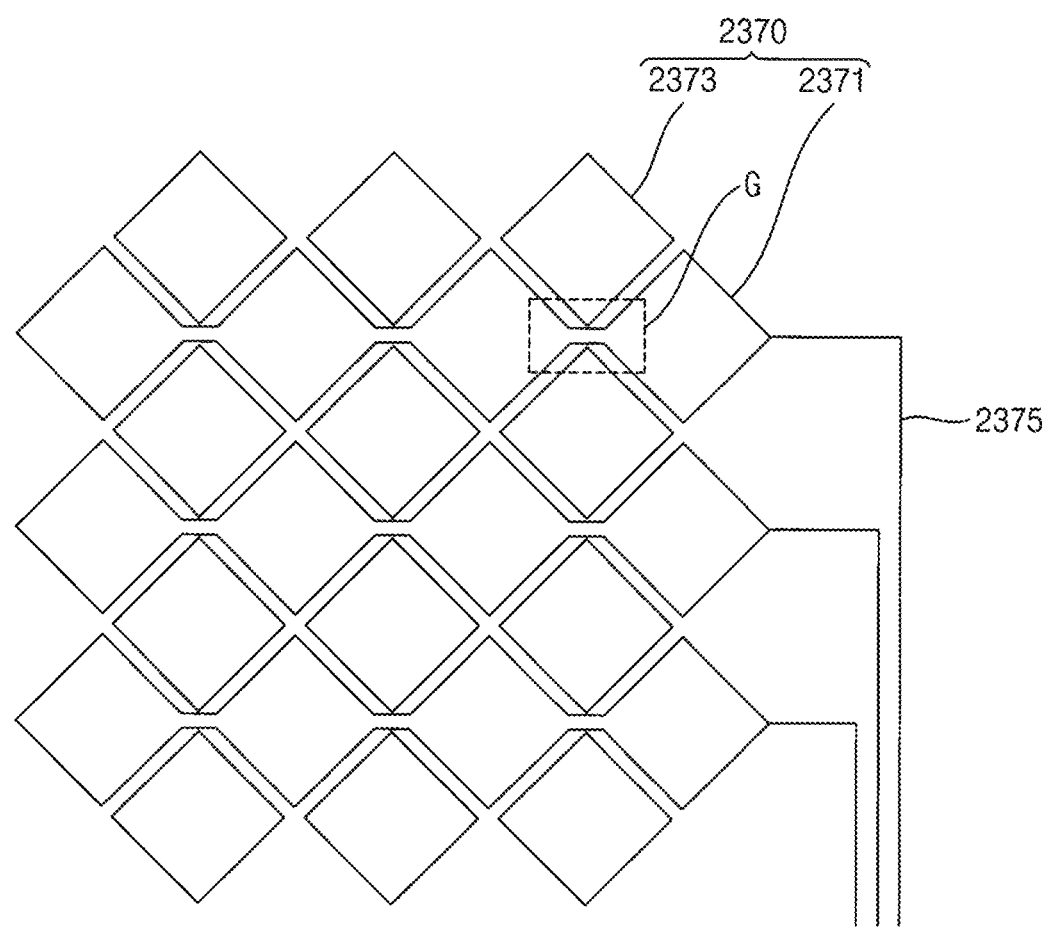
FIG. 68 is a plan view illustrating a first sensing electrode of FIG. 50.
Figure 69:
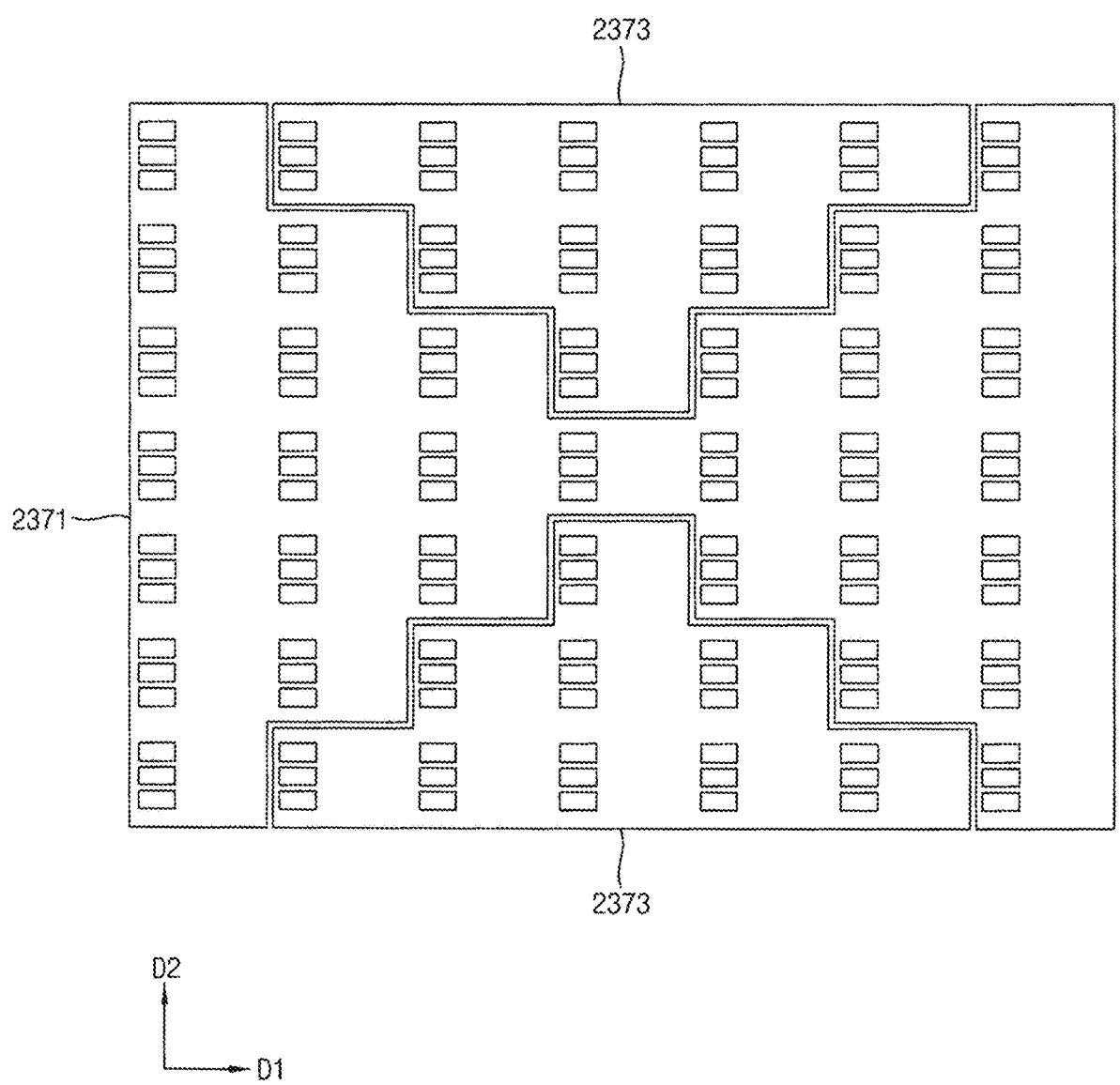
FIG. 69 is a plan view magnifying 'G' portion of FIG. 68.
Figure 70:
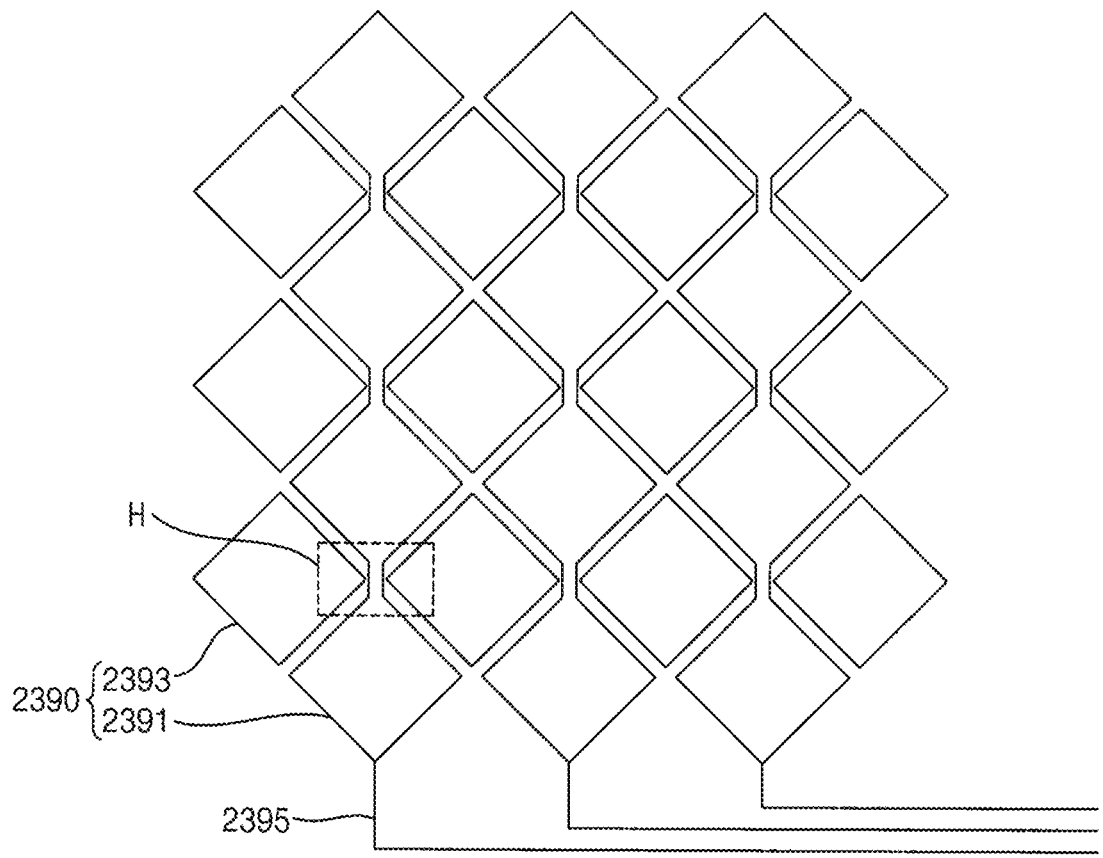
FIG. 70 is a plan view illustrating a second sensing electrode of FIG. 50.
Figure 71:
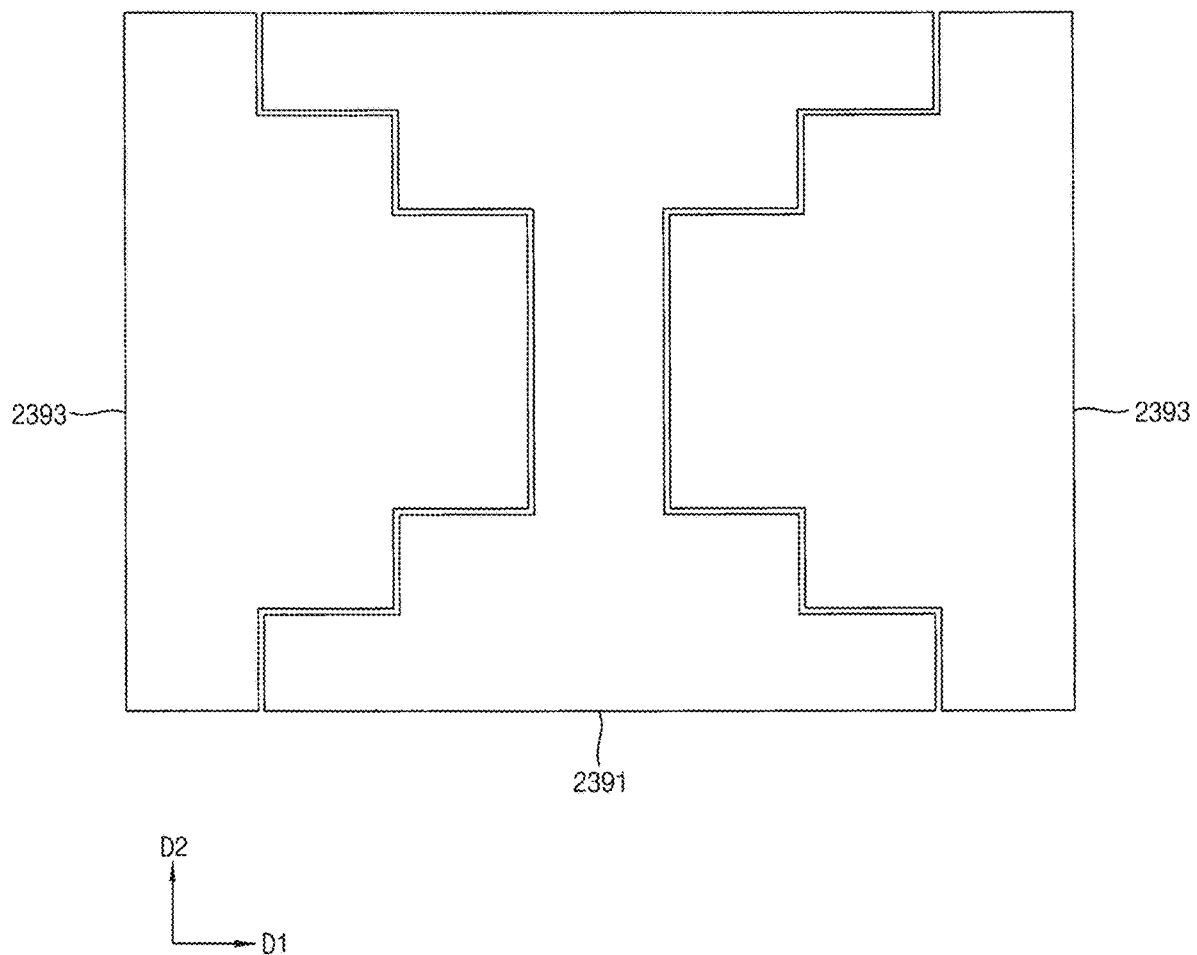
FIG. 71 is a plan view magnifying 'H' portion of FIG. 70.
Figure 72:
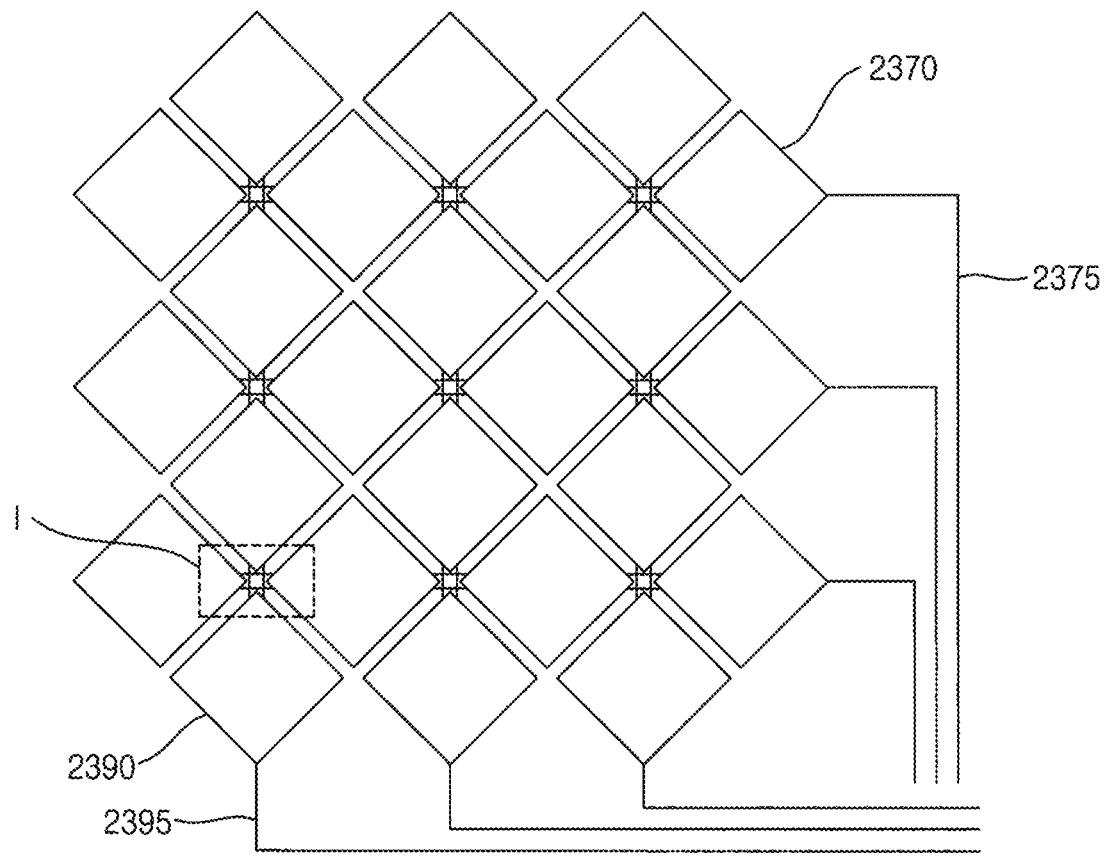
FIG. 72 is a plan view illustrating the first sensing electrode of FIG. 68 and the second sensing electrode of FIG. 70.
Figure 73:
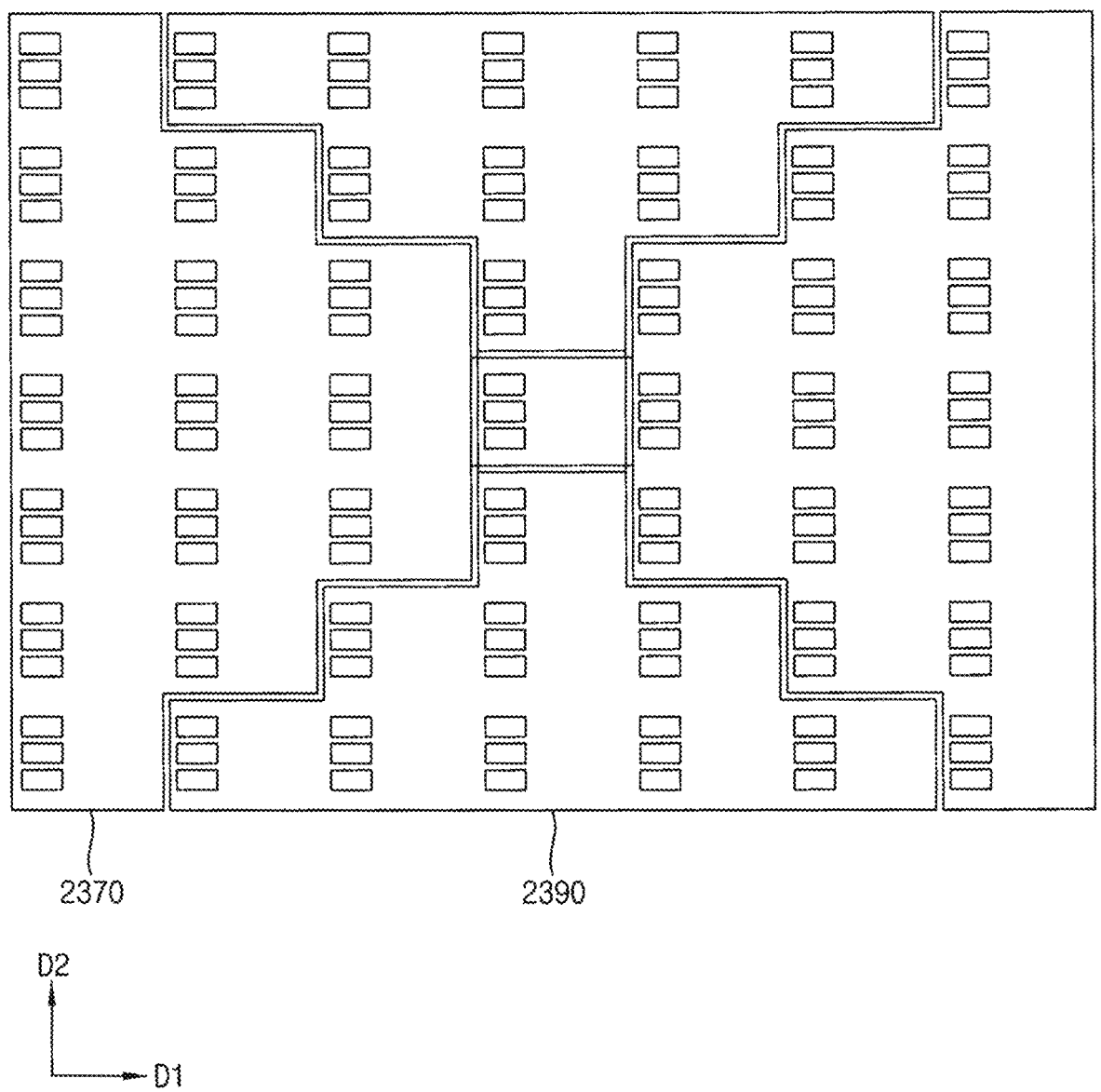
FIG. 73 is a plan view magnifying 'I' portion of FIG. 72.

FIG. 68 is a plan view illustrating a first sensing electrode of FIG. 50. FIG. 69 is a plan view magnifying 'G' portion of FIG. 68. FIG. 70 is a plan view illustrating a second sensing electrode of FIG. 50. FIG. 71 is a plan view magnifying 'H' portion of FIG. 70. FIG. 72 is a plan view illustrating the first sensing electrode of FIG. 68 and the second sensing electrode of FIG. 70. FIG. 73 is a plan view magnifying 'I' portion of FIG. 72.

Referring to FIGS. 50 and 68 to 73, a first sensing electrode 2370 and a second sensing electrode 2390 are illustrated.

The first sensing electrode 2370 may include plurality of first sensing patterns 2371 having a rhombus shape and sequentially connected each other in a first direction D1 and a plurality of first dummy patterns 2373 having a rhombus shape and disposed between the first sensing patterns 2371. The first dummy patterns 2373 are spaced apart from each other. The first sensing electrode 2370 is disposed in the reflection region III. The first sensing electrode 2370 may be connected to a sensing driving part through a first connecting line 2375. The first connecting line 2375 may include the same material as that of the first sensing electrode 2370. The first connecting line 2375 may be disposed on the same layer as that on which the first sensing electrode 2370 is disposed.

The second sensing electrode 2390 may include plurality of second sensing patterns 2391 having a rhombus shape and sequentially connected each other in a second direction D2 and a plurality of second dummy patterns 2393 having a rhombus shape and disposed between the second sensing patterns 2391. The second dummy patterns 2393 are spaced apart from each other. The second sensing electrode 2390 is disposed in the light-emitting region II and the reflection region III. The second sensing electrode 2390 may be connected to a sensing driving part through a second connecting line 2395. The second connecting line 2395 may include the same material as that of the second sensing electrode 2390. The second connecting line 2395 may be disposed on the same layer as that on which the second sensing electrode 2390 is disposed.

The first sensing electrode 2370 may include a material having a predetermined reflectivity. The second sensing electrode 2390 may include a material having a predetermined reflectivity. The first sensing electrode 2370 may partially overlap the second sensing electrode 2390.

The first sensing electrode 2370 may be disposed on a first surface of the second substrate 2350. The fourth insulation layer 2385 is disposed on the first sensing electrode 2370. The second sensing electrode 2390 is disposed on the fourth insulation layer 2385.

The first sensing electrode 2370 and second sensing electrode 2390 may perform as a sensing electrode of a touch screen panel of mutual capacitance type. In an exemplary embodiment, when an electric conductor is contacted, capacitance of an intersecting point of the first sensing electrode 2370 and second sensing electrode 2390 around a touch position is changed, for example. Thus, a touch panel sensor (not shown) may decide a touch position based on a capacitance sensing signal corresponding to the change of capacitance.

The first sensing electrode 2370 may have a different thickness from a thickness of the second sensing electrode 2390. In an exemplary embodiment, a thickness of the first sensing electrode 2370 may be about 1000 Å, for example. When the thickness of the first sensing electrode 2370 is about 1000 Å, transmissivity of the first sensing electrode 2370 may be about 0%, and reflexibility of the first sensing electrode 2370 may be greater than about 95%. In addition, a thickness of the second sensing electrode 2390 may be about 100 Å. When the thickness of the second sensing electrode 2390 is about 100 Å, transmissivity of the second sensing electrode 2390 may be greater than about 50% and less than about 95%. When an organic light emitting display device emits light, the second sensing electrode 2390 may display an image in the light-emitting region II, and when an organic light emitting display device does not emit light, the second sensing electrode 2390 may perform a mirror function.

Figure 74:
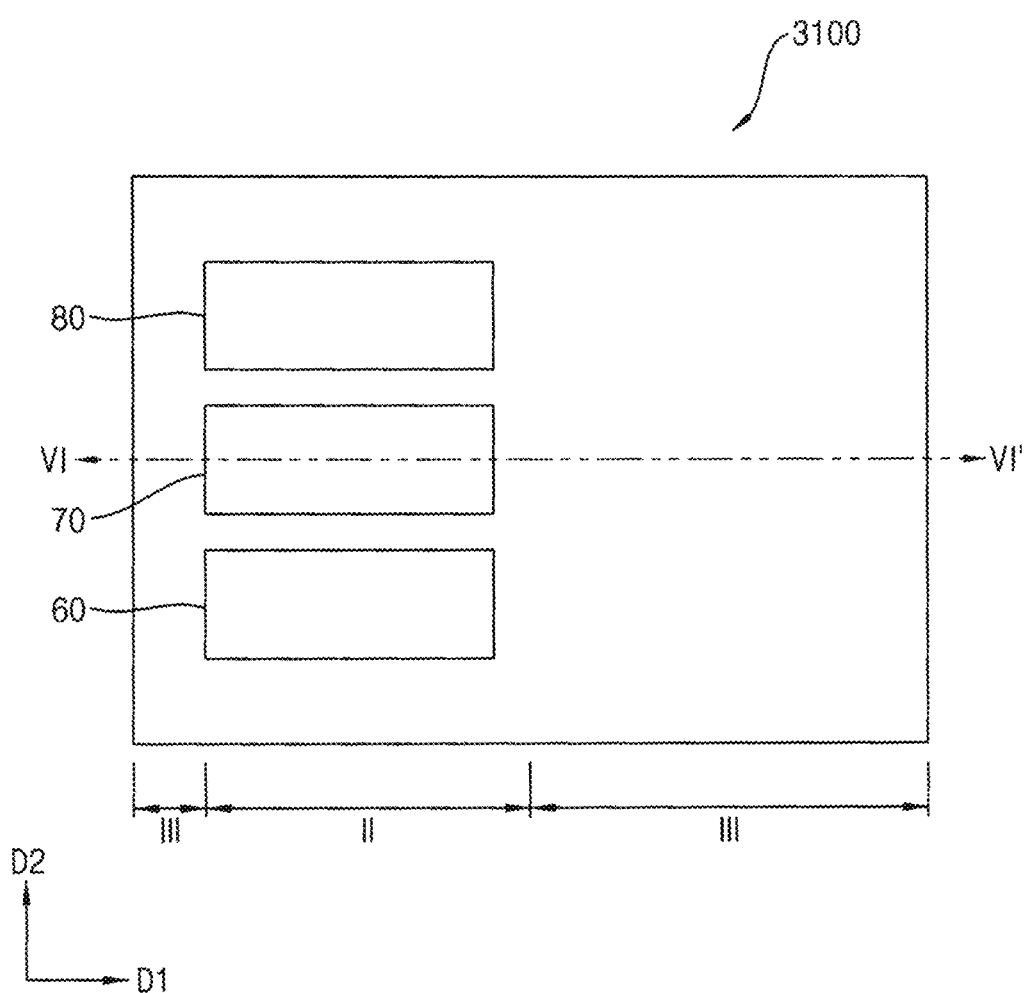
FIG. 74 is a plan view illustrating an organic light emitting display device according to an exemplary embodiment of the invention.
Figure 75:
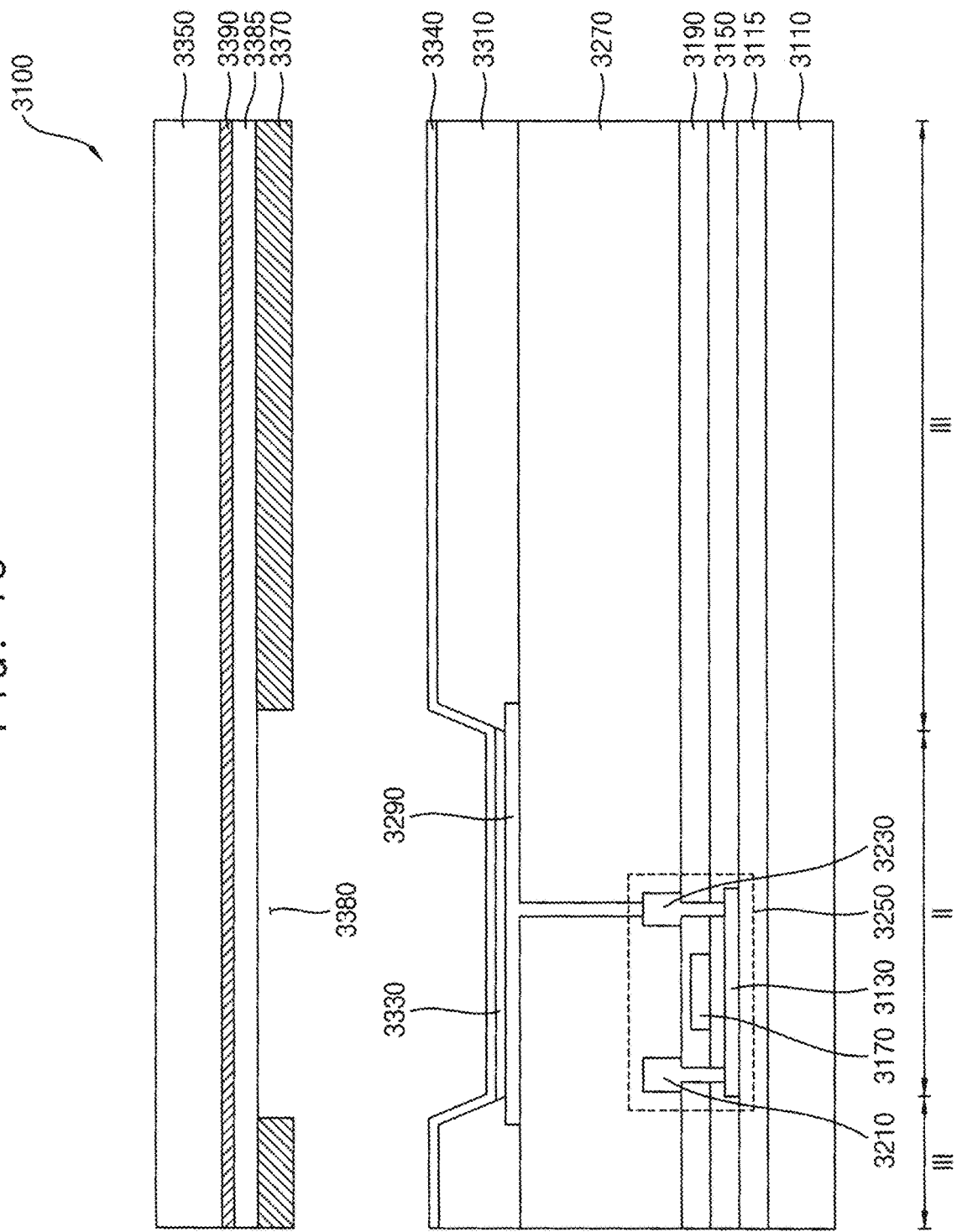
FIG. 75 is a cross-sectional view taken along line VI-VI' of FIG. 74.

FIG. 74 is a plan view illustrating an organic light emitting display device according to an exemplary embodiment of the invention. FIG. 75 is a cross-sectional view taken along line VI-VI' of FIG. 74.

An organic light emitting display device according to the illustrated exemplary embodiment is substantially same as the organic light emitting display device of FIGS. 1 and 2 except for a first sensing electrode 3370, a fourth insulation layer 3385 and a second sensing electrode 3390 and thus similar reference numerals are used for same elements and repetitive explanation will be omitted.

Referring to FIGS. 74 and 75, the second sensing electrode 3390 is disposed on a second substrate 3350. The second sensing electrode 3390 may be disposed in the reflection region III and the light-emitting region II. The fourth insulation layer 3385 is disposed on the second sensing electrode 3390. The first sensing electrode 3370 is disposed on the fourth insulation layer 3385.

The second sensing electrode 3390 may include a material having a predetermined reflectivity. In an exemplary embodiment, the second sensing electrode 3390 may include gold (Au), silver (Ag), aluminum (Al), magnesium (Mg), platinum (Pt), Nickel (Ni), titanium (Ti), etc., for example. In an alternative exemplary embodiment, the second sensing electrode 3390 may include an alloy, metal nitride, conductive metal oxide, etc. In an exemplary embodiment, the second sensing electrode 3390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 3350 and the first substrate 3110 may include substantially the same materials. In an exemplary embodiment, the second substrate 3350 may include quartz, synthetic quartz, calcium fluoride, fluoride-doping quartz, sodalime glass, non-alkali glass etc., for example. In exemplary embodiments, the second substrate 3350 may include a transparent inorganic material or flexible plastic. In an exemplary embodiment, the second substrate 3350 may include a flexible transparent resin substrate, for example. In this case, to increase flexibility of the organic light emitting display device 3100, the second substrate 3350 may include a stacked structure where at least one organic layer and at least one inorganic layer are alternately stacked.

The fourth insulation layer 3385 is disposed on the second sensing electrode 3390. The fourth insulation layer 3385 may includes an adhesive material.

The first sensing electrode 3370 is disposed on the fourth insulation layer 3385. The first sensing electrode 3370 may be disposed in the light-emitting region II and outside of the reflection region III.

The first sensing electrode 3370 may include a material having a predetermined reflectivity. In an exemplary embodiment, the first sensing electrode 3370 may include gold (Au), silver (Ag), aluminum (Al), magnesium (Mg), platinum (Pt), Nickel (Ni), titanium (Ti), etc., for example. In an alternative exemplary embodiment, the first sensing electrode 3370 may include an alloy, metal nitride, conductive metal oxide, etc. In an exemplary embodiment, the first sensing electrode 3370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The first sensing electrode 3370 may have a different thickness from a thickness of the second sensing electrode 3390. In an exemplary embodiment, a thickness of the first sensing electrode 3370 may be about 1000 Å, for example. When the thickness of the first sensing electrode 3370 is about 1000 Å, transmissivity of the first sensing electrode 3370 may be about 0%, and reflexibility of the first sensing electrode 3370 may be greater than about 95%. In addition, a thickness of the second sensing electrode 3390 may be about 100 Å. When the thickness of the second sensing electrode 3390 is about 100 Å, transmissivity of the second sensing electrode 3390 may be greater than about 50% and less than about 95%. When an organic light emitting display device emits light, the second sensing electrode 3390 may display an image in the light-emitting region II, and when an organic light emitting display device does not emit light, the second sensing electrode 3390 may perform a mirror function.

FIGS. 76 to 83 are cross-sectional views illustrating a method of manufacturing the organic light emitting display device of FIG. 75.

Figure 76:
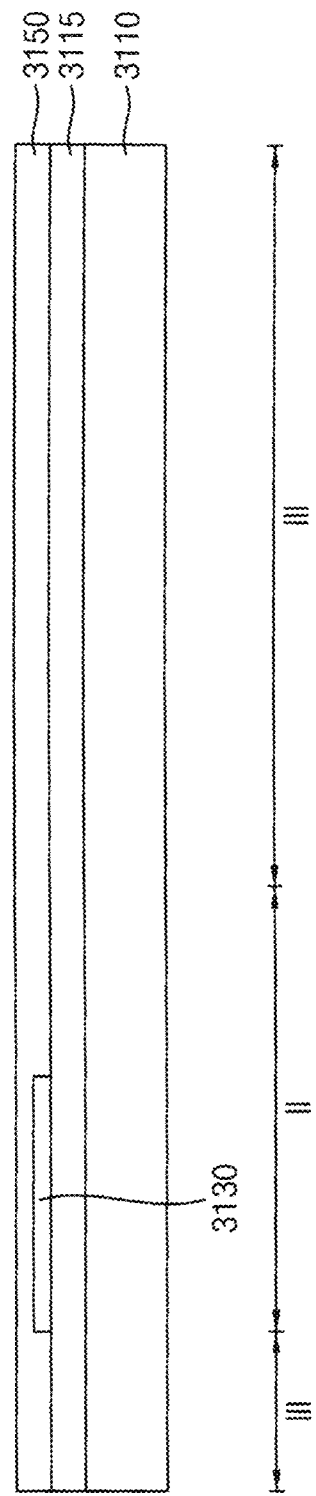
FIGS. 76 to 83 are cross-sectional views illustrating a method of manufacturing the organic light emitting display device of FIG. 75.

Referring to FIG. 76, the buffer layer 3115 is disposed on the first substrate 3110. Thereafter, the active pattern 3130 and the first insulation layer 3150 are disposed on the buffer layer 3115.

In an exemplary embodiment, the first substrate 3110 may include quartz, synthetic quartz, calcium fluoride, fluoride-doping quartz, a sodalime glass, a non-alkali glass etc., for example.

The light emitting structure may be disposed on the first substrate 3110. The first substrate 3110 may include transparent materials. In an exemplary embodiment, the first substrate 3110 may include quartz, synthetic quartz, calcium fluoride, fluoride-doping quartz, a sodalime glass, a non-alkali glass etc., for example. In an alternative exemplary embodiment, the first substrate 3110 may include a flexible transparent resin substrate. Here, the flexible transparent resin substrate for the first substrate 3110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 3110 may have a structure in which the first polyimide layer, the barrier film layer and the second polyimide layer are stacked on a glass substrate. Here, after an insulation layer is provided on the second polyimide layer, the light emitting structure (e.g., the semiconductor element 3250, a capacitor, the first electrode 3290, the light emitting layer 3330, the second electrode 3340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 3110 after the removal of the glass substrate. As the organic light emitting display device 3100 includes the light-emitting region II and the reflection region III, the first substrate 3110 may also include the light-emitting region II and the reflection region III.

A buffer layer 3115 may be disposed on the first substrate 3110. The buffer layer 3115 may extend from the light-emitting region II into the reflection region III. The buffer layer 3115 may prevent the diffusion (e.g., an out gassing) of metal atoms and/or impurities from the first substrate 110. Additionally, the buffer layer 3115 may control a rate of a heat transfer in a crystallization process for forming the active pattern 3130, thereby obtaining substantially uniform the active pattern 3130. Furthermore, the buffer layer 3115 may improve a surface flatness of the first substrate 3110 when a surface of the first substrate 3110 is relatively irregular. According to a type of the first substrate 3110, at least two buffer layers may be provided on the first substrate 3110, or the buffer layer may not be disposed.

In an exemplary embodiment, the active pattern 3130 may include an oxide semiconductor, an inorganic semiconductor (e.g., amorphous silicon, polysilicon, etc.), an organic semiconductor, etc., for example.

The first insulation layer 3150 may be disposed on the active pattern 3130. The first insulation layer 3150 may cover the active pattern 3130 in the light-emitting region II, and may extend in the first direction on the first substrate 3110. That is, the first insulation layer 3150 may be disposed on the entire surface of the first substrate 3110. In an exemplary embodiment, the first insulation layer 3150 may include a silicon compound, a metal oxide, etc., for example.

Figure 77:
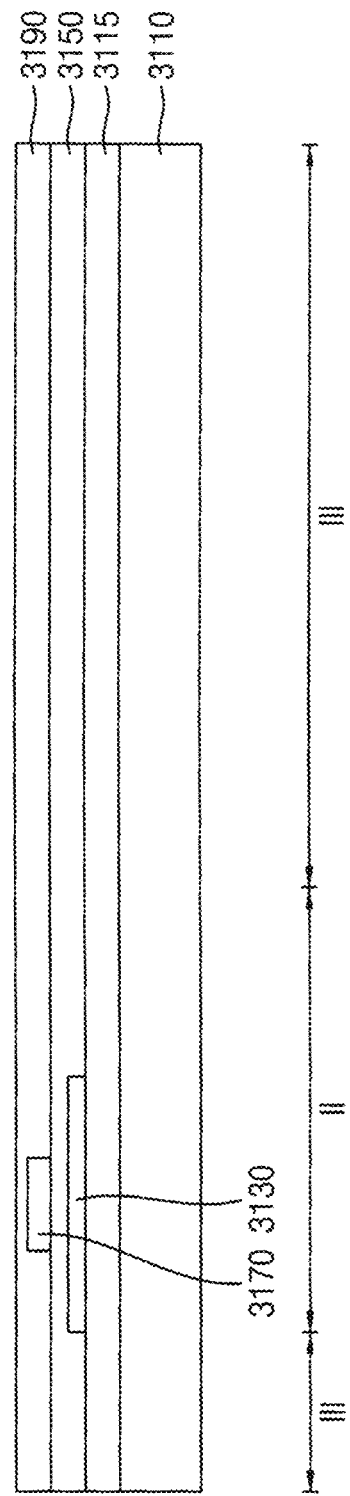

Referring to FIG. 77, the gate electrode 3170 and the second insulation layer 3190 are disposed on the first substrate 3110 on which the first insulation layer 3150 is disposed.

The gate electrode 3170 may be disposed on a portion of the first insulation layer 3150 under which the active pattern 3130 is disposed. In an exemplary embodiment, the gate electrode 3170 may include a metal, an alloy, metal nitride, conductive metal oxide, transparent conductive materials, etc., for example.

The second insulation layer 3190 may be disposed on the gate electrode 3170. The second insulation layer 3190 may cover the gate electrode 3170 in the light-emitting region II, and may extend in the first direction on the first substrate 3110. That is, the second insulation layer 3190 may be disposed on the entire surface of the first substrate 3110. In an exemplary embodiment, the second insulation layer 3190 may include a silicon compound, a metal oxide, etc., for example.

Figure 78:
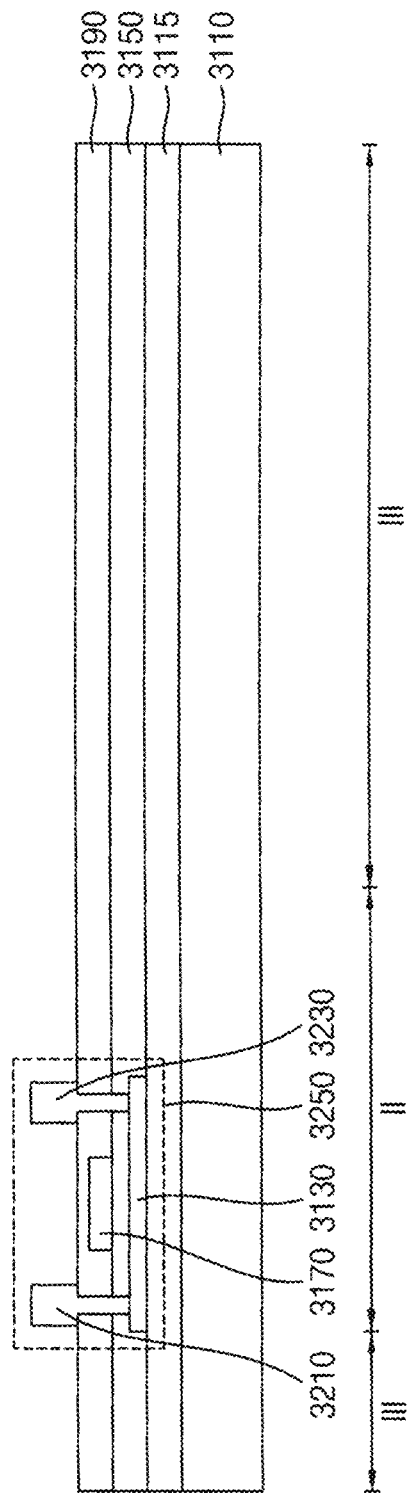

Referring to FIG. 78, the source electrode 3210 and the drain electrode 3230 are disposed on the first substrate 3110 on which the second insulation layer 3190 is disposed.

The source electrode 3210 and the drain electrode 3230 may be disposed on the second insulation layer 3190. The source electrode 3210 may be in contact with a first side of the active layer 3130 by removing a portion of the first and second insulation layers 3150 and 3190. The drain electrode 3230 may be in contact with a second side of the active layer 3130 by removing a second portion of the first and second insulation layers 3150 and 3190. In an exemplary embodiment, each of the source electrode 3210 and the drain electrode 3230 may include a metal, an alloy, metal nitride, conductive metal oxide, transparent conductive materials, etc., for example.

In the illustrated exemplary embodiment, the gate electrode 3170 is disposed on the active pattern 3130. However, the invention is not limited thereto, and the gate electrode 3170 may be disposed under the active pattern 3130.

Figure 79:
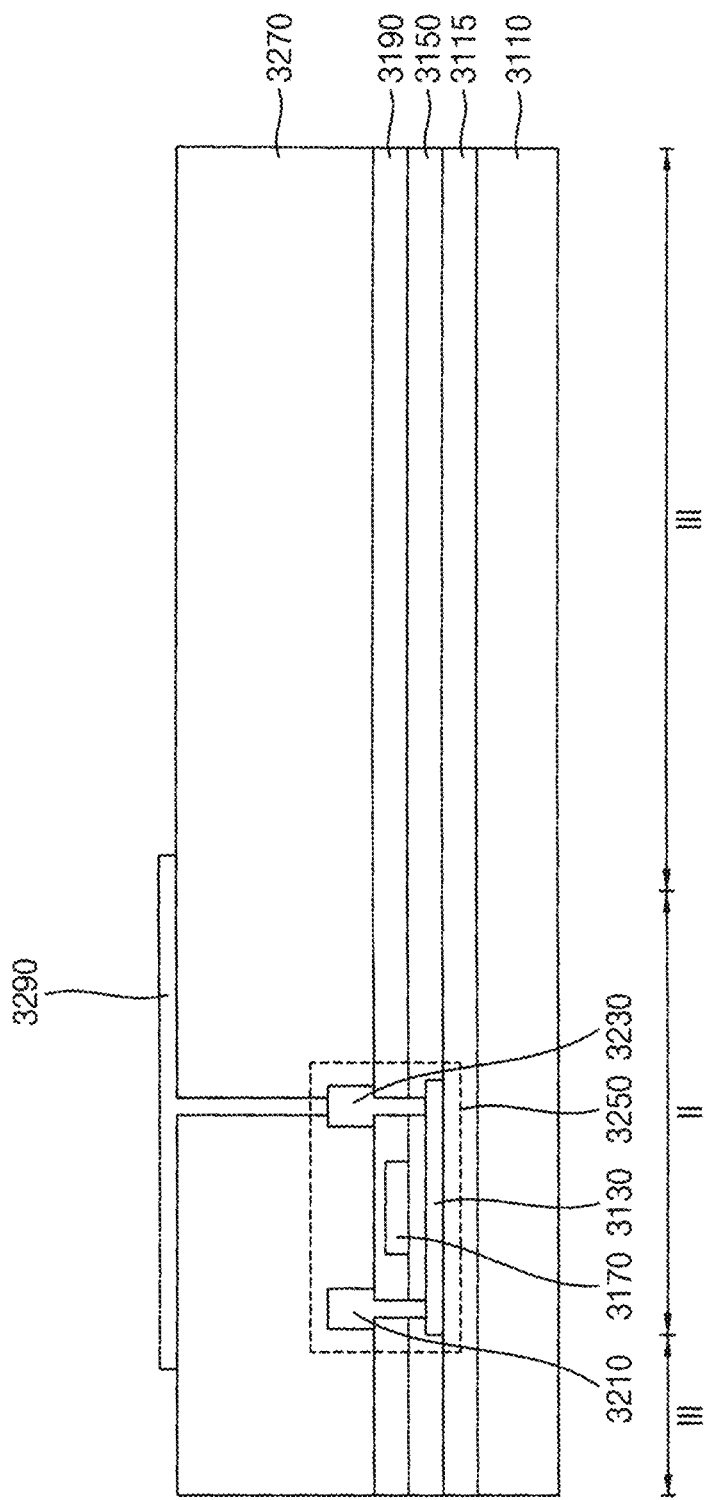

Referring to FIG. 79, the third insulation layer 3270 and the first electrode 3290 are disposed on the first substrate 3110 on which the source electrode 3210 and the drain electrode 3230 are disposed.

The third insulation layer 3270 may be disposed on the source electrode 3210 and the drain electrode 3230. The third insulation layer 3270 may cover the source electrode 3210 and the drain electrode 3230 in the sub-pixel region II, and may extend in the first direction on the first substrate 3110. That is, the third insulation layer 3270 may be disposed on the entire surface of the first substrate 3110. In an exemplary embodiment, the third insulation layer 3270 may include a silicon compound, a metal oxide, etc., for example.

The first electrode 3290 may be disposed on the third insulation layer 3270. The first electrode 3290 may be in contact with the source electrode 3210 by removing a portion of the third insulation layer 3270. In addition, the first electrode 3290 may be electrically connected to the semiconductor element 3250. In an exemplary embodiment, the first electrode 3290 may include a metal, an alloy, metal nitride, conductive metal oxide, transparent conductive materials, etc., for example.

Figure 80:
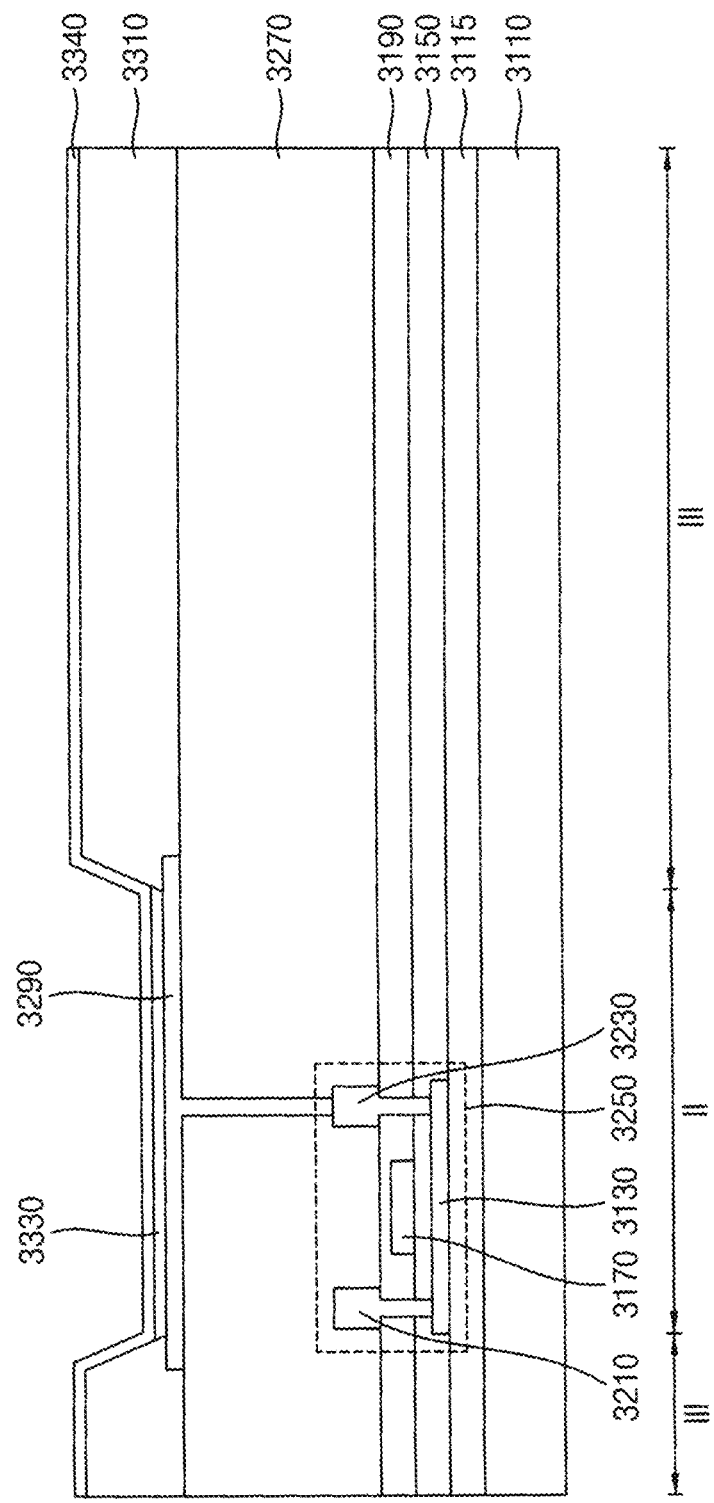

Referring to FIG. 80, the pixel defining layer 3310, the light emitting layer 3330 and the second electrode 3340 are disposed on the first substrate 3110 on which the first electrode 3290 is disposed.

The pixel defining layer 3310 may be disposed on the third insulation layer 3270 to expose a portion of the first electrode 3290. The pixel defining layer 3310 may include organic materials or inorganic materials. In this case, the light emitting layer 3330 may be disposed on a portion that the first electrode 3290 is exposed by the pixel defining layer 3310.

The light emitting layer 3330 may be disposed on the exposed first electrode 3290. The light emitting layer 3330 may be provided using light emitting materials capable of generating different colors of light (e.g., a red color of light, a blue color of light, and a green color of light). However, the invention is not limited thereto, and the light emitting layer 3330 may stack light emitting materials capable of generating different colors of light to emit white color of light.

The second electrode 3340 may be disposed on the pixel defining layer 3310 and the light emitting layer 3330. The second electrode 3340 may cover the pixel defining layer 3310 and the light emitting layer 3330 in the light-emitting region II and the reflection region III, and may extend in the first direction on the first substrate 3110. That is, the second electrode 3340 may be electrically connected to the first through third pixels. In an exemplary embodiment, the second electrode 3340 may include a metal, an alloy, metal nitride, conductive metal oxide, a transparent conductive material, etc., for example. These may be used alone or in a combination thereof. The first substrate 3110 may be combined with the second substrate 3350 by using a sealing member. In addition, a filler may be disposed between the first substrate 3110 and the second substrate 3350.

Figure 81:
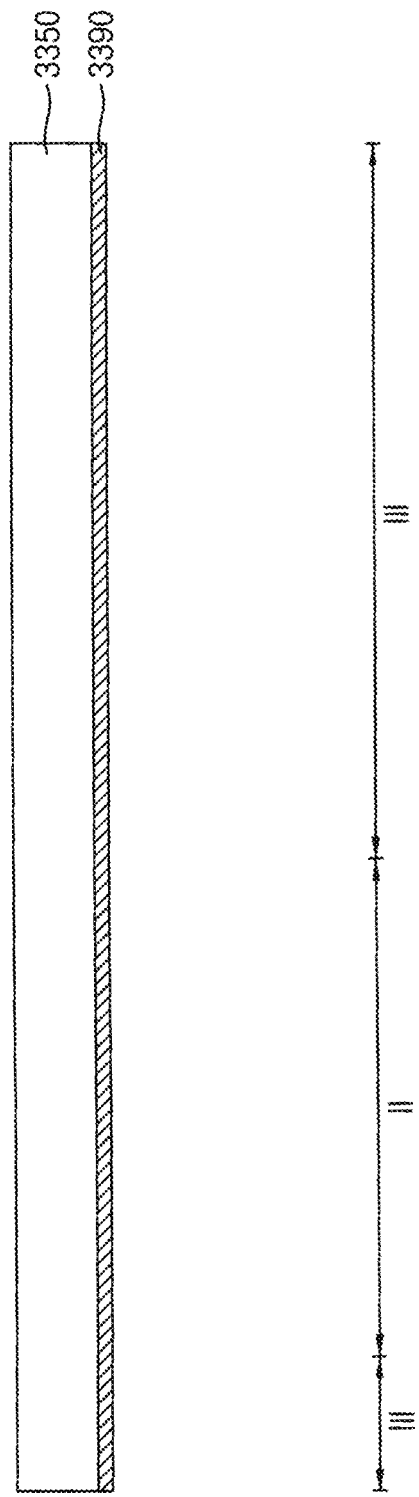

Referring to FIG. 81, the second sensing electrode 3390 is disposed on the second substrate 3350.

The second sensing electrode 3390 may be disposed on a first surface of the second substrate 3350. A first surface of the second sensing electrode 3390 may face the second electrode 3340, and a second surface opposing the first surface of the second sensing electrode 3390 may contact with the second substrate 3350.

The second sensing electrode 3390 may include a material having a predetermined reflectivity. In an exemplary embodiment, the second sensing electrode 3390 may include gold (Au), silver (Ag), aluminum (Al), magnesium (Mg), platinum (Pt), Nickel (Ni), titanium (Ti), etc., for example. In an alternative exemplary embodiment, the second sensing electrode 3390 may include an alloy, metal nitride, conductive metal oxide, etc. In an exemplary embodiment, the second sensing electrode 3390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 3350 and the first substrate 3110 may include substantially the same materials. In an exemplary embodiment, the second substrate 3350 may include quartz, synthetic quartz, calcium fluoride, fluoride-doping quartz, sodalime glass, non-alkali glass etc., for example. In exemplary embodiments, the second substrate 3350 may include a transparent inorganic material or flexible plastic. In an exemplary embodiment, the second substrate 3350 may include a flexible transparent resin substrate, for example. In this case, to increase flexibility of the organic light emitting display device 3100, the second substrate 3350 may include a stacked structure where at least one organic layer and at least one inorganic layer are alternately stacked.

Figure 82:
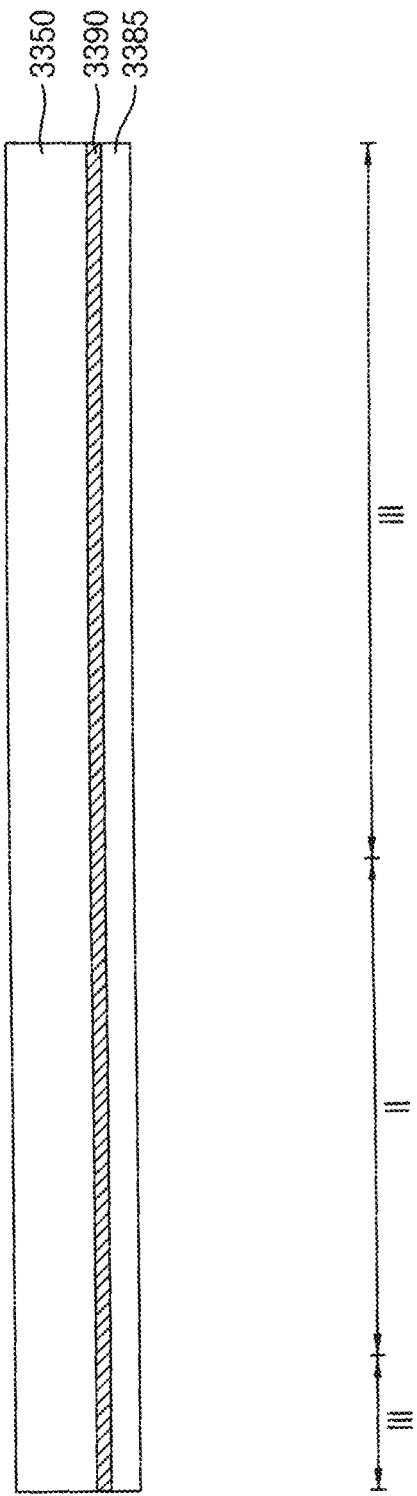

Referring to FIG. 82, the fourth insulation layer 3385 is disposed on the second substrate 3350 on which the second sensing electrode 3390 is disposed.

The fourth insulation layer 3385 may prevent from oxidation of the second sensing electrode 3390. The fourth insulation layer 3385 may include an adhesive material. The fourth insulation layer 3385 may prevent from separating of the first sensing electrode 3370 and the second sensing electrode 3390 from the second substrate 3350. The fourth insulation layer 3385 may insulate between the first sensing electrode 3370 and the second sensing electrode 3390.

Figure 83:
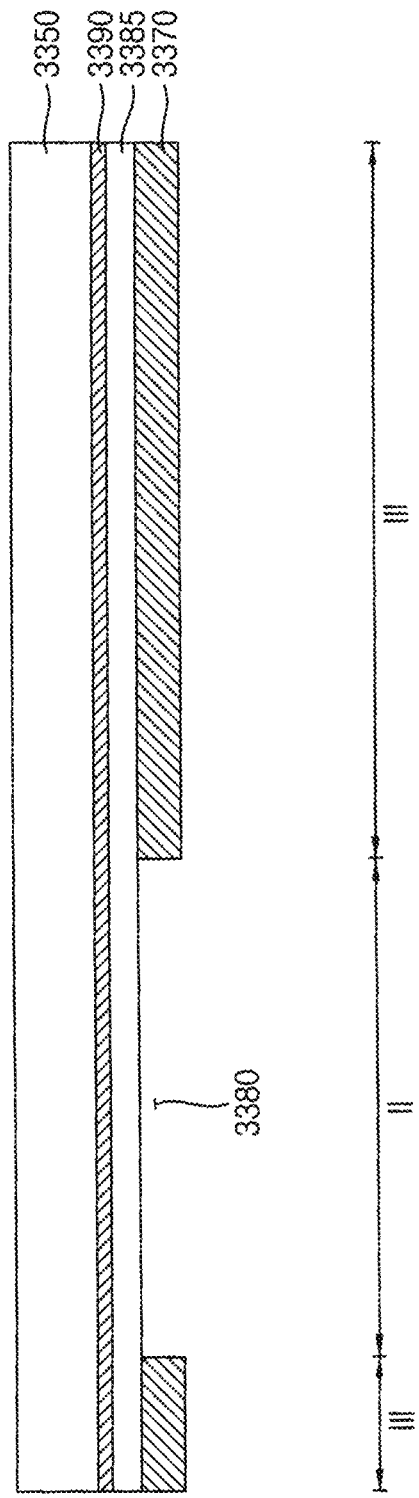

Referring to FIG. 83, the first sensing electrode 3370 is disposed on the fourth insulation layer 3385.

The first sensing electrode 3370 may be disposed in the light-emitting region II and outside of the reflection region III.

The first sensing electrode 3370 may include a material having a predetermined reflectivity. In an exemplary embodiment, the first sensing electrode 3370 may include gold (Au), silver (Ag), aluminum (Al), magnesium (Mg), platinum (Pt), Nickel (Ni), titanium (Ti), etc., for example. In an alternative exemplary embodiment, the first sensing electrode 3370 may include an alloy, metal nitride, conductive metal oxide, etc. In an exemplary embodiment, the first sensing electrode 3370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 84:
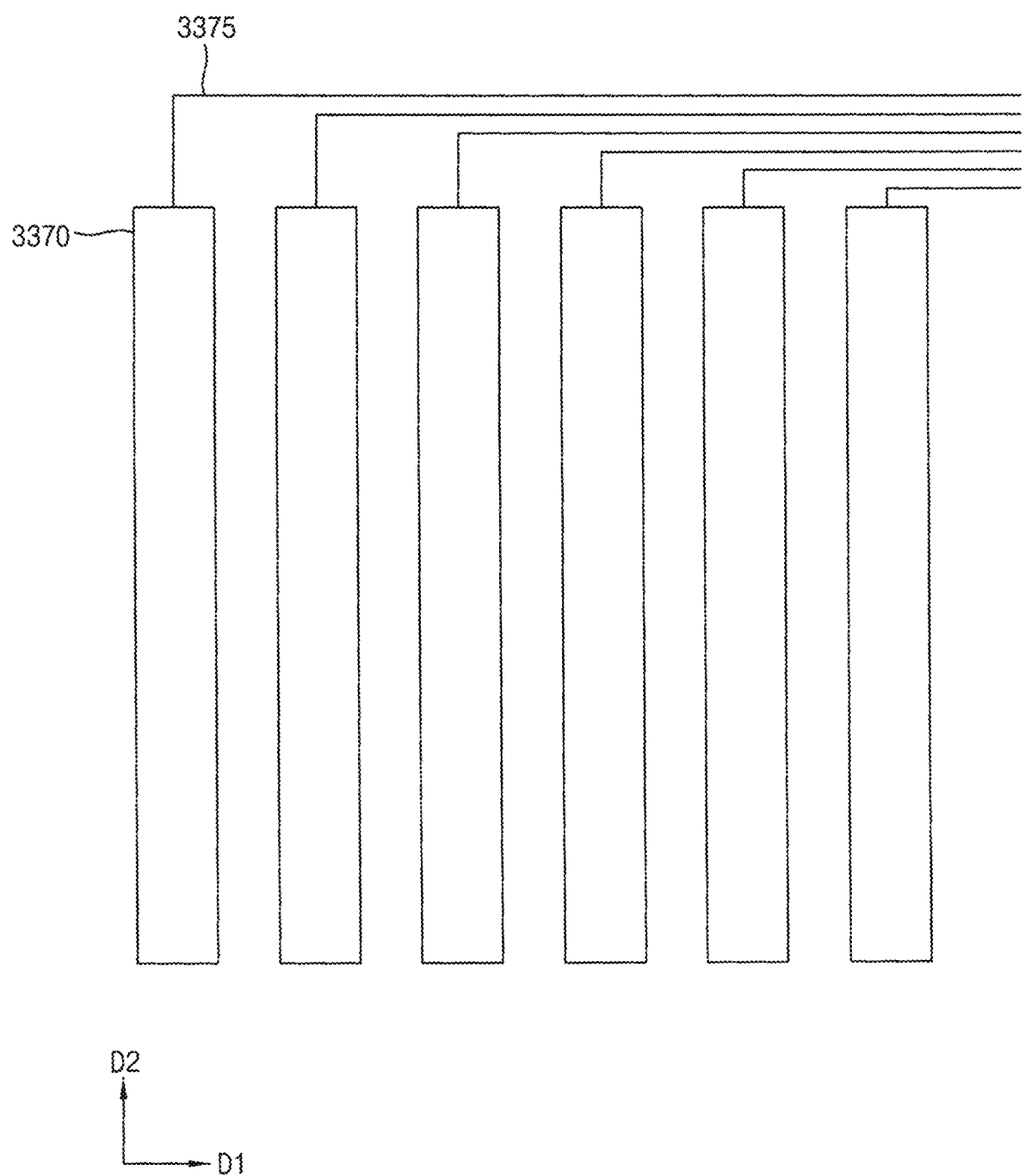
FIG. 84 is a plan view illustrating a first sensing electrode of FIG. 75.
Figure 85:
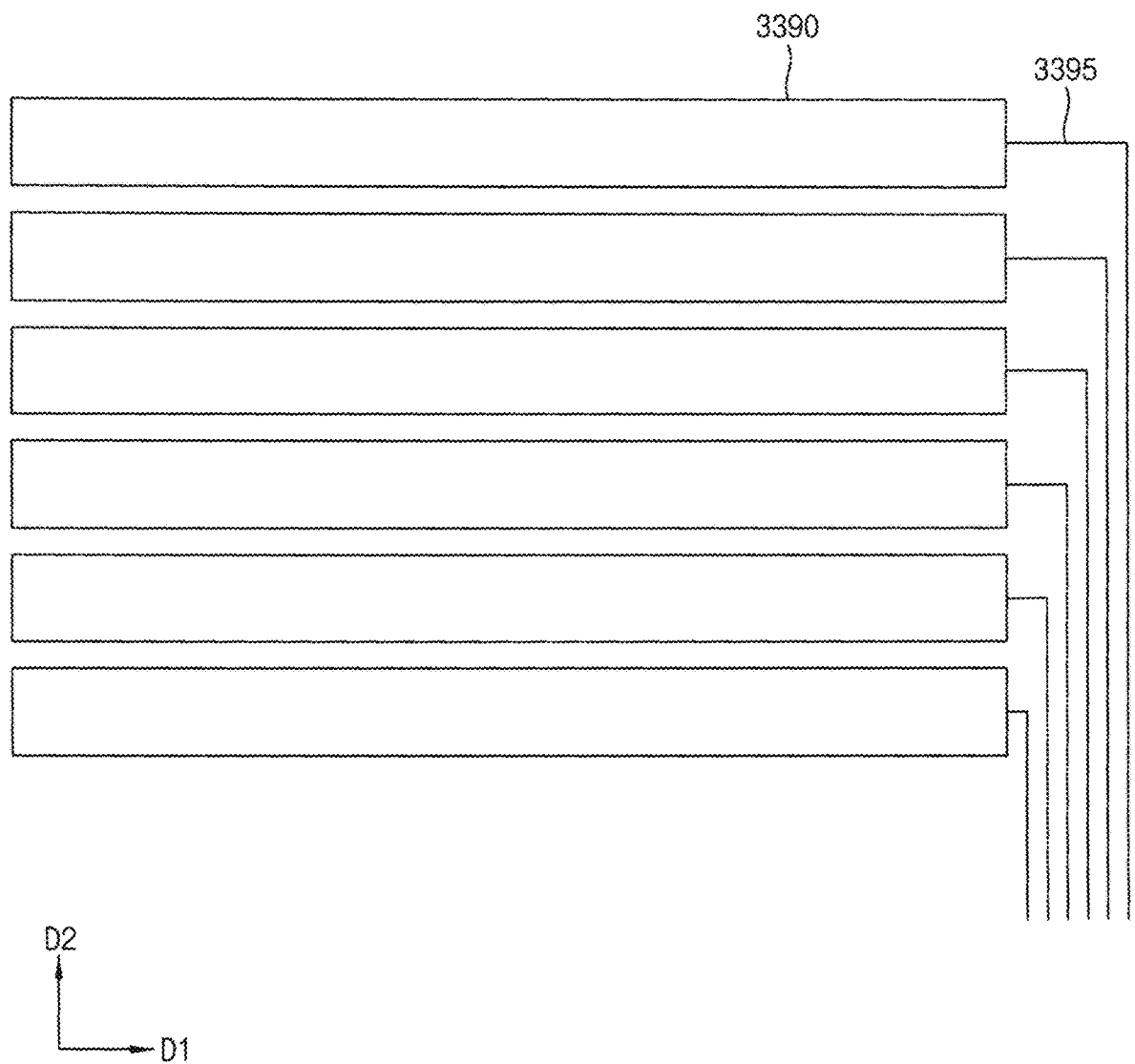
FIG. 85 is a plan view illustrating a second sensing electrode of FIG. 75.
Figure 86:
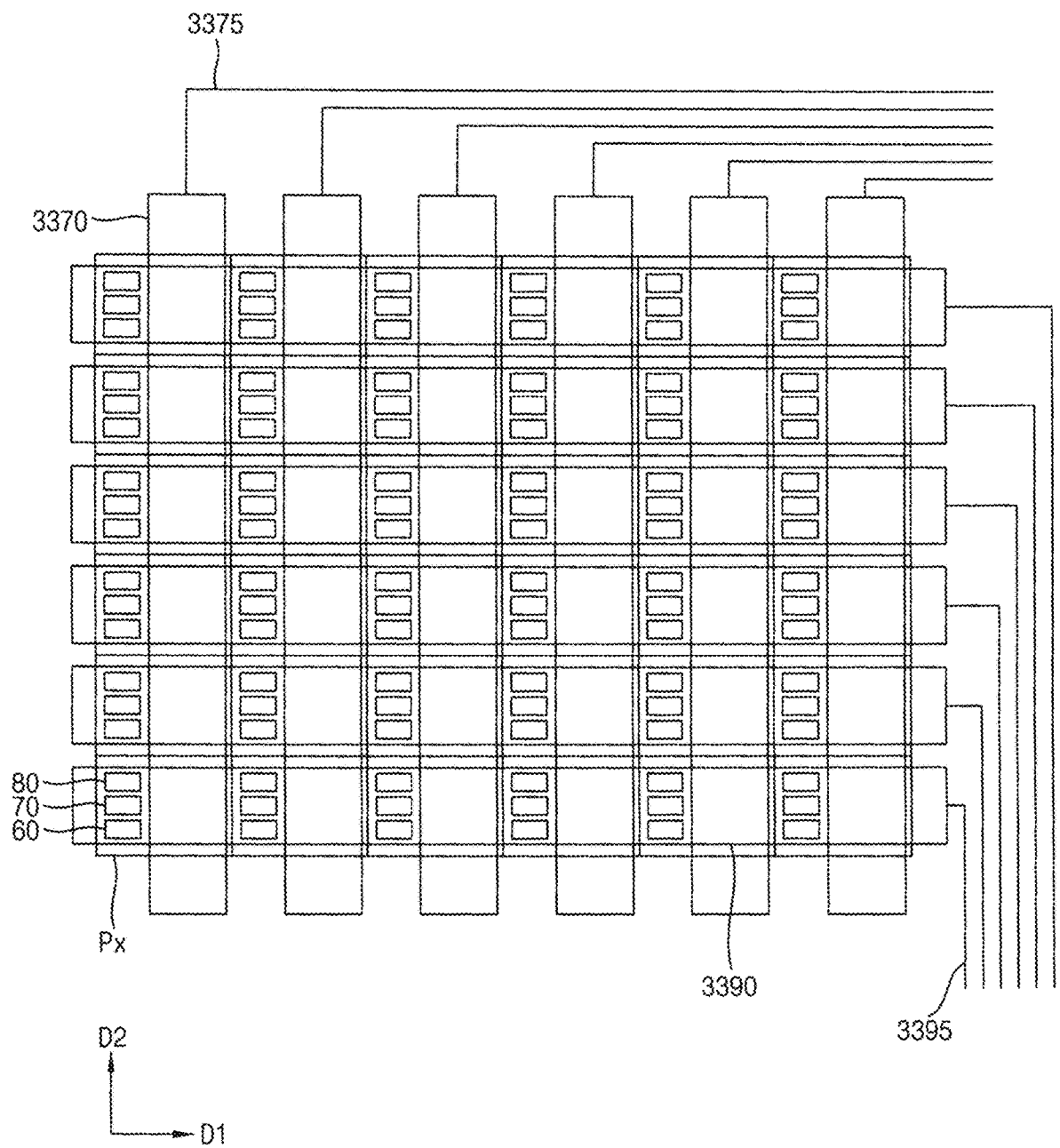
FIG. 86 is a plan view illustrating the first sensing electrode of FIG. 84 and the second sensing electrode of FIG. 85.

FIG. 84 is a plan view illustrating a first sensing electrode of FIG. 75. FIG. 85 is a plan view illustrating a second sensing electrode of FIG. 75. FIG. 86 is a plan view illustrating the first sensing electrode of FIG. 84 and the second sensing electrode of FIG. 85.

Referring to FIGS. 75 and 84 to 86, a first sensing electrode 3370 and a second sensing electrode 3390 are illustrated.

The first sensing electrode 3370 may be provided as a plurality of patterns extending in a second direction D2. The first sensing electrode 3370 is disposed in the reflection region III. The first sensing electrode 3370 may be connected to a sensing driving part through a first connecting line 3375. The first connecting line 3375 may include the same material as that of the first sensing electrode 3370. The first connecting line 3375 may be disposed on the same layer as that on which the first sensing electrode 3370 is disposed.

The second sensing electrode 3390 may be provided as a plurality of patterns extending in a first direction D1 crossing the second direction D2. The second sensing electrode 3390 is disposed in the light-emitting region II and the reflection region III. The second sensing electrode 3390 may be connected to a sensing driving part through a second connecting line 3395. The second connecting line 3395 may include the same material as that of the second sensing electrode 3390. The second connecting line 3395 may be disposed on the same layer as that on which the second sensing electrode 3390 is disposed.

The first sensing electrode 3370 may include a material having a predetermined reflectivity. The second sensing electrode 3390 may include a material having a predetermined reflectivity. The first sensing electrode 3370 may partially overlap the second sensing electrode 3390.

The second sensing electrode 3390 is disposed on a second substrate 3350. The fourth insulation layer 3385 is disposed on the second sensing electrode 3390. The first sensing electrode 3370 is disposed on the fourth insulation layer 3385.

The first sensing electrode 3370 and second sensing electrode 3390 may perform as a sensing electrode of a touch screen panel of mutual capacitance type. In an exemplary embodiment, when an electric conductor is contacted, capacitance of an intersecting point of the first sensing electrode 3370 and second sensing electrode 3390 around a touch position is changed, for example. Thus, a touch panel sensor (not shown) may decide a touch position based on a capacitance sensing signal corresponding to the change of capacitance.

The first sensing electrode 3370 may have a different thickness from a thickness of the second sensing electrode 3390. In an exemplary embodiment, a thickness of the first sensing electrode 3370 may be about 1000 Å, for example. When the thickness of the first sensing electrode 3370 is about 1000 Å, transmissivity of the first sensing electrode 3370 may be about 0%, and reflexibility of the first sensing electrode 3370 may be greater than about 95%. In addition, a thickness of the second sensing electrode 3390 may be about 100 Å. When the thickness of the second sensing electrode 3390 is about 100 Å, transmissivity of the second sensing electrode 3390 may be greater than about 50% and less than about 95%. When an organic light emitting display device emits light, the second sensing electrode 3390 may display an image in the light-emitting region II, and when an organic light emitting display device does not emit light, the second sensing electrode 3390 may perform a mirror function.

Figure 87:
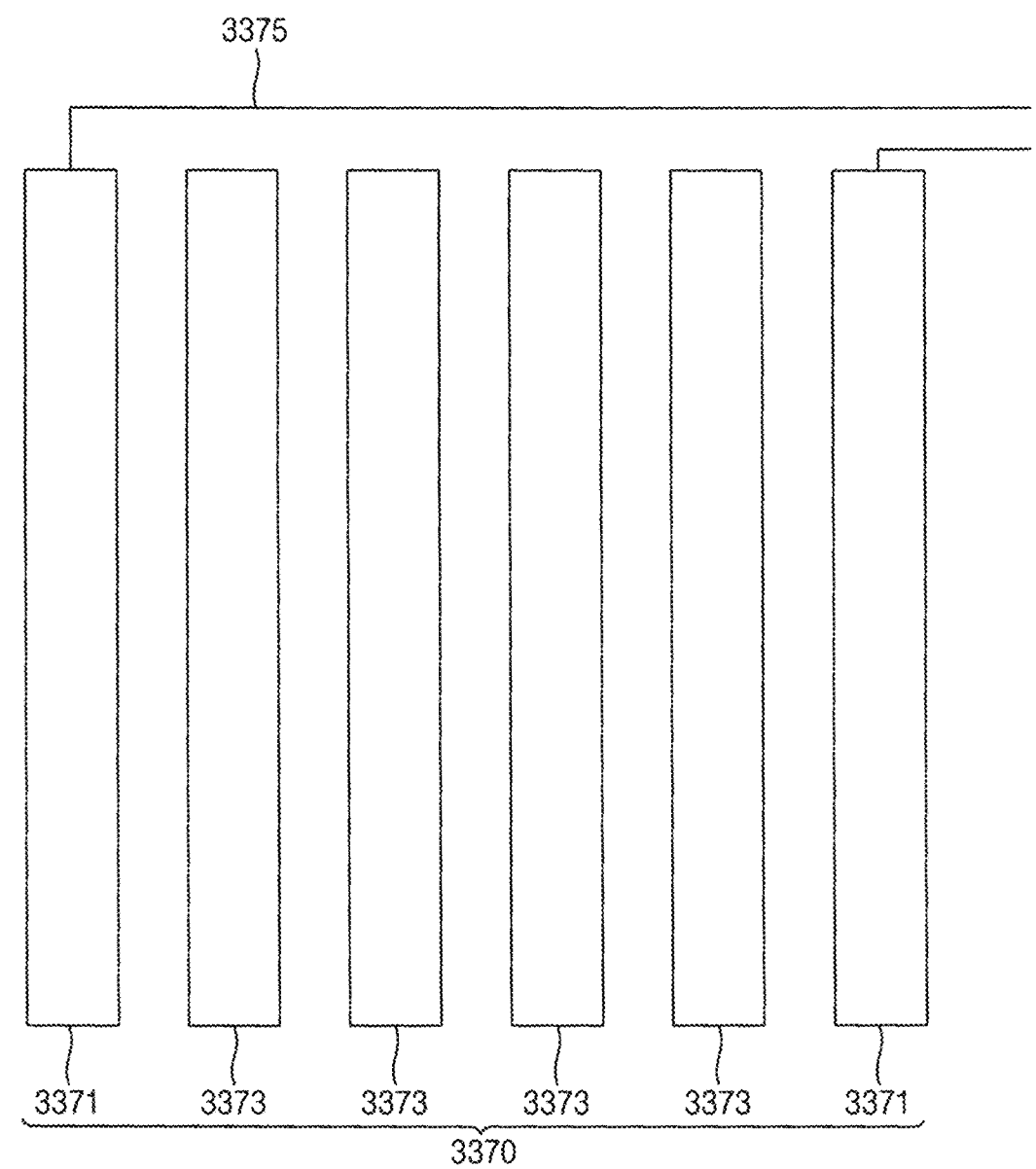
FIG. 87 is a plan view illustrating a first sensing electrode of FIG. 75.
Figure 88:
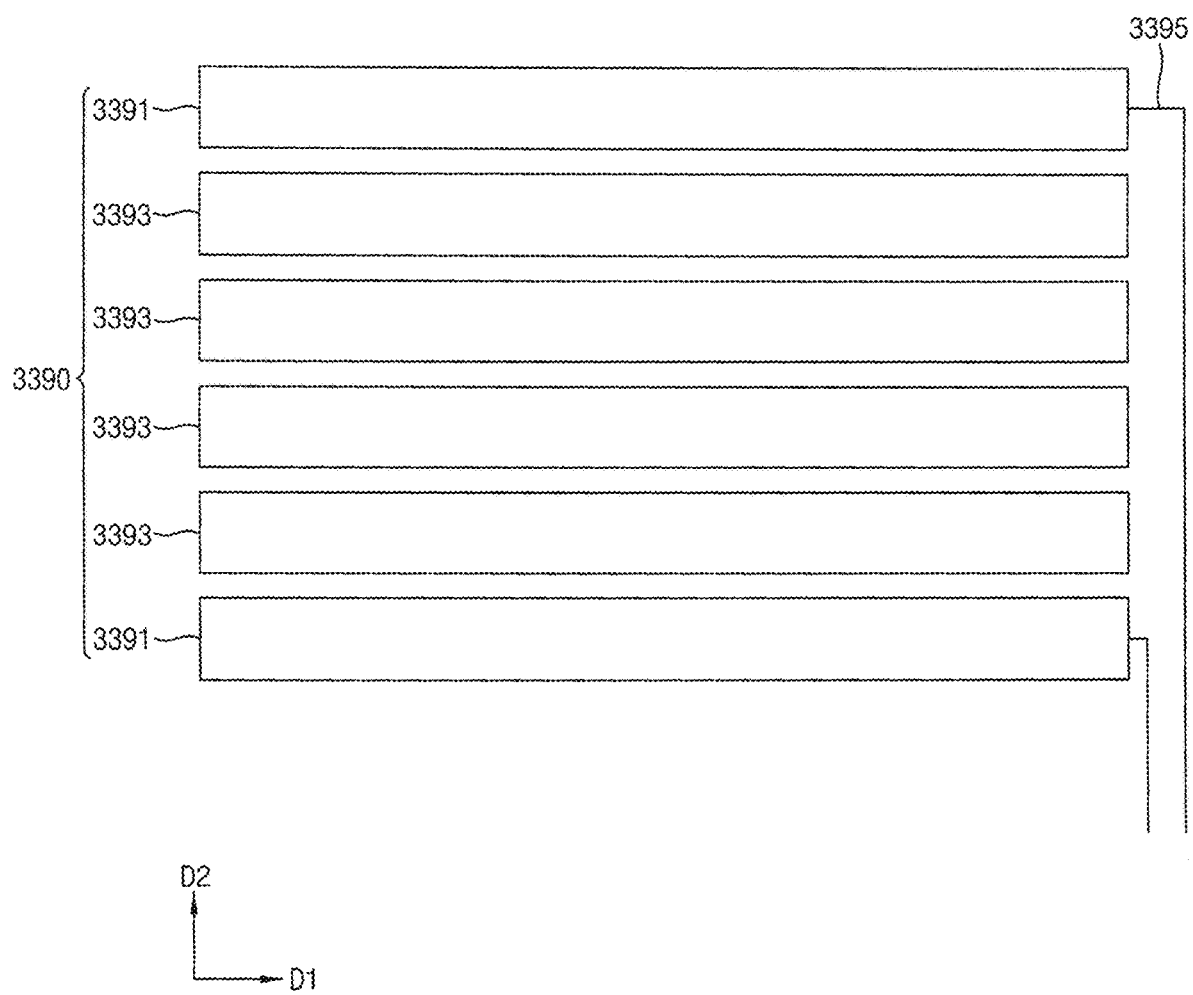
FIG. 88 is a plan view illustrating a second sensing electrode of FIG. 75.
Figure 89:
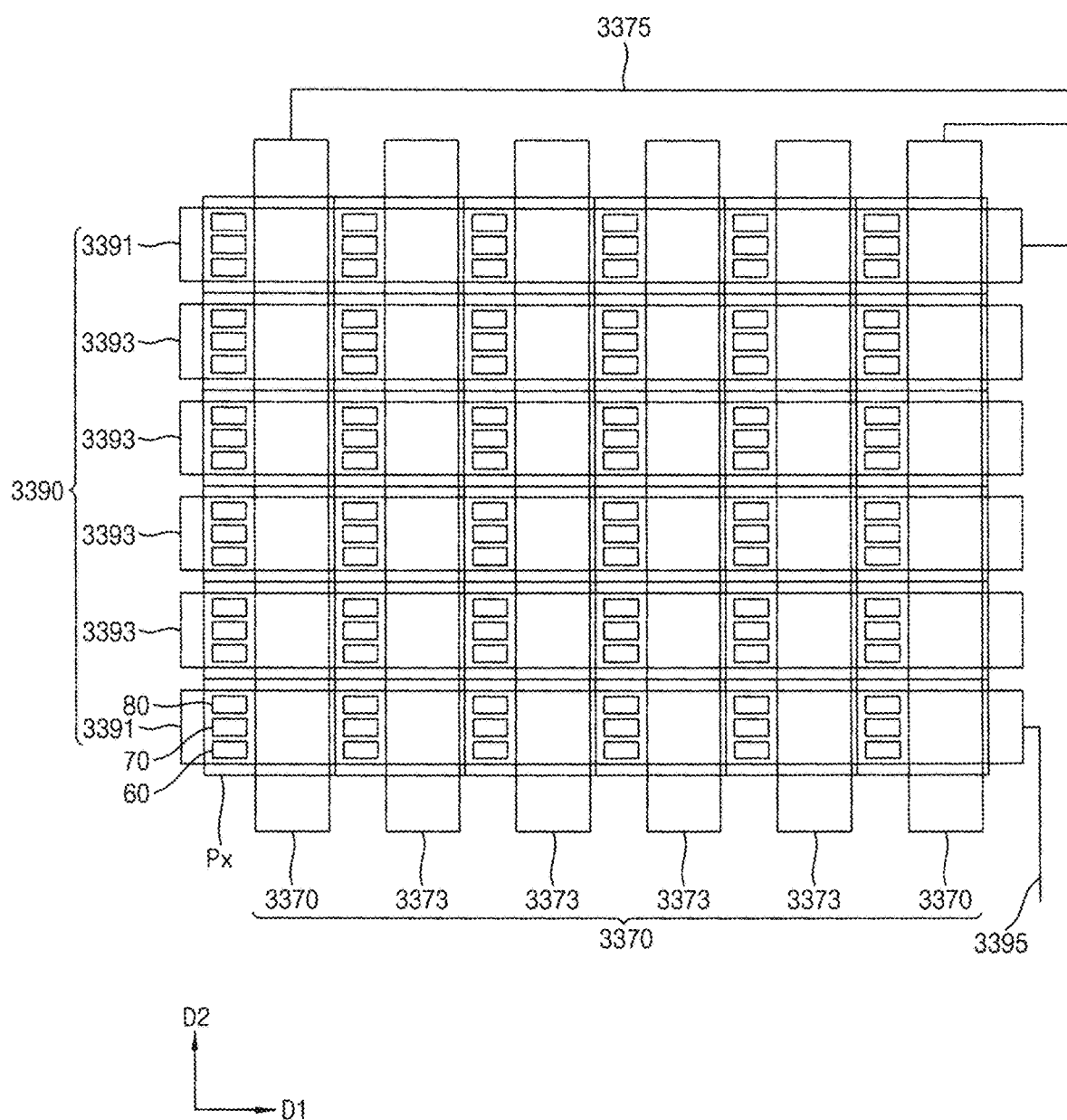
FIG. 89 is a plan view illustrating the first sensing electrode of FIG. 87 and the second sensing electrode of FIG. 88.

FIG. 87 is a plan view illustrating a first sensing electrode of FIG. 75. FIG. 88 is a plan view illustrating a second sensing electrode of FIG. 75. FIG. 89 is a plan view illustrating the first sensing electrode of FIG. 87 and the second sensing electrode of FIG. 88.

Referring to FIGS. 75 and 87 to 89, a first sensing electrode 3370 and a second sensing electrode 3390 are illustrated.

The first sensing electrode 3370 may include a plurality of first sensing patterns 3371 extending in a second direction D2 and a plurality of first dummy patterns 3373 disposed between the first sensing patterns 3371. The first sensing electrode 3370 is disposed in the reflection region III. An interval of the first sensing patterns 3371 may be adjusted according to the number of the first dummy patterns 3373. The first sensing electrode 3370 may be connected to a sensing driving part through a first connecting line 3375. The first connecting line 3375 may include the same material as that of the first sensing electrode 3370. The first connecting line 3375 may be disposed on the same layer as that on which the first sensing electrode 3370 is disposed.

The second sensing electrode 3390 may be provided as a plurality of second sensing patterns 3391 extending in a first direction D1 crossing the second direction D2 and a plurality of second dummy patterns 3393 disposed between the second sensing patterns 3391. The second sensing electrode 3390 is disposed in the light-emitting region II and the reflection region III. An interval of the second sensing electrode 3390 may be adjusted according to the number of the second dummy patterns 3393. The second sensing electrode 3390 may be connected to a sensing driving part through a second connecting line 3395. The second connecting line 3395 may include the same material as that of the second sensing electrode 3390. The second connecting line 3395 may be disposed on the same layer as that on which the second sensing electrode 3390 is disposed.

The first sensing electrode 3370 may include a material having a predetermined reflectivity. The second sensing electrode 3390 may include a material having a predetermined reflectivity. The first sensing electrode 3370 may partially overlap the second sensing electrode 3390.

The second sensing electrode 3390 is disposed on a second substrate 3350. The fourth insulation layer 3385 is disposed on the second sensing electrode 3390. The first sensing electrode 3370 is disposed on the fourth insulation layer 3385.

The first sensing electrode 3370 and second sensing electrode 3390 may perform as a sensing electrode of a touch screen panel of mutual capacitance type. In an exemplary embodiment, when an electric conductor is contacted, capacitance of an intersecting point of the first sensing electrode 3370 and second sensing electrode 3390 around a touch position is changed, for example. Thus, a touch panel sensor (not shown) may decide a touch position based on a capacitance sensing signal corresponding to the change of capacitance.

The first sensing electrode 3370 may have a different thickness from a thickness of the second sensing electrode 3390. In an exemplary embodiment, a thickness of the first sensing electrode 3370 may be about 1000 Å, for example. When the thickness of the first sensing electrode 3370 is about 1000 Å, transmissivity of the first sensing electrode 3370 may be about 0%, and reflexibility of the first sensing electrode 3370 may be greater than about 95%. In addition, a thickness of the second sensing electrode 3390 may be about 100 Å. When the thickness of the second sensing electrode 3390 is about 100 Å, transmissivity of the second sensing electrode 3390 may be greater than about 50% and less than about 95%. When an organic light emitting display device emits light, the second sensing electrode 3390 may display an image in the light-emitting region II, and when an organic light emitting display device does not emit light, the second sensing electrode 3390 may perform a mirror function.

Figure 90:
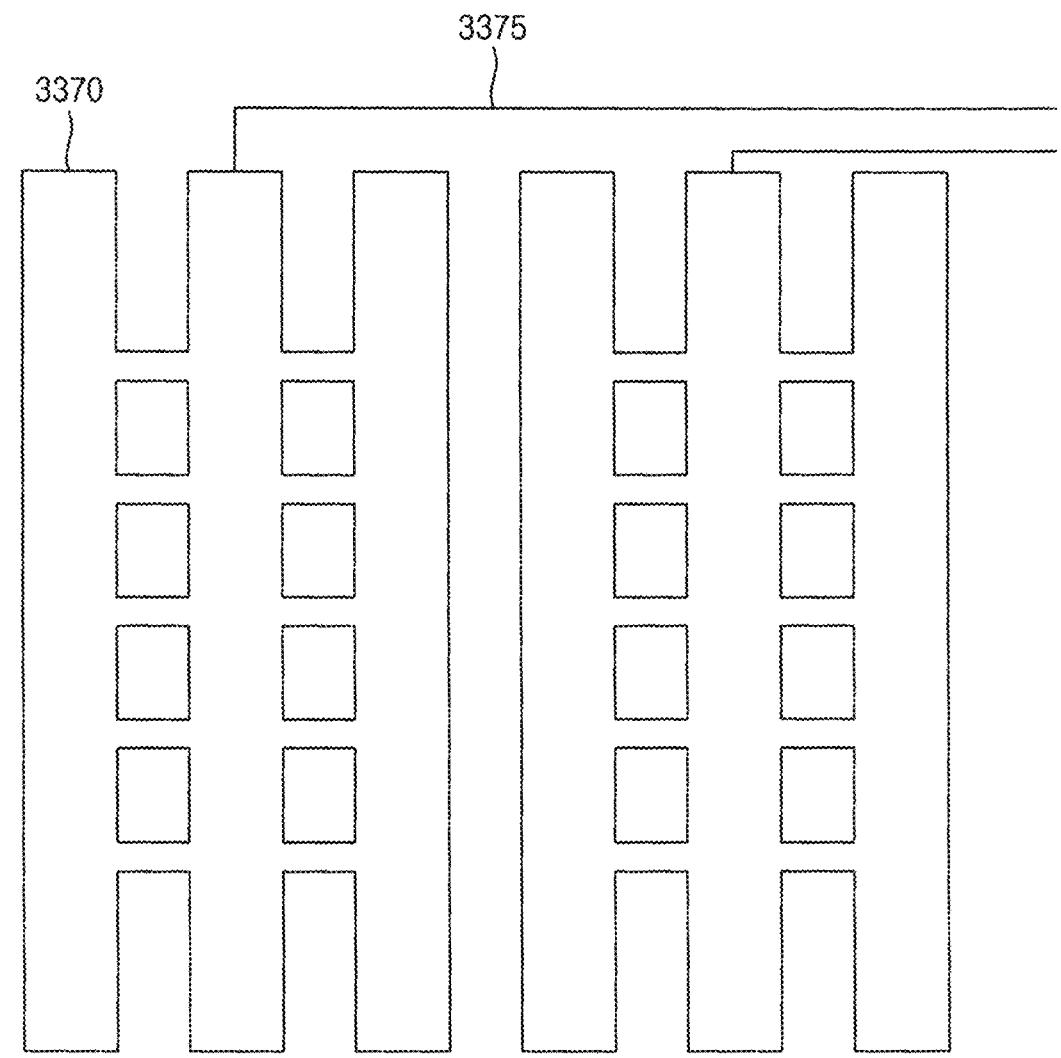
FIG. 90 is a plan view illustrating a first sensing electrode of FIG. 75.
Figure 91:
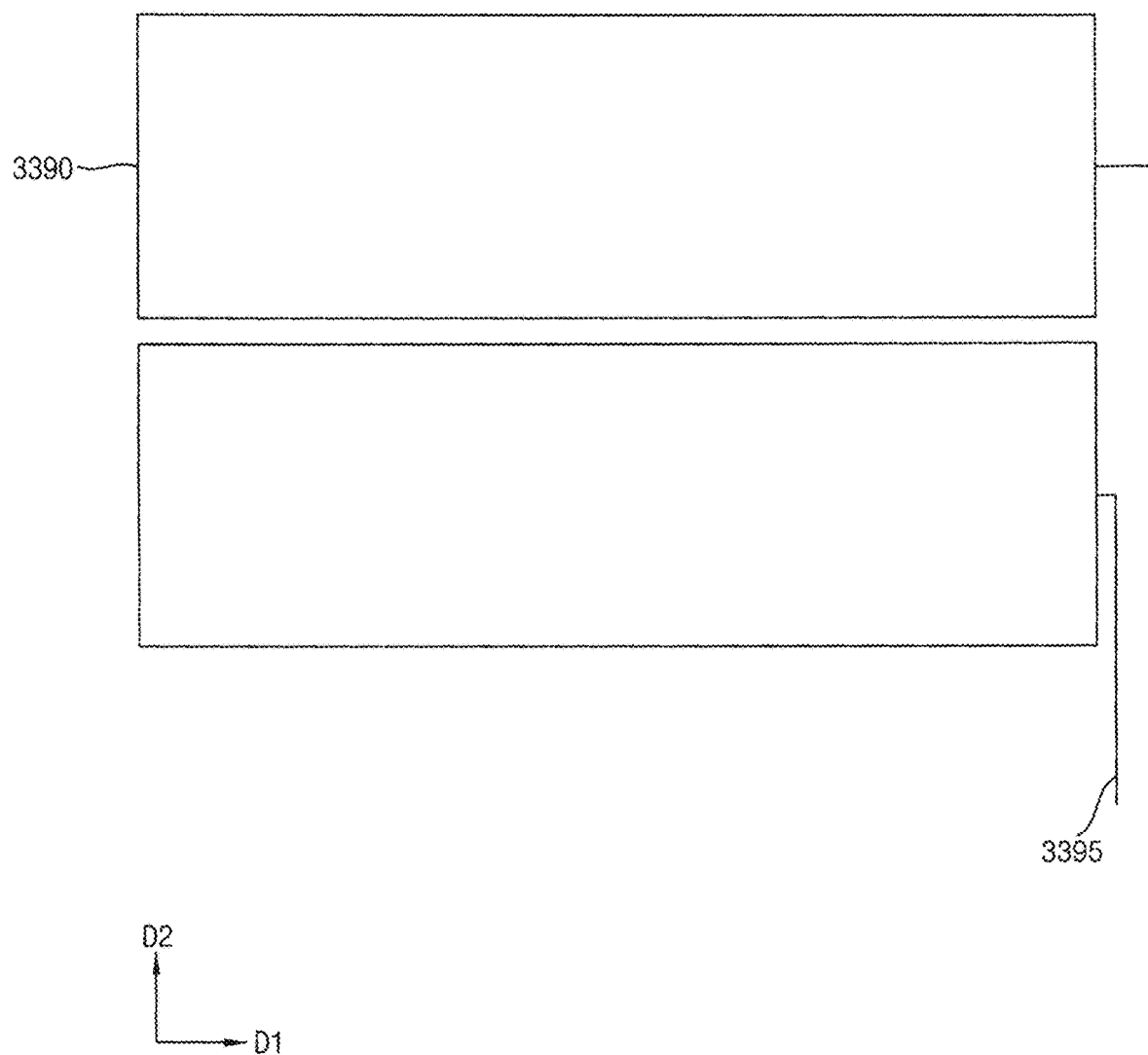
FIG. 91 is a plan view illustrating a second sensing electrode of FIG. 75.
Figure 92:
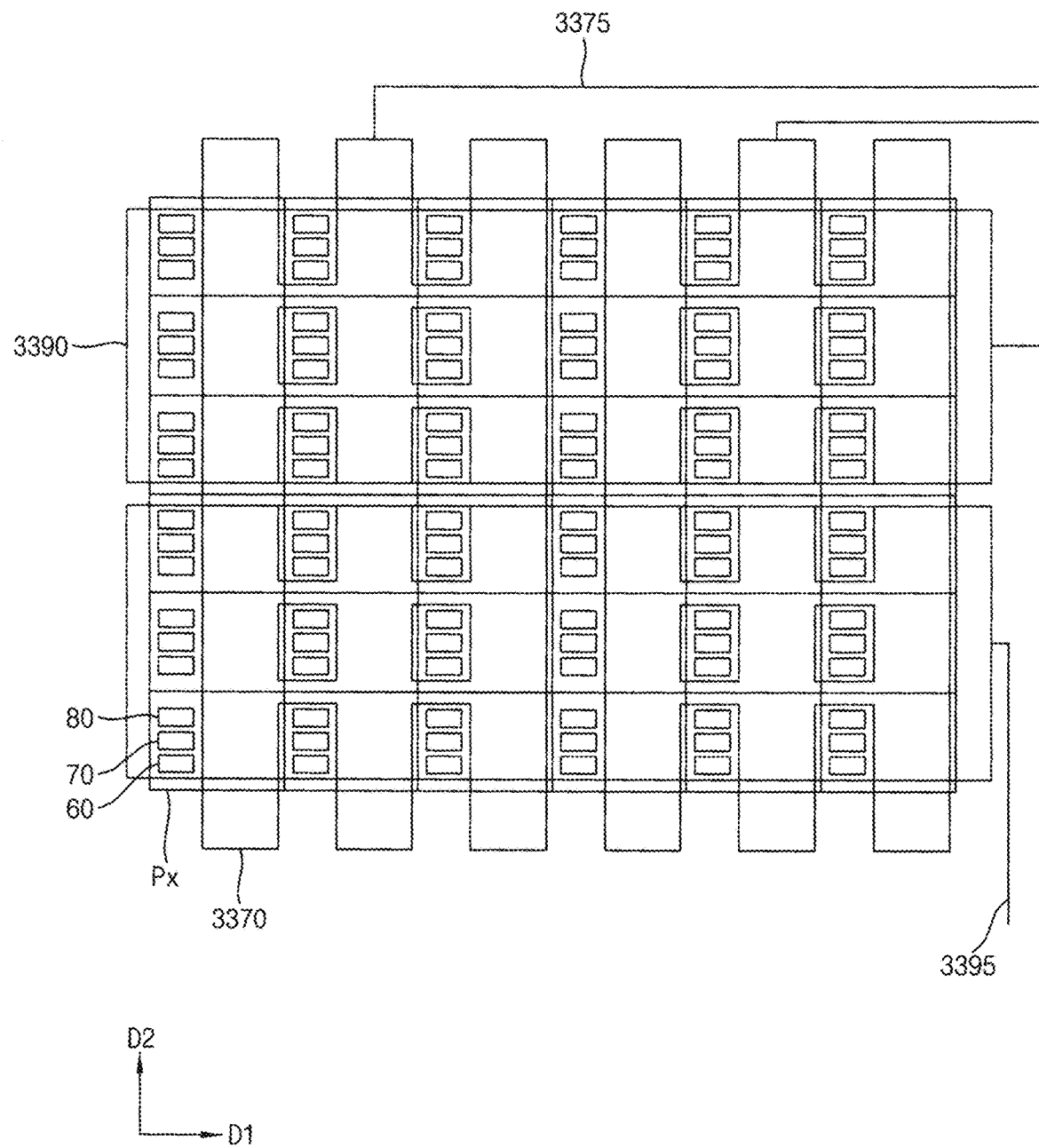
FIG. 92 is a plan view illustrating the first sensing electrode of FIG. 90 and the second sensing electrode of FIG. 91.

FIG. 90 is a plan view illustrating a first sensing electrode of FIG. 75. FIG. 91 is a plan view illustrating a second sensing electrode of FIG. 75. FIG. 92 is a plan view illustrating the first sensing electrode of FIG. 90 and the second sensing electrode of FIG. 91.

Referring to FIGS. 75 and 90 to 92, a first sensing electrode 3370 and a second sensing electrode 3390 are illustrated.

The first sensing electrode 3370 may be provided as a plurality of patterns extending in a second direction D2. The first sensing electrode 3370 may be provided as a mesh shape. The first sensing electrode 3370 is disposed in the reflection region III. The first sensing electrode 3370 may be connected to a sensing driving part through a first connecting line 3375. The first connecting line 3375 may include the same material as that of the first sensing electrode 3370. The first connecting line 3375 may be disposed on the same layer as that on which the first sensing electrode 3370 is disposed.

The second sensing electrode 3390 may be provided as a plurality of patterns extending in a first direction D1 crossing the second direction D2. A width of the second sensing electrode 3390 in the second direction D2 is the same as a width of the first sensing electrode 3370 in the first direction D1. The second sensing electrode 3390 is disposed in the light-emitting region II and the reflection region III. The second sensing electrode 3390 may be connected to a sensing driving part through a second connecting line 3395. The second connecting line 3395 may include the same material as that of the second sensing electrode 3390. The second connecting line 3395 may be disposed on the same layer as that on which the second sensing electrode 3390 is disposed.

The first sensing electrode 3370 may include a material having a predetermined reflectivity. The second sensing electrode 3390 may include a material having a predetermined reflectivity. The first sensing electrode 3370 may partially overlap the second sensing electrode 3390.

The second sensing electrode 3390 is disposed on a second substrate 3350. The fourth insulation layer 3385 is disposed on the second sensing electrode 3390. The first sensing electrode 3370 is disposed on the fourth insulation layer 3385.

The first sensing electrode 3370 and second sensing electrode 3390 may perform as a sensing electrode of a touch screen panel of mutual capacitance type. In an exemplary embodiment, when an electric conductor is contacted, capacitance of an intersecting point of the first sensing electrode 3370 and second sensing electrode 3390 around a touch position is changed, for example. Thus, a touch panel sensor (not shown) may decide a touch position based on a capacitance sensing signal corresponding to the change of capacitance.

The first sensing electrode 3370 may have a different thickness from a thickness of the second sensing electrode 3390. In an exemplary embodiment, a thickness of the first sensing electrode 3370 may be about 1000 Å, for example. When the thickness of the first sensing electrode 3370 is about 1000 Å, transmissivity of the first sensing electrode 3370 may be about 0%, and reflexibility of the first sensing electrode 3370 may be greater than about 95%. In addition, a thickness of the second sensing electrode 3390 may be about 100 Å. When the thickness of the second sensing electrode 3390 is about 100 Å, transmissivity of the second sensing electrode 3390 may be greater than about 50% and less than about 95%. When an organic light emitting display device emits light, the second sensing electrode 3390 may display an image in the light-emitting region II, and when an organic light emitting display device does not emit light, the second sensing electrode 3390 may perform a mirror function.

Figure 93:
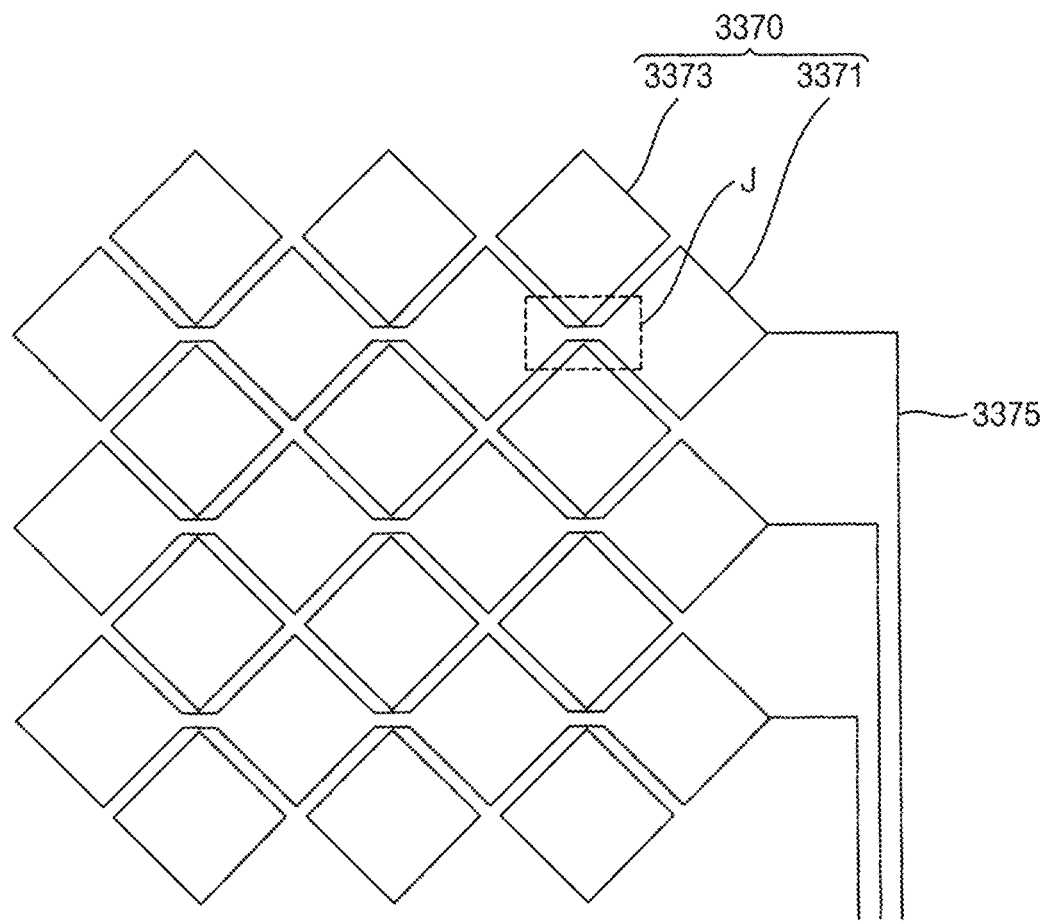
FIG. 93 is a plan view illustrating a first sensing electrode of FIG. 75.
Figure 94:
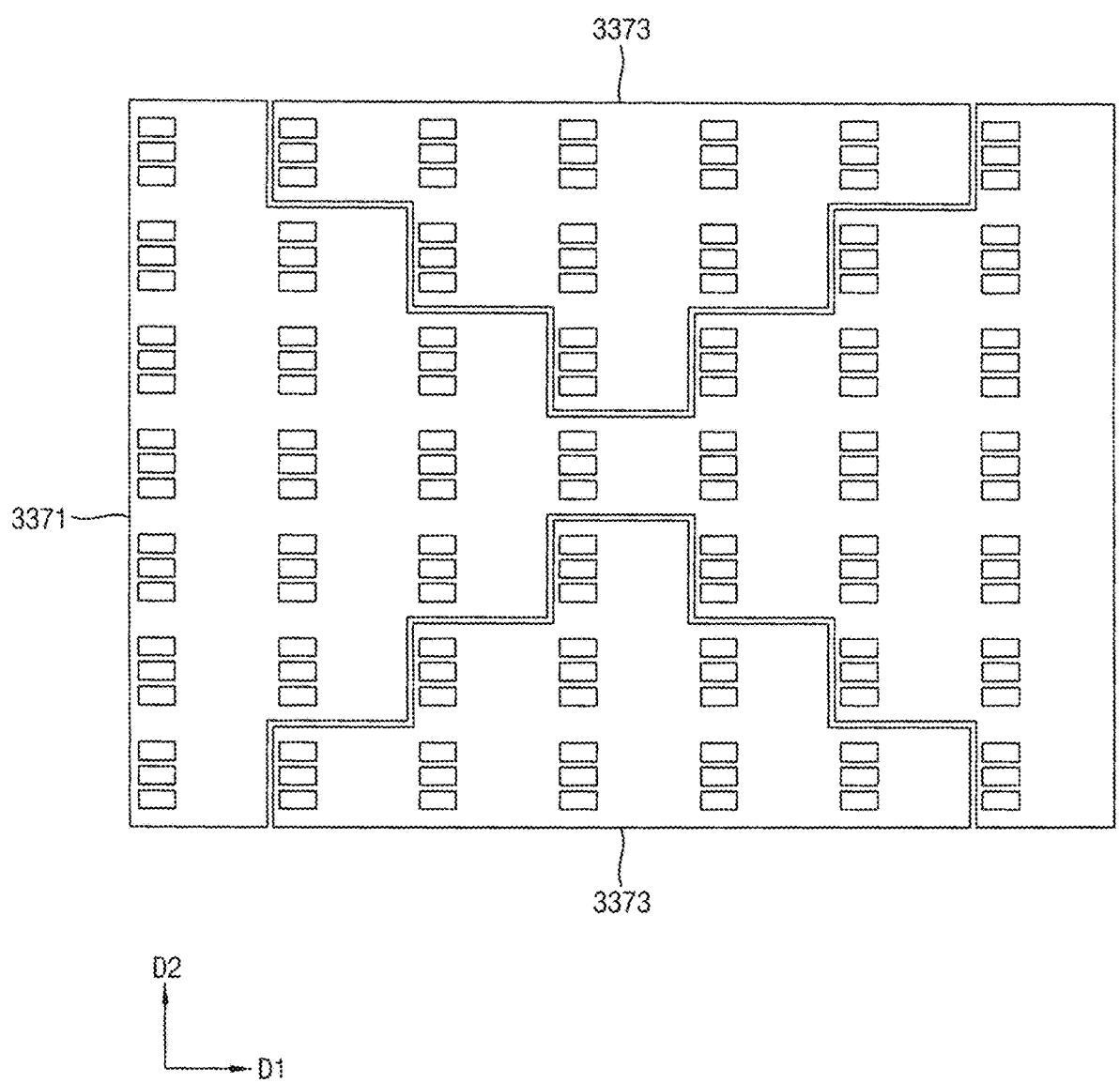
FIG. 94 is a plan view magnifying 'J' portion of FIG. 93.
Figure 95:
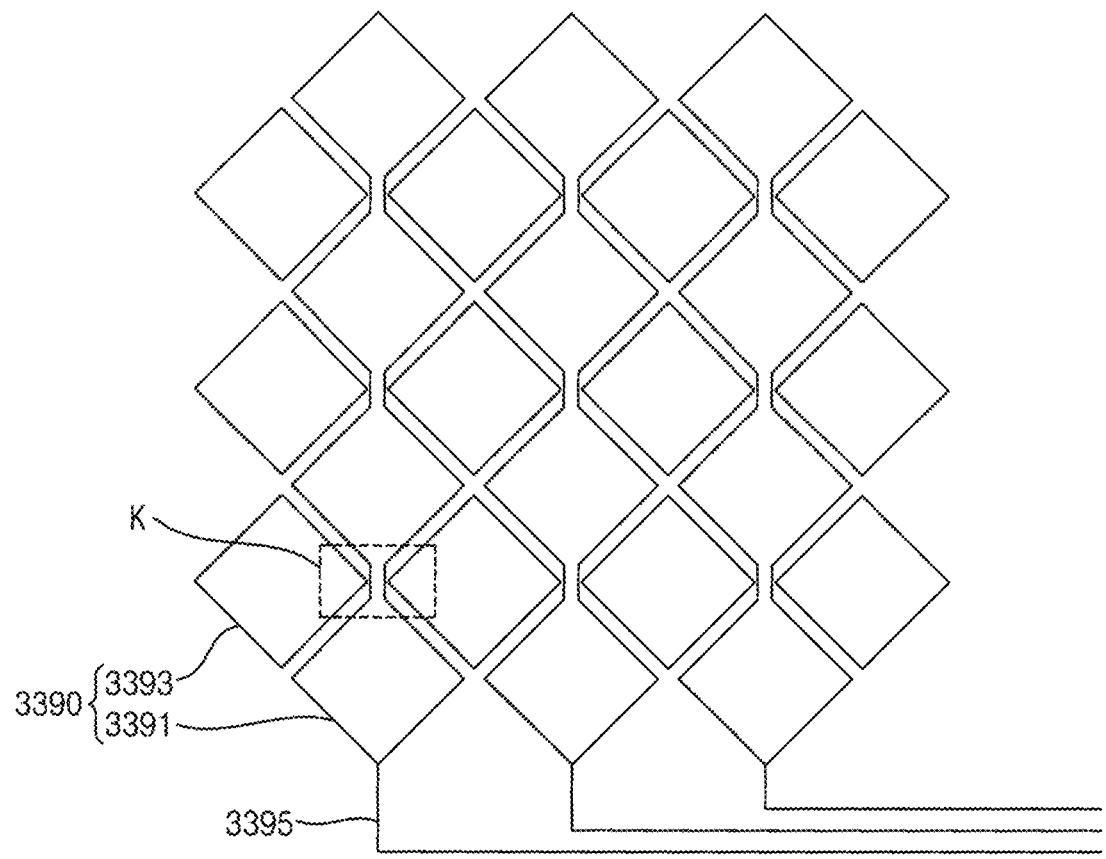
FIG. 95 is a plan view illustrating a second sensing electrode of FIG. 75.
Figure 96:
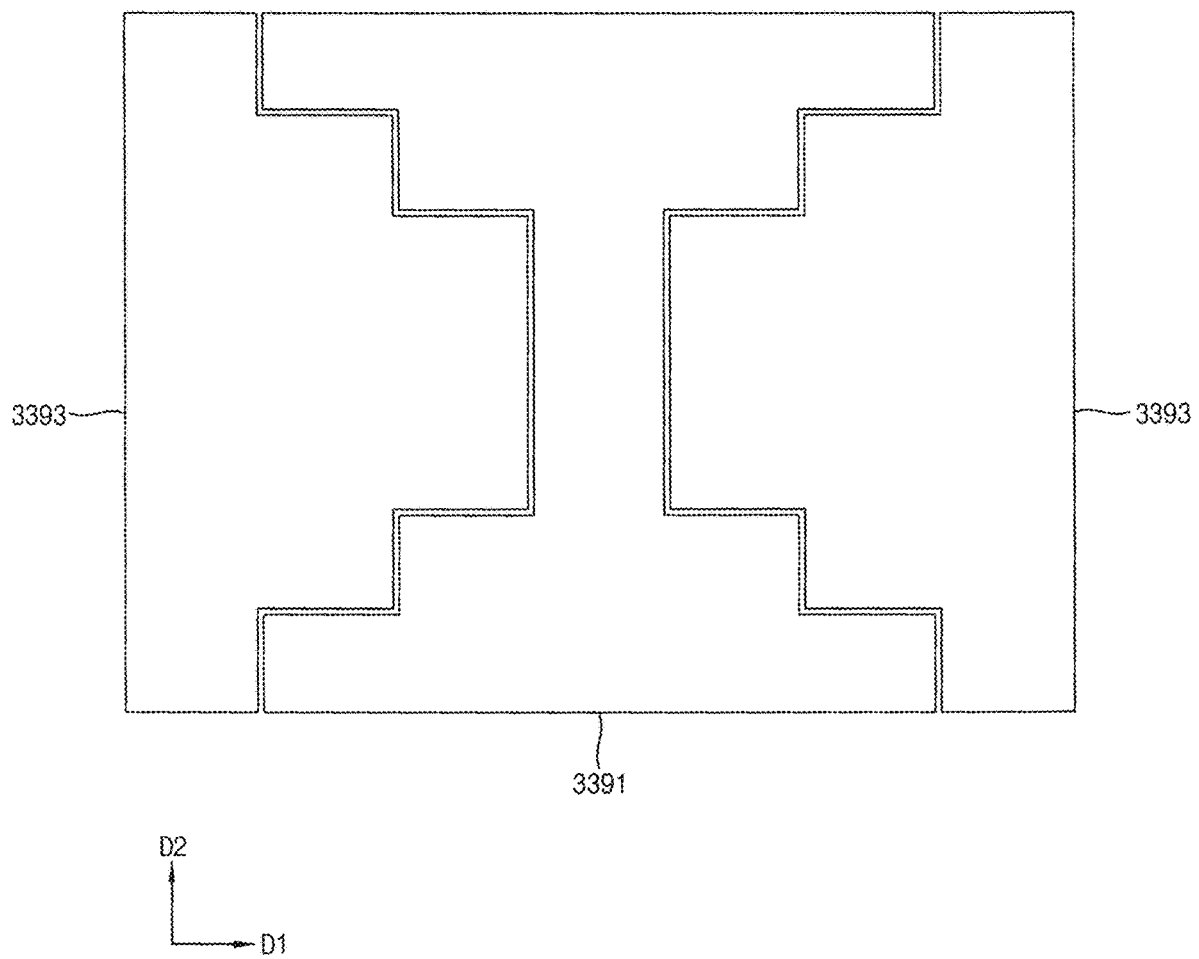
FIG. 96 is a plan view magnifying 'K' portion of FIG. 95.
Figure 97:
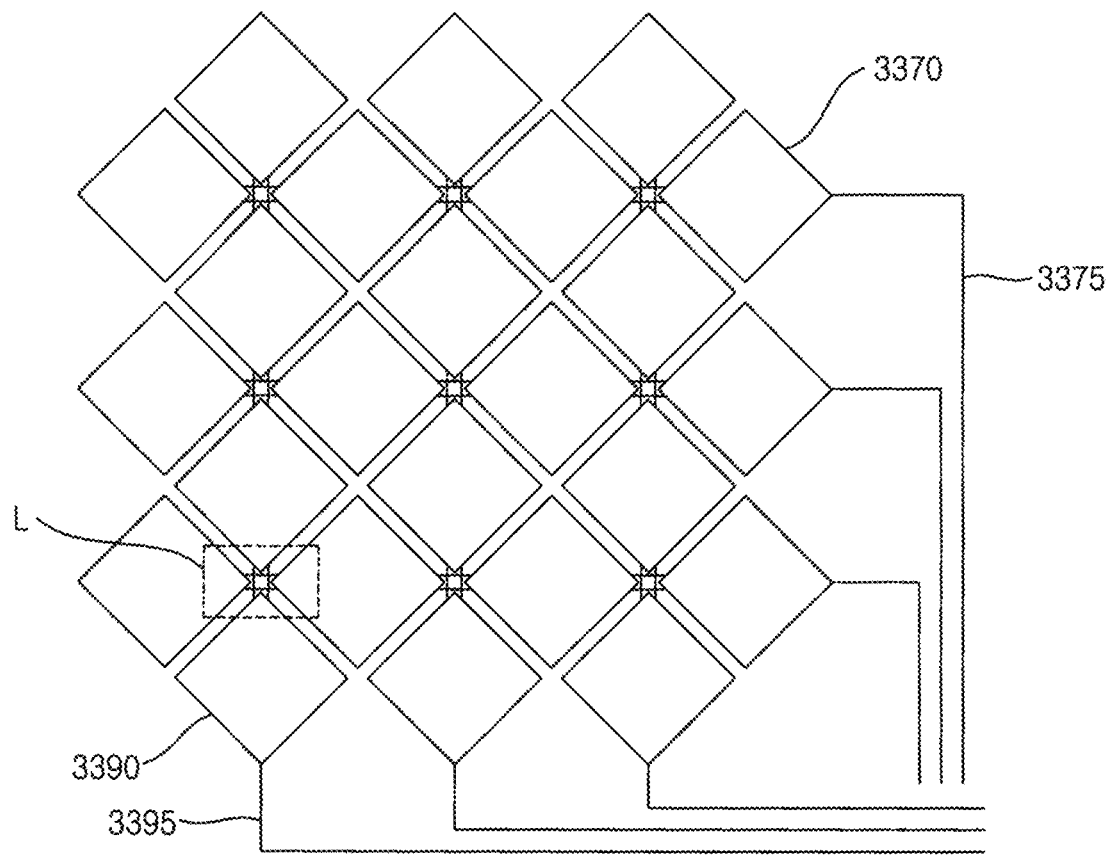
FIG. 97 is a plan view illustrating the first sensing electrode of FIG. 93 and the second sensing electrode of FIG. 95.
Figure 98:
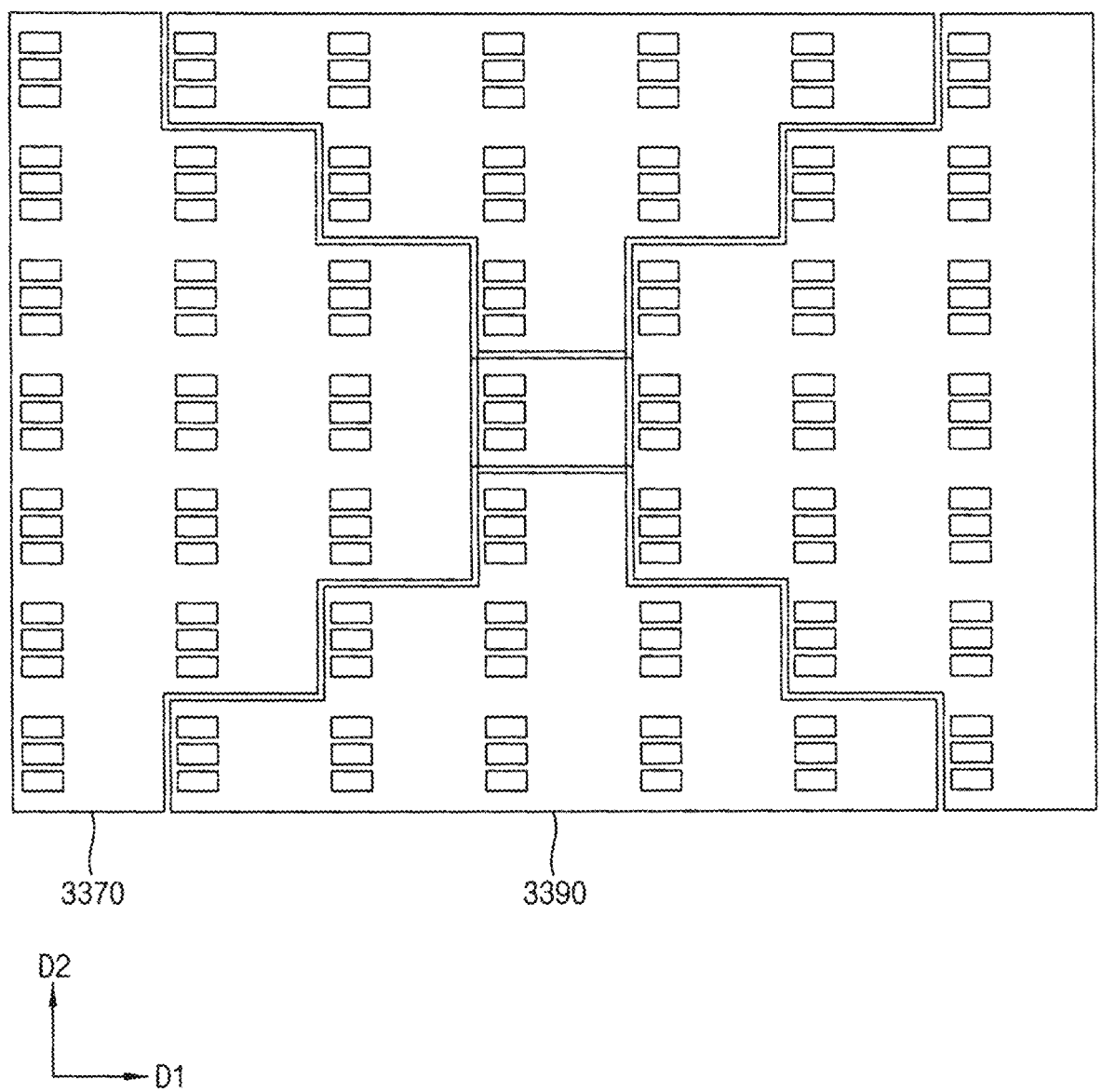
FIG. 98 is a plan view magnifying 'L' portion of FIG. 97.

FIG. 93 is a plan view illustrating a first sensing electrode of FIG. 75. FIG. 94 is a plan view magnifying 'J' portion of FIG. 93. FIG. 95 is a plan view illustrating a second sensing electrode of FIG. 75. FIG. 96 is a plan view magnifying 'K' portion of FIG. 95. FIG. 97 is a plan view illustrating the first sensing electrode of FIG. 93 and the second sensing electrode of FIG. 95. FIG. 98 is a plan view magnifying 1' portion of FIG. 97.

Referring to FIGS. 75 and 93 to 98, a first sensing electrode 3370 and a second sensing electrode 3390 are illustrated.

The first sensing electrode 3370 may include plurality of first sensing patterns 3371 having a rhombus shape and sequentially connected each other in a first direction D1 and a plurality of first dummy patterns 3373 having a rhombus shape and disposed between the first sensing patterns 3371. The first dummy patterns 3373 are spaced apart from each other. The first sensing electrode 3370 is disposed in the reflection region III. The first sensing electrode 3370 may be connected to a sensing driving part through a first connecting line 3375. The first connecting line 3375 may include the same material as that of the first sensing electrode 3370. The first connecting line 3375 may be disposed on the same layer as that on which the first sensing electrode 3370 is disposed.

The second sensing electrode 3390 may include plurality of second sensing patterns 3391 having a rhombus shape and sequentially connected each other in a second direction D2 and a plurality of second dummy patterns 3393 having a rhombus shape and disposed between the second sensing patterns 3391. The second dummy patterns 3393 are spaced apart from each other. The second sensing electrode 3390 is disposed in the light-emitting region II and the reflection region III. The second sensing electrode 3390 may be connected to a sensing driving part through a second connecting line 3395. The second connecting line 3395 may include the same material as that of the second sensing electrode 3390. The second connecting line 3395 may be disposed on the same layer as that on which the second sensing electrode 3390 is disposed.

The first sensing electrode 3370 may include a material having a predetermined reflectivity. The second sensing electrode 3390 may include a material having a predetermined reflectivity. The first sensing electrode 3370 may partially overlap the second sensing electrode 3390.

The second sensing electrode 3390 is disposed on a second substrate 3350. The fourth insulation layer 3385 is disposed on the second sensing electrode 3390. The first sensing electrode 3370 is disposed on the fourth insulation layer 3385.

The first sensing electrode 3370 and second sensing electrode 3390 may perform as a sensing electrode of a touch screen panel of mutual capacitance type. In an exemplary embodiment, when an electric conductor is contacted, capacitance of an intersecting point of the first sensing electrode 3370 and second sensing electrode 3390 around a touch position is changed, for example. Thus, a touch panel sensor (not shown) may decide a touch position based on a capacitance sensing signal corresponding to the change of capacitance.

The first sensing electrode 3370 may have a different thickness from a thickness of the second sensing electrode 3390. In an exemplary embodiment, a thickness of the first sensing electrode 3370 may be about 1000 Å, for example. When the thickness of the first sensing electrode 3370 is about 1000 Å, transmissivity of the first sensing electrode 3370 may be about 0%, and reflexibility of the first sensing electrode 3370 may be greater than about 95%. In addition, a thickness of the second sensing electrode 3390 may be about 100 Å. When the thickness of the second sensing electrode 3390 is about 100 Å, transmissivity of the second sensing electrode 3390 may be greater than about 50% and less than about 95%. When an organic light emitting display device emits light, the second sensing electrode 3390 may display an image in the light-emitting region II, and when an organic light emitting display device does not emit light, the second sensing electrode 3390 may perform a mirror function.

Figure 99:
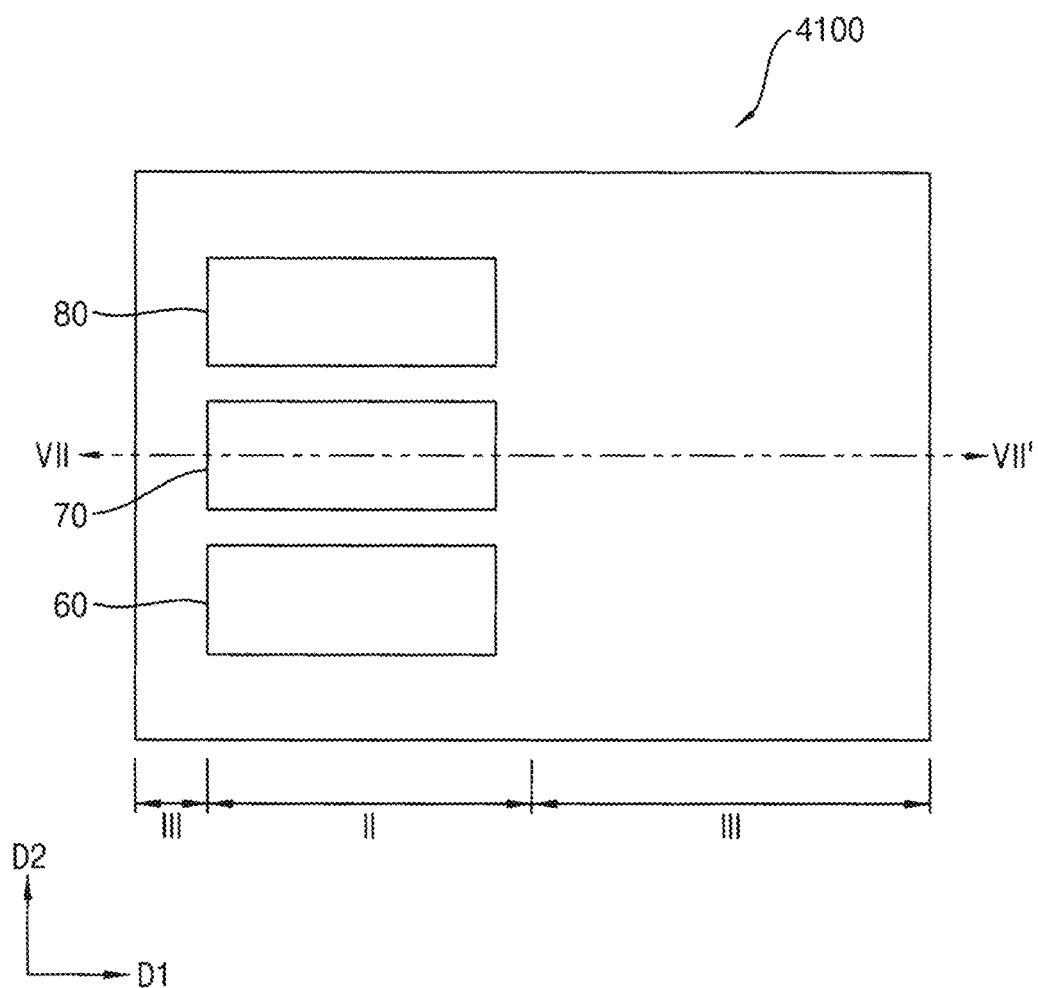
FIG. 99 is a plan view illustrating an exemplary embodiment of an organic light emitting display device according to the invention.
Figure 100:
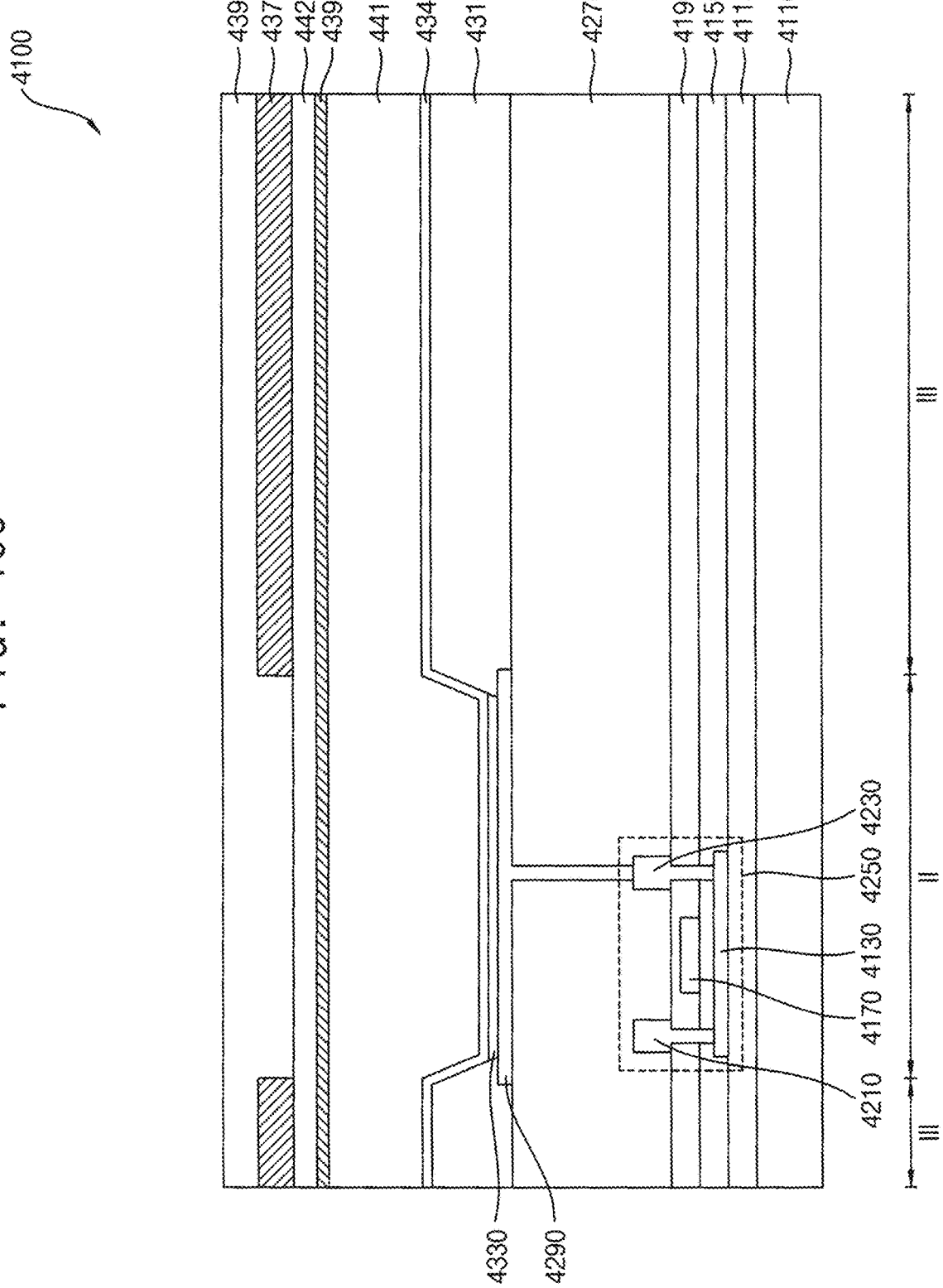
FIG. 100 is a cross-sectional view taken along line VII-VII' of FIG. 99.
Figure 101:
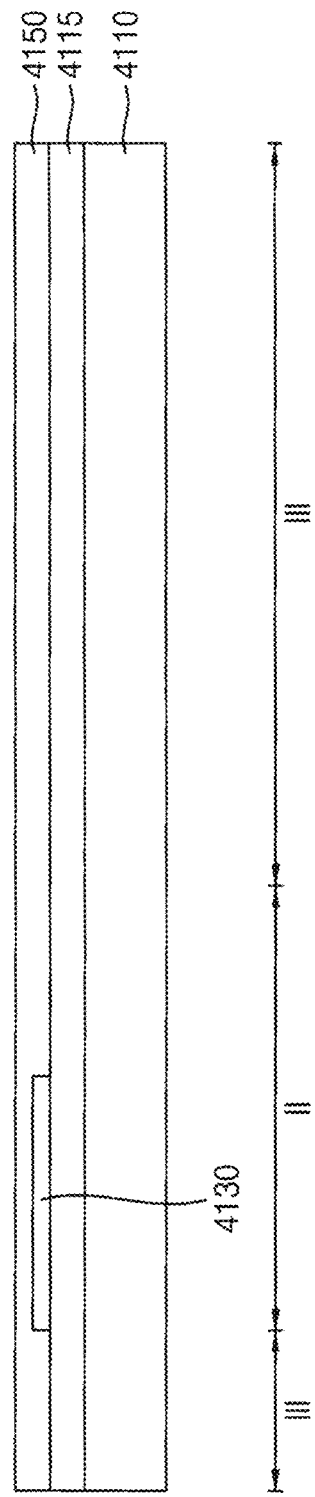
FIGS. 101 to 108 are cross-sectional views illustrating a method of manufacturing the organic light emitting display device of FIG. 100.

FIG. 99 is a plan view illustrating an organic light emitting display device according to an exemplary embodiment of the invention. FIG. 100 is a cross-sectional view taken along line VII-VII' of FIG. 99.

An organic light emitting display device according to the illustrated exemplary embodiment is substantially same as the organic light emitting display device of FIGS. 1 and 2 except for a first sensing electrode 4370, a thin film encapsulation layer 4410, a fourth insulation layer 4420 and second sensing electrode 4390 and thus similar reference numerals are used for same elements and repetitive explanation will be omitted.

Referring to FIGS. 99 and 100, the thin film encapsulation layer 4410 is disposed on a second electrode 4340. The thin film encapsulation layer 4410 may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. The organic layer may also include a polyacrylate, for example, the organic layer may include a polymerized monomer composition including a diacrylate monomer or a triacrylate monomer. The monomer composition may further include a monoacrylate monomer. In an exemplary embodiment, the monomer composition may further include a suitable photoinitiator such as thermoplastic polyolefin ("TPO"), but is not limited thereto.

The first inorganic layer and the second inorganic layer may be single layers or stacked layers including a metal oxide or a metal nitride. In an exemplary embodiment, the first inorganic layer and the second inorganic layer may include one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

However, the invention is not limited thereto, and the thin film encapsulation layer 4410 maybe provided by stacking (e.g., sequentially stacking) a first inorganic layer, a first organic layer, a second inorganic layer, a second organic layer and a third inorganic layer.

The second sensing electrode 4390 is disposed on the thin film encapsulation layer 4410. The second sensing electrode 4390 may be disposed in the light-emitting region II and the reflection region III.

The second sensing electrode 4390 may include a material having a predetermined reflectivity. In an exemplary embodiment, the second sensing electrode 4390 may include gold (Au), silver (Ag), aluminum (Al), magnesium (Mg), platinum (Pt), Nickel (Ni), titanium (Ti), etc., for example. In an alternative exemplary embodiment, the second sensing electrode 4390 may include an alloy, metal nitride, conductive metal oxide, etc. In an exemplary embodiment, the second sensing electrode 4390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The fourth insulation layer 4420 is disposed on the second sensing electrode 4390. The fourth insulation layer 4420 may includes an adhesive material.

The first sensing electrode 4370 is disposed on the fourth insulation layer 4420. The first sensing electrode 4370 may be disposed in the reflection region III and outside of the light-emitting region II.

The first sensing electrode 4370 may include a material having a predetermined reflectivity. In an exemplary embodiment, the first sensing electrode 4370 may include gold (Au), silver (Ag), aluminum (Al), magnesium (Mg), platinum (Pt), Nickel (Ni), titanium (Ti), etc., for example. In an alternative exemplary embodiment, the first sensing electrode 4370 may include an alloy, metal nitride, conductive metal oxide, etc. In an exemplary embodiment, the first sensing electrode 4370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

A fifth insulation layer 4395 may be disposed on the first sensing electrode 4370. In an exemplary embodiment, the fifth insulation layer 4395 may include a silicon compound, a metal oxide, etc., for example.

In the illustrated exemplary embodiment, the second sensing electrode 4390 is disposed on the thin film encapsulation layer 4410. The fourth insulation layer 4420 is disposed on the second sensing electrode 4390, and the first sensing electrode 4370 is disposed on the fourth insulation layer 4420. However, the invention is not limited thereto, and the first sensing electrode 4370 may be disposed on the thin film encapsulation layer 4410. In addition, the fourth insulation layer 4420 may be disposed on the first sensing electrode 4370, and the second sensing electrode 4390 may be disposed on the fourth insulation layer 4420.

FIGS. 101 to 108 are cross-sectional views illustrating a method of manufacturing the organic light emitting display device of FIG. 100.

Referring to FIG. 100, the buffer layer 4115 is disposed on the first substrate 4110. Thereafter, the active pattern 4130 and the first insulation layer 4150 are disposed on the buffer layer 4115.

In an exemplary embodiment, the first substrate 4110 may include quartz, synthetic quartz, calcium fluoride, fluoride-doping quartz, a sodalime glass, a non-alkali glass etc., for example.

The light emitting structure may be disposed on the first substrate 4110. The first substrate 4110 may include transparent materials. In an exemplary embodiment, the first substrate 4110 may include quartz, synthetic quartz, calcium fluoride, fluoride-doping quartz, a sodalime glass, a non-alkali glass etc., for example. In an alternative exemplary embodiment, the first substrate 4110 may include a flexible transparent resin substrate. Here, the flexible transparent resin substrate for the first substrate 4110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 4110 may have a structure in which the first polyimide layer, the barrier film layer and the second polyimide layer are stacked on a glass substrate. Here, after an insulation layer is provided on the second polyimide layer, the light emitting structure (e.g., the semiconductor element 4250, a capacitor, the first electrode 4290, the light emitting layer 4330, the second electrode 4340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 4110 after the removal of the glass substrate. As the organic light emitting display device 4100 includes the light-emitting region II and the reflection region III, the first substrate 4110 may also include the light-emitting region II and the reflection region III.

A buffer layer 4115 may be disposed on the first substrate 4110. The buffer layer 4115 may extend from the light-emitting region II into the reflection region III. The buffer layer 4115 may prevent the diffusion (e.g., an out gassing) of metal atoms and/or impurities from the first substrate 4110. Additionally, the buffer layer 4115 may control a rate of a heat transfer in a crystallization process for forming the active pattern 4130, thereby obtaining substantially uniform the active pattern 4130. Furthermore, the buffer layer 4115 may improve a surface flatness of the first substrate 4110 when a surface of the first substrate 4110 is relatively irregular. According to a type of the first substrate 4110, at least two buffer layers may be provided on the first substrate 4110, or the buffer layer may not be disposed.

In an exemplary embodiment, the active pattern 4130 may include an oxide semiconductor, an inorganic semiconductor (e.g., amorphous silicon, polysilicon, etc.), an organic semiconductor, etc., for example.

The first insulation layer 4150 may be disposed on the active pattern 4130. The first insulation layer 4150 may cover the active pattern 4130 in the light-emitting region II, and may extend in the first direction on the first substrate 4110. That is, the first insulation layer 4150 may be disposed on the entire surface of the first substrate 4110. In an exemplary embodiment, the first insulation layer 4150 may include a silicon compound, a metal oxide, etc., for example.

Figure 102:
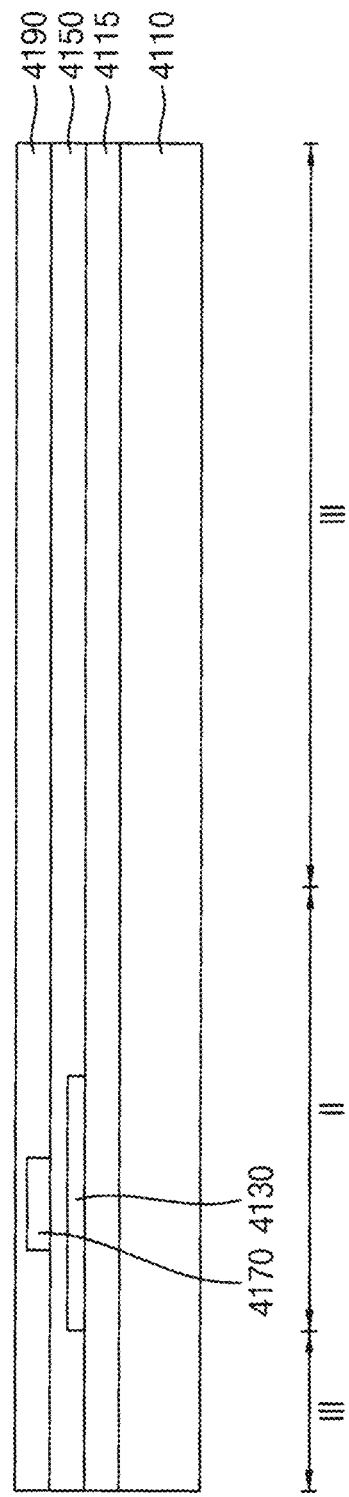

Referring to FIG. 102, the gate electrode 4170 and the second insulation layer 4190 are disposed on the first substrate 4110 on which the first insulation layer 4150 is disposed.

The gate electrode 4170 may be disposed on a portion of the first insulation layer 4150 under which the active pattern 4130 is disposed. In an exemplary embodiment, the gate electrode 4170 may include a metal, an alloy, metal nitride, conductive metal oxide, transparent conductive materials, etc., for example.

The second insulation layer 4190 may be disposed on the gate electrode 4170. The second insulation layer 4190 may cover the gate electrode 4170 in the light-emitting region II, and may extend in the first direction on the first substrate 4110. That is, the second insulation layer 4190 may be disposed on the entire surface of the first substrate 4110. In an exemplary embodiment, the second insulation layer 4190 may include a silicon compound, a metal oxide, etc., for example.

Figure 103:
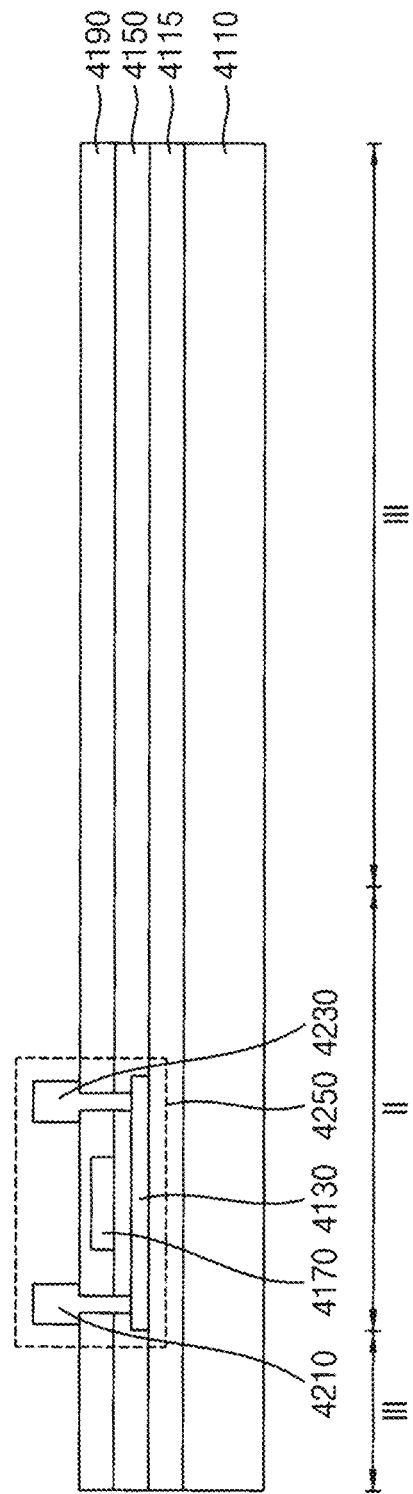

Referring to FIG. 103, the source electrode 4210 and the drain electrode 4230 are disposed on the first substrate 4110 on which the second insulation layer 4190 is disposed.

The source electrode 4210 and the drain electrode 4230 may be disposed on the second insulation layer 4190. The source electrode 4210 may be in contact with a first side of the active layer 4130 by removing a portion of the first and second insulation layers 4150 and 4190. The drain electrode 4230 may be in contact with a second side of the active layer 4130 by removing a second portion of the first and second insulation layers 4150 and 4190. In an exemplary embodiment, each of the source electrode 4210 and the drain electrode 4230 may include a metal, an alloy, metal nitride, conductive metal oxide, transparent conductive materials, etc., for example.

In the illustrated exemplary embodiment, the gate electrode 4170 is disposed on the active pattern 4130. However, the invention is not limited thereto, and the gate electrode 4170 may be disposed under the active pattern 4130.

Figure 104:
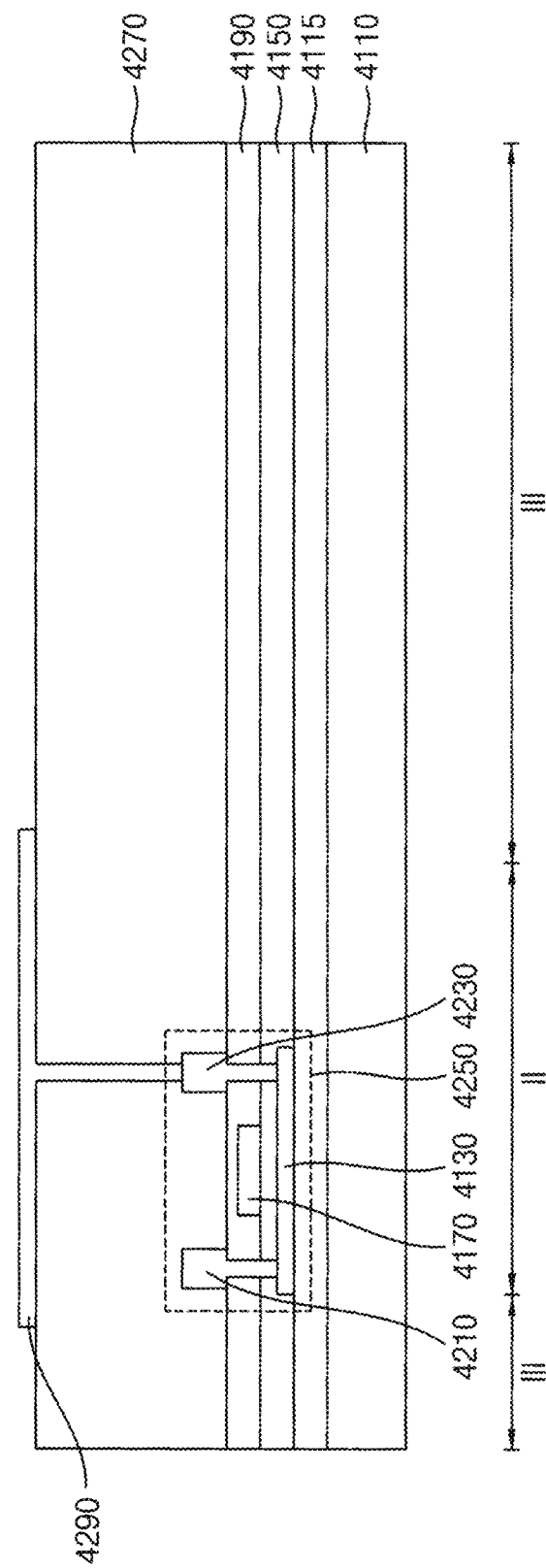

Referring to FIG. 104, the third insulation layer 4270 and the first electrode 4290 are disposed on the first substrate 4110 on which the source electrode 4210 and the drain electrode 4230 are disposed.

The third insulation layer 4270 may be disposed on the source electrode 4210 and the drain electrode 4230. The third insulation layer 4270 may cover the source electrode 4210 and the drain electrode 4230 in the sub-pixel region II, and may extend in the first direction on the first substrate 4110. That is, the third insulation layer 4270 may be disposed on the entire surface of the first substrate 4110. In an exemplary embodiment, the third insulation layer 4270 may include a silicon compound, a metal oxide, etc., for example.

The first electrode 4290 may be disposed on the third insulation layer 4270. The first electrode 4290 may be in contact with the source electrode 4210 by removing a portion of the third insulation layer 4270. In addition, the first electrode 4290 may be electrically connected to the semiconductor element 4250. In an exemplary embodiment, the first electrode 4290 may include a metal, an alloy, metal nitride, conductive metal oxide, transparent conductive materials, etc., for example.

Figure 105:
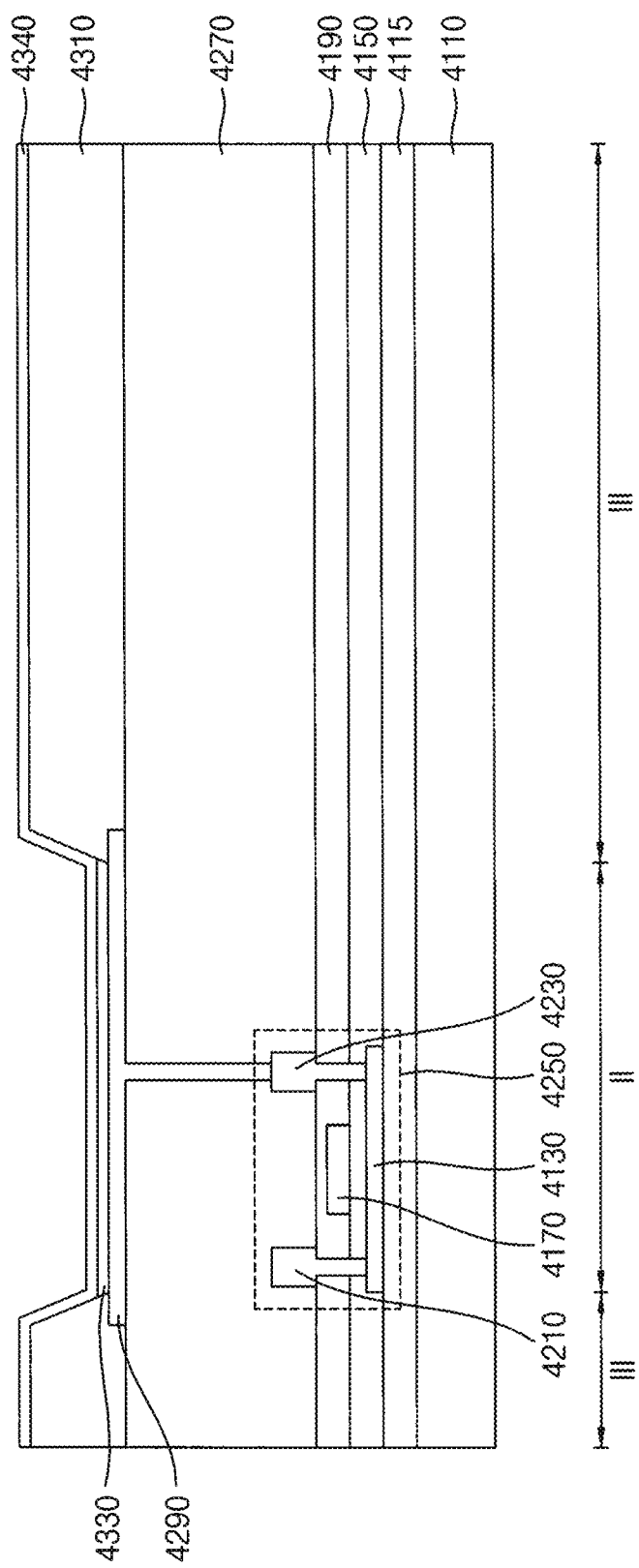

Referring to FIG. 105, the pixel defining layer 4310, the light emitting layer 4330 and the second electrode 4340 are disposed on the first substrate 4110 on which the first electrode 4290 is disposed.

The pixel defining layer 4310 may be disposed on the third insulation layer 4270 to expose a portion of the first electrode 4290. The pixel defining layer 4310 may include organic materials or inorganic materials. In this case, the light emitting layer 4330 may be disposed on a portion that the first electrode 4290 is exposed by the pixel defining layer 4310.

The light emitting layer 4330 may be disposed on the exposed first electrode 4290. The light emitting layer 4330 may be provided using light emitting materials capable of generating different colors of light (e.g., a red color of light, a blue color of light, and a green color of light). However, the invention is not limited thereto, and the light emitting layer 4330 may stack light emitting materials capable of generating different colors of light to emit white color of light.

The second electrode 4340 may be disposed on the pixel defining layer 4310 and the light emitting layer 4330. The second electrode 4340 may cover the pixel defining layer 4310 and the light emitting layer 4330 in the light-emitting region II and the reflection region III, and may extend in the first direction on the first substrate 4110. That is, the second electrode 4340 may be electrically connected to the first through third pixels. In an exemplary embodiment, the second electrode 4340 may include a metal, an alloy, metal nitride, conductive metal oxide, a transparent conductive material, etc., for example. These may be used alone or in a combination thereof.

Figure 106:
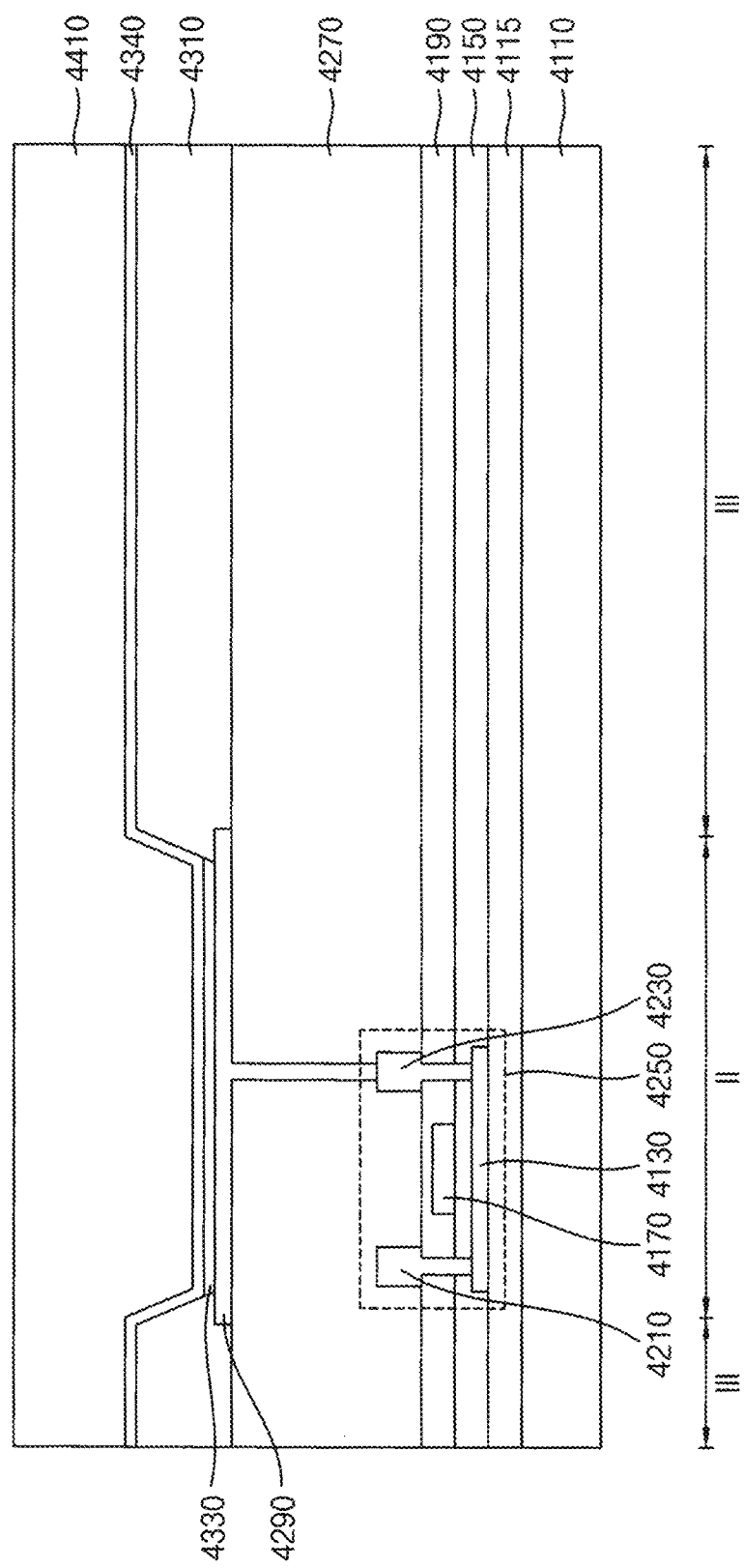

Referring to FIG. 106, the thin film encapsulation layer 4410 is disposed on the first substrate 4110 on which the second electrode 4340 is disposed.

The thin film encapsulation layer 4410 may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. The organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

Figure 107:
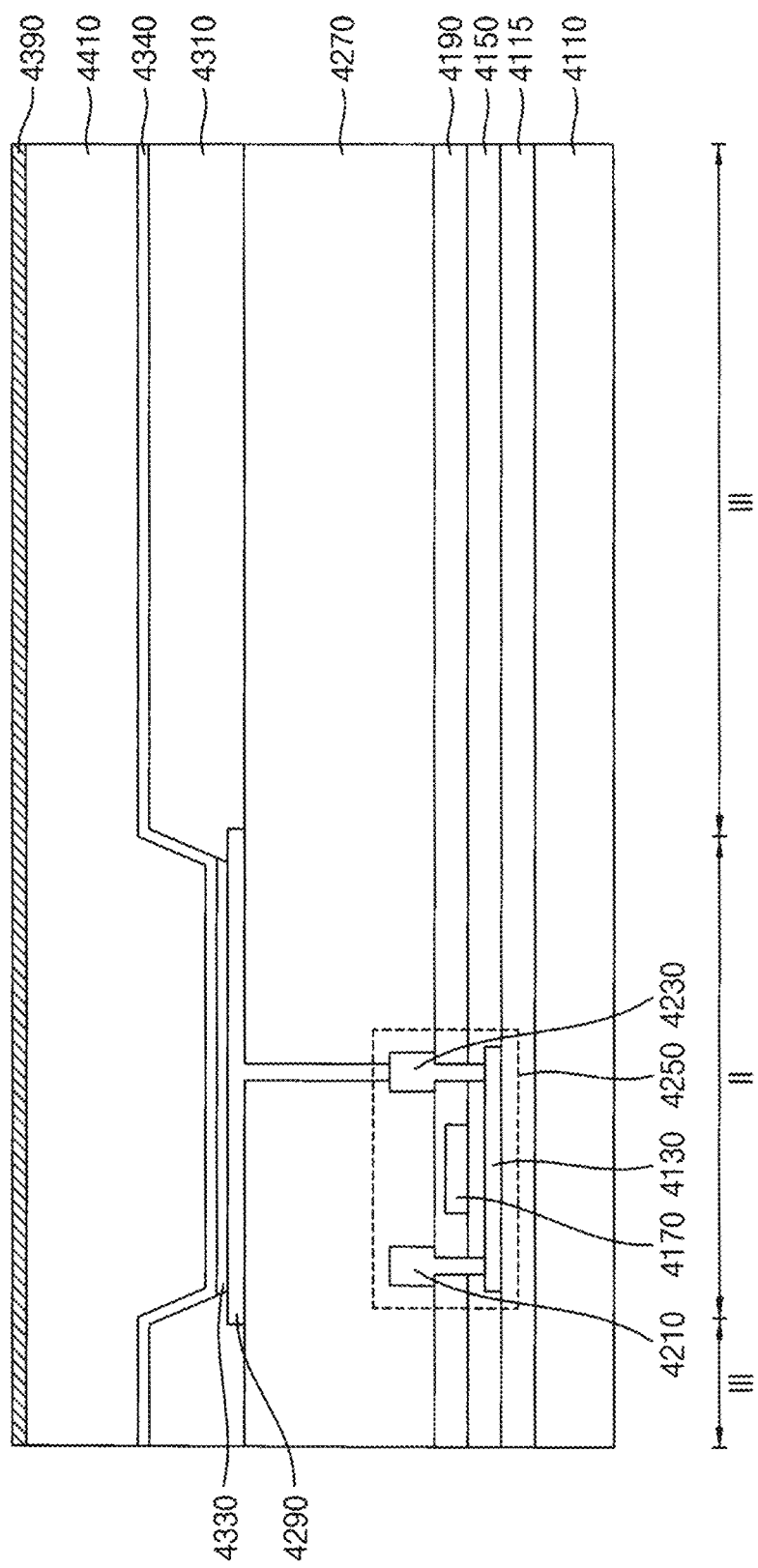

Referring to FIG. 107, the second sensing electrode 4390 is disposed on the first substrate 4110 on which the thin film encapsulation layer 4410 is disposed.

The second sensing electrode 4390 may be disposed in the light-emitting region II and the reflection region III.

The second sensing electrode 4390 may include a material having a predetermined reflectivity. In an exemplary embodiment, the second sensing electrode 4390 may include gold (Au), silver (Ag), aluminum (Al), magnesium (Mg), platinum (Pt), Nickel (Ni), titanium (Ti), etc., for example. In an alternative exemplary embodiment, the second sensing electrode 4390 may include an alloy, metal nitride, conductive metal oxide, etc. In an exemplary embodiment, the second sensing electrode 4390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 108:
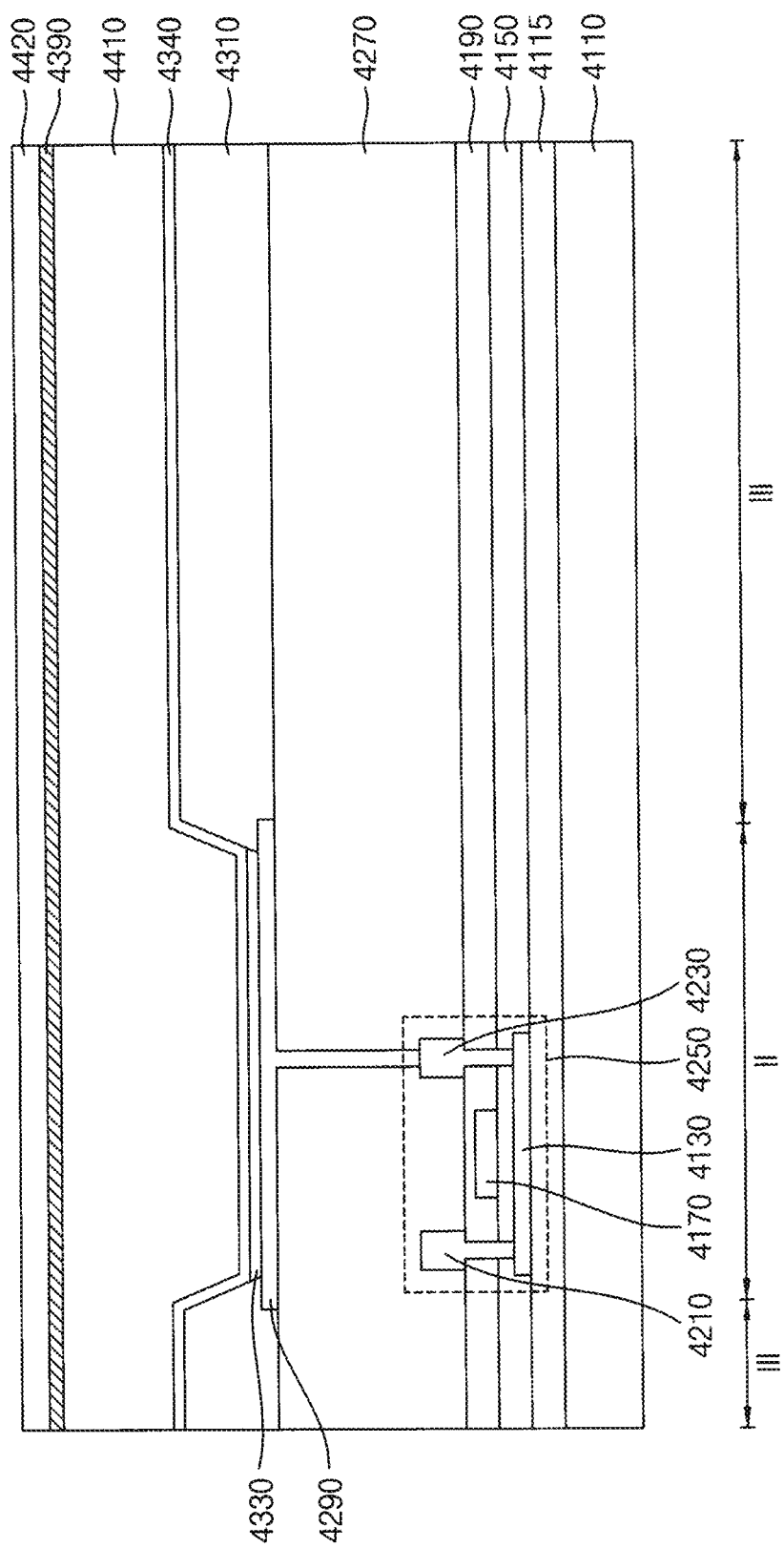

Referring to FIG. 108, the fourth insulation layer 4420 is disposed on the first substrate 4110 on which the second sensing electrode 4390 is disposed.

The fourth insulation layer 4420 may prevent from oxidation of the second sensing electrode 4390. The fourth insulation layer 4420 may include an adhesive material. The fourth insulation layer 4420 may insulate between the first sensing electrode 4370 and the second sensing electrode 4390.

Referring to FIG. 100, the first sensing electrode 4370 is disposed on the first substrate 4110 on which the fourth insulation layer 4420 is disposed. The fifth insulation layer 4395 is disposed on the first sensing electrode 4370.

The first sensing electrode 4370 may be disposed in the reflection region III and outside of the light-emitting region II.

The first sensing electrode 4370 may include a material having a predetermined reflectivity. In an exemplary embodiment, the first sensing electrode 4370 may include gold (Au), silver (Ag), aluminum (Al), magnesium (Mg), platinum (Pt), Nickel (Ni), titanium (Ti), etc., for example. In an alternative exemplary embodiment, the first sensing electrode 4370 may include an alloy, metal nitride, conductive metal oxide, etc. In an exemplary embodiment, the first sensing electrode 4370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 109:
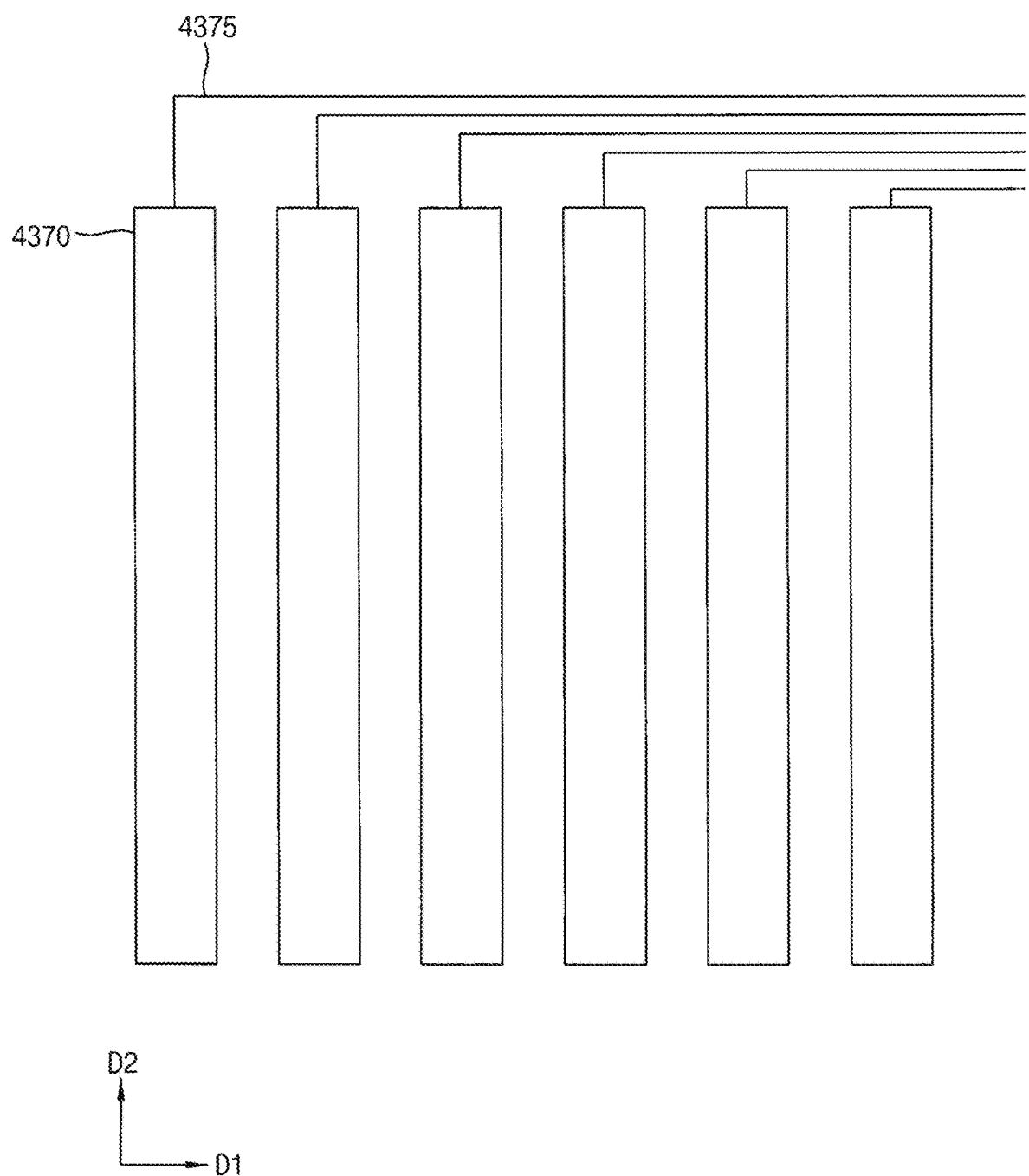
FIG. 109 is a plan view illustrating a first sensing electrode of FIG. 100.
Figure 110:
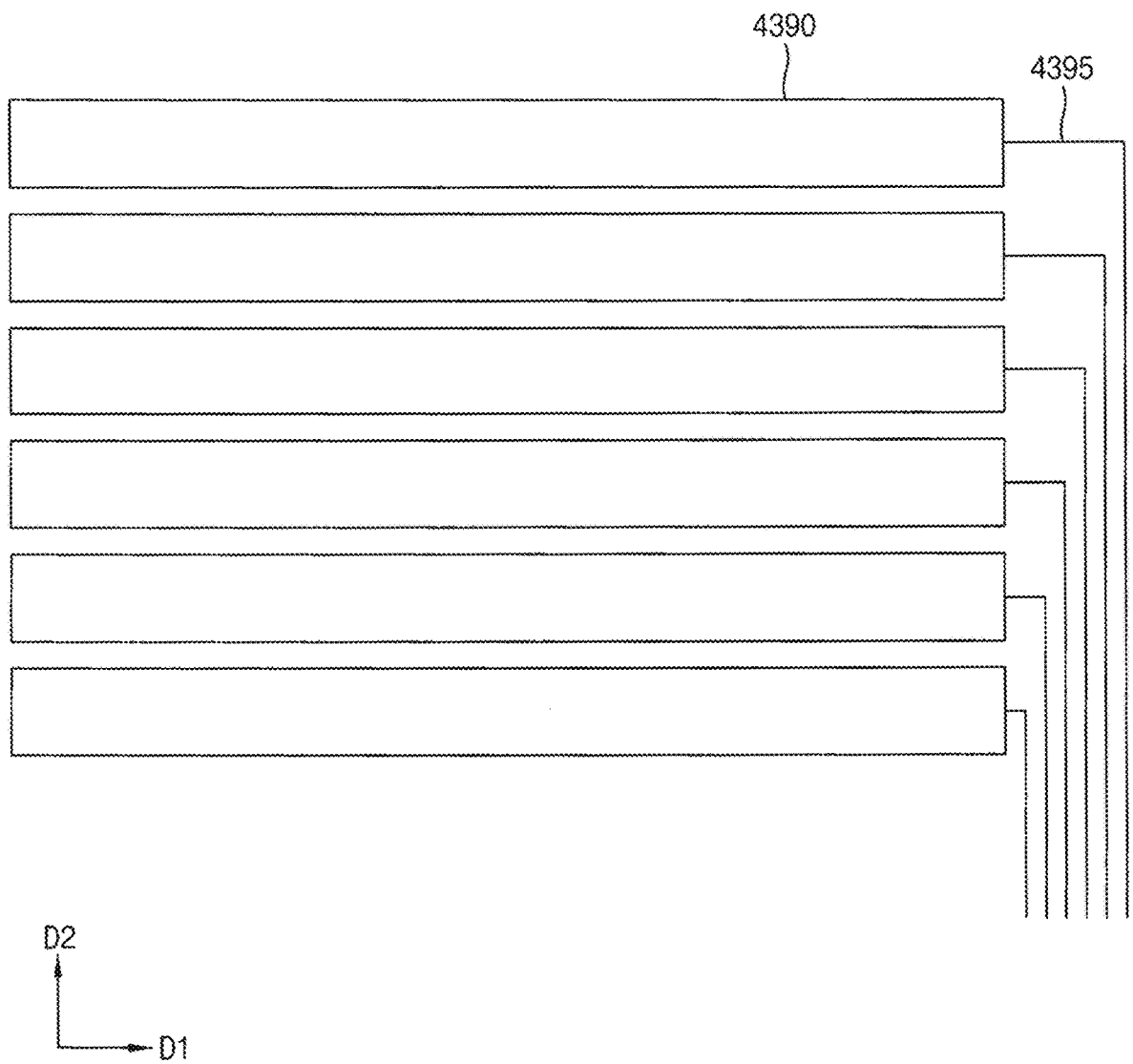
FIG. 110 is a plan view illustrating a second sensing electrode of FIG. 100.
Figure 111:
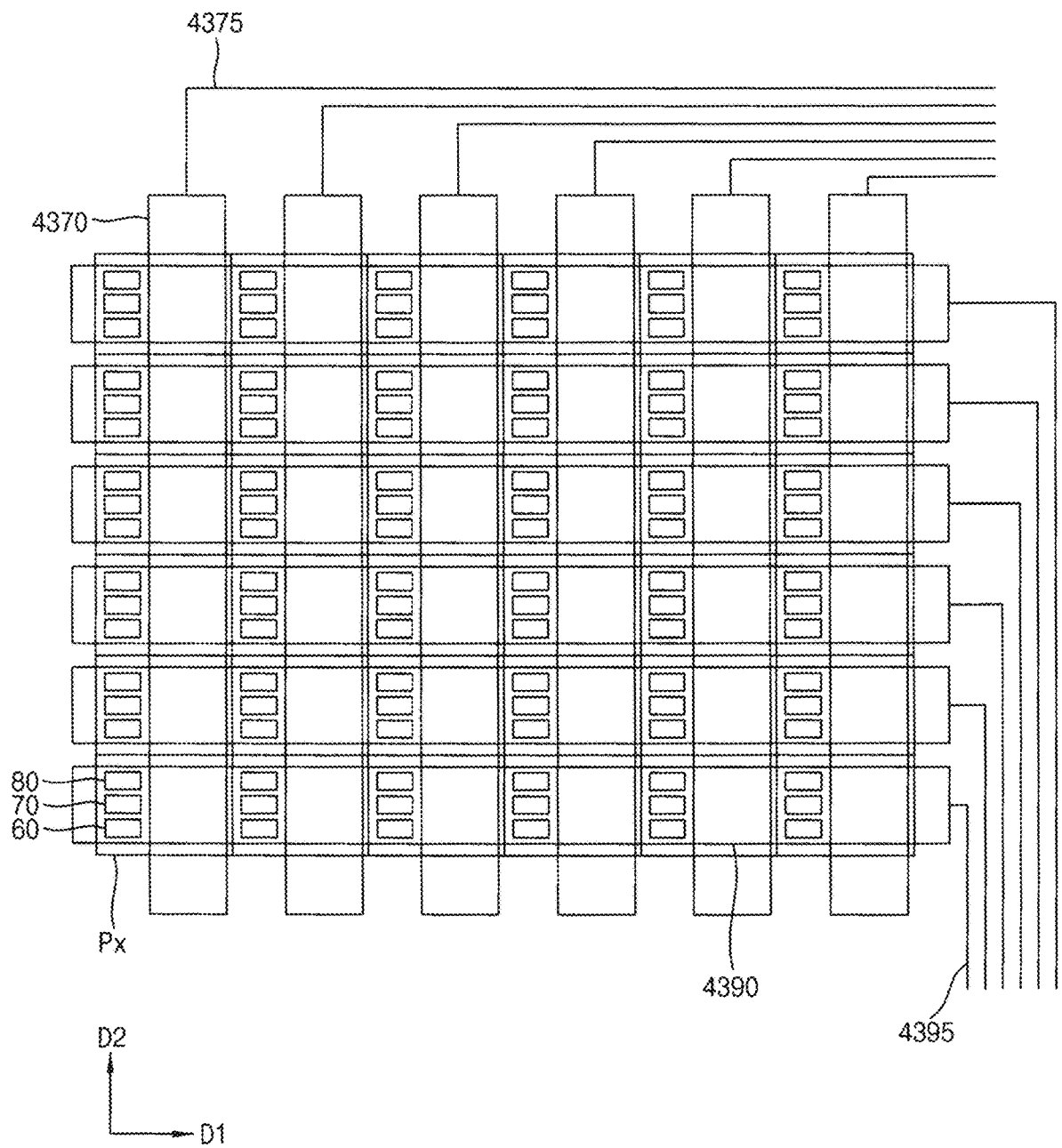
FIG. 111 is a plan view illustrating the first sensing electrode of FIG. 109 and the second sensing electrode of FIG. 110.

FIG. 109 is a plan view illustrating a first sensing electrode of FIG. 100. FIG. 110 is a plan view illustrating a second sensing electrode of FIG. 100. FIG. 111 is a plan view illustrating the first sensing electrode of FIG. 109 and the second sensing electrode of FIG. 110.

Referring to FIGS. 100 and 109 to 111, a first sensing electrode 4370 and a second sensing electrode 4390 are illustrated.

The first sensing electrode 4370 may be provided as a plurality of patterns extending in a second direction D2. The first sensing electrode 4370 is disposed in the reflection region III. The first sensing electrode 4370 may be connected to a sensing driving part through a first connecting line 4375. The first connecting line 4375 may include the same material as that of the first sensing electrode 4370. The first connecting line 4375 may be disposed on the same layer as that on which the first sensing electrode 4370 is disposed.

The second sensing electrode 4390 may be provided as a plurality of patterns extending in a first direction D1 crossing the second direction D2. The second sensing electrode 4390 is disposed in the light-emitting region II and the reflection region III. The second sensing electrode 4390 may be connected to a sensing driving part through a second connecting line 4395. The second connecting line 4395 may include the same material as that of the second sensing electrode 4390. The second connecting line 4395 may be disposed on the same layer as that on which the second sensing electrode 4390 is disposed.

The first sensing electrode 4370 may include a material having a predetermined reflectivity. The second sensing electrode 4390 may include a material having a predetermined reflectivity. The first sensing electrode 4370 may partially overlap the second sensing electrode 4390.

The second sensing electrode 4390 is disposed on the thin film encapsulation layer 4410. The fourth insulation layer 4420 is disposed on the second sensing electrode 4390, and the first sensing electrode 4370 is disposed on the fourth insulation layer 4420.

The first sensing electrode 4370 and second sensing electrode 4390 may perform as a sensing electrode of a touch screen panel of mutual capacitance type. In an exemplary embodiment, when an electric conductor is contacted, capacitance of an intersecting point of the first sensing electrode 4370 and second sensing electrode 4390 around a touch position is changed, for example. Thus, a touch panel sensor (not shown) may decide a touch position based on a capacitance sensing signal corresponding to the change of capacitance.

The first sensing electrode 4370 may have a different thickness from a thickness of the second sensing electrode 4390. In an exemplary embodiment, a thickness of the first sensing electrode 4370 may be about 1000 Å, for example. When the thickness of the first sensing electrode 4370 is about 1000 Å, transmissivity of the first sensing electrode 4370 may be about 0%, and reflexibility of the first sensing electrode 4370 may be greater than about 95%. In addition, a thickness of the second sensing electrode 4390 may be about 100 Å. When the thickness of the second sensing electrode 4390 is about 100 Å, transmissivity of the second sensing electrode 4390 may be greater than about 50% and less than about 95%. When an organic light emitting display device emits light, the second sensing electrode 4390 may display an image in the light-emitting region II, and when an organic light emitting display device does not emit light, the second sensing electrode 4390 may perform a mirror function.

Figure 112:
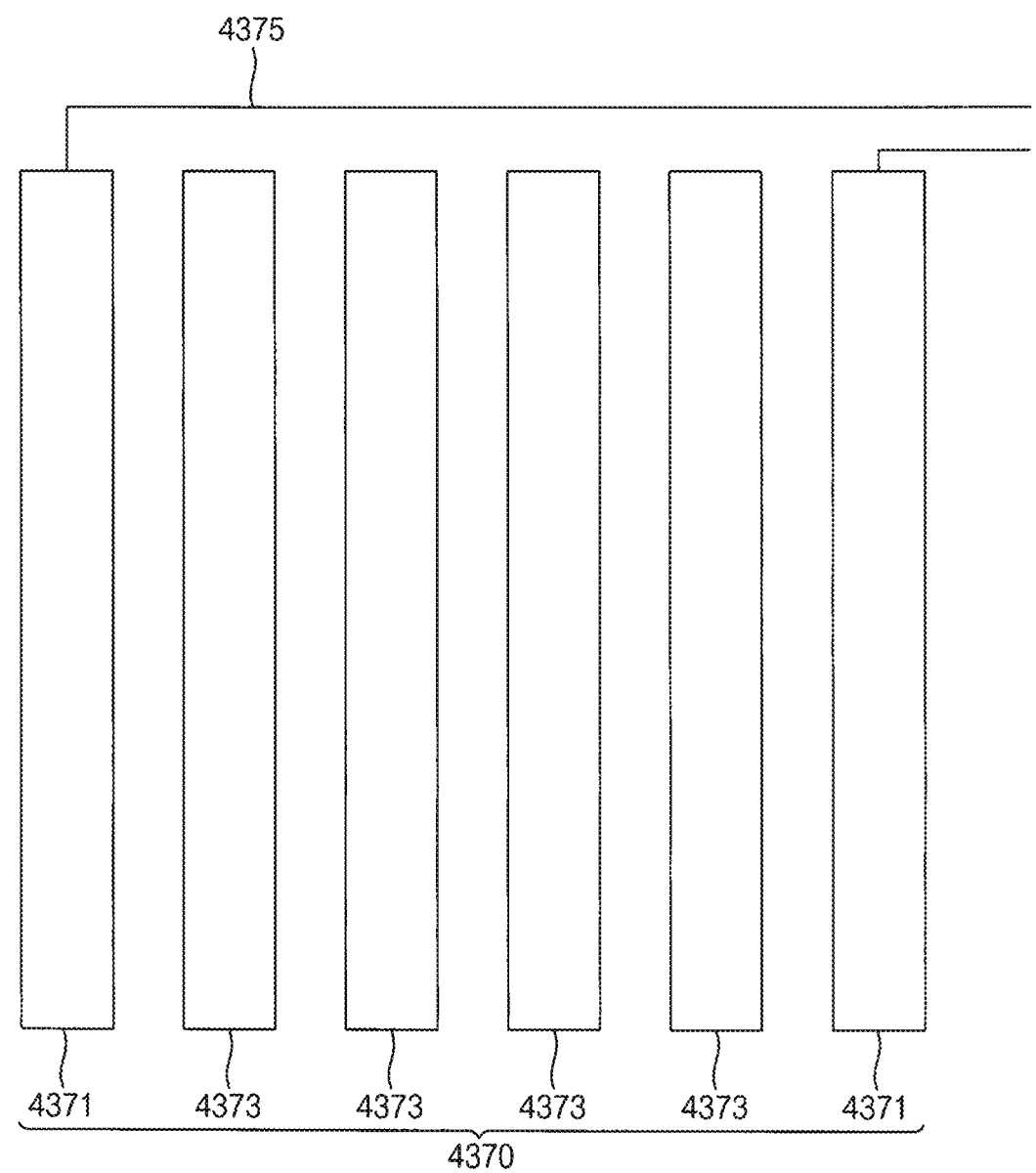
FIG. 112 is a plan view illustrating a first sensing electrode of FIG. 100.
Figure 113:
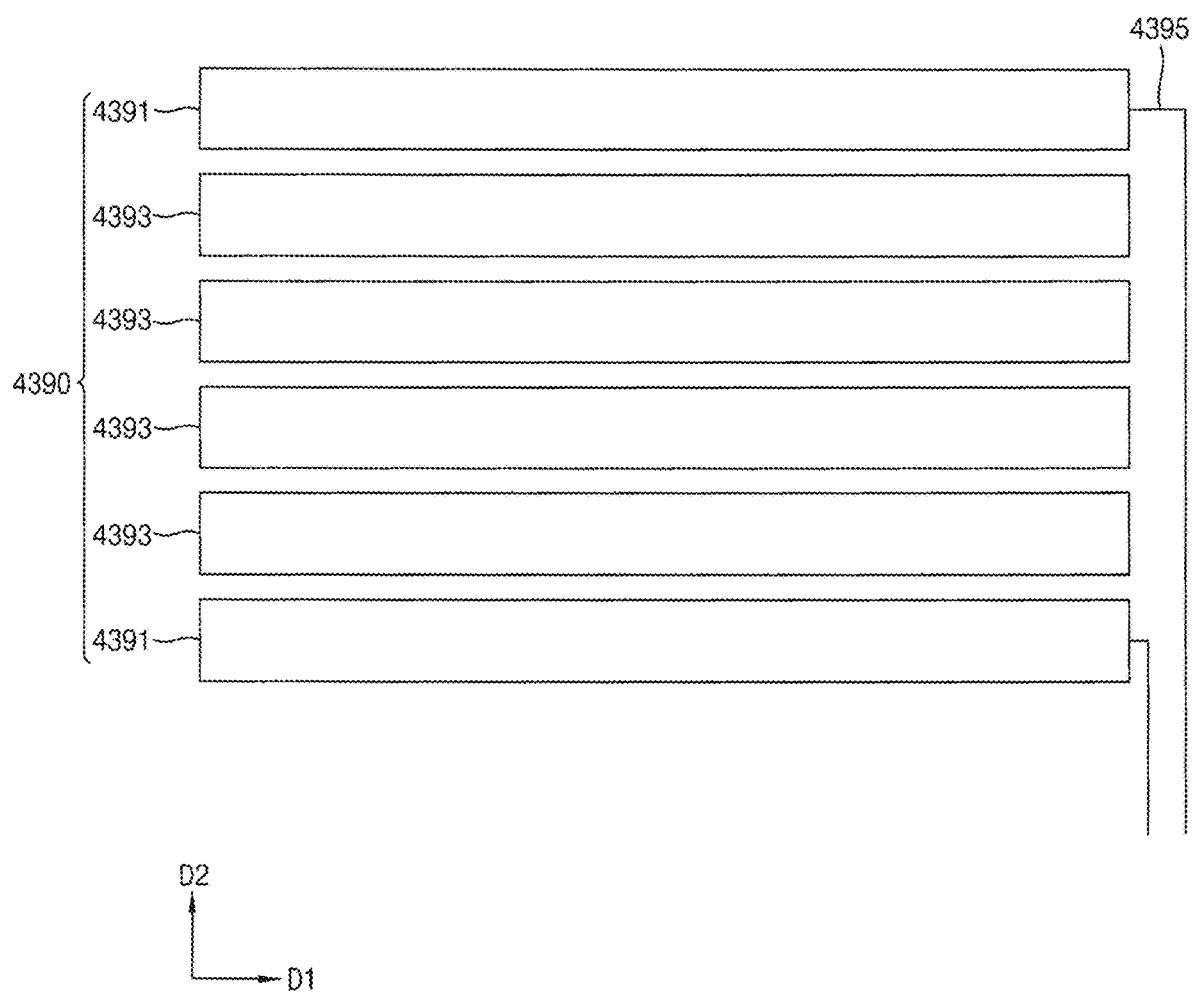
FIG. 113 is a plan view illustrating a second sensing electrode of FIG. 100.
Figure 114:
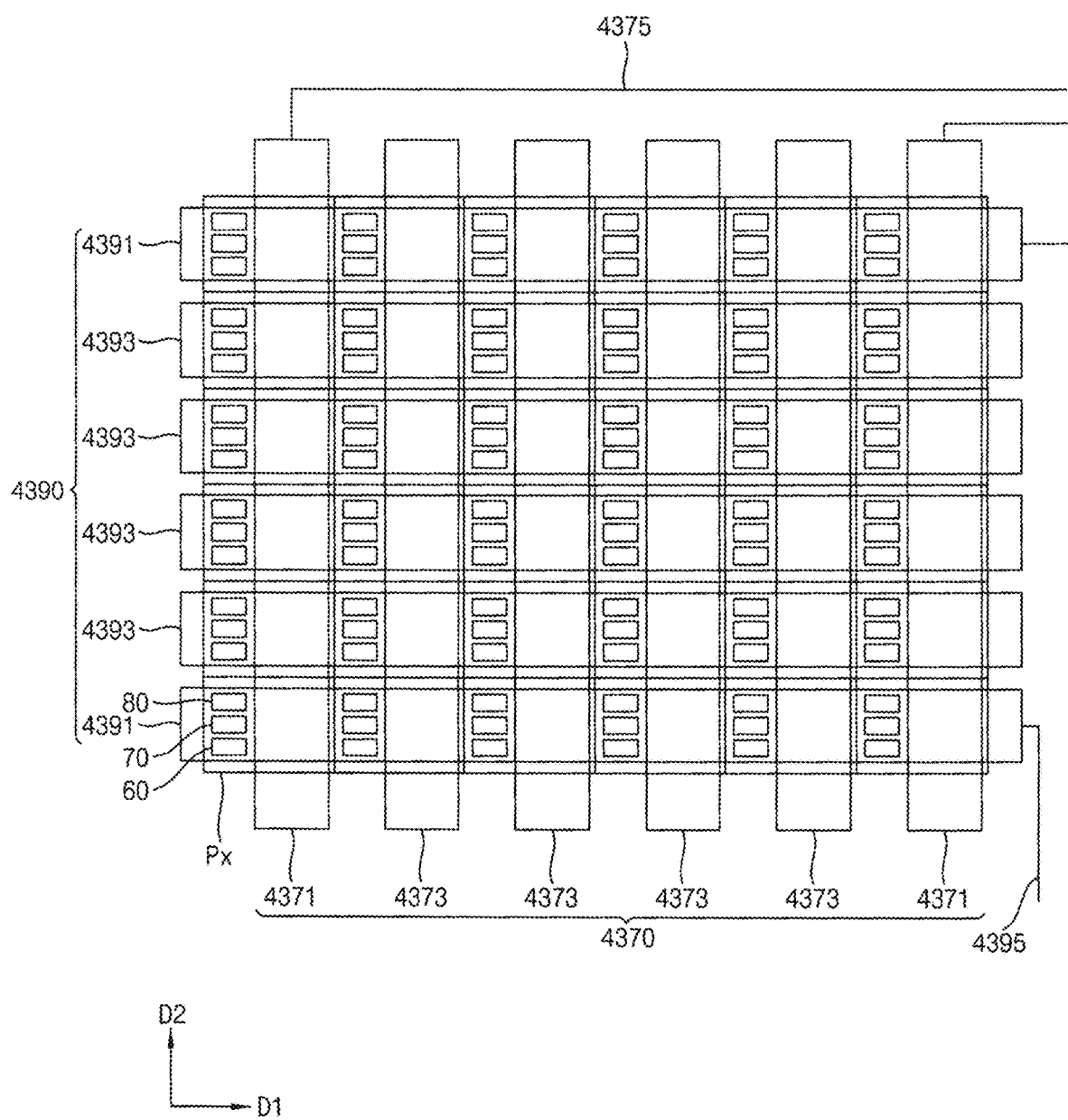
FIG. 114 is a plan view illustrating the first sensing electrode of FIG. 112 and the second sensing electrode of FIG. 113.

FIG. 112 is a plan view illustrating a first sensing electrode of FIG. 100. FIG. 113 is a plan view illustrating a second sensing electrode of FIG. 100. FIG. 114 is a plan view illustrating the first sensing electrode of FIG. 112 and the second sensing electrode of FIG. 113.

Referring to FIGS. 100 and 112 to 114, a first sensing electrode 4370 and a second sensing electrode 4390 are illustrated.

The first sensing electrode 4370 may include a plurality of first sensing patterns 4371 extending in a second direction D2 and a plurality of first dummy patterns 4373 disposed between the first sensing patterns 4371. The first sensing electrode 4370 is disposed in the reflection region III. An interval of the first sensing patterns 4371 may be adjusted according to the number of the first dummy patterns 4373. The first sensing electrode 4370 may be connected to a sensing driving part through a first connecting line 4375. The first connecting line 4375 may include the same material as that of the first sensing electrode 4370. The first connecting line 4375 may be disposed on the same layer as that on which the first sensing electrode 4370 is disposed.

The second sensing electrode 4390 may be provided as a plurality of second sensing patterns 4391 extending in a first direction D1 crossing the second direction D2 and a plurality of second dummy patterns 4393 disposed between the second sensing patterns 4391. The second sensing electrode 4390 is disposed in the light-emitting region II and the reflection region III. An interval of the second sensing electrode 4390 may be adjusted according to the number of the second dummy patterns 4393. The second sensing electrode 4390 may be connected to a sensing driving part through a second connecting line 4395. The second connecting line 4395 may include the same material as that of the second sensing electrode 4390. The second connecting line 4395 may be disposed on the same layer as that on which the second sensing electrode 4390 is disposed.

The first sensing electrode 4370 may include a material having a predetermined reflectivity. The second sensing electrode 4390 may include a material having a predetermined reflectivity. The first sensing electrode 4370 may partially overlap the second sensing electrode 4390.

The second sensing electrode 4390 is disposed on the thin film encapsulation layer 4410. The fourth insulation layer 4420 is disposed on the second sensing electrode 4390, and the first sensing electrode 4370 is disposed on the fourth insulation layer 4420.

The first sensing electrode 4370 and second sensing electrode 4390 may perform as a sensing electrode of a touch screen panel of mutual capacitance type. In an exemplary embodiment, when an electric conductor is contacted, capacitance of an intersecting point of the first sensing electrode 4370 and second sensing electrode 4390 around a touch position is changed, for example. Thus, a touch panel sensor (not shown) may decide a touch position based on a capacitance sensing signal corresponding to the change of capacitance.

The first sensing electrode 4370 may have a different thickness from a thickness of the second sensing electrode 4390. In an exemplary embodiment, a thickness of the first sensing electrode 4370 may be about 1000 Å, for example. When the thickness of the first sensing electrode 4370 is about 1000 Å, transmissivity of the first sensing electrode 4370 may be about 0%, and reflexibility of the first sensing electrode 4370 may be greater than about 95%. In addition, a thickness of the second sensing electrode 4390 may be about 100 Å. When the thickness of the second sensing electrode 4390 is about 100 Å, transmissivity of the second sensing electrode 4390 may be greater than about 50% and less than about 95%. When an organic light emitting display device emits light, the second sensing electrode 4390 may display an image in the light-emitting region II, and when an organic light emitting display device does not emit light, the second sensing electrode 4390 may perform a mirror function.

Figure 115:
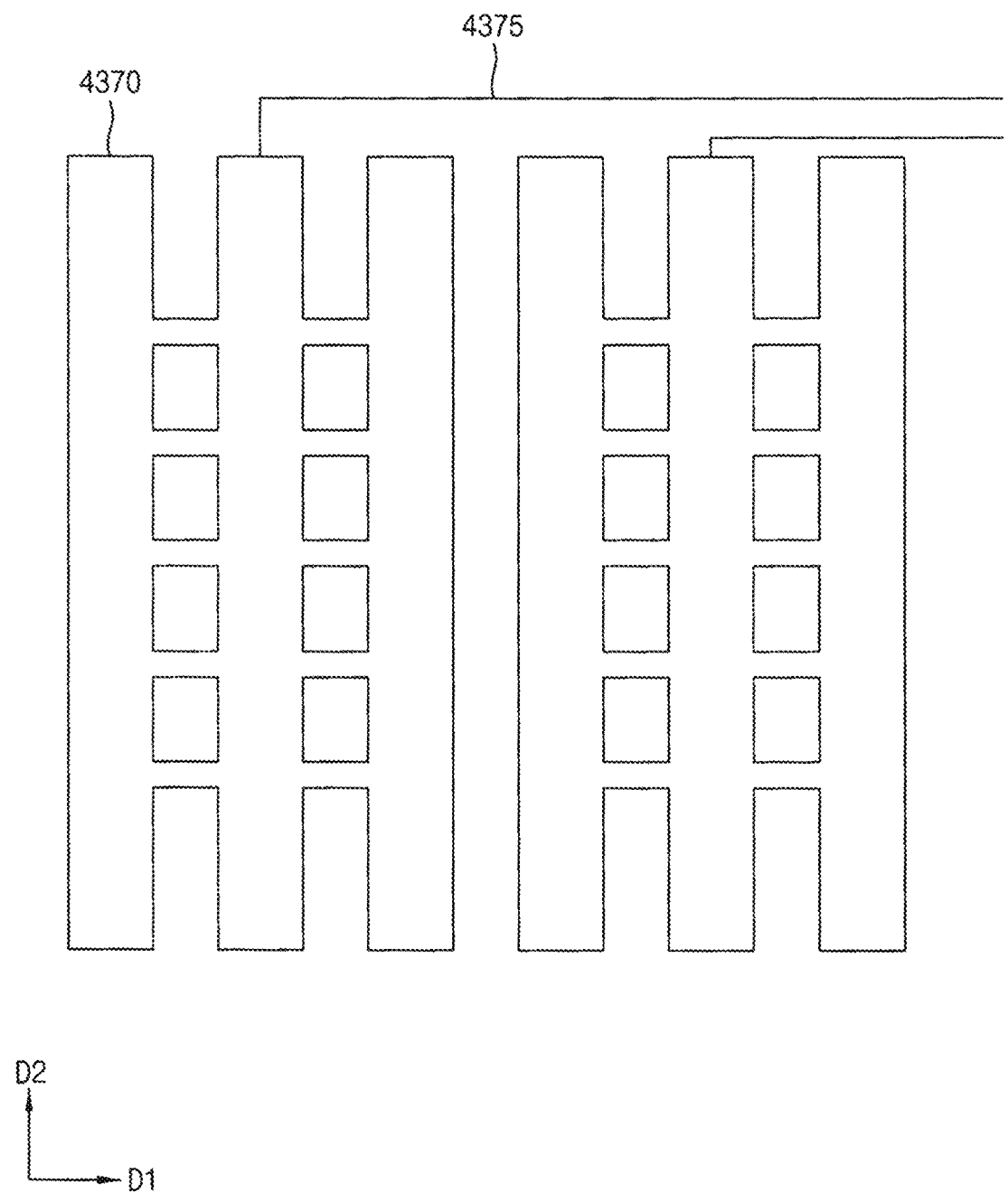
FIG. 115 is a plan view illustrating a first sensing electrode of FIG. 100.
Figure 116:
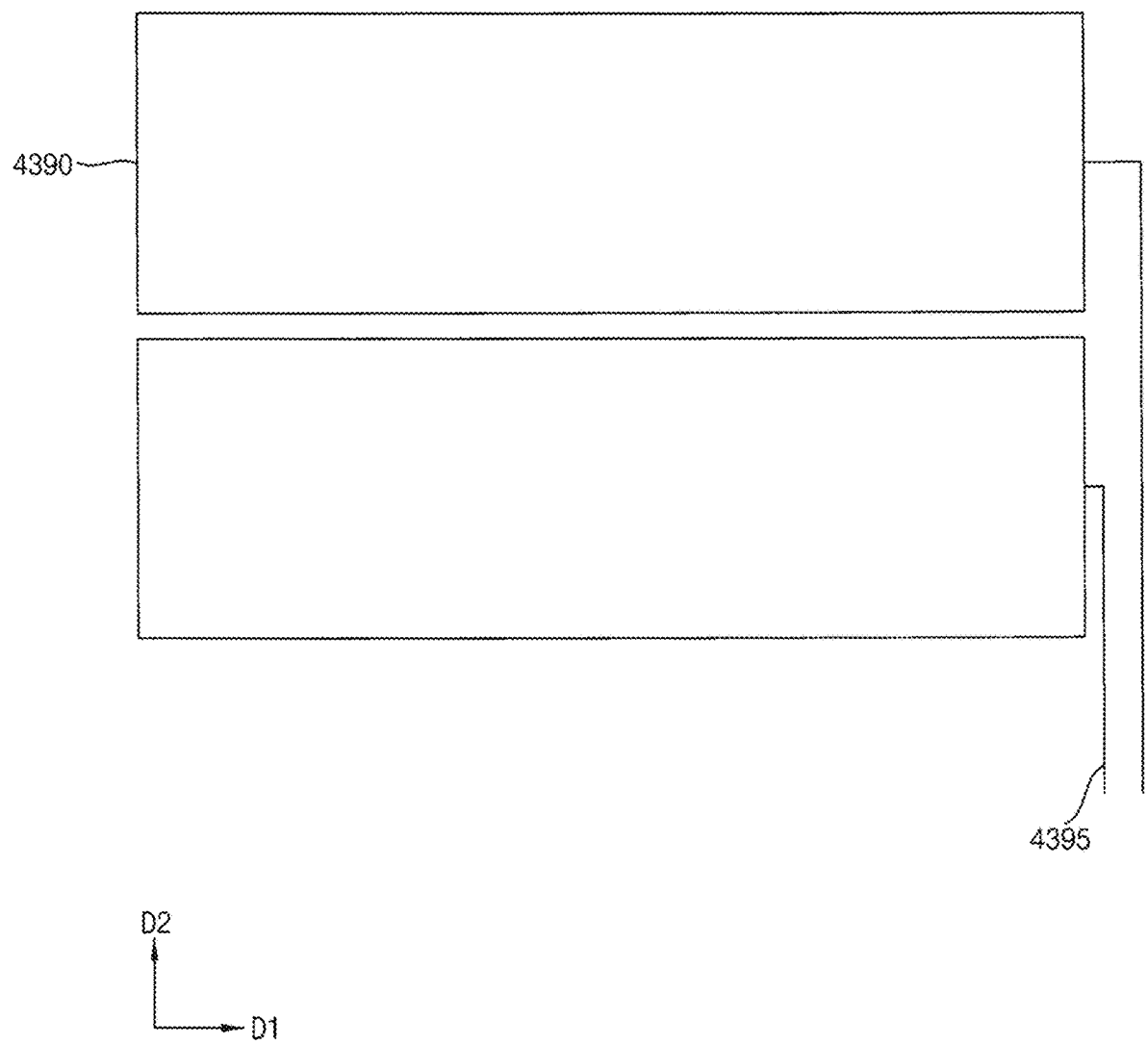
FIG. 116 is a plan view illustrating a second sensing electrode of FIG. 100.
Figure 117:
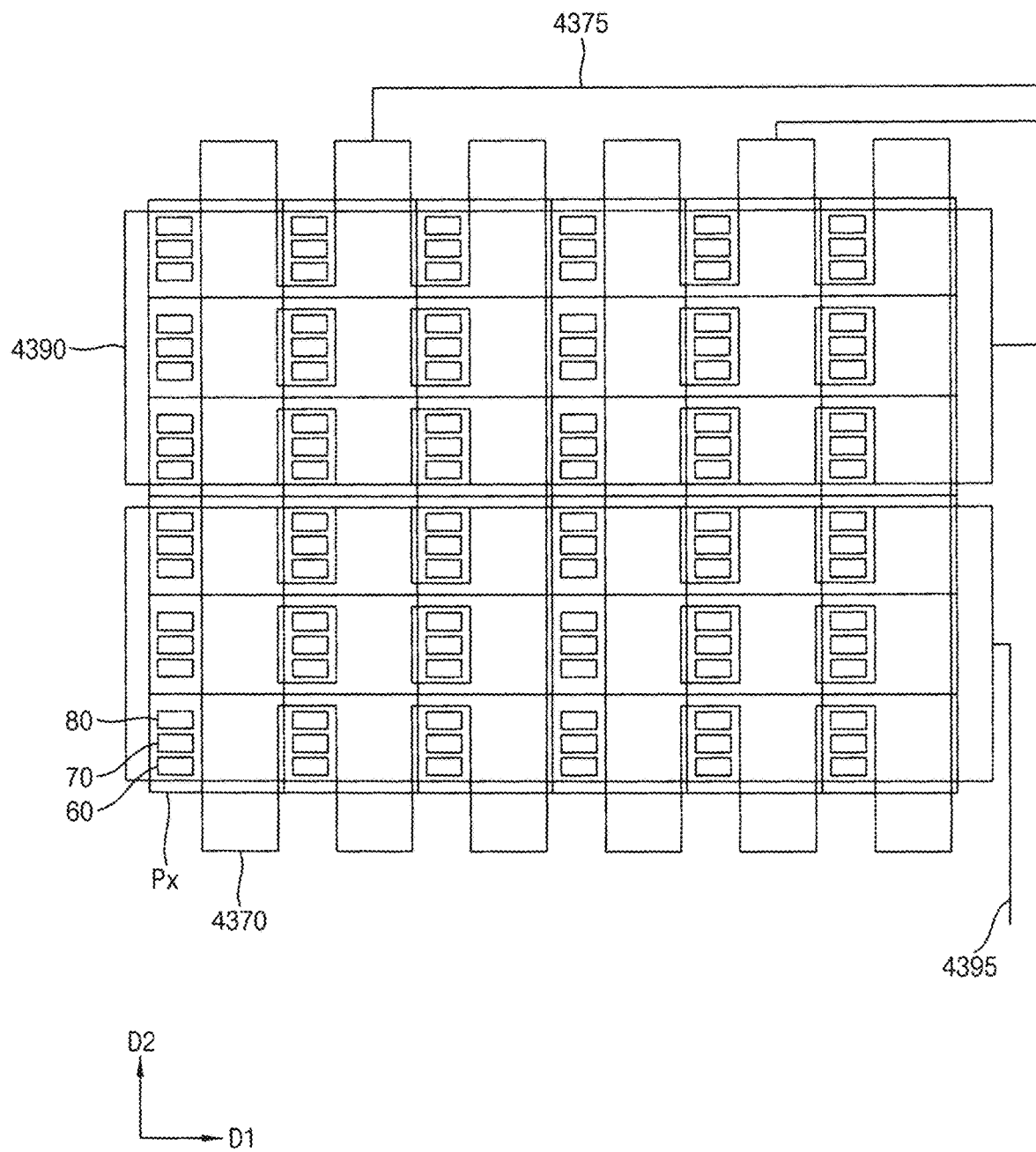
FIG. 117 is a plan view illustrating the first sensing electrode of FIG. 115 and the second sensing electrode of FIG. 116.

FIG. 115 is a plan view illustrating a first sensing electrode of FIG. 100. FIG. 116 is a plan view illustrating a second sensing electrode of FIG. 100. FIG. 117 is a plan view illustrating the first sensing electrode of FIG. 115 and the second sensing electrode of FIG. 116.

Referring to FIGS. 100 and 115 to 117, a first sensing electrode 4370 and a second sensing electrode 4390 are illustrated.

The first sensing electrode 4370 may be provided as a plurality of patterns extending in a second direction D2. The first sensing electrode 4370 may be provided as a mesh shape. The first sensing electrode 4370 is disposed in the reflection region III. The first sensing electrode 4370 may be connected to a sensing driving part through a first connecting line 4375. The first connecting line 4375 may include the same material as that of the first sensing electrode 4370. The first connecting line 4375 may be disposed on the same layer as that on which the first sensing electrode 4370 is disposed.

The second sensing electrode 4390 may be provided as a plurality of patterns extending in a first direction D1 crossing the second direction D2. A width of the second sensing electrode 4390 in the second direction D2 is the same as a width of the first sensing electrode 4370 in the first direction D1. The second sensing electrode 4390 is disposed in the light-emitting region II and the reflection region III. The second sensing electrode 4390 may be connected to a sensing driving part through a second connecting line 4395. The second connecting line 4395 may include the same material as that of the second sensing electrode 4390. The second connecting line 4395 may be disposed on the same layer as that on which the second sensing electrode 4390 is disposed.

The first sensing electrode 4370 may include a material having a predetermined reflectivity. The second sensing electrode 4390 may include a material having a predetermined reflectivity. The first sensing electrode 4370 may partially overlap the second sensing electrode 4390.

The second sensing electrode 4390 is disposed on the thin film encapsulation layer 4410. The fourth insulation layer 4420 is disposed on the second sensing electrode 4390, and the first sensing electrode 4370 is disposed on the fourth insulation layer 4420.

The first sensing electrode 4370 and second sensing electrode 4390 may perform as a sensing electrode of a touch screen panel of mutual capacitance type. In an exemplary embodiment, when an electric conductor is contacted, capacitance of an intersecting point of the first sensing electrode 4370 and second sensing electrode 4390 around a touch position is changed, for example. Thus, a touch panel sensor (not shown) may decide a touch position based on a capacitance sensing signal corresponding to the change of capacitance.

The first sensing electrode 4370 may have a different thickness from a thickness of the second sensing electrode 4390. In an exemplary embodiment, a thickness of the first sensing electrode 4370 may be about 1000 Å, for example. When the thickness of the first sensing electrode 4370 is about 1000 Å, transmissivity of the first sensing electrode 4370 may be about 0%, and reflexibility of the first sensing electrode 4370 may be greater than about 95%. In addition, a thickness of the second sensing electrode 4390 may be about 100 Å. When the thickness of the second sensing electrode 4390 is about 100 Å, transmissivity of the second sensing electrode 4390 may be greater than about 50% and less than about 95%. When an organic light emitting display device emits light, the second sensing electrode 4390 may display an image in the light-emitting region II, and when an organic light emitting display device does not emit light, the second sensing electrode 4390 may perform a mirror function.

Figure 118:
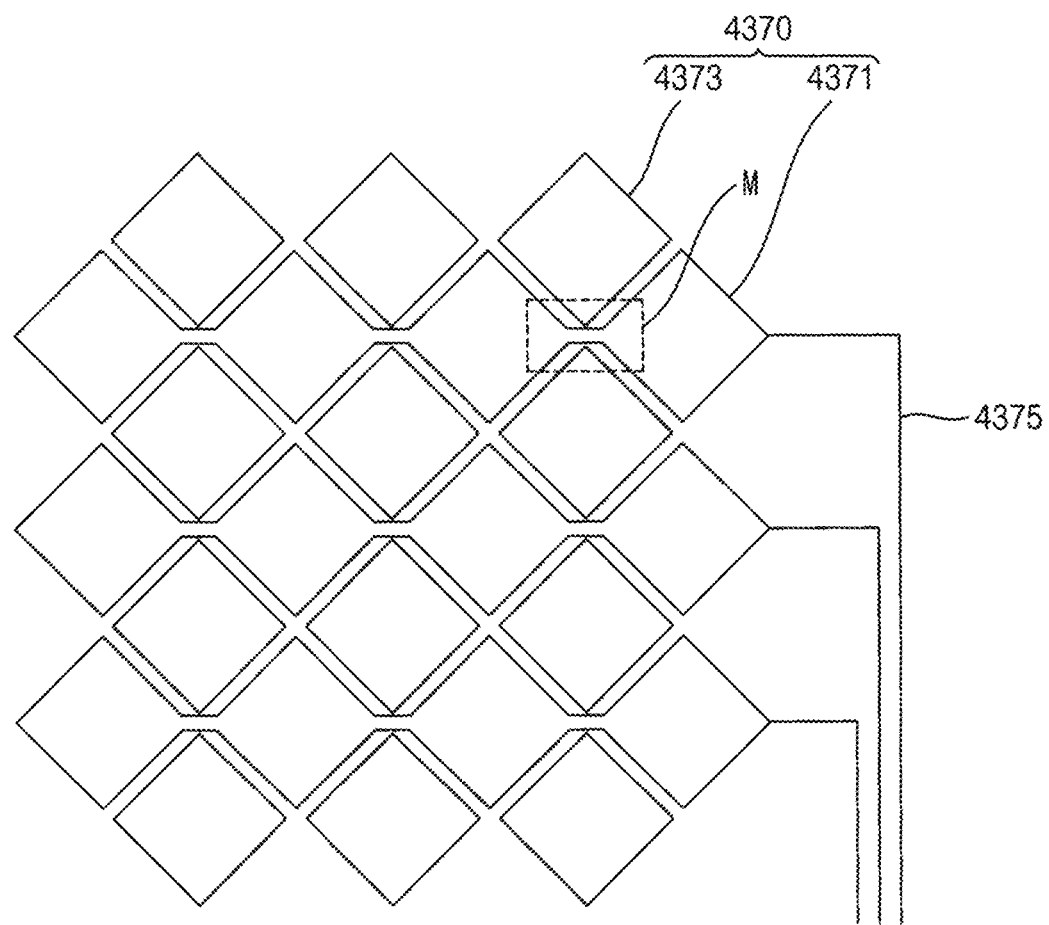
FIG. 118 is a plan view illustrating a first sensing electrode of FIG. 100.
Figure 119:
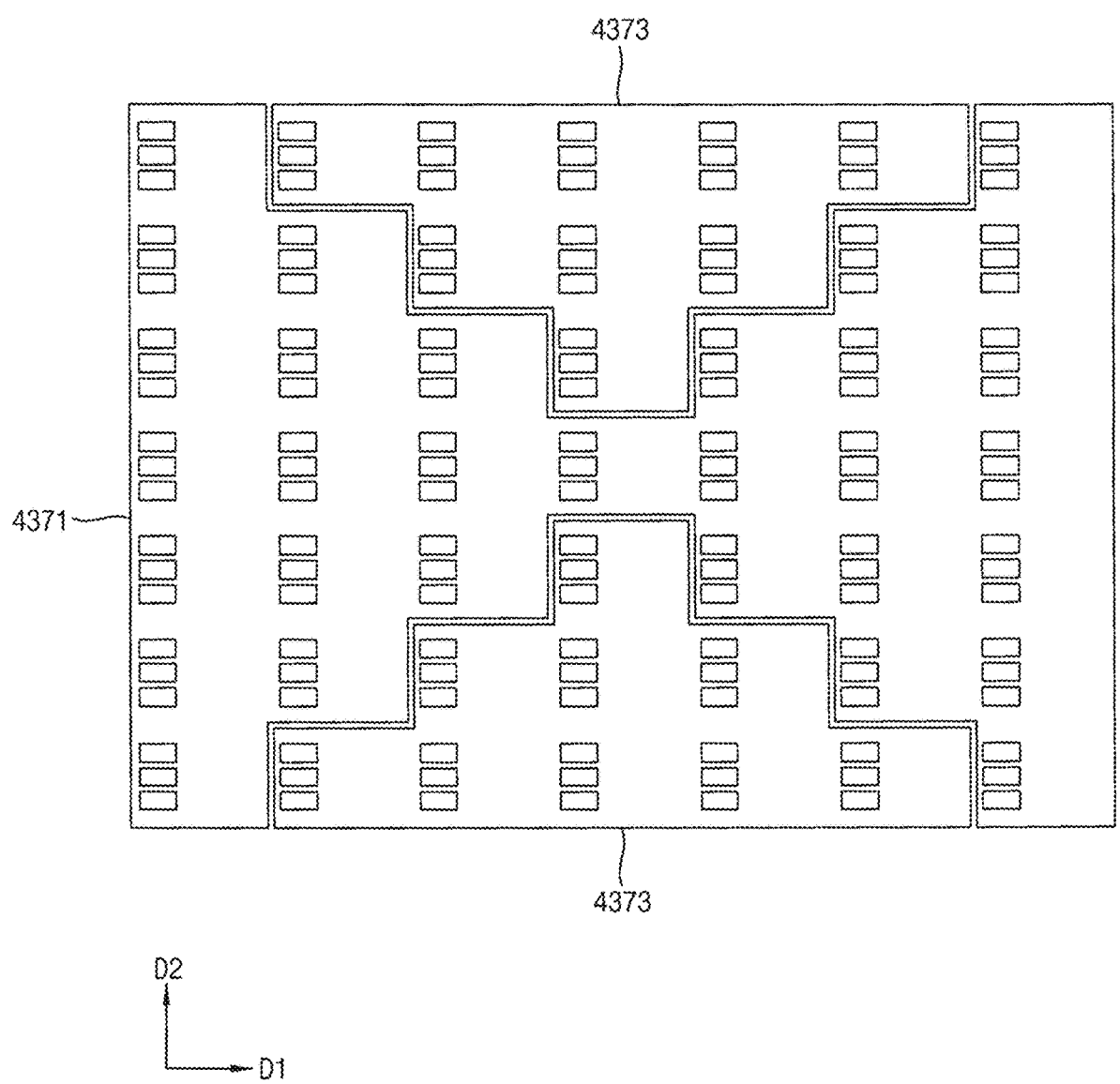
FIG. 119 is a plan view magnifying 'M' portion of FIG. 118.
Figure 120:
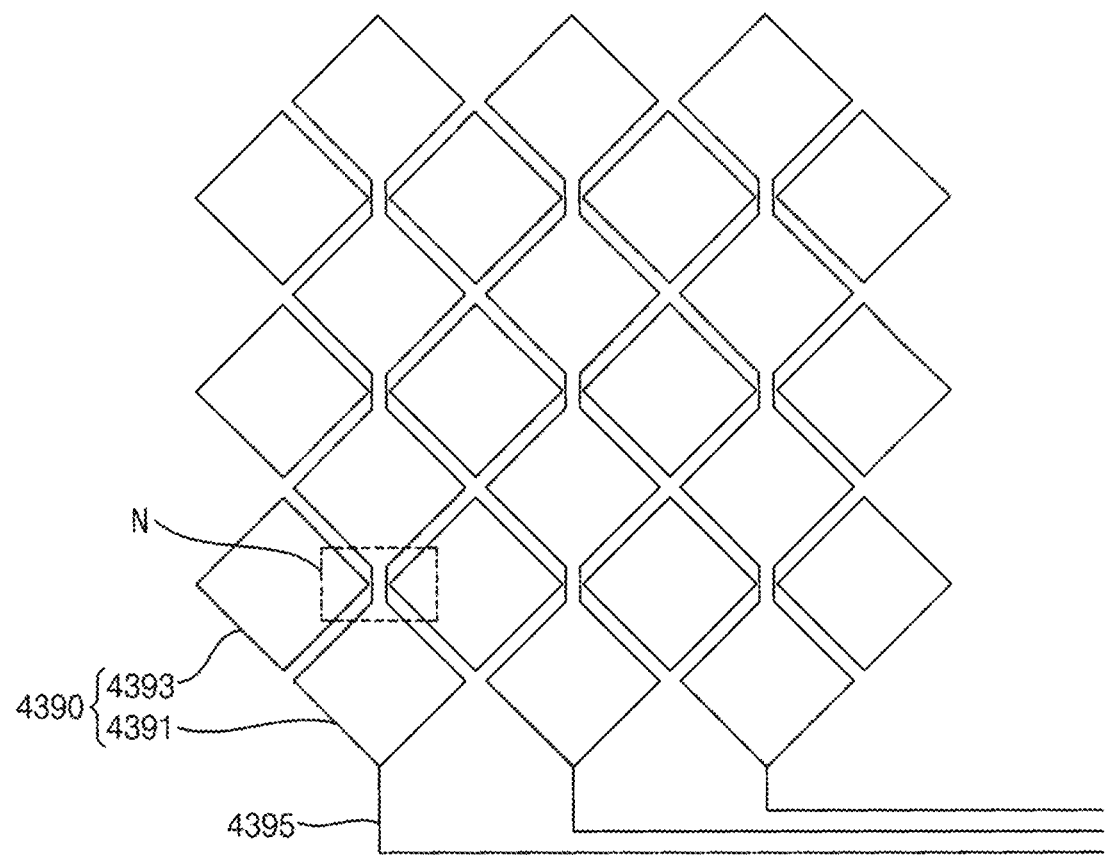
FIG. 120 is a plan view illustrating a second sensing electrode of FIG. 100.
Figure 121:
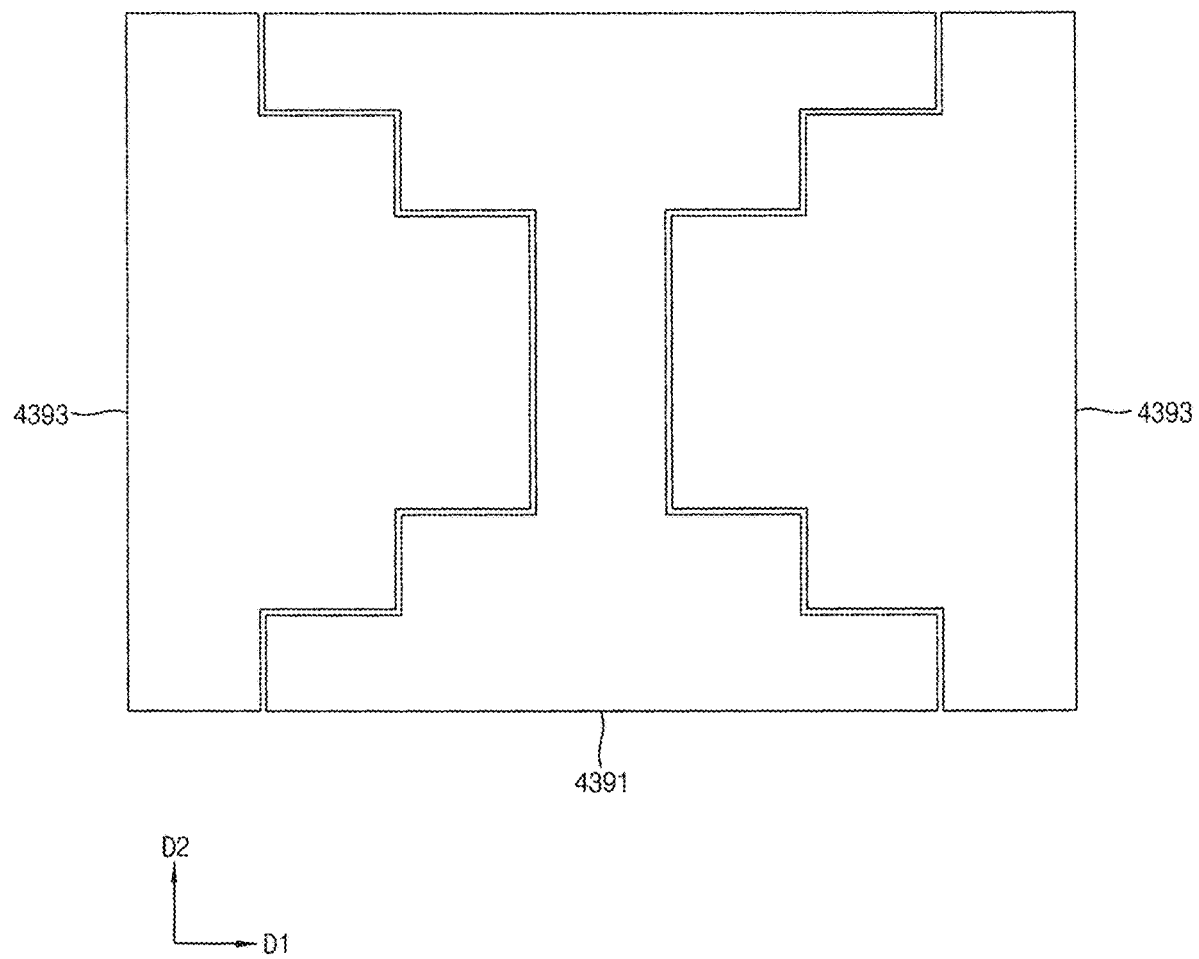
FIG. 121 is a plan view magnifying 'N' portion of FIG. 120.
Figure 122:
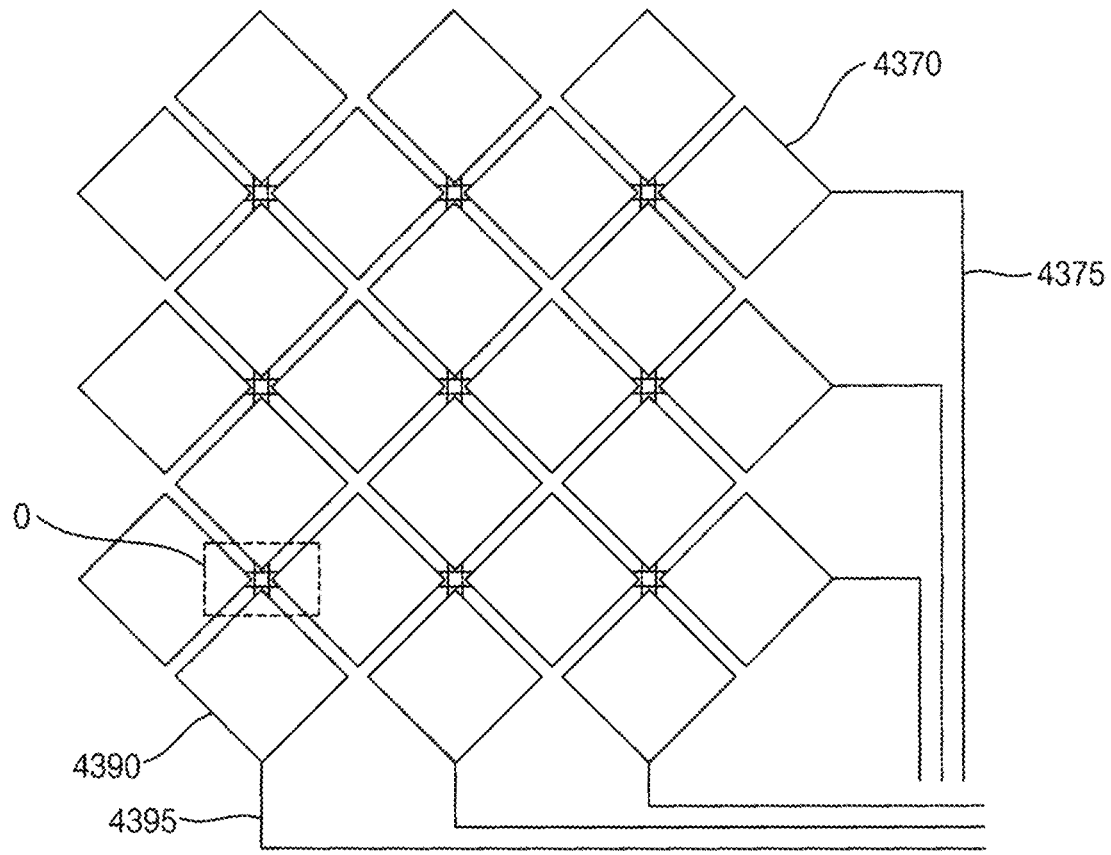
FIG. 122 is a plan view illustrating the first sensing electrode of FIG. 118 and the second sensing electrode of FIG. 120.
Figure 123:
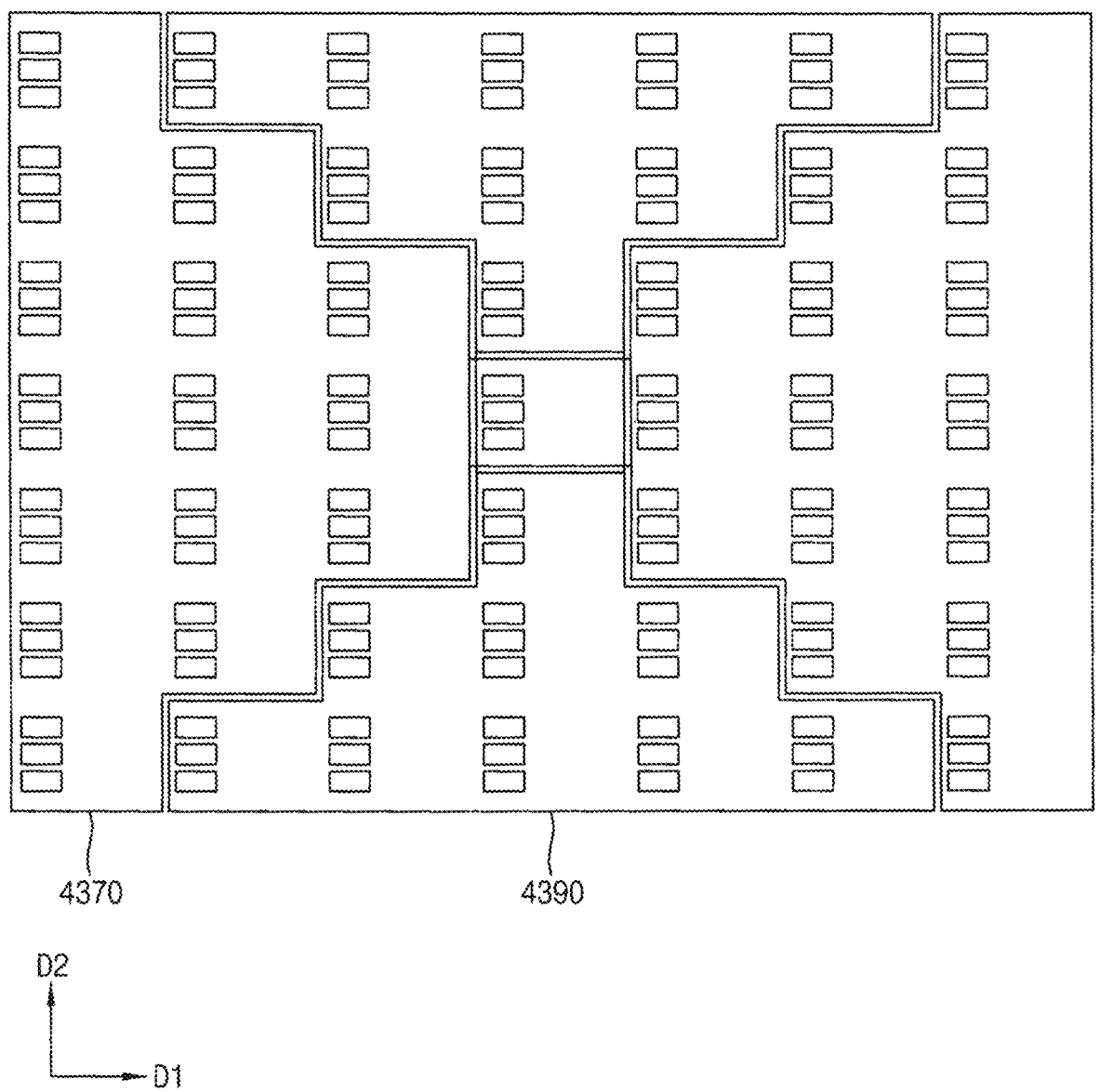
FIG. 123 is a plan view magnifying 'O' portion of FIG. 122.

FIG. 118 is a plan view illustrating a first sensing electrode of FIG. 100. FIG. 119 is a plan view magnifying 'M' portion of FIG. 118. FIG. 120 is a plan view illustrating a second sensing electrode of FIG. 100. FIG. 121 is a plan view magnifying 'N' portion of FIG. 120. FIG. 122 is a plan view illustrating the first sensing electrode of FIG. 118 and the second sensing electrode of FIG. 120. FIG. 123 is a plan view magnifying 'O' portion of FIG. 122.

Referring to FIGS. 100 and 118 to 123, a first sensing electrode 4370 and a second sensing electrode 4390 are illustrated.

The first sensing electrode 4370 may include plurality of first sensing patterns 4371 having a rhombus shape and sequentially connected each other in a first direction D1 and a plurality of first dummy patterns 4373 having a rhombus shape and disposed between the first sensing patterns 4371. The first dummy patterns 4373 are spaced apart from each other. The first sensing electrode 4370 is disposed in the reflection region III. The first sensing electrode 4370 may be connected to a sensing driving part through a first connecting line 4375. The first connecting line 4375 may include the same material as that of the first sensing electrode 4370. The first connecting line 4375 may be disposed on the same layer as that on which the first sensing electrode 4370 is disposed.

The second sensing electrode 4390 may include plurality of second sensing patterns 4391 having a rhombus shape and sequentially connected each other in a second direction D2 and a plurality of second dummy patterns 4393 having a rhombus shape and disposed between the second sensing patterns 4391. The second dummy patterns 4393 are spaced apart from each other. The second sensing electrode 4390 is disposed in the light-emitting region II and the reflection region III. The second sensing electrode 4390 may be connected to a sensing driving part through a second connecting line 4395. The second connecting line 4395 may include the same material as that of the second sensing electrode 4390. The second connecting line 4395 may be disposed on the same layer as that on which the second sensing electrode 4390 is disposed.

The first sensing electrode 4370 may include a material having a predetermined reflectivity. The second sensing electrode 4390 may include a material having a predetermined reflectivity. The first sensing electrode 4370 may partially overlap the second sensing electrode 4390.

The second sensing electrode 4390 is disposed on the thin film encapsulation layer 4410. The fourth insulation layer 4420 is disposed on the second sensing electrode 4390, and the first sensing electrode 4370 is disposed on the fourth insulation layer 4420.

The first sensing electrode 4370 and second sensing electrode 4390 may perform as a sensing electrode of a touch screen panel of mutual capacitance type. In an exemplary embodiment, when an electric conductor is contacted, capacitance of an intersecting point of the first sensing electrode 4370 and second sensing electrode 4390 around a touch position is changed, for example. Thus, a touch panel sensor (not shown) may decide a touch position based on a capacitance sensing signal corresponding to the change of capacitance.

The first sensing electrode 4370 may have a different thickness from a thickness of the second sensing electrode 4390. In an exemplary embodiment, a thickness of the first sensing electrode 4370 may be about 1000 Å, for example. When the thickness of the first sensing electrode 4370 is about 1000 Å, transmissivity of the first sensing electrode 4370 may be about 0%, and reflexibility of the first sensing electrode 4370 may be greater than about 95%. In addition, a thickness of the second sensing electrode 4390 may be about 100 Å. When the thickness of the second sensing electrode 4390 is about 100 Å, transmissivity of the second sensing electrode 4390 may be greater than about 50% and less than about 95%. When an organic light emitting display device emits light, the second sensing electrode 4390 may display an image in the light-emitting region II, and when an organic light emitting display device does not emit light, the second sensing electrode 4390 may perform a mirror function.

Figure 124:
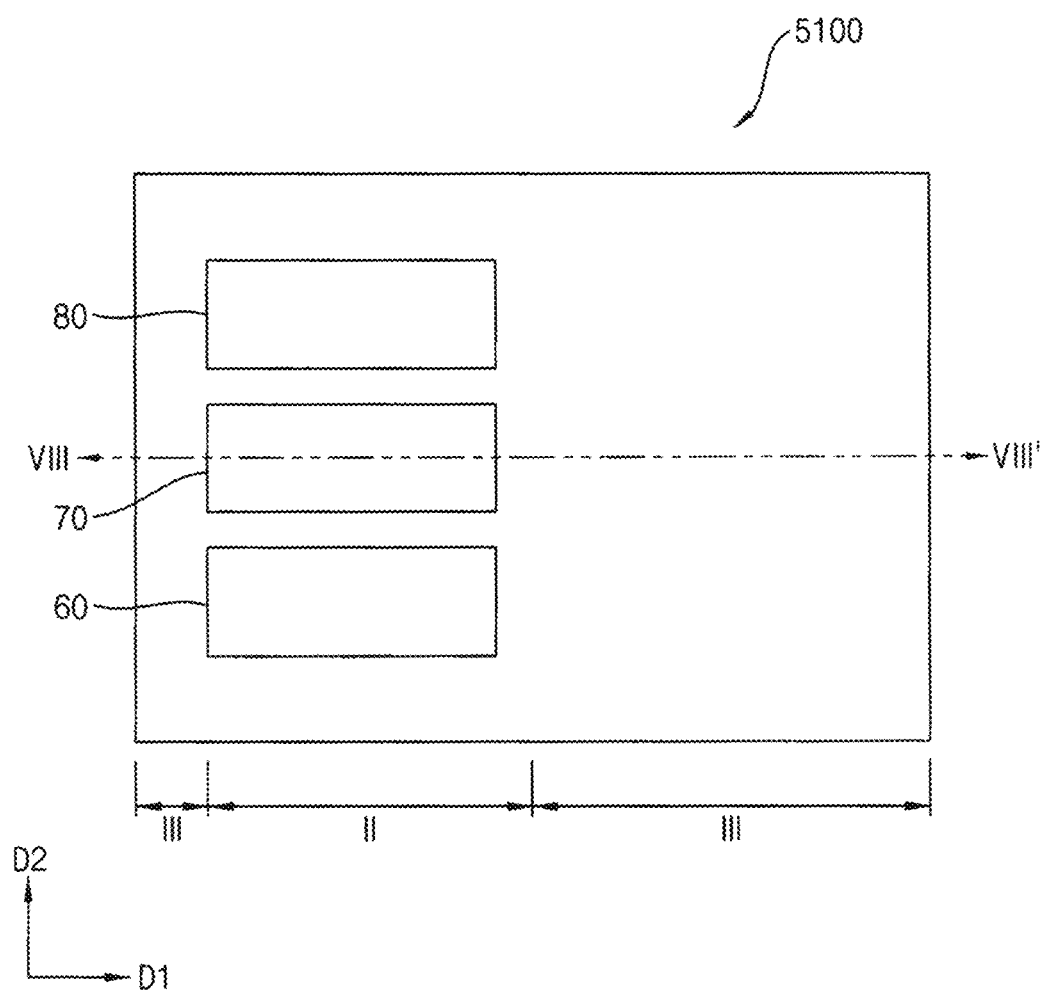
FIG. 124 is a plan view illustrating an exemplary embodiment of an organic light emitting display device according to the invention.
Figure 125:
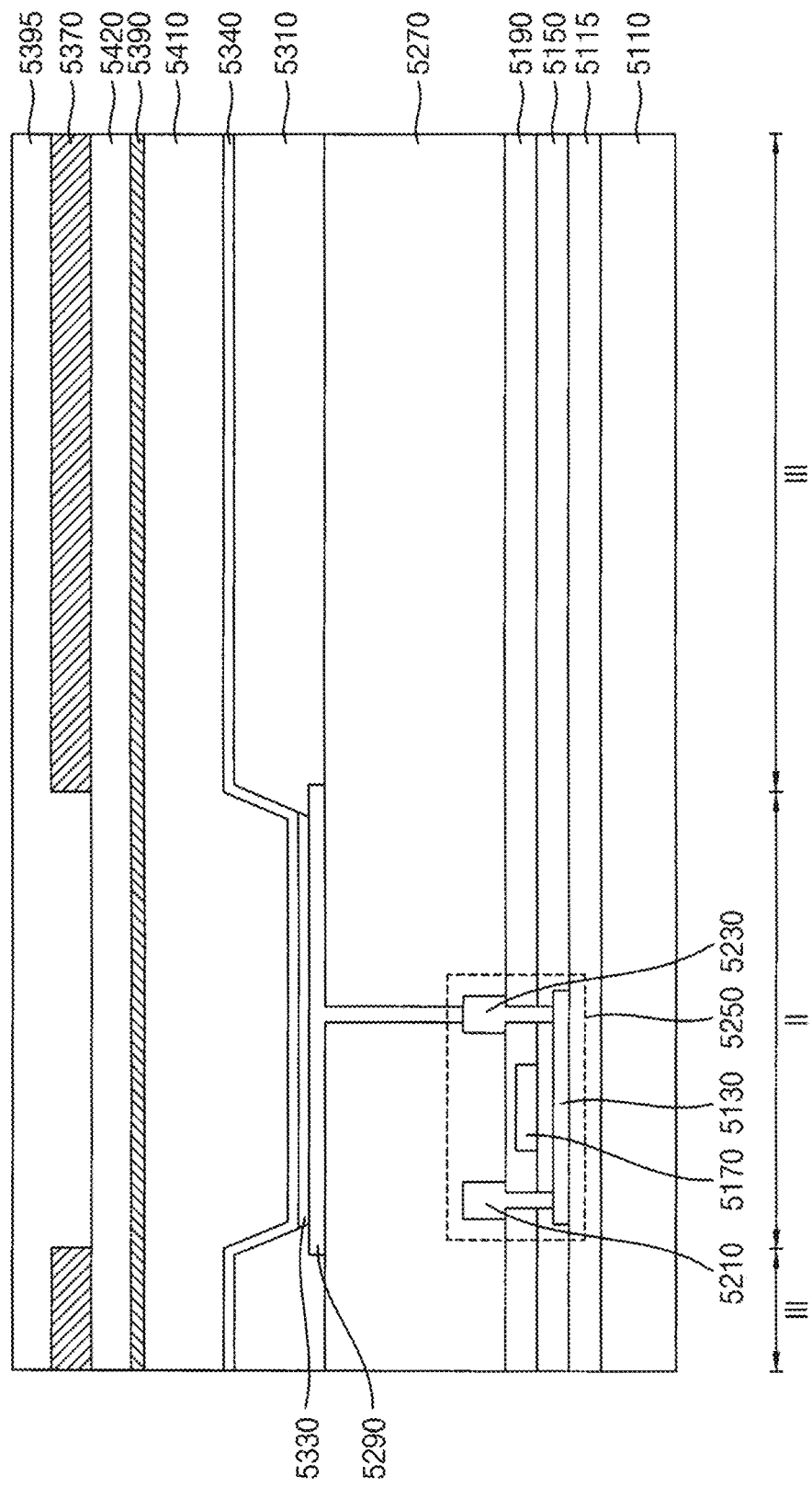
FIG. 125 is a cross-sectional view taken along line VIII-VIII' of FIG. 124.

FIG. 124 is a plan view illustrating an organic light emitting display device according to an exemplary embodiment of the invention. FIG. 125 is a cross-sectional view taken along line VIII-VIII' of FIG. 124.

An organic light emitting display device according to the illustrated exemplary embodiment is substantially same as the organic light emitting display device of FIGS. 1 and 2 except for a first sensing electrode 5370, a first thin film encapsulation layer 5410, a second thin film encapsulation layer 5420 and second sensing electrode 5390 and thus similar reference numerals are used for same elements and repetitive explanation will be omitted.

Referring to FIGS. 124 and 125, a thin film encapsulation layer is disposed on a second electrode 5340. The thin film encapsulation layer may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. The organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

However, the invention is not limited thereto, and the thin film encapsulation layer maybe provided by stacking (e.g., sequentially stacking) a first inorganic layer, a first organic layer, a second inorganic layer, a second organic layer and a third inorganic layer.

In the illustrated exemplary embodiment, the thin film encapsulation layer may include a first thin film encapsulation layer 5410 and a second thin film encapsulation layer 5420. In an exemplary embodiment, the first thin film encapsulation layer 5410 may include a first inorganic layer and an organic layer, for example. The second thin film encapsulation layer 5420 may include second inorganic layer. However, the invention is not limited thereto.

The second sensing electrode 5390 is disposed on the first thin film encapsulation layer 5410. The second sensing electrode 5390 may be disposed in the light-emitting region II and the reflection region III.

The second sensing electrode 5390 may include a material having a predetermined reflectivity. In an exemplary embodiment, the second sensing electrode 5390 may include gold (Au), silver (Ag), aluminum (Al), magnesium (Mg), platinum (Pt), Nickel (Ni), titanium (Ti), etc., for example. In an alternative exemplary embodiment, the second sensing electrode 5390 may include an alloy, metal nitride, conductive metal oxide, etc. In an exemplary embodiment, the second sensing electrode 5390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc.

The second thin film encapsulation layer 5420 is disposed on the second sensing electrode 5390. The first sensing electrode 5370 is disposed on the second thin film encapsulation layer 5420. The first sensing electrode 5370 may be disposed in the reflection region III and outside of the light-emitting region II.

The first sensing electrode 5370 may include a material having a predetermined reflectivity. In an exemplary embodiment, the first sensing electrode 5370 may include gold (Au), silver (Ag), aluminum (Al), magnesium (Mg), platinum (Pt), Nickel (Ni), titanium (Ti), etc., for example. In an alternative exemplary embodiment, the first sensing electrode 5370 may include an alloy, metal nitride, conductive metal oxide, etc. In an exemplary embodiment, the first sensing electrode 5370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

A fifth insulation layer 5395 may be disposed on the first sensing electrode 5370. In an exemplary embodiment, the fifth insulation layer 5395 may include a silicon compound, a metal oxide, etc., for example.

In the illustrated exemplary embodiment, the second sensing electrode 5390 is disposed on the first thin film encapsulation layer 5410. The second thin film encapsulation layer 5420 is disposed on the second sensing electrode 5390, and the first sensing electrode 5370 is disposed on the second thin film encapsulation layer 5420. However, the invention is not limited thereto, and the first sensing electrode 5370 may be disposed on the first thin film encapsulation layer 5410. In addition, the second thin film encapsulation layer 5420 may be disposed on the first sensing electrode 5370, and the second sensing electrode 5390 may be disposed on the second thin film encapsulation layer 5420.

FIGS. 126 to 133 are cross-sectional views illustrating a method of manufacturing the organic light emitting display device of FIG. 125.

Figure 126:
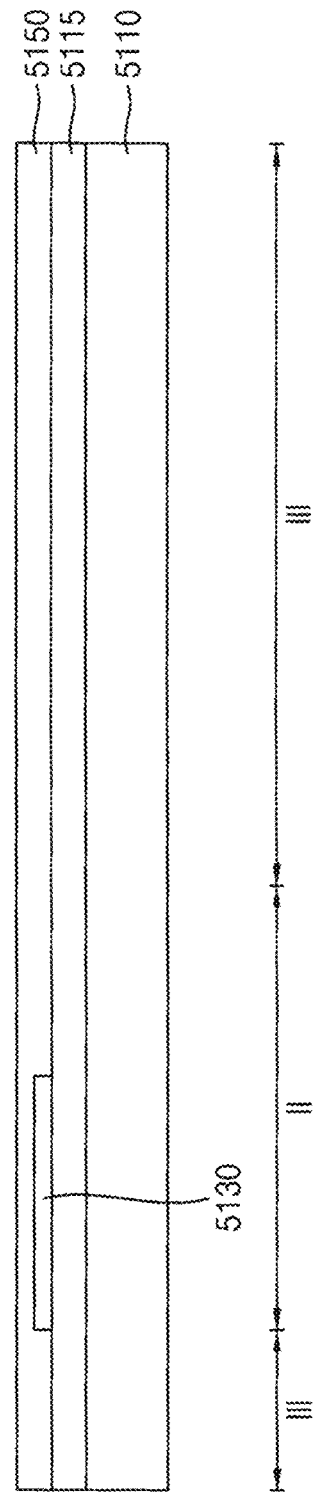
FIGS. 126 to 133 are cross-sectional views illustrating a method of manufacturing the organic light emitting display device of FIG. 125.

Referring to FIG. 126, the buffer layer 5115 is disposed on the first substrate 5110. Thereafter, the active pattern 5130 and the first insulation layer 5150 are disposed on the buffer layer 5115.

In an exemplary embodiment, the first substrate 5110 may include quartz, synthetic quartz, calcium fluoride, fluoride-doping quartz, a sodalime glass, a non-alkali glass etc., for example.

The light emitting structure may be disposed on the first substrate 5110. The first substrate 5110 may include transparent materials. In an exemplary embodiment, the first substrate 5110 may include quartz, synthetic quartz, calcium fluoride, fluoride-doping quartz, a sodalime glass, a non-alkali glass etc., for example. In an alternative exemplary embodiment, the first substrate 5110 may include a flexible transparent resin substrate. Here, the flexible transparent resin substrate for the first substrate 5110 may include a polyimide substrate. In an exemplary embodiment, the polyimide substrate may include a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 5110 may have a structure in which the first polyimide layer, the barrier film layer and the second polyimide layer are stacked on a glass substrate. Here, after an insulation layer is provided on the second polyimide layer, the light emitting structure (e.g., the semiconductor element 5250, a capacitor, the first electrode 5290, the light emitting layer 5330, the second electrode 5340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 5110 after the removal of the glass substrate. As the organic light emitting display device 5100 includes the light-emitting region II and the reflection region III, the first substrate 5110 may also include the light-emitting region II and the reflection region III.

A buffer layer 5115 may be disposed on the first substrate 5110. The buffer layer 5115 may extend from the light-emitting region II into the reflection region III. The buffer layer 5115 may prevent the diffusion (e.g., an out gassing) of metal atoms and/or impurities from the first substrate 110. Additionally, the buffer layer 5115 may control a rate of a heat transfer in a crystallization process for forming the active pattern 5130, thereby obtaining substantially uniform the active pattern 5130. Furthermore, the buffer layer 5115 may improve a surface flatness of the first substrate 5110 when a surface of the first substrate 5110 is relatively irregular. According to a type of the first substrate 5110, at least two buffer layers may be provided on the first substrate 5110, or the buffer layer may not be disposed.

In an exemplary embodiment, the active pattern 5130 may include an oxide semiconductor, an inorganic semiconductor (e.g., amorphous silicon, polysilicon, etc.), an organic semiconductor, etc., for example.

The first insulation layer 5150 may be disposed on the active pattern 5130. The first insulation layer 5150 may cover the active pattern 5130 in the light-emitting region II, and may extend in the first direction on the first substrate 5110. That is, the first insulation layer 5150 may be disposed on the entire surface of the first substrate 5110. In an exemplary embodiment, the first insulation layer 5150 may include a silicon compound, a metal oxide, etc., for example.

Figure 127:
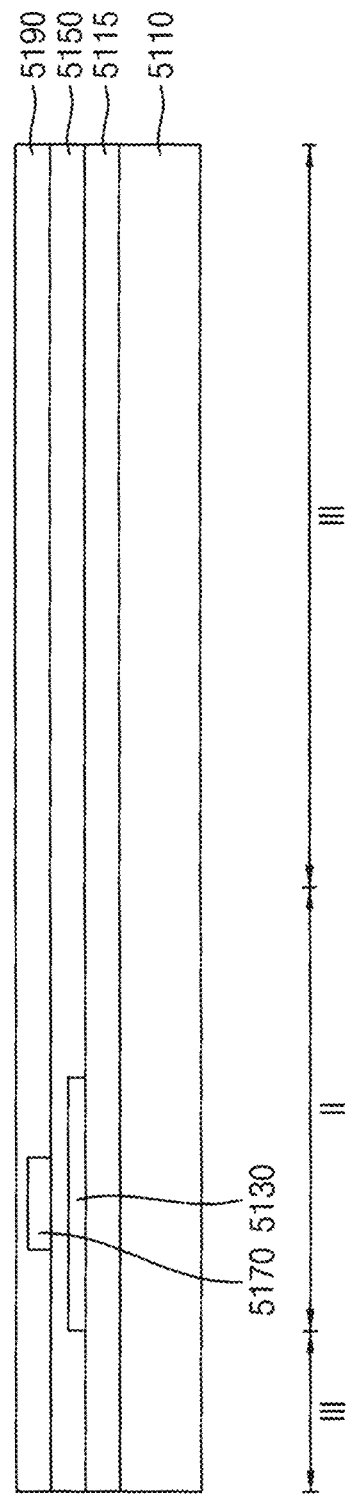

Referring to FIG. 127, the gate electrode 5170 and the second insulation layer 5190 are disposed on the first substrate 5110 on which the first insulation layer 5150 is disposed.

The gate electrode 5170 may be disposed on a portion of the first insulation layer 150 under which the active pattern 5130 is disposed. In an exemplary embodiment, the gate electrode 5170 may include a metal, an alloy, metal nitride, conductive metal oxide, transparent conductive materials, etc., for example.

The second insulation layer 5190 may be disposed on the gate electrode 5170. The second insulation layer 5190 may cover the gate electrode 5170 in the light-emitting region II, and may extend in the first direction on the first substrate 5110. That is, the second insulation layer 5190 may be disposed on the entire surface of the first substrate 5110. In an exemplary embodiment, the second insulation layer 5190 may include a silicon compound, a metal oxide, etc., for example.

Figure 128:
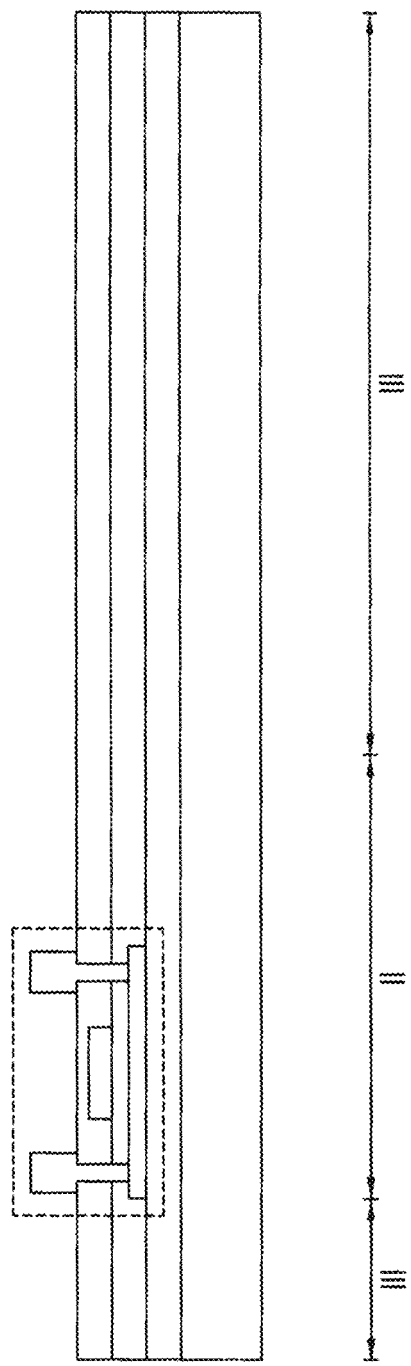

Referring to FIG. 128, the source electrode 5210 and the drain electrode 5230 are disposed on the first substrate 5110 on which the second insulation layer 5190 is disposed.

The source electrode 5210 and the drain electrode 5230 may be disposed on the second insulation layer 5190. The source electrode 5210 may be in contact with a first side of the active layer 5130 by removing a portion of the first and second insulation layers 5150 and 5190. The drain electrode 5230 may be in contact with a second side of the active layer 5130 by removing a second portion of the first and second insulation layers 5150 and 5190. In an exemplary embodiment, each of the source electrode 5210 and the drain electrode 5230 may include a metal, an alloy, metal nitride, conductive metal oxide, transparent conductive materials, etc., for example.

In the illustrated exemplary embodiment, the gate electrode 5170 is disposed on the active pattern 5130. However, the invention is not limited thereto, and the gate electrode 5170 may be disposed under the active pattern 5130.

Figure 129:
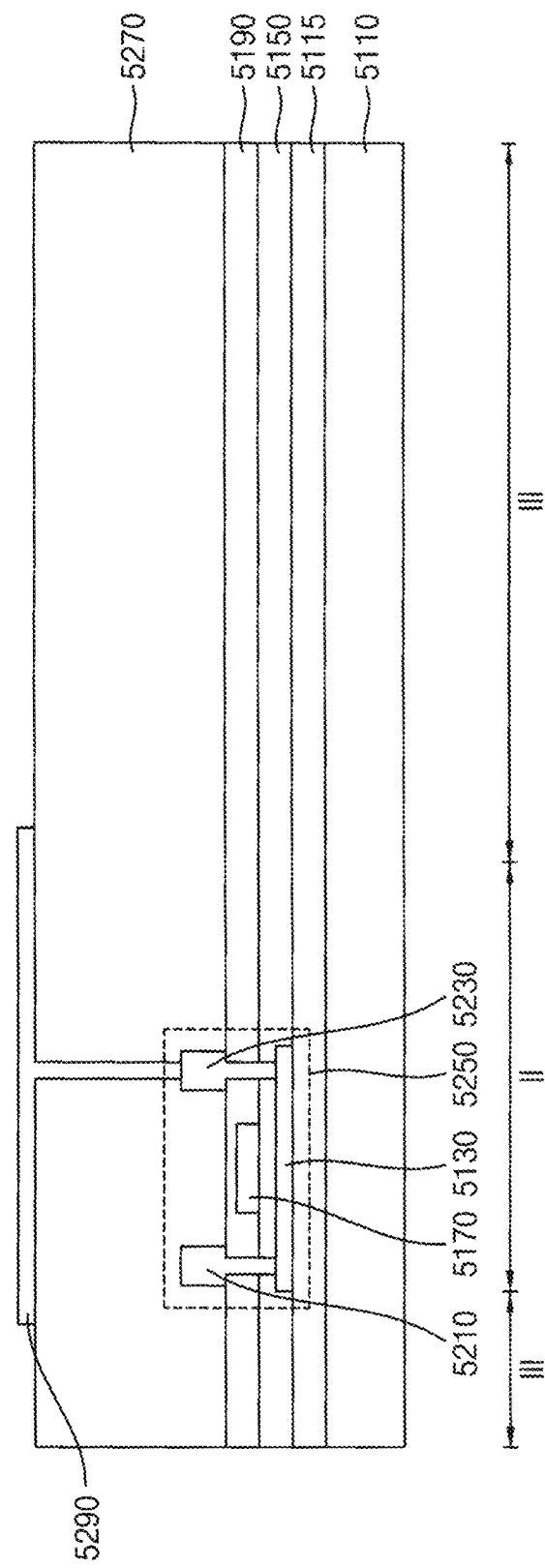

Referring to FIG. 129, the third insulation layer 5270 and the first electrode 5290 are disposed on the first substrate 5110 on which the source electrode 5210 and the drain electrode 5230 are disposed.

The third insulation layer 5270 may be disposed on the source electrode 5210 and the drain electrode 5230. The third insulation layer 5270 may cover the source electrode 5210 and the drain electrode 5230 in the sub-pixel region II, and may extend in the first direction on the first substrate 5110. That is, the third insulation layer 5270 may be disposed on the entire surface of the first substrate 5110. In an exemplary embodiment, the third insulation layer 5270 may include a silicon compound, a metal oxide, etc., for example.

The first electrode 5290 may be disposed on the third insulation layer 5270. The first electrode 5290 may be in contact with the source electrode 5210 by removing a portion of the third insulation layer 5270. In addition, the first electrode 5290 may be electrically connected to the semiconductor element 5250. In an exemplary embodiment, the first electrode 5290 may include a metal, an alloy, metal nitride, conductive metal oxide, transparent conductive materials, etc., for example.

Figure 130:
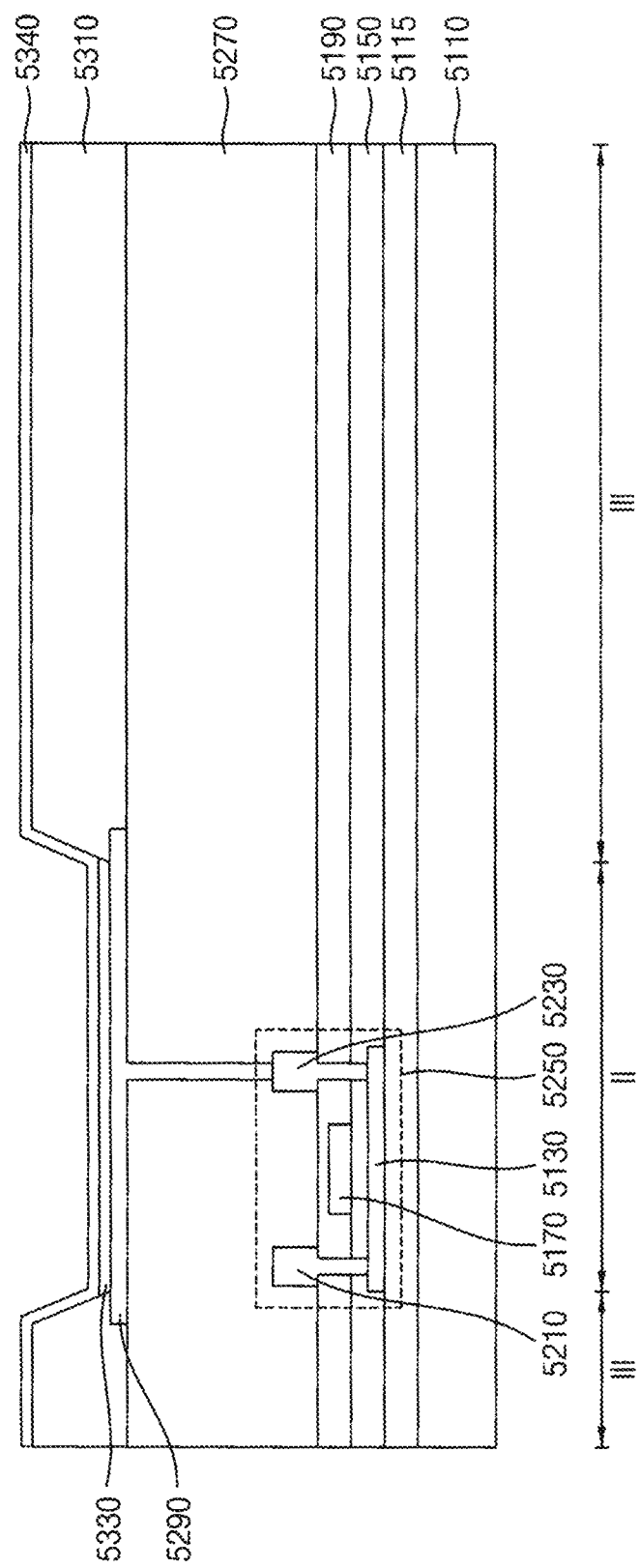

Referring to FIG. 130, the pixel defining layer 5310, the light emitting layer 5330 and the second electrode 5340 are disposed on the first substrate 5110 on which the first electrode 5290 is disposed.

The pixel defining layer 5310 may be disposed on the third insulation layer 5270 to expose a portion of the first electrode 5290. The pixel defining layer 5310 may include organic materials or inorganic materials. In this case, the light emitting layer 5330 may be disposed on a portion that the first electrode 5290 is exposed by the pixel defining layer 5310.

The light emitting layer 5330 may be disposed on the exposed first electrode 5290. The light emitting layer 5330 may be provided using light emitting materials capable of generating different colors of light (e.g., a red color of light, a blue color of light, and a green color of light). However, the invention is not limited thereto, and the light emitting layer 5330 may stack light emitting materials capable of generating different colors of light to emit white color of light.

The second electrode 5340 may be disposed on the pixel defining layer 5310 and the light emitting layer 5330. The second electrode 5340 may cover the pixel defining layer 5310 and the light emitting layer 5330 in the light-emitting region II and the reflection region III, and may extend in the first direction on the first substrate 5110. That is, the second electrode 5340 may be electrically connected to the first through third pixels. In an exemplary embodiment, the second electrode 5340 may include a metal, an alloy, metal nitride, conductive metal oxide, a transparent conductive material, etc., for example. These may be used alone or in a combination thereof.

Figure 131:
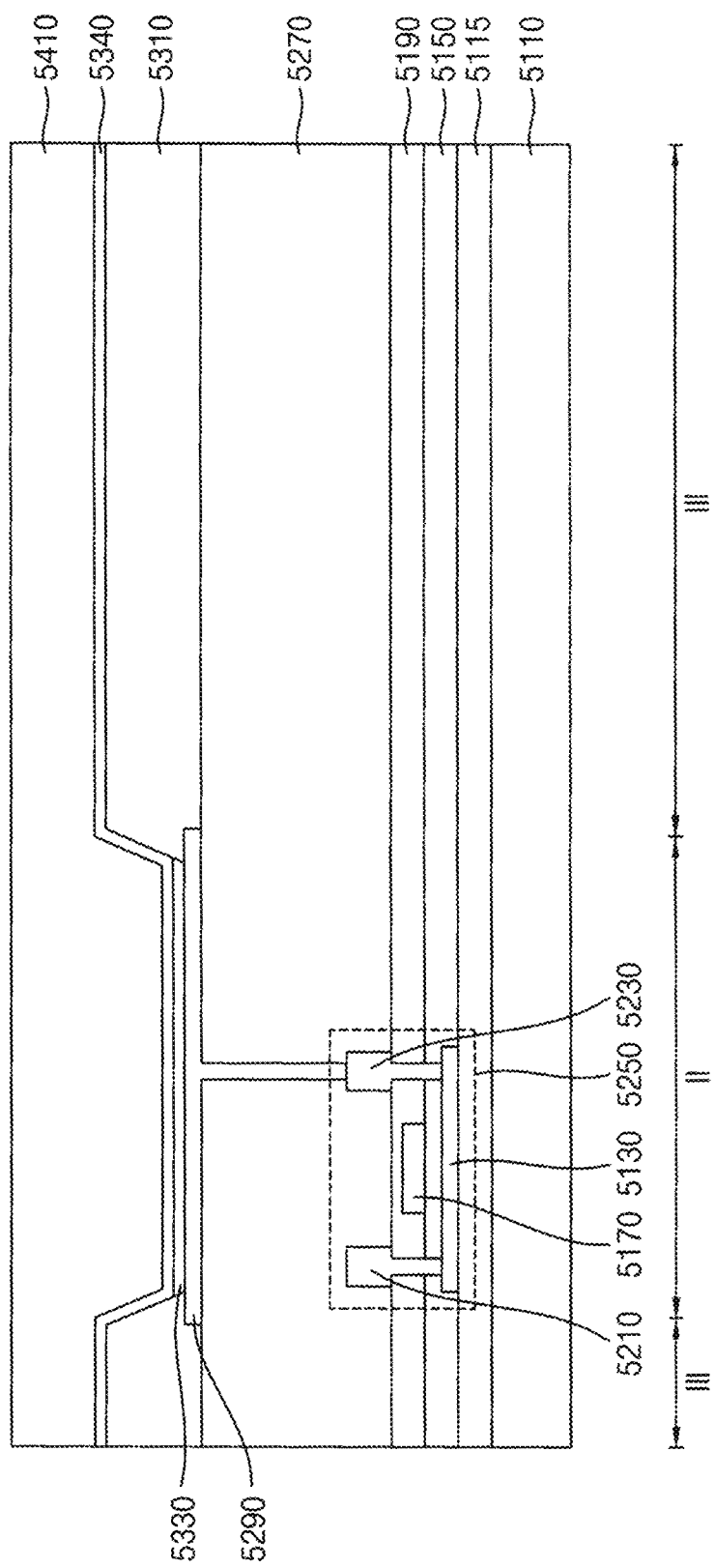

Referring to FIG. 131, the first thin film encapsulation layer 5410 is disposed on the first substrate 5110 on which the second electrode 5340 is disposed.

A thin film encapsulation layer according to the illustrated exemplary embodiment may includes a first thin film encapsulation layer 5410 and a second thin film encapsulation layer 5420. The thin film encapsulation layer may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. The organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

The first thin film encapsulation layer 5410 may include a first inorganic layer. However, the invention is not limited thereto, and the first thin film encapsulation layer 5410 may include a first inorganic layer and an organic layer.

Figure 132:
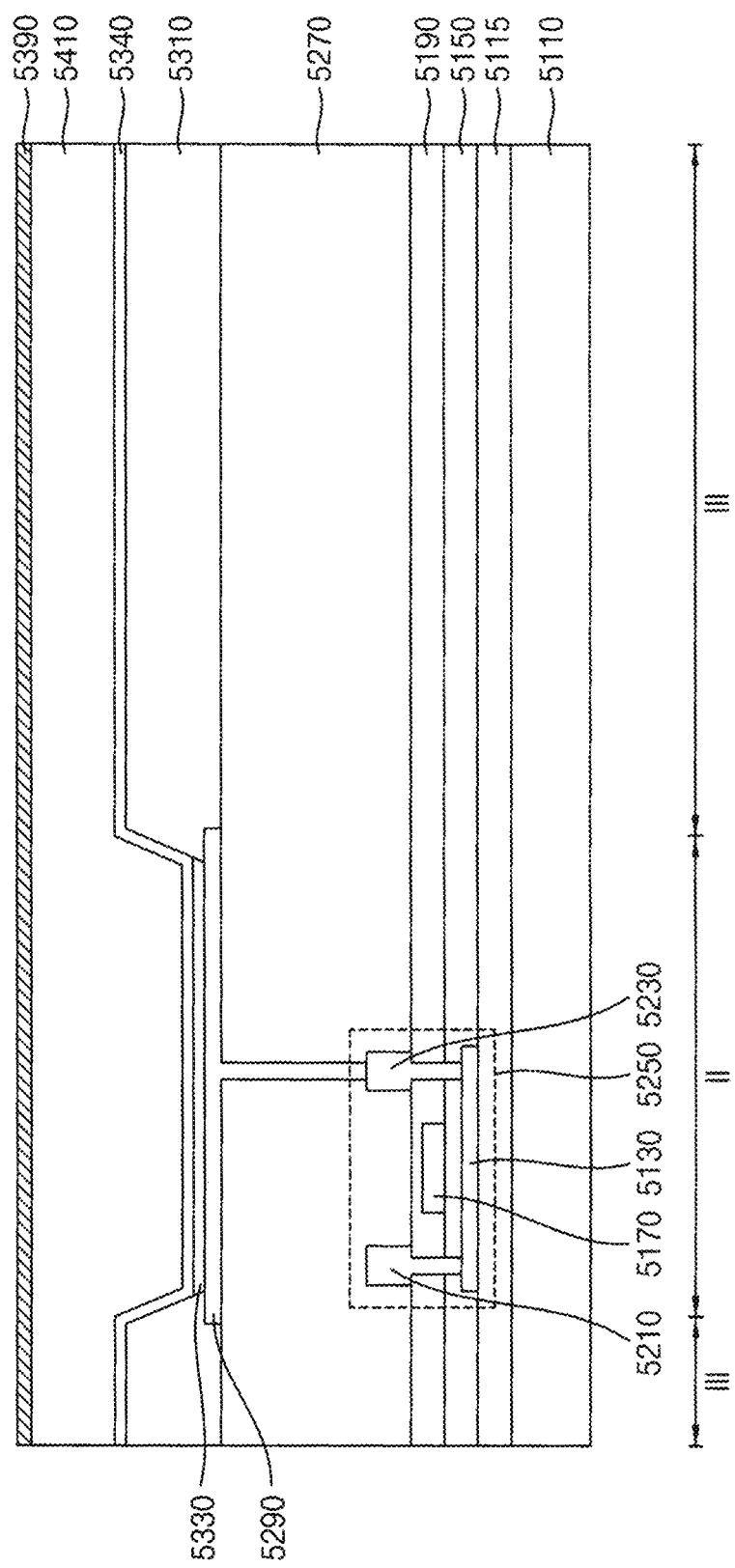

Referring to FIG. 132, the second sensing electrode 5390 is disposed on the first substrate 5110 on which the first thin film encapsulation layer 5410 is disposed.

The second sensing electrode 5390 may be disposed in the light-emitting region II and the reflection region III.

The second sensing electrode 5390 may include a material having a predetermined reflectivity. In an exemplary embodiment, the second sensing electrode 5390 may include gold (Au), silver (Ag), aluminum (Al), magnesium (Mg), platinum (Pt), Nickel (Ni), titanium (Ti), etc., for example. In an alternative exemplary embodiment, the second sensing electrode 5390 may include an alloy, metal nitride, conductive metal oxide, etc. In an exemplary embodiment, the second sensing electrode 5390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 133:
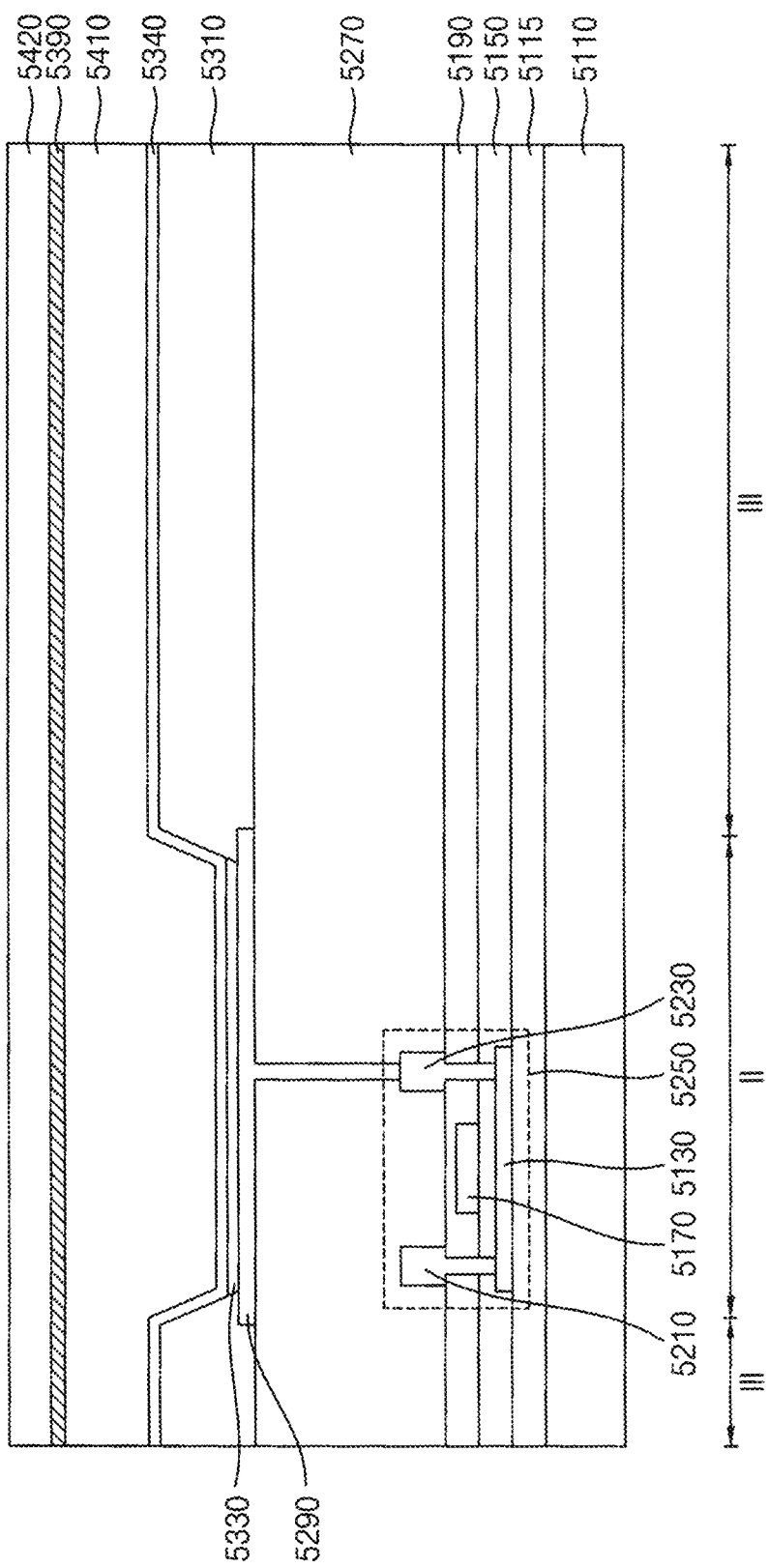

Referring to FIG. 133, the second thin film encapsulation layer 5420 is disposed on the first substrate 5110 on which the second sensing electrode 5390 is disposed.

The second thin film encapsulation layer 5420 may include a second inorganic layer. However, the invention is not limited thereto, and the second thin film encapsulation layer 5420 may include an organic layer and a second inorganic layer.

In the illustrated exemplary embodiment, the thin film encapsulation layer may include a first thin film encapsulation layer 5410 and a second thin film encapsulation layer 5420. The second sensing electrode 5390 is disposed between the first thin film encapsulation layer 5410 and the second thin film encapsulation layer 5420. That is, the second sensing electrode 5390 is disposed between thin film encapsulation layers.

Referring to FIG. 125, the first sensing electrode 5370 is disposed on the first substrate 5110 on which the second thin film encapsulation layer 5420 is disposed. The fifth insulation layer 4595 is disposed on the first sensing electrode 4370.

The first sensing electrode 5370 may be disposed in the reflection region III and outside of the light-emitting region II.

The first sensing electrode 5370 may include a material having a predetermined reflectivity. In an exemplary embodiment, the first sensing electrode 5370 may include gold (Au), silver (Ag), aluminum (Al), magnesium (Mg), platinum (Pt), Nickel (Ni), titanium (Ti), etc., for example. In an alternative exemplary embodiment, the first sensing electrode 5370 may include an alloy, metal nitride, conductive metal oxide, etc. In an exemplary embodiment, the first sensing electrode 5370 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 134:
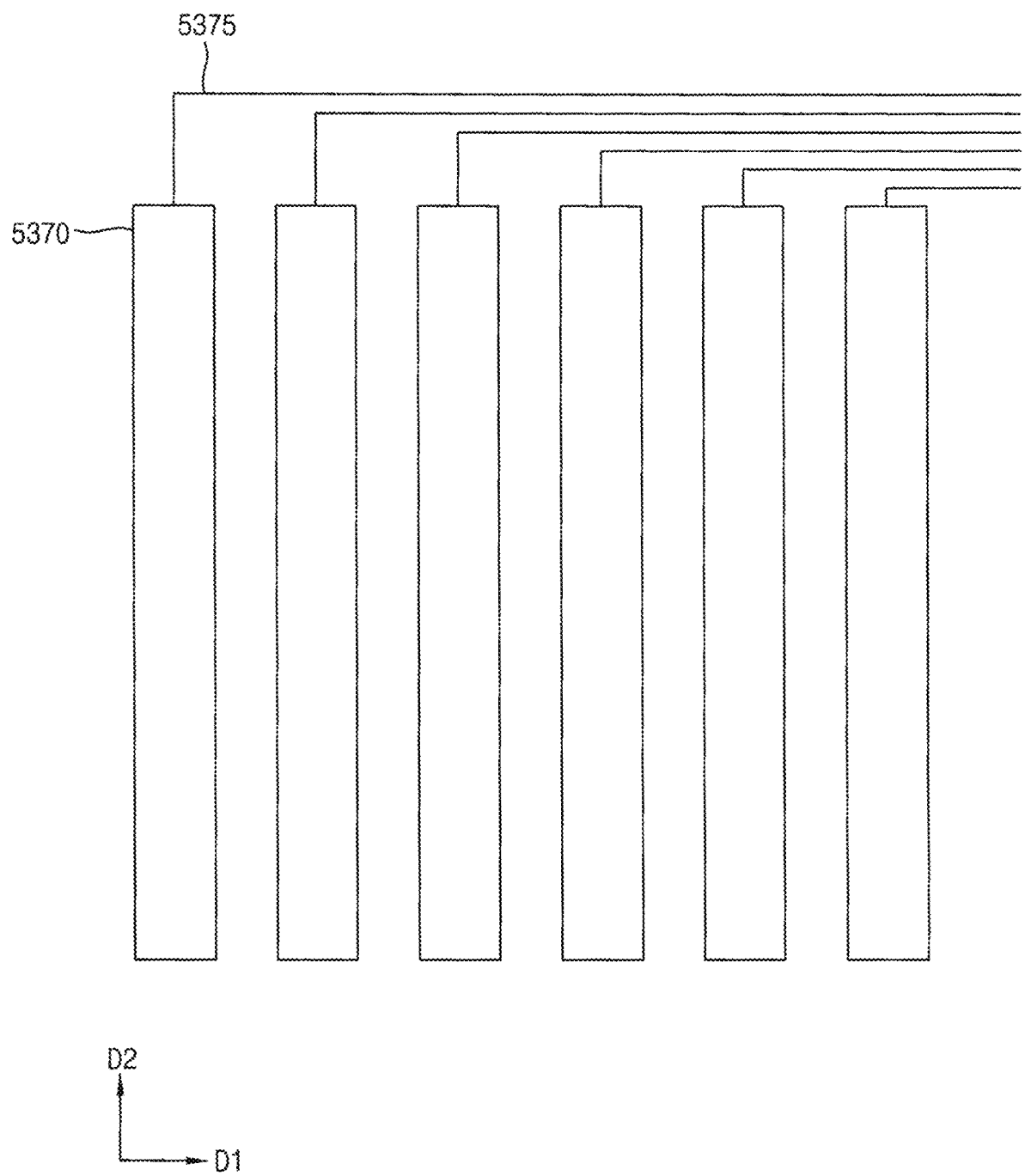
FIG. 134 is a plan view illustrating a first sensing electrode of FIG. 125.
Figure 135:
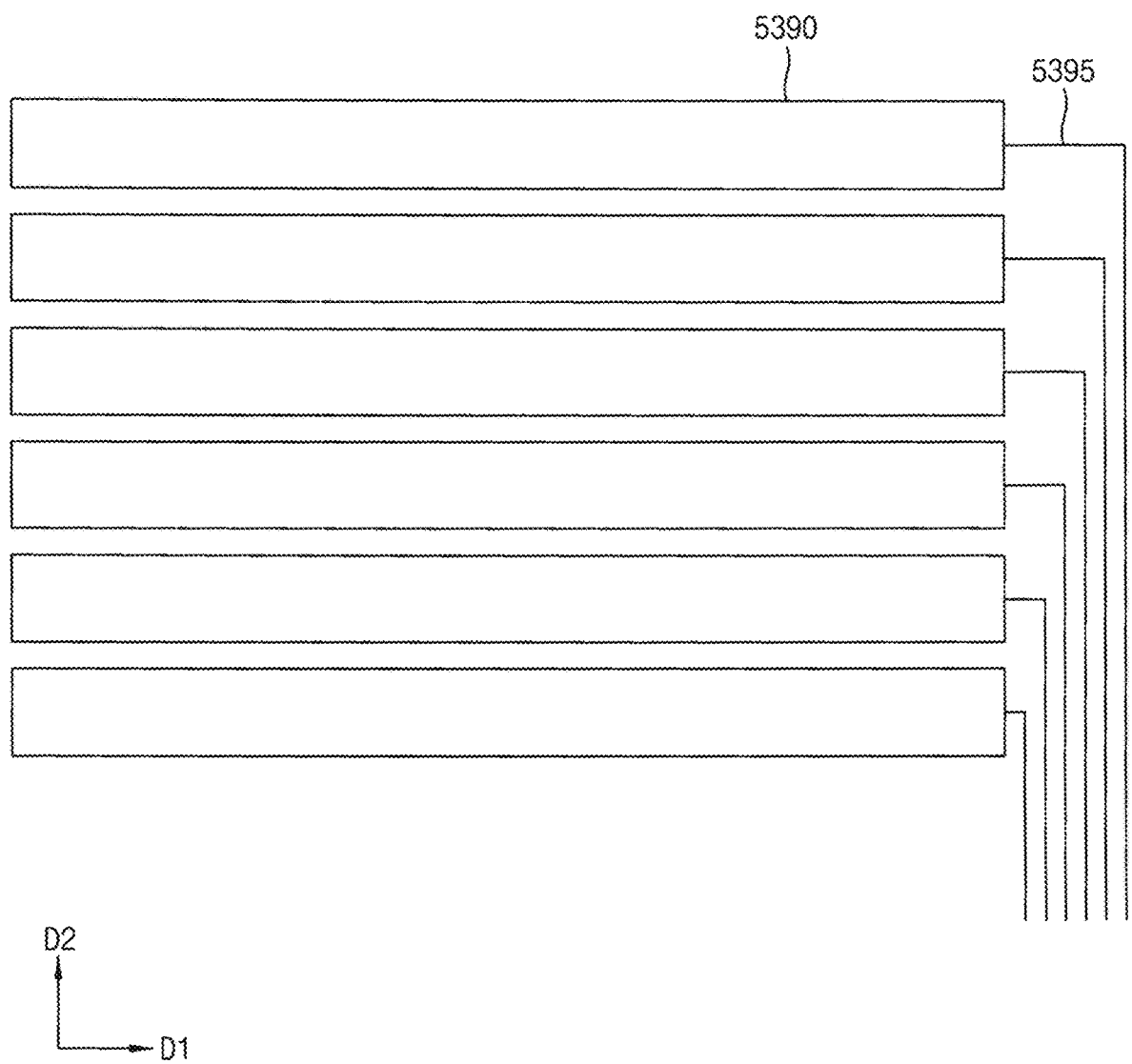
FIG. 135 is a plan view illustrating a second sensing electrode of FIG. 125.
Figure 136:
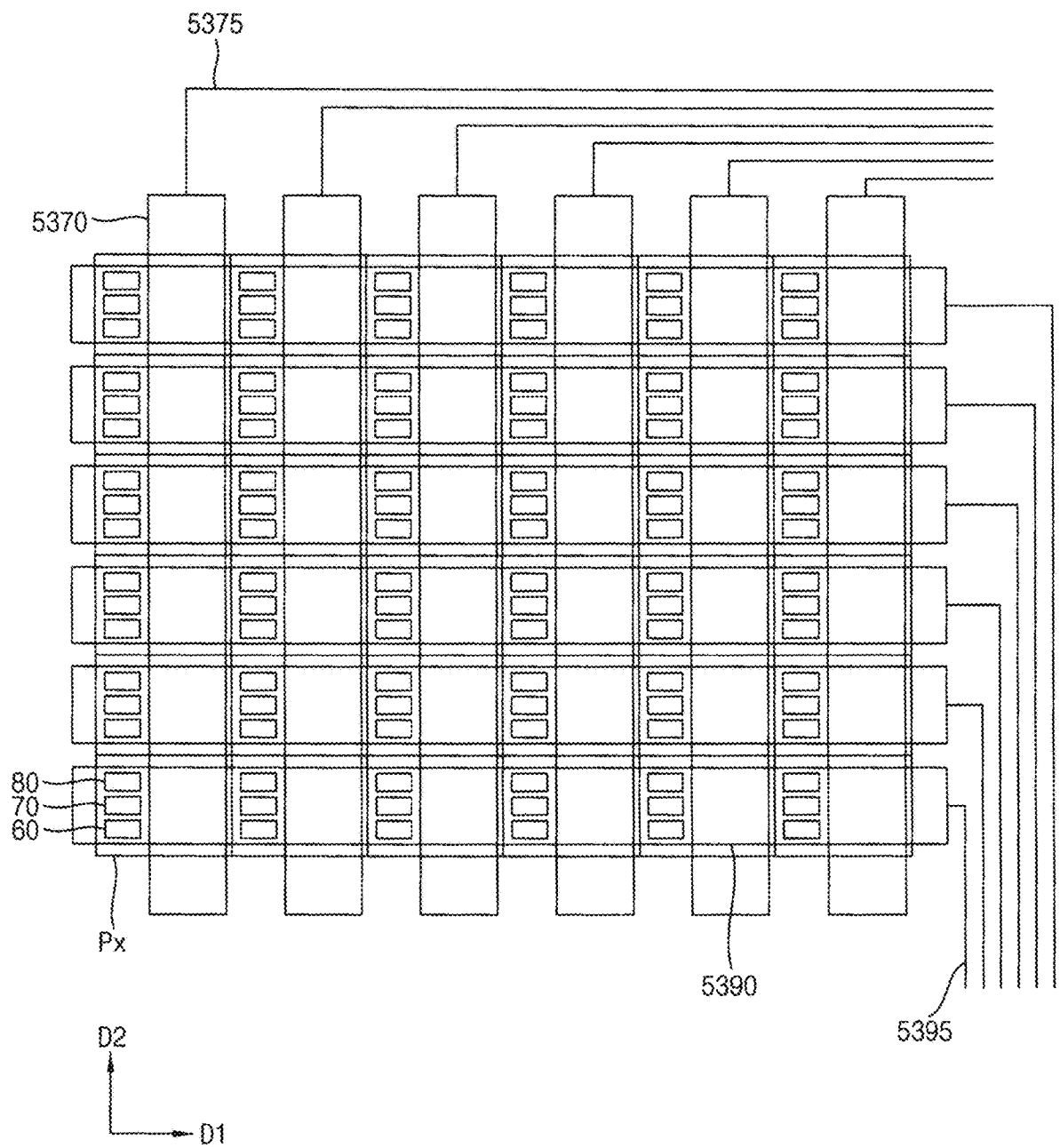
FIG. 136 is a plan view illustrating the first sensing electrode of FIG. 134 and the second sensing electrode of FIG. 135.

FIG. 134 is a plan view illustrating a first sensing electrode of FIG. 125. FIG. 135 is a plan view illustrating a second sensing electrode of FIG. 125. FIG. 136 is a plan view illustrating the first sensing electrode of FIG. 134 and the second sensing electrode of FIG. 135.

Referring to FIGS. 125 and 134 to 136, a first sensing electrode 5370 and a second sensing electrode 5390 are illustrated.

The first sensing electrode 5370 may be provided as a plurality of patterns extending in a second direction D2. The first sensing electrode 5370 is disposed in the reflection region III. The first sensing electrode 5370 may be connected to a sensing driving part through a first connecting line 5375. The first connecting line 5375 may include the same material as that of the first sensing electrode 5370. The first connecting line 5375 may be disposed on the same layer as that on which the first sensing electrode 5370 is disposed.

The second sensing electrode 5390 may be provided as a plurality of patterns extending in a first direction D1 crossing the second direction D2. The second sensing electrode 5390 is disposed in the light-emitting region II and the reflection region III. The second sensing electrode 5390 may be connected to a sensing driving part through a second connecting line 5395. The second connecting line 5395 may include the same material as that of the second sensing electrode 5390. The second connecting line 5395 may be disposed on the same layer as that on which the second sensing electrode 5390 is disposed.

The first sensing electrode 5370 may include a material having a predetermined reflectivity. The second sensing electrode 5390 may include a material having a predetermined reflectivity. The first sensing electrode 5370 may partially overlap the second sensing electrode 5390.

The second sensing electrode 5390 is disposed on the first thin film encapsulation layer 5410. The second thin film encapsulation layer 5420 is disposed on the second sensing electrode 5390. The first sensing electrode 5370 is disposed on the second thin film encapsulation layer 5420.

The first sensing electrode 5370 and second sensing electrode 5390 may perform as a sensing electrode of a touch screen panel of mutual capacitance type. In an exemplary embodiment, when an electric conductor is contacted, capacitance of an intersecting point of the first sensing electrode 5370 and second sensing electrode 5390 around a touch position is changed, for example. Thus, a touch panel sensor (not shown) may decide a touch position based on a capacitance sensing signal corresponding to the change of capacitance.

The first sensing electrode 5370 may have a different thickness from a thickness of the second sensing electrode 5390. In an exemplary embodiment, a thickness of the first sensing electrode 5370 may be about 1000 Å, for example. When the thickness of the first sensing electrode 5370 is about 1000 Å, transmissivity of the first sensing electrode 5370 may be about 0%, and reflexibility of the first sensing electrode 5370 may be greater than about 95%. In addition, a thickness of the second sensing electrode 5390 may be about 100 Å. When the thickness of the second sensing electrode 5390 is about 100 Å, transmissivity of the second sensing electrode 5390 may be greater than about 50% and less than about 95%. When an organic light emitting display device emits light, the light is emitted through the second electrode 390 in the light-emitting region II, and when an organic light emitting display device does not emit light, the second sensing electrode 5390 may perform a mirror function.

Figure 137:
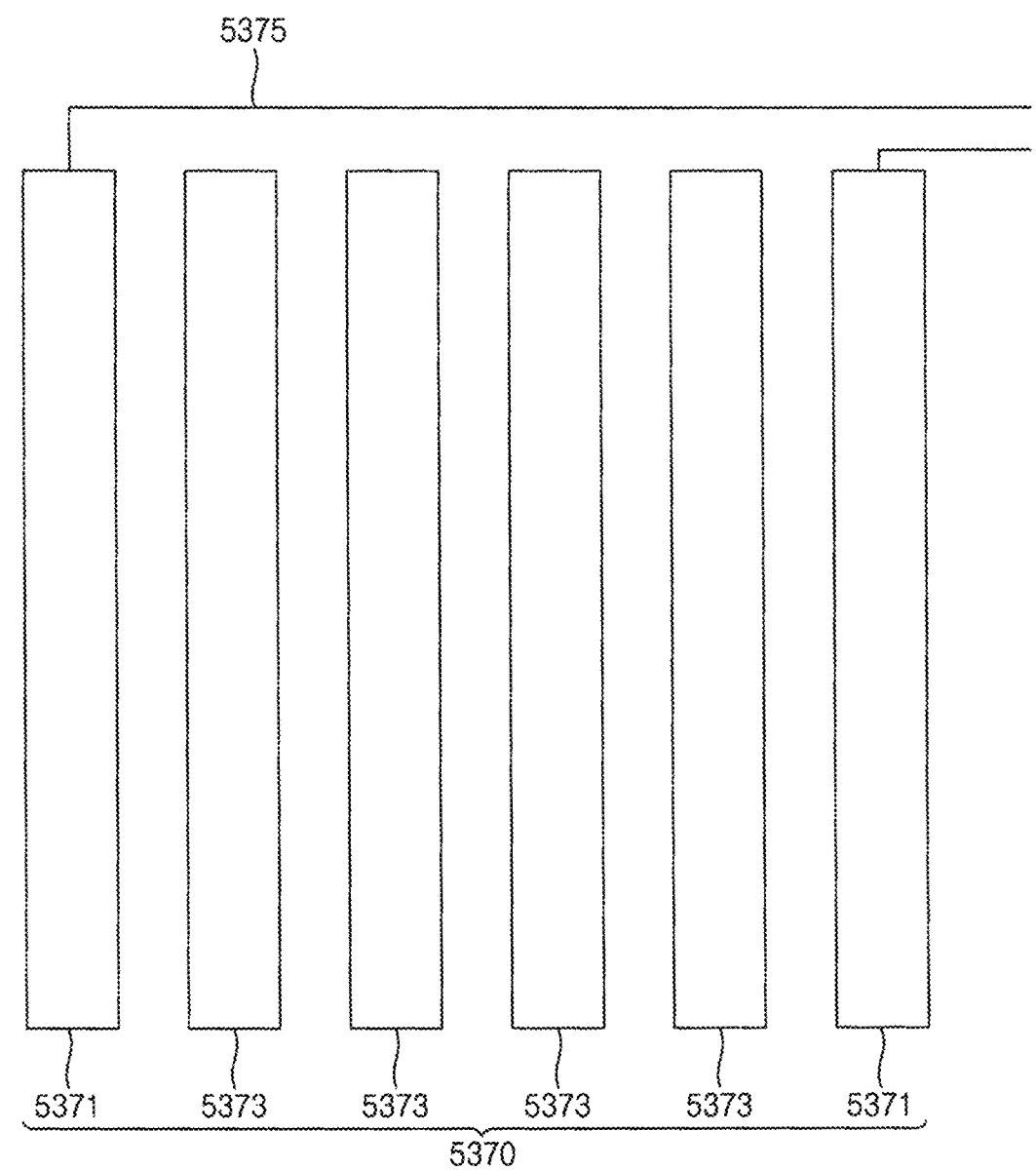
FIG. 137 is a plan view illustrating a first sensing electrode of FIG. 125.
Figure 138:
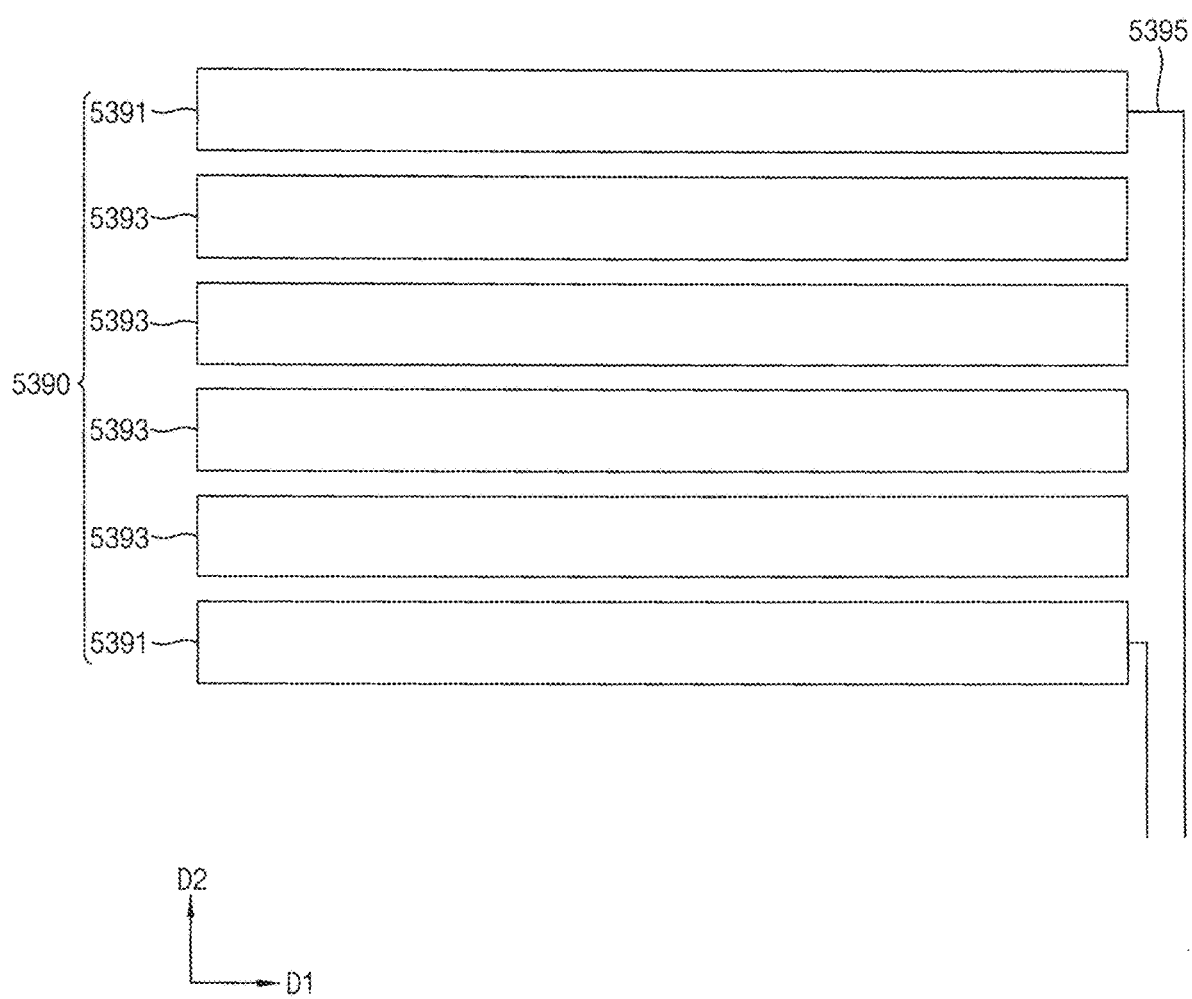
FIG. 138 is a plan view illustrating a second sensing electrode of FIG. 125.
Figure 139:
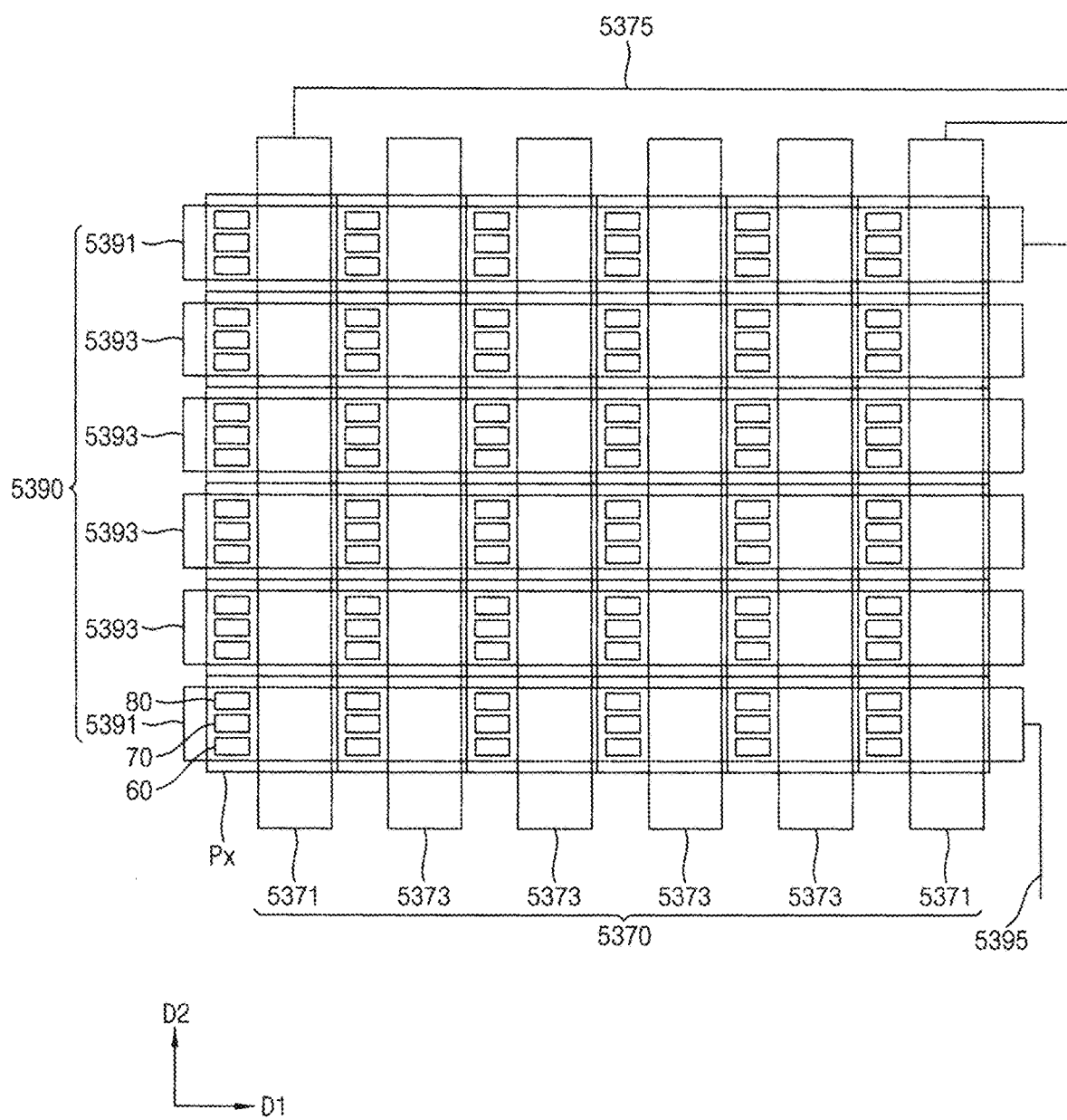
FIG. 139 is a plan view illustrating the first sensing electrode of FIG. 137 and the second sensing electrode of FIG. 138.

FIG. 137 is a plan view illustrating a first sensing electrode of FIG. 125. FIG. 138 is a plan view illustrating a second sensing electrode of FIG. 125. FIG. 139 is a plan view illustrating the first sensing electrode of FIG. 137 and the second sensing electrode of FIG. 138.

Referring to FIGS. 125 and 137 to 139, a first sensing electrode 5370 and a second sensing electrode 5390 are illustrated.

The first sensing electrode 5370 may include a plurality of first sensing patterns 5371 extending in a second direction D2 and a plurality of first dummy patterns 5373 disposed between the first sensing patterns 5371. The first sensing electrode 5370 is disposed in the reflection region III. An interval of the first sensing patterns 5371 may be adjusted according to the number of the first dummy patterns 5373. The first sensing electrode 5370 may be connected to a sensing driving part through a first connecting line 5375. The first connecting line 5375 may include the same material as that of the first sensing electrode 5370. The first connecting line 5375 may be disposed on the same layer as that on which the first sensing electrode 5370 is disposed.

The second sensing electrode 5390 may be provided as a plurality of second sensing patterns 5391 extending in a first direction D1 crossing the second direction D2 and a plurality of second dummy patterns 5393 disposed between the second sensing patterns 5391. The second sensing electrode 5390 is disposed in the light-emitting region II and the reflection region III. An interval of the second sensing electrode 5390 may be adjusted according to the number of the second dummy patterns 5393. The second sensing electrode 5390 may be connected to a sensing driving part through a second connecting line 5395. The second connecting line 5395 may include the same material as that of the second sensing electrode 5390. The second connecting line 5395 may be disposed on the same layer as that on which the second sensing electrode 5390 is disposed.

The first sensing electrode 5370 may include a material having a predetermined reflectivity. The second sensing electrode 5390 may include a material having a predetermined reflectivity. The first sensing electrode 5370 may partially overlap the second sensing electrode 5390.

The second sensing electrode 5390 is disposed on the first thin film encapsulation layer 5410. The second thin film encapsulation layer 5420 is disposed on the second sensing electrode 5390. The first sensing electrode 5370 is disposed on the second thin film encapsulation layer 5420.

The first sensing electrode 5370 and second sensing electrode 5390 may perform as a sensing electrode of a touch screen panel of mutual capacitance type. In an exemplary embodiment, when an electric conductor is contacted, capacitance of an intersecting point of the first sensing electrode 5370 and second sensing electrode 5390 around a touch position is changed, for example. Thus, a touch panel sensor (not shown) may decide a touch position based on a capacitance sensing signal corresponding to the change of capacitance.

The first sensing electrode 5370 may have a different thickness from a thickness of the second sensing electrode 5390. In an exemplary embodiment, a thickness of the first sensing electrode 5370 may be about 1000 Å, for example. When the thickness of the first sensing electrode 5370 is about 1000 Å, transmissivity of the first sensing electrode 5370 may be about 0%, and reflexibility of the first sensing electrode 5370 may be greater than about 95%. In addition, a thickness of the second sensing electrode 5390 may be about 100 Å. When the thickness of the second sensing electrode 5390 is 100 Å, transmissivity of the second sensing electrode 5390 may be greater than about 50% and less than about 95%. When an organic light emitting display device emits light, the light is emitted through the second electrode 390 in the light-emitting region II, and when an organic light emitting display device does not emit light, the second sensing electrode 5390 may perform a mirror function.

Figure 140:
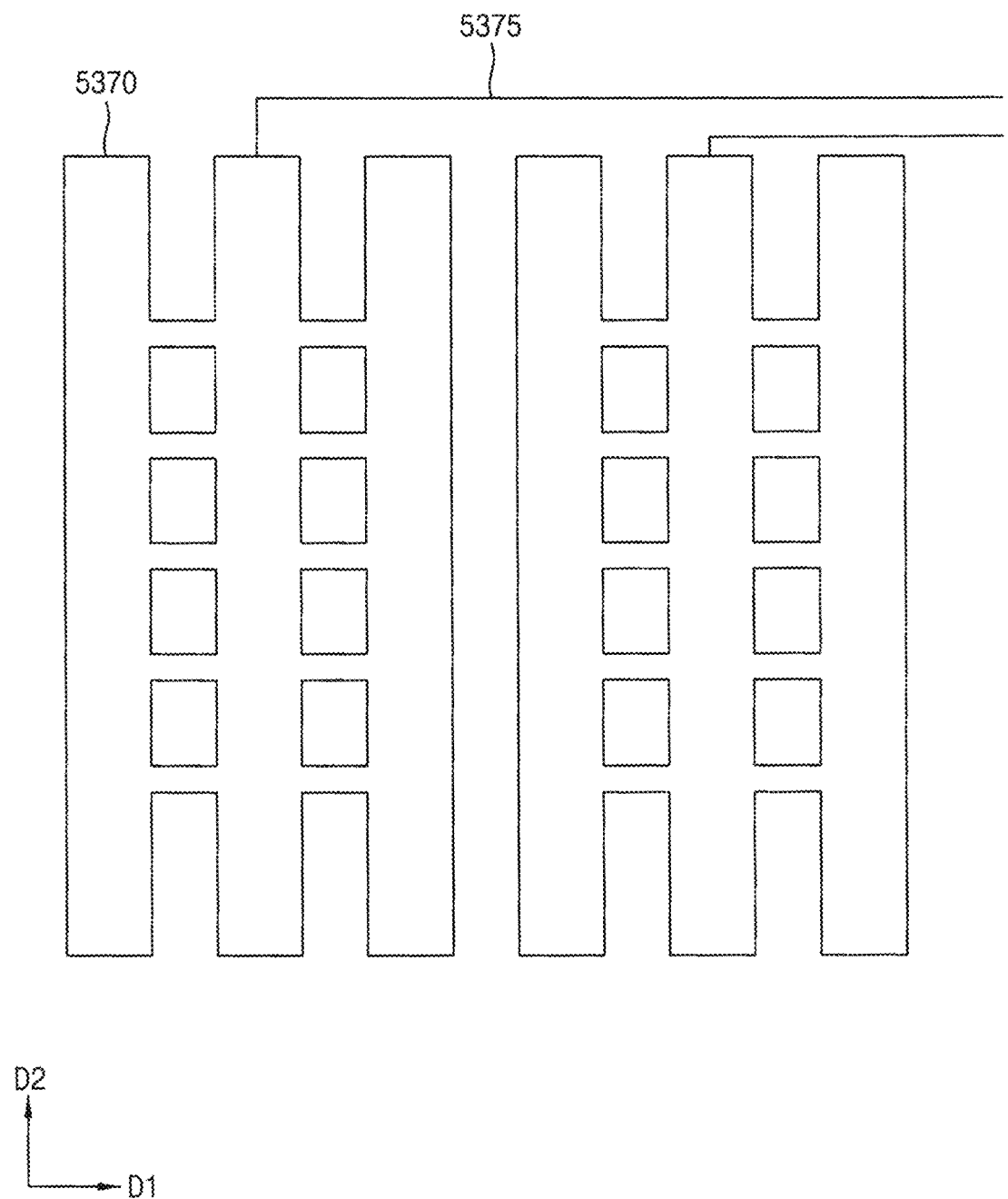
FIG. 140 is a plan view illustrating a first sensing electrode of FIG. 125.
Figure 141:
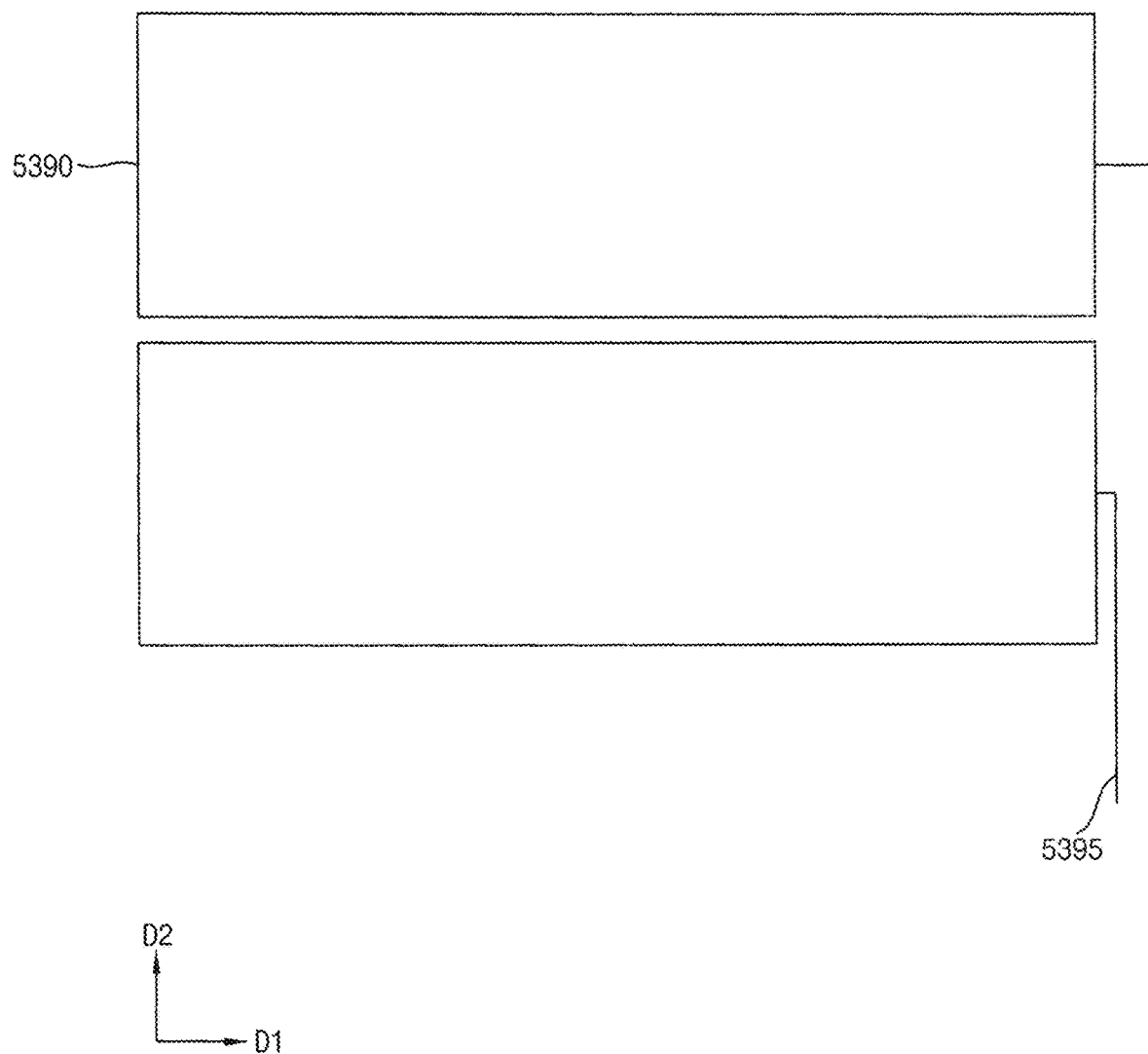
FIG. 141 is a plan view illustrating a second sensing electrode of FIG. 125.
Figure 142:
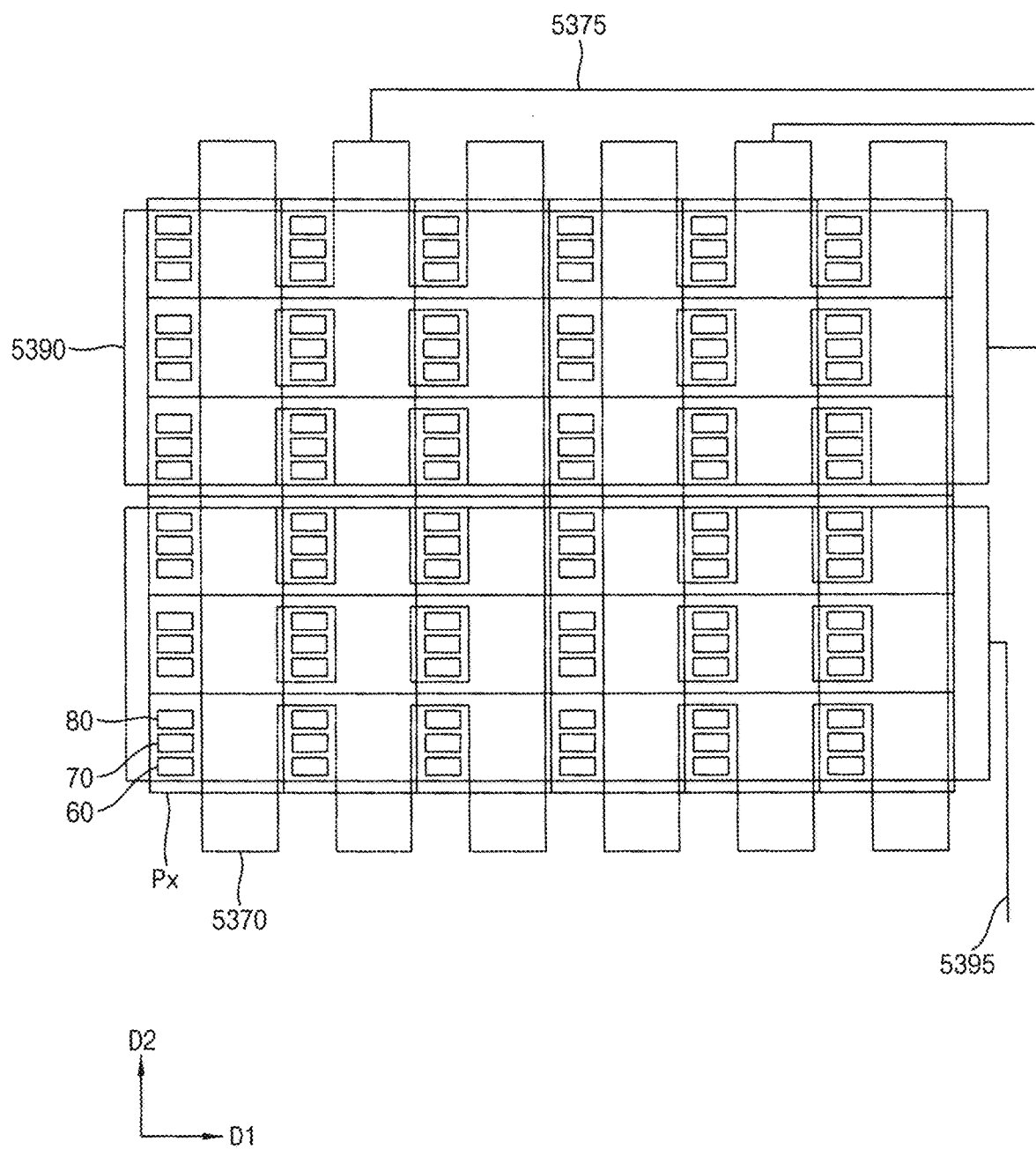
FIG. 142 is a plan view illustrating the first sensing electrode of FIG. 140 and the second sensing electrode of FIG. 141.

FIG. 140 is a plan view illustrating a first sensing electrode of FIG. 125. FIG. 141 is a plan view illustrating a second sensing electrode of FIG. 125. FIG. 142 is a plan view illustrating the first sensing electrode of FIG. 140 and the second sensing electrode of FIG. 141.

Referring to FIGS. 125 and 140 to 142, a first sensing electrode 5370 and a second sensing electrode 5390 are illustrated.

The first sensing electrode 5370 may be provided as a plurality of patterns extending in a second direction D2. The first sensing electrode 5370 may be provided as a mesh shape. The first sensing electrode 5370 is disposed in the reflection region III. The first sensing electrode 5370 may be connected to a sensing driving part through a first connecting line 5375. The first connecting line 5375 may include the same material as that of the first sensing electrode 5370. The first connecting line 5375 may be disposed on the same layer as that on which the first sensing electrode 5370 is disposed.

The second sensing electrode 5390 may be provided as a plurality of patterns extending in a first direction D1 crossing the second direction D2. A width of the second sensing electrode 5390 in the second direction D2 is the same as a width of the first sensing electrode 5370 in the first direction D1. The second sensing electrode 5390 is disposed in the light-emitting region II and the reflection region III. The second sensing electrode 5390 may be connected to a sensing driving part through a second connecting line 5395. The second connecting line 5395 may include the same material as that of the second sensing electrode 5390. The second connecting line 5395 may be disposed on the same layer as that on which the second sensing electrode 5390 is disposed.

The first sensing electrode 5370 may include a material having a predetermined reflectivity. The second sensing electrode 5390 may include a material having a predetermined reflectivity. The first sensing electrode 5370 may partially overlap the second sensing electrode 5390.

The second sensing electrode 5390 is disposed on the first thin film encapsulation layer 5410. The second thin film encapsulation layer 5420 is disposed on the second sensing electrode 5390. The first sensing electrode 5370 is disposed on the second thin film encapsulation layer 5420.

The first sensing electrode 5370 and second sensing electrode 5390 may perform as a sensing electrode of a touch screen panel of mutual capacitance type. In an exemplary embodiment, when an electric conductor is contacted, capacitance of an intersecting point of the first sensing electrode 5370 and second sensing electrode 5390 around a touch position is changed, for example. Thus, a touch panel sensor (not shown) may decide a touch position based on a capacitance sensing signal corresponding to the change of capacitance.

The first sensing electrode 5370 may have a different thickness from a thickness of the second sensing electrode 5390. In an exemplary embodiment, a thickness of the first sensing electrode 5370 may be about 1000 Å, for example. When the thickness of the first sensing electrode 5370 is about 1000 Å, transmissivity of the first sensing electrode 5370 may be about 0%, and reflexibility of the first sensing electrode 5370 may be greater than about 95%. In addition, a thickness of the second sensing electrode 5390 may be about 100 Å. When the thickness of the second sensing electrode 5390 is about 100 Å, transmissivity of the second sensing electrode 5390 may be greater than about 50% and less than about 95%. When an organic light emitting display device emits light, the second sensing electrode 5390 may display an image in the light-emitting region II, and when an organic light emitting display device does not emit light, the second sensing electrode 5390 may perform a mirror function.

Figure 143:
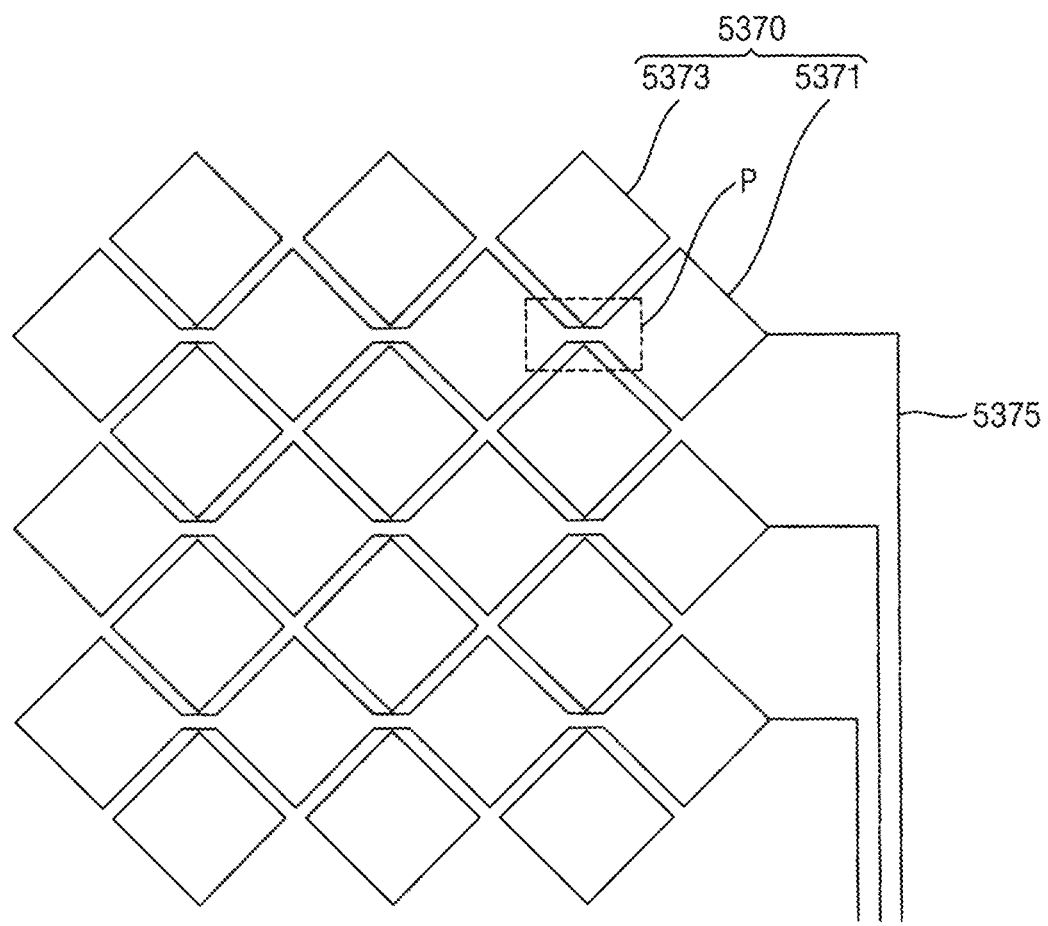
FIG. 143 is a plan view illustrating a first sensing electrode of FIG. 125.
Figure 144:
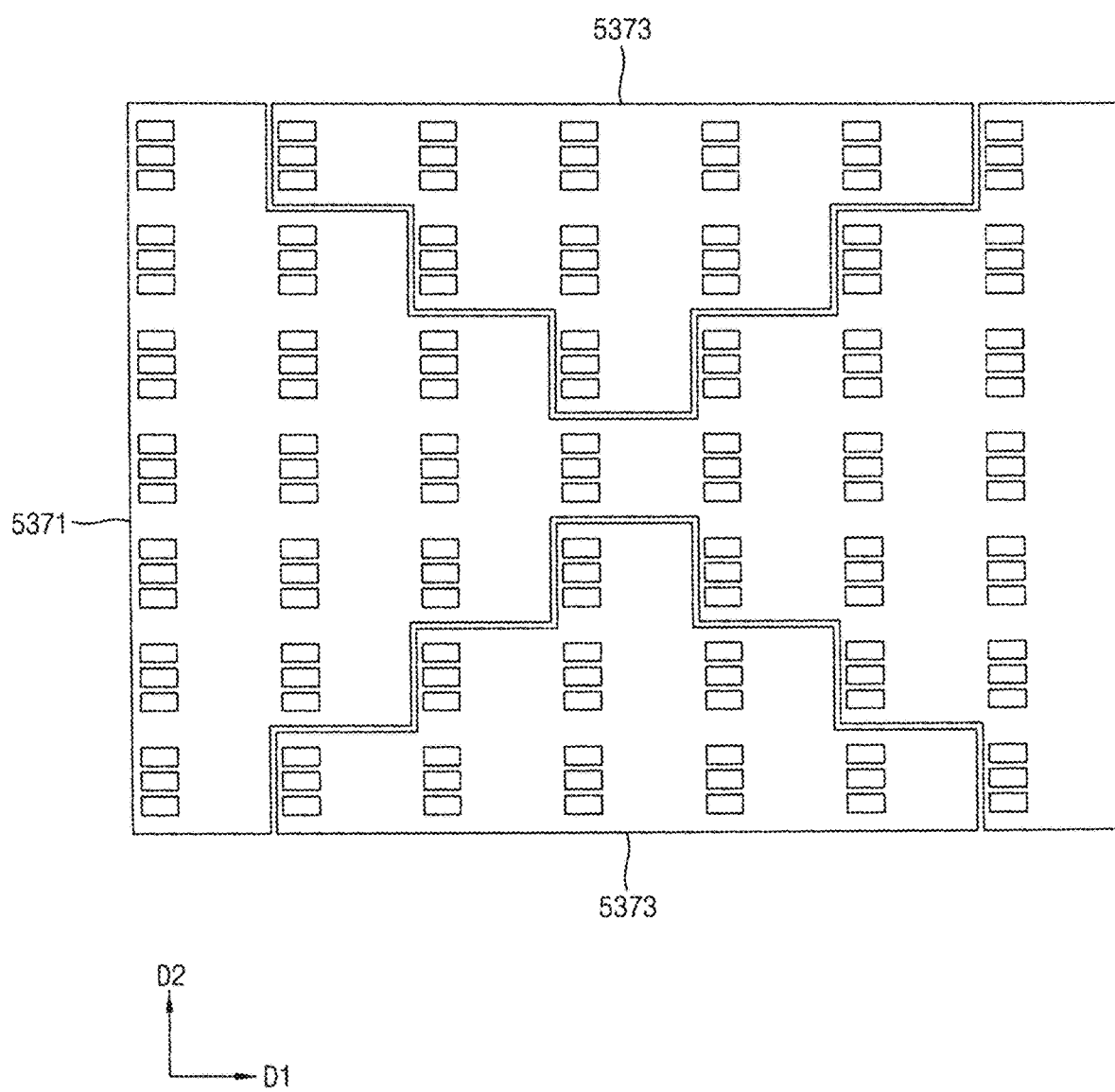
FIG. 144 is a plan view magnifying 'P' portion of FIG. 143.
Figure 145:
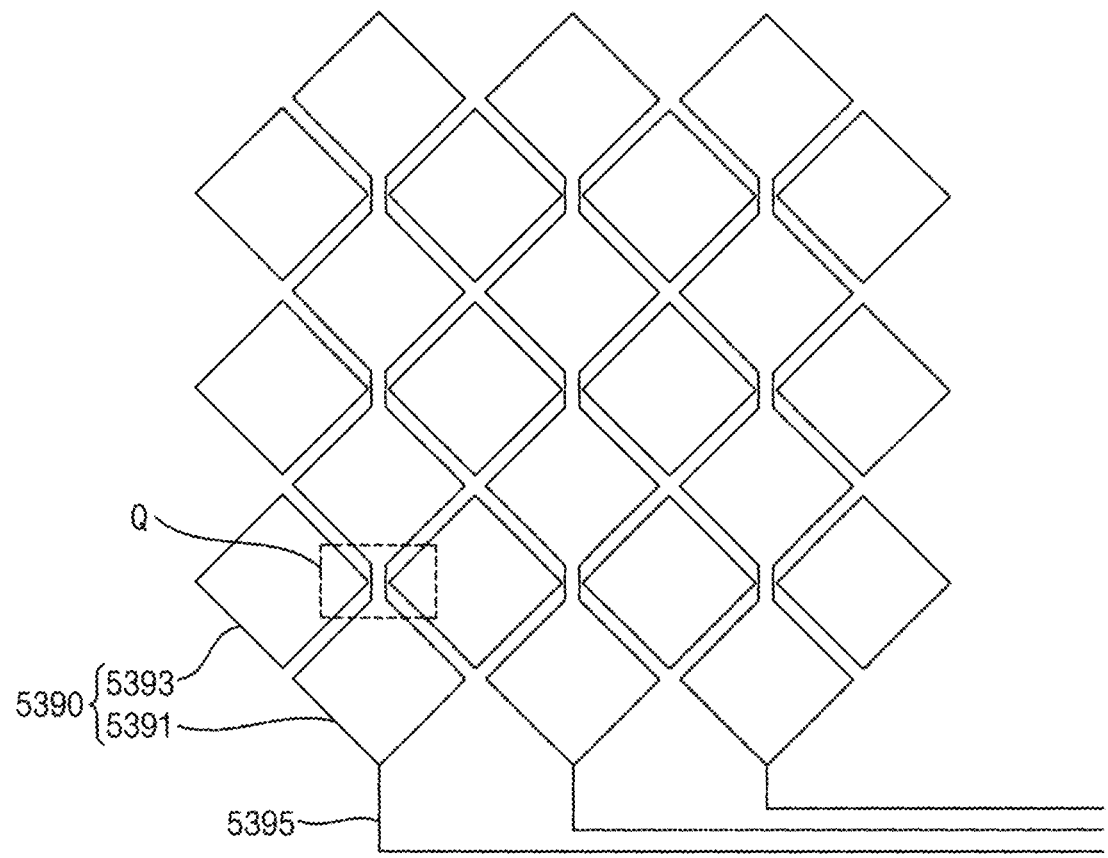
FIG. 145 is a plan view illustrating a second sensing electrode of FIG. 125.
Figure 146:
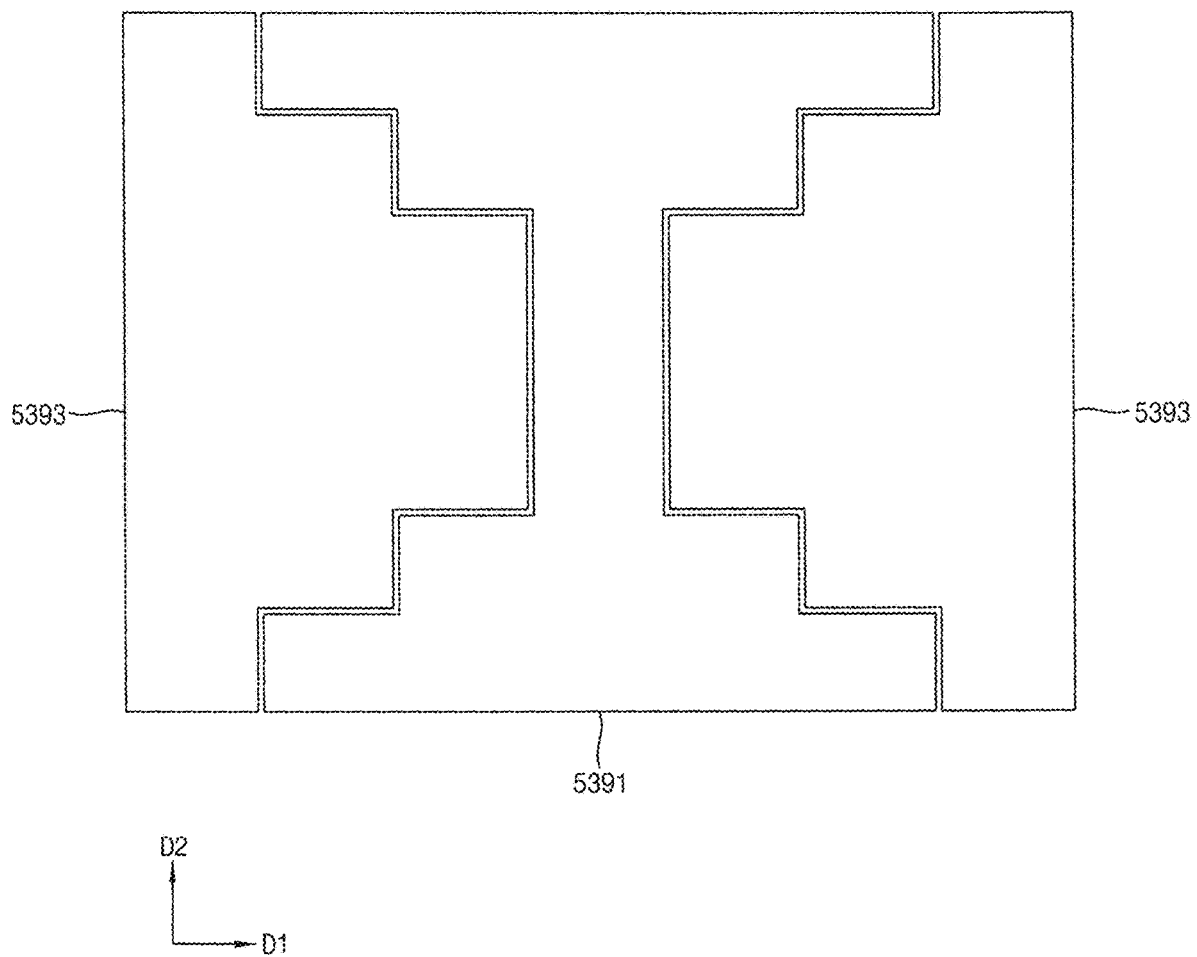
FIG. 146 is a plan view magnifying 'Q' portion of FIG. 145.
Figure 148:
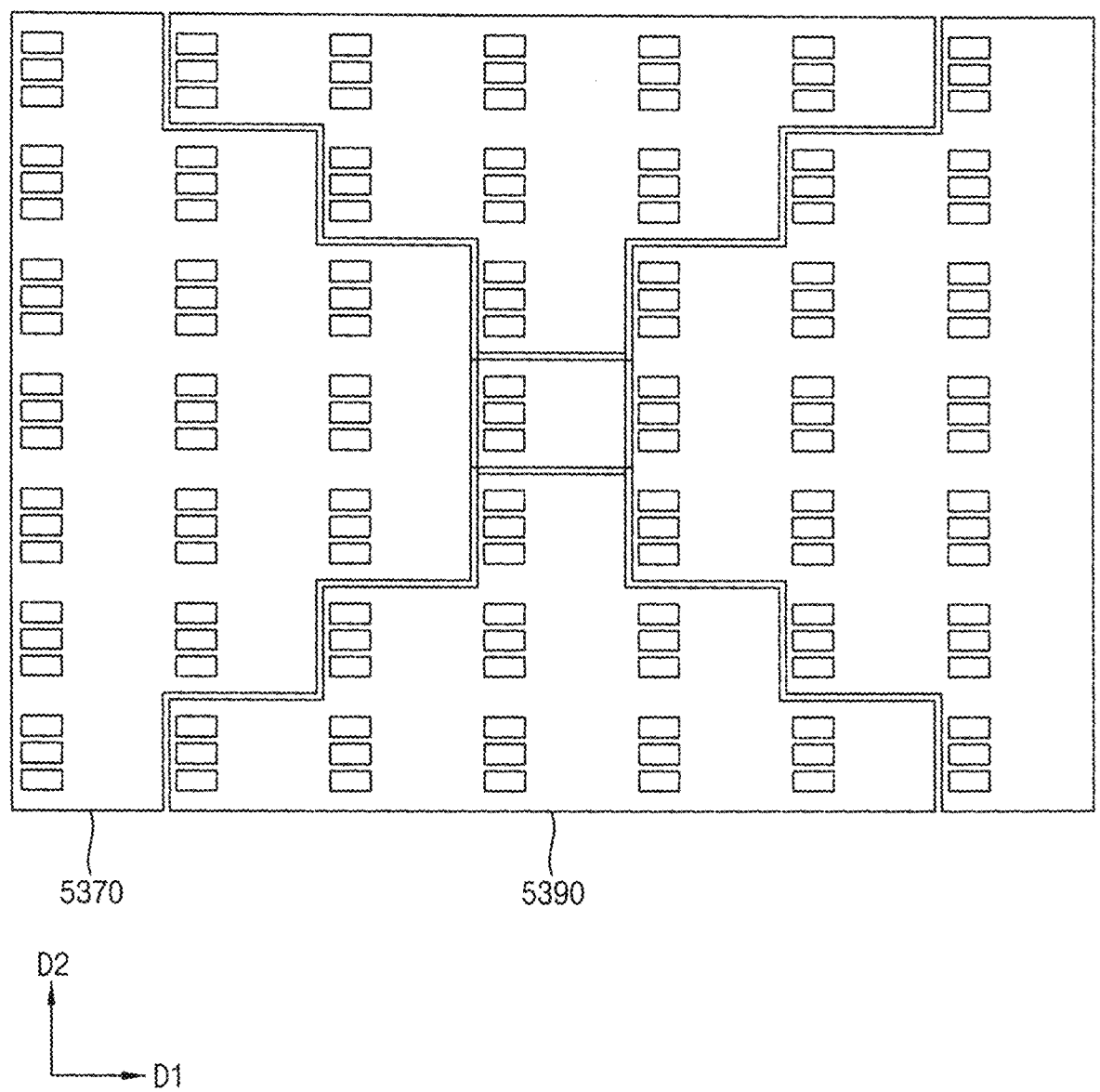
FIG. 148 is a plan view magnifying 'R' portion of FIG. 147.

FIG. 143 is a plan view illustrating a first sensing electrode of FIG. 125. FIG. 144 is a plan view magnifying 'P' portion of FIG. 143. FIG. 145 is a plan view illustrating a second sensing electrode of FIG. 125. FIG. 146 is a plan view magnifying 'Q' portion of FIG. 145. FIG. 147 is a plan view illustrating the first sensing electrode of FIG. 143 and the second sensing electrode of FIG. 145. FIG. 148 is a plan view magnifying 'R' portion of FIG. 147.

Referring to FIGS. 125 and 143 to 148, a first sensing electrode 5370 and a second sensing electrode 5390 are illustrated.

The first sensing electrode 5370 may include plurality of first sensing patterns 5371 having a rhombus shape and sequentially connected each other in a first direction D1 and a plurality of first dummy patterns 5373 having a rhombus shape and disposed between the first sensing patterns 5371. The first dummy patterns 5373 are spaced apart from each other. The first sensing electrode 5370 is disposed in the reflection region III. The first sensing electrode 5370 may be connected to a sensing driving part through a first connecting line 5375. The first connecting line 5375 may include the same material as that of the first sensing electrode 5370. The first connecting line 5375 may be disposed on the same layer as that on which the first sensing electrode 5370 is disposed.

The second sensing electrode 5390 may include plurality of second sensing patterns 5391 having a rhombus shape and sequentially connected each other in a second direction D2 and a plurality of second dummy patterns 5393 having a rhombus shape and disposed between the second sensing patterns 5391. The second dummy patterns 5393 are spaced apart from each other. The second sensing electrode 5390 is disposed in the light-emitting region II and the reflection region III. The second sensing electrode 5390 may be connected to a sensing driving part through a second connecting line 5395. The second connecting line 5395 may include the same material as that of the second sensing electrode 5390. The second connecting line 5395 may be disposed on the same layer as that on which the second sensing electrode 5390 is disposed.

The first sensing electrode 5370 may include a material having a predetermined reflectivity. The second sensing electrode 5390 may include a material having a predetermined reflectivity. The first sensing electrode 5370 may partially overlap the second sensing electrode 5390.

The second sensing electrode 5390 is disposed on the first thin film encapsulation layer 5410. The second thin film encapsulation layer 5420 is disposed on the second sensing electrode 5390. The first sensing electrode 5370 is disposed on the second thin film encapsulation layer 5420.

The first sensing electrode 5370 and second sensing electrode 5390 may perform as a sensing electrode of a touch screen panel of mutual capacitance type. In an exemplary embodiment, when an electric conductor is contacted, capacitance of an intersecting point of the first sensing electrode 5370 and second sensing electrode 5390 around a touch position is changed, for example. Thus, a touch panel sensor (not shown) may decide a touch position based on a capacitance sensing signal corresponding to the change of capacitance.

The first sensing electrode 5370 may have a different thickness from a thickness of the second sensing electrode 5390. In an exemplary embodiment, a thickness of the first sensing electrode 5370 may be about 1000 Å, for example. When the thickness of the first sensing electrode 5370 is about 1000 Å, transmissivity of the first sensing electrode 5370 may be about 0%, and reflexibility of the first sensing electrode 5370 may be greater than about 95%. In addition, a thickness of the second sensing electrode 5390 may be about 100 Å. When the thickness of the second sensing electrode 5390 is about 100 Å, transmissivity of the second sensing electrode 5390 may be greater than about 50% and less than about 95%. When an organic light emitting display device emits light, the light is emitted through the second electrode 390 in the light-emitting region II, and when an organic light emitting display device does not emit light, the second sensing electrode 5390 may perform a mirror function.

According to the illustrated exemplary embodiment, an organic light emitting display device includes a reflection member having a mirror function and a touch function. Thus, additional process for forming an electrode layer having a touch function may be omitted. This, a manufacturing cost may be decreased.

In addition, the organic light emitting display device includes a first reflection member disposed in a reflection region and a second disposed in the light-emitting region and the reflection region. Thus, scattered reflection occurred at an edge of the first reflection member may be decreased.

In addition, the organic light emitting display device includes a thin film encapsulation layer. Thus, a flexible organic light emitting display device having a mirror function and a touch function may be manufactured.

The foregoing is illustrative of the invention and is not to be construed as limiting thereof. Although a few exemplary embodiments of the invention have been described, those skilled in the art will readily appreciate that many modifications are possible in the illustrated exemplary embodiments without materially departing from the novel teachings and advantages of the invention. Accordingly, all such modifications are intended to be included within the scope of the invention as defined in the claims. The invention is defined by the following claims, with equivalents of the claims to be included therein.

What is claimed is:

1. An organic light emitting display device comprising:
    a substrate comprising a light-emitting region and a reflection region;
    a lower electrode disposed in the light-emitting region on the substrate;
    an emission layer disposed on the lower electrode;
    an upper electrode disposed in the light-emitting region and the reflection region on the emission layer;
    a first electrode disposed only in the reflection region on the upper electrode, the first electrode including a first material having a first reflectivity; and
    a second electrode disposed in the light-emitting region and the reflection region on the upper electrode, the second electrode including a second material having a second reflectivity, the second electrode overlapping the first electrode substantially in an entirety of the reflection region,
    wherein the first electrode and the second electrode define a touch sensor which senses a touch position based on a change of capacitance between the first electrode and the second electrode, and
    wherein the second electrode includes at least one selected from a metal, an alloy, a metal nitride, and a conductive metal oxide.

2. The organic light emitting display device of claim 1, further comprising:
    an opposite substrate facing the substrate,
    wherein the first electrode is disposed on a first surface of the opposite substrate, and the second electrode is disposed on a second surface opposing the first surface of the opposite substrate, and
    wherein the first electrode is disposed in the reflection region and outside of the light-emitting region.

3. The organic light emitting display device of claim 1, further comprising:

an opposite substrate facing the substrate,
wherein
the first electrode is disposed on the substrate, and
the second electrode is disposed on a first surface of the opposite substrate, and is disposed between the substrate and the opposite substrate.

4. The organic light emitting display device of claim 1, further comprising:
an opposite substrate facing the substrate, and
an insulation layer disposed between the first electrode and the second electrode, and comprising an adhesive material,
wherein
the first electrode is disposed on a first surface of the opposite substrate, and is disposed between the substrate and the opposite substrate, and
the second electrode is disposed on the first electrode.

5. The organic light emitting display device of claim 1, further comprising:
an opposite substrate facing the substrate, and
an insulation layer disposed between the first electrode and the second electrode, and comprising an adhesive material,
wherein
the second electrode is disposed on a first surface of the opposite substrate, and is disposed between the substrate and the opposite substrate, and
the first electrode is disposed on the second electrode.

6. The organic light emitting display device of claim 1, further comprising:
a thin film encapsulation layer disposed on the substrate, and
an insulation layer disposed between the first electrode and the second electrode, and comprising an adhesive material,
wherein
the second electrode is disposed on the thin film encapsulation layer, and
the first electrode is disposed on the second electrode.

7. The organic light emitting display device of claim 1, further comprising:
a first thin film encapsulation layer disposed on the substrate, and
a second thin film encapsulation layer disposed between the first electrode and the second electrode,
wherein
the second electrode is disposed on the first thin film encapsulation layer, and
the first electrode is disposed on the second electrode.

8. The organic light emitting display device of claim 1, wherein
the first electrode comprises a plurality of first patterns extending in a first direction, and
the second electrode comprises a plurality of second patterns extending in a second direction crossing the first direction.

9. The organic light emitting display device of claim 8, wherein the plurality of first patterns comprises:
a plurality of first sensing patterns which sense a touch position; and
a plurality of first dummy patterns disposed between the plurality of first sensing patterns, and
wherein the plurality of second patterns comprises:
a plurality of second sensing patterns which sense the touch position; and
a plurality of second dummy patterns disposed between the plurality of second sensing patterns.

10. The organic light emitting display device of claim 9,
wherein the plurality of first sensing patterns have a mesh shape, and
wherein a width of the plurality of second patterns in the second direction is same as a width of the plurality of first patterns in the first direction.

11. The organic light emitting display device of claim 1,
wherein the first electrode further comprises:
a plurality of first sensing patterns having a rhombus shape; and
a plurality of first dummy patterns having a rhombus shape, and disposed between the plurality of first sensing patterns, and spaced apart from each other,
wherein the second electrode further comprises:
a plurality of second sensing patterns having a rhombus shape;
and a plurality of second dummy patterns having a rhombus shape, and disposed between the plurality of second sensing patterns, and spaced apart from each other, and
wherein first sensing patterns, which are disposed in a first direction, of the plurality of first sensing patterns are connected to each other and second sensing patterns, which are disposed in a second direction crossing the first direction, of the plurality of second sensing patterns are connected to each other.

12. The organic light emitting display device of claim 1, wherein the first material is same as the second material.

13. The organic light emitting display device of claim 1, wherein the first material is different from the second material.

14. An organic light emitting display device comprising:
a substrate comprising a light-emitting region and a reflection region;
a lower electrode disposed in the light-emitting region on the substrate;
an emission layer disposed on the lower electrode;
an upper electrode disposed in the light-emitting region and the reflection region on the emission layer;
a first electrode disposed only in the reflection region on the upper electrode, the first electrode having a first thickness; and
a second electrode disposed in the light-emitting region and the reflection region on the upper electrode, the second electrode having a second thickness, the second electrode overlapping the first electrode substantially in an entirety of the reflection region,
wherein the first electrode and the second electrode define a touch sensor which senses a touch position based on a change of capacitance between the first electrode and the second electrode, and
wherein the first thickness of the first electrode is greater than the second thickness of the second electrode, and
wherein the second electrode includes at least one selected from a metal, an alloy, a metal nitride, and a conductive metal oxide.

15. The organic light emitting display device of claim 14, wherein the first electrode includes a first material having a first reflectivity, and the second electrode includes a second material having a second reflectivity.

16. The organic light emitting display device of claim 15, wherein the first material is same as the second material.

17. The organic light emitting display device of claim 15, wherein the first material is different from the second material.

* * * * *